(12) United States Patent
Jann et al.

(10) Patent No.: US 11,374,557 B2
(45) Date of Patent: Jun. 28, 2022

(54) RADIO DESIGN, CONTROL, AND ARCHITECTURE

(71) Applicant: Intel Corporation, Santa Clara, CA (US)

(72) Inventors: Benjamin Jann, Hillsboro, OR (US); Ashoke Ravi, Portland, OR (US); Satwik Patnaik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/255,291

(22) PCT Filed: Dec. 28, 2018

(86) PCT No.: PCT/US2018/067874
§ 371 (c)(1),
(2) Date: Dec. 22, 2020

(87) PCT Pub. No.: WO2020/139371
PCT Pub. Date: Jul. 2, 2020

(65) Prior Publication Data
US 2021/0391853 A1    Dec. 16, 2021

(51) Int. Cl.
| | | |
|---|---|---|
| *H03B 27/00* | (2006.01) | |
| *H03B 19/14* | (2006.01) | |
| *H03K 5/14* | (2014.01) | |
| *H03B 5/12* | (2006.01) | |
| *H03M 1/50* | (2006.01) | |

(52) U.S. Cl.
CPC ............... *H03K 5/14* (2013.01); *H03B 5/12* (2013.01); *H03B 19/14* (2013.01); *H03B 27/00* (2013.01); *H03M 1/502* (2013.01); *H03B 2200/0078* (2013.01)

(58) Field of Classification Search
CPC ................... H03B 19/14; H03B 27/00; H03B 2200/0078; H03K 5/14; H03L 7/0812–0818; H03M 1/502
See application file for complete search history.

(56) References Cited

U.S. PATENT DOCUMENTS

| | | |
|---|---|---|
| 6,686,805 B2 | 2/2004 | Cyrusian |
| 8,014,486 B2 | 9/2011 | Schwartz |
| 2004/0005869 A1 | 1/2004 | See et al. |

(Continued)

OTHER PUBLICATIONS

International Search Authority, PCT Search Report issued for PCT/US2018/067874, 5 pgs., dated May 2, 2019.

*Primary Examiner* — Levi Gannon
(74) *Attorney, Agent, or Firm* — Banner & Witcoff Ltd.

(57) ABSTRACT

Techniques are described related to digital radio control, partitioning, and operation. The various techniques described herein enable high-frequency local oscillator signal generation and frequency multiplication using radio-frequency (RF) digital to analog converters (RFDACs). The use of these components and others described throughout this disclosure allow for the realization of various improvements. For example, digital, analog, and hybrid beamforming control are implemented and the newly-enabled digital radio architecture partitioning enables radio components to be pushed to the radio head, allowing for the omission of high frequency cables and/or connectors.

24 Claims, 45 Drawing Sheets

(56) References Cited

U.S. PATENT DOCUMENTS

| | | | | |
|---|---|---|---|---|
| 2009/0129446 A1* | 5/2009 | Wilhite | ............... | H03F 1/34 |
| | | | | 375/147 |
| 2010/0111227 A1* | 5/2010 | Philippe | ............ | H03C 5/00 |
| | | | | 375/300 |
| 2011/0286553 A1* | 11/2011 | Min | ................ | H04B 1/30 |
| | | | | 375/319 |
| 2014/0072077 A1* | 3/2014 | Cheng | ............... | H04L 27/12 |
| | | | | 375/303 |

* cited by examiner $$\begin{pmatrix} \frac{2\pi}{M_X} + \frac{2\pi}{M_Y} & \frac{2\pi}{M_X} + \frac{4\pi}{M_Y} & \cdots & \frac{2\pi}{M_X} + \frac{2\pi(M_Y-1)}{M_Y} & \frac{2\pi}{M_X} \\ \frac{4\pi}{M_X} + \frac{2\pi}{M_Y} & \frac{4\pi}{M_X} + \frac{4\pi}{M_Y} & \cdots & \frac{4\pi}{M_X} + \frac{2\pi(M_Y-1)}{M_Y} & \frac{4\pi}{M_X} \\ \vdots & \vdots & \ddots & \vdots & \vdots \\ \frac{2\pi(M_X-1)}{M_X} + \frac{2\pi}{M_Y} & \frac{2\pi(M_X-1)}{M_X} + \frac{4\pi}{M_Y} & \cdots & \frac{2\pi(M_X-1)}{M_X} + \frac{2\pi(M_Y-1)}{M_Y} & \frac{2\pi(M_X-1)}{M_X} \\ \frac{2\pi}{M_Y} & \frac{4\pi}{M_Y} & \cdots & \frac{2\pi(M_Y-1)}{M_Y} & 0 \end{pmatrix}$$

$$\begin{pmatrix} 0° & 30° & 60° & 90° & 120° & 150° & 180° & 210° & 240° & 270° & 300° & 330° \\ 72° & 102° & 132° & 162° & 192° & 222° & 252° & 282° & 312° & 342° & 12° & 42° \\ 144° & 174° & 204° & 234° & 264° & 294° & 324° & 354° & 24° & 54° & 84° & 114° \\ 216° & 246° & 276° & 306° & 336° & 6° & 36° & 66° & 96° & 126° & 156° & 186° \\ 288° & 318° & 348° & 18° & 48° & 78° & 108° & 138° & 168° & 198° & 228° & 258° \end{pmatrix}$$

$\eta P = 12$ & $(2N+1) = 5$ and $(M_X, M_Y) = (12,5)$

FIG. 9A $$\begin{pmatrix} 0° & 30° & 60° & 90° & 120° & 150° & 180° & 210° & 240° & 270° & 300° & 330° \\ 120° & 150° & 180° & 210° & 240° & 270° & 300° & 330° & 0° & 30° & 60° & 90° \\ 240° & 270° & 300° & 330° & 0° & 30° & 60° & 90° & 120° & 150° & 180° & 210° \end{pmatrix}$$

$\eta P = 12$ & $(2N+1) = 3$ and $(M_X, M_Y) = (12,3)$

FIG. 9B $$\begin{pmatrix} 0° & 40° & 80° & 120° & 160° & 200° & 240° & 280° & 320° \\ 90° & 130° & 170° & 210° & 250° & 290° & 330° & 10° & 50° \\ 180° & 220° & 260° & 300° & 340° & 20° & 60° & 100° & 140° \\ 270° & 310° & 350° & 30° & 70° & 110° & 150° & 190° & 230° \end{pmatrix}$$

$\eta P = 12$ & $(2N+1) = 3$ and $(M_X, M_Y) = (9,4)$

FIG. 9C

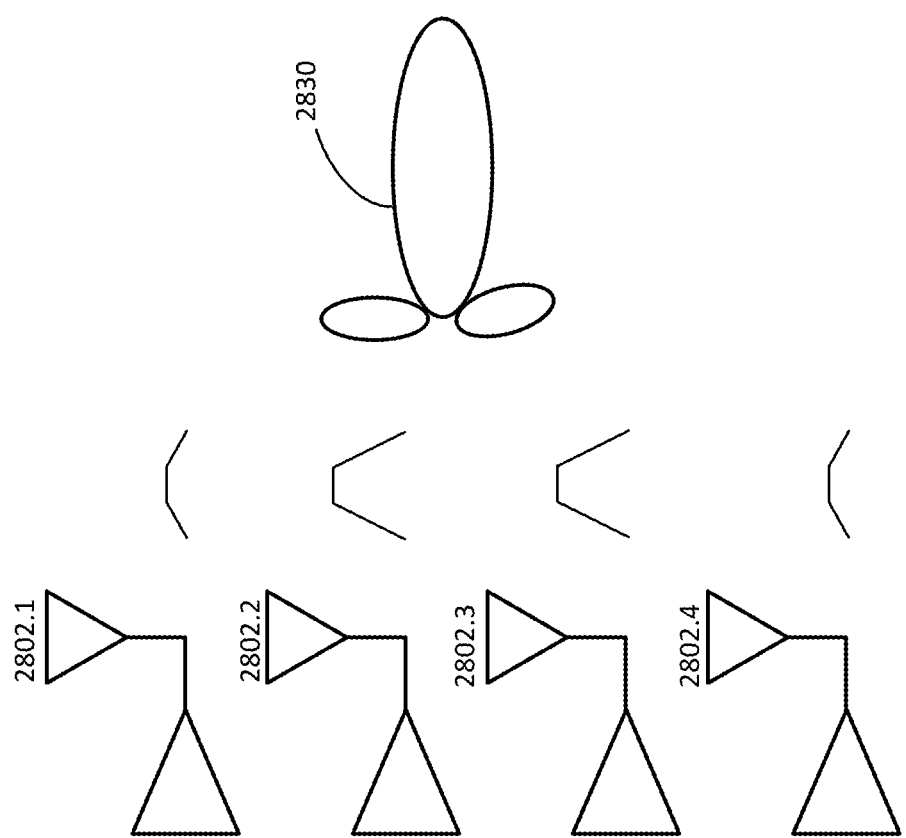

RADIO DESIGN, CONTROL, AND ARCHITECTURE

TECHNICAL FIELD

Aspects described herein generally relate to radios and, more particularly, to radio designs implementing frequency-multiplication, digital control, and novel radio architectures.

BACKGROUND

Modern RF radios generally utilize local oscillators (LOs), which need to be distributed to one or more radio chains (e.g., receivers, transmitters, or transceivers). Furthermore, modern RF radios may implement beamforming and/or require high-frequency signal distribution. The generation, distribution, and processing of such signals introduces design complexities that need to be addressed. For instance, modern RF radios suffer from signal loss, the use of excessive power (and in turn heat generation), and the use of expensive and lossy cabling and connectors as interconnects between RF radio boards. Current attempts to solve these and other issues have been inadequate.

BRIEF DESCRIPTION OF THE DRAWINGS/FIGURES

The accompanying drawings, which are incorporated herein and form a part of the specification, illustrate the aspects of the present disclosure and, together with the description, further serve to explain the principles of the aspects and to enable a person skilled in the pertinent art to make and use the aspects.

FIG. 6 illustrates an exemplary $M_x$-by-$M_y$ matrix indicating the phase created for the two-dimensional delay-line 500 as shown in FIG. 5, in accordance with an aspect of the disclosure.

FIGS. 9A-9C illustrate exemplary phase matrices for three different cases of sub-harmonic multiplication factor (2N+1) and phase resolution ηP, in accordance with an aspect of the disclosure.

Figure 28B:
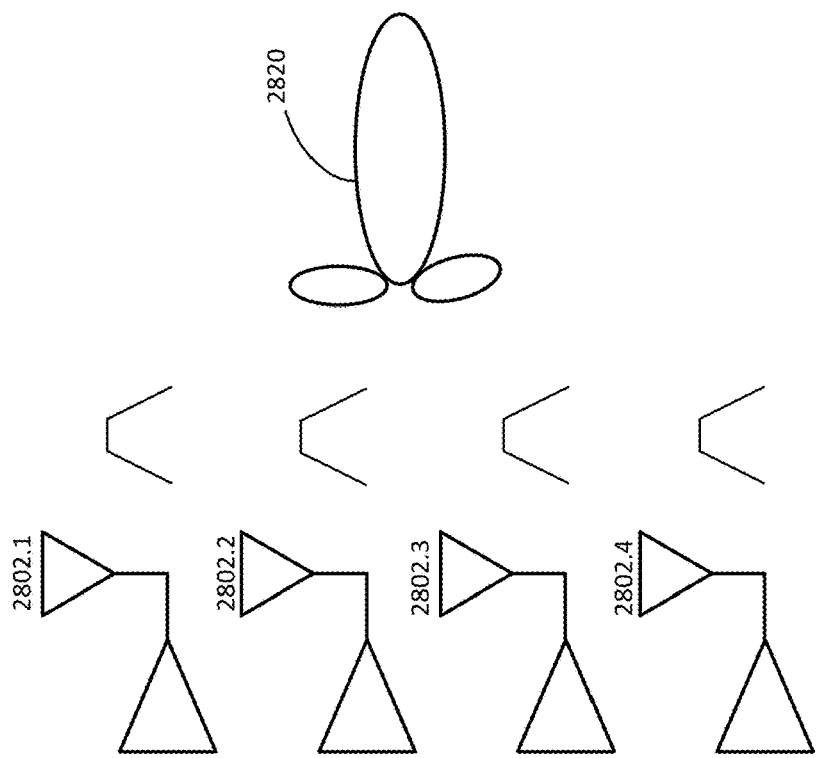
Figure 28A:
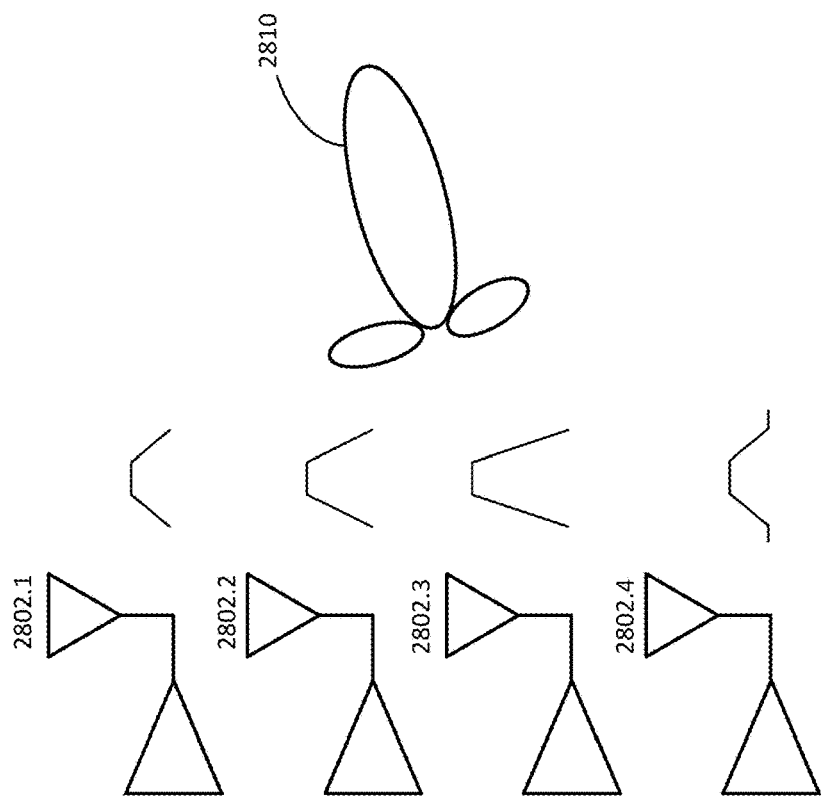

FIGS. 28A-C illustrate example beamforming results from a phased array antenna system, in accordance with an aspect of the disclosure.

Figure 29:
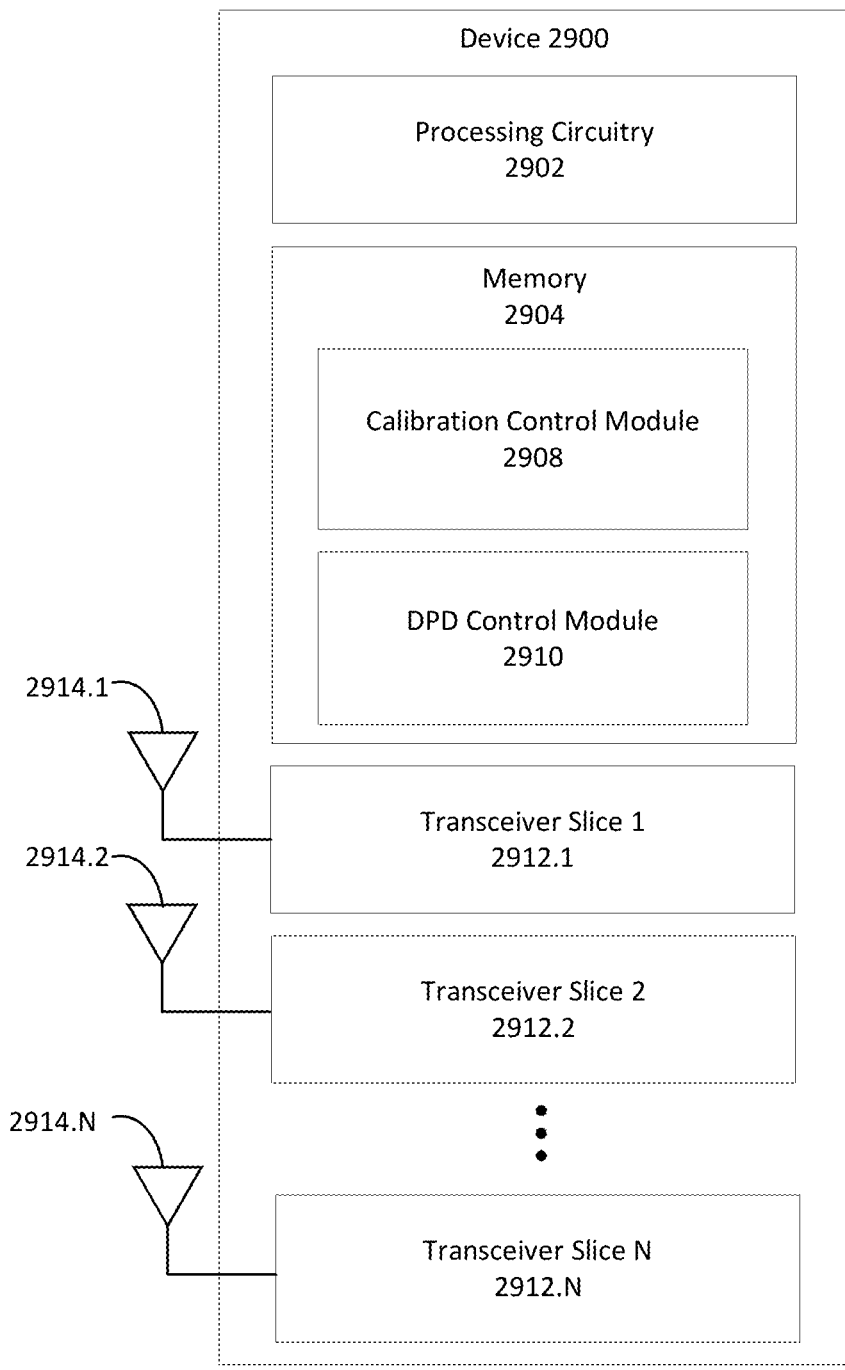

FIG. 29 illustrates a block diagram of an exemplary device, in accordance with an aspect of the disclosure.

Figure 30:
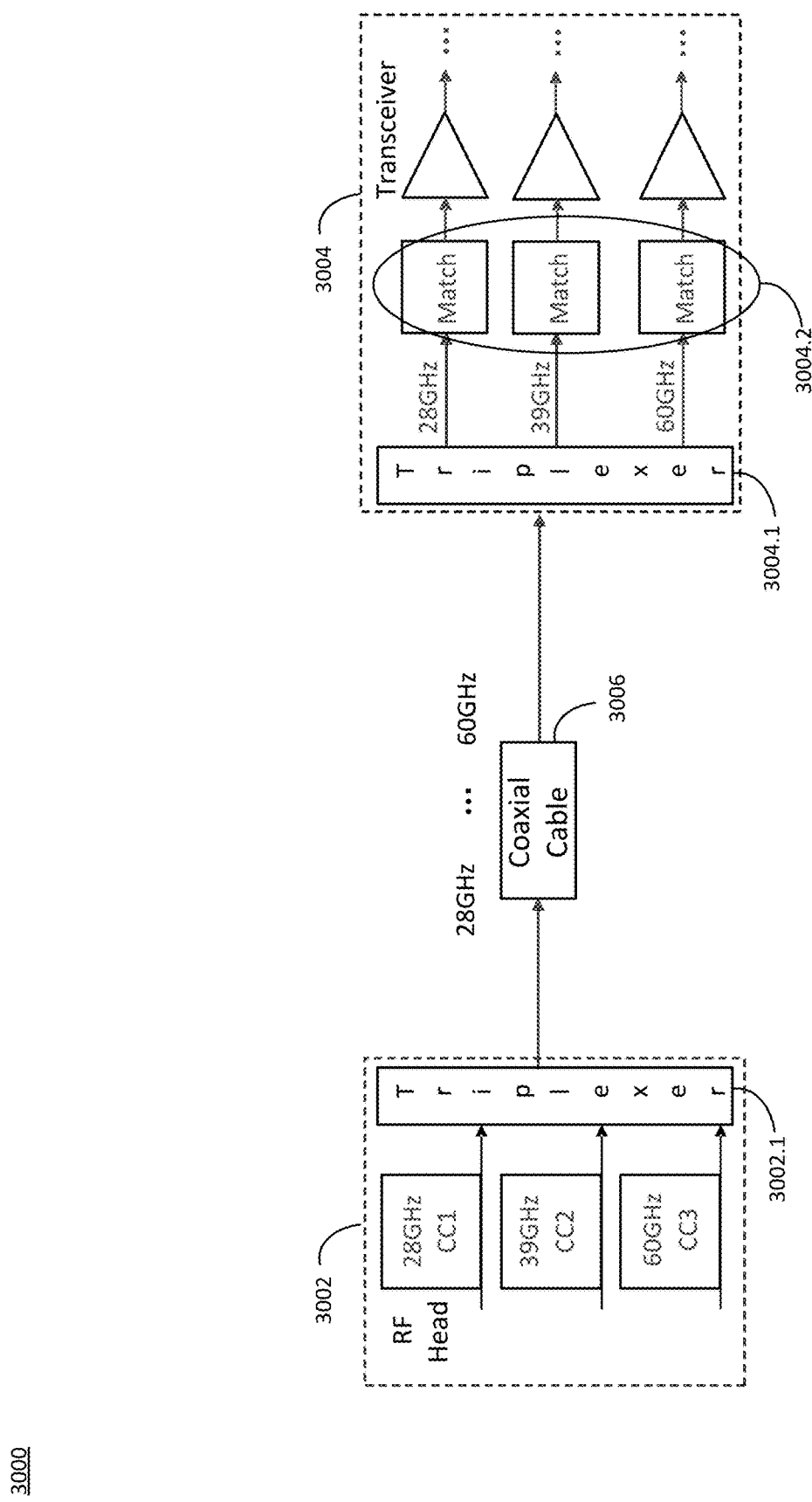

FIG. 30 illustrates a block diagram showing an exemplary board-to-board interconnect, in accordance with an aspect of the disclosure.

Figure 31A:
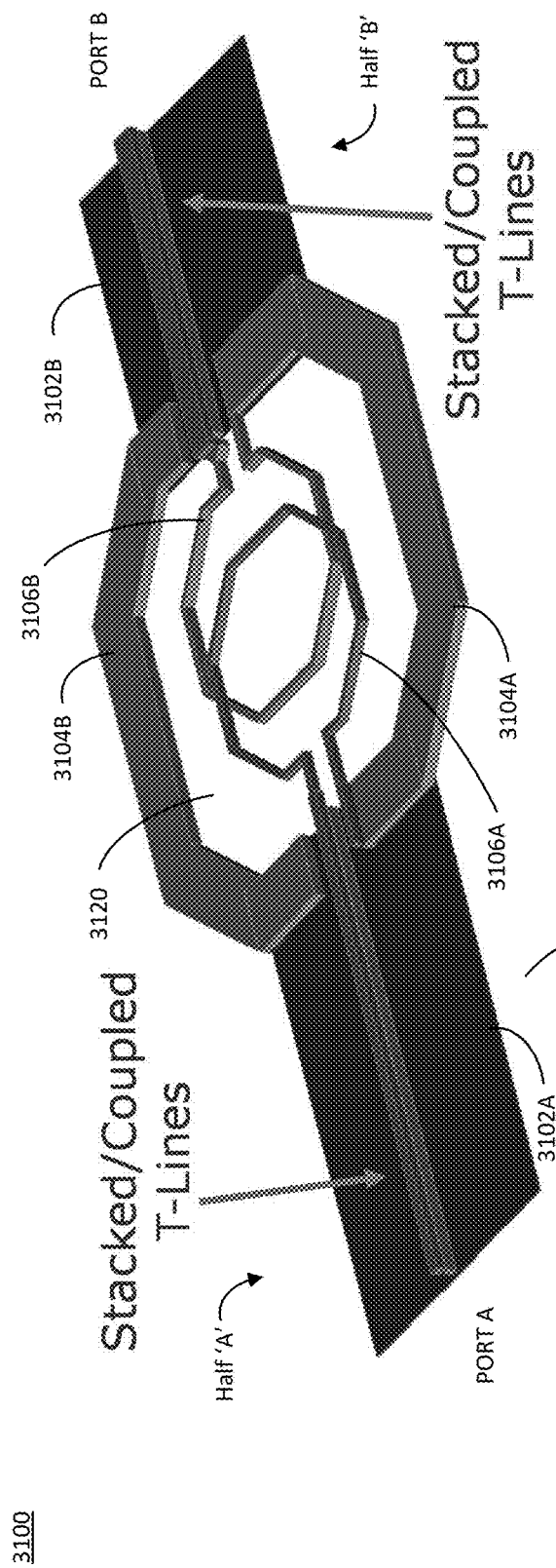
Figure 31B:
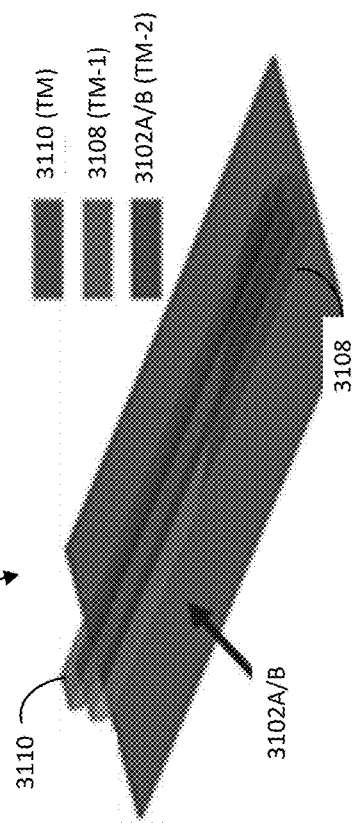

FIGS. 31A-B illustrate exemplary coupled-inductor architecture implementing stacked and coupled transmission lines, in accordance with an aspect of the disclosure.

Figure 32:
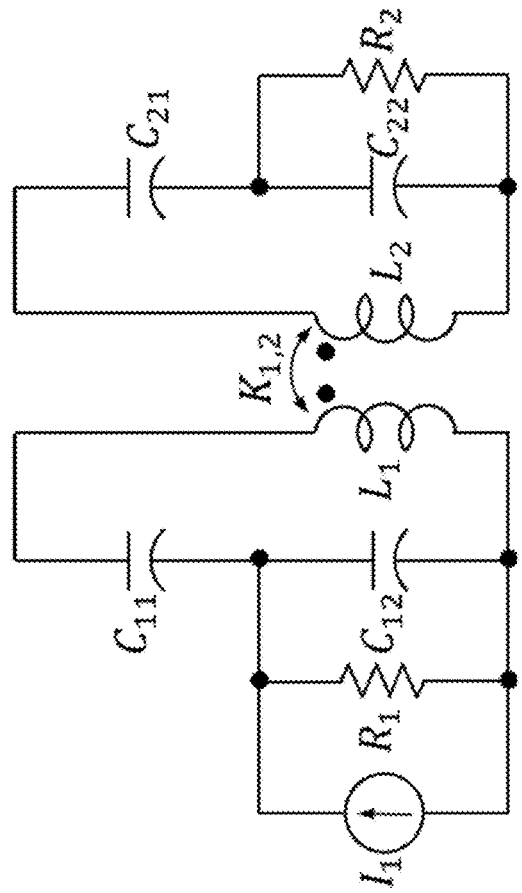

FIG. 32 illustrates an equivalent circuit representation of the coupled-inductor architecture as shown in FIG. 31A, in accordance with an aspect of the disclosure.

Figure 33:
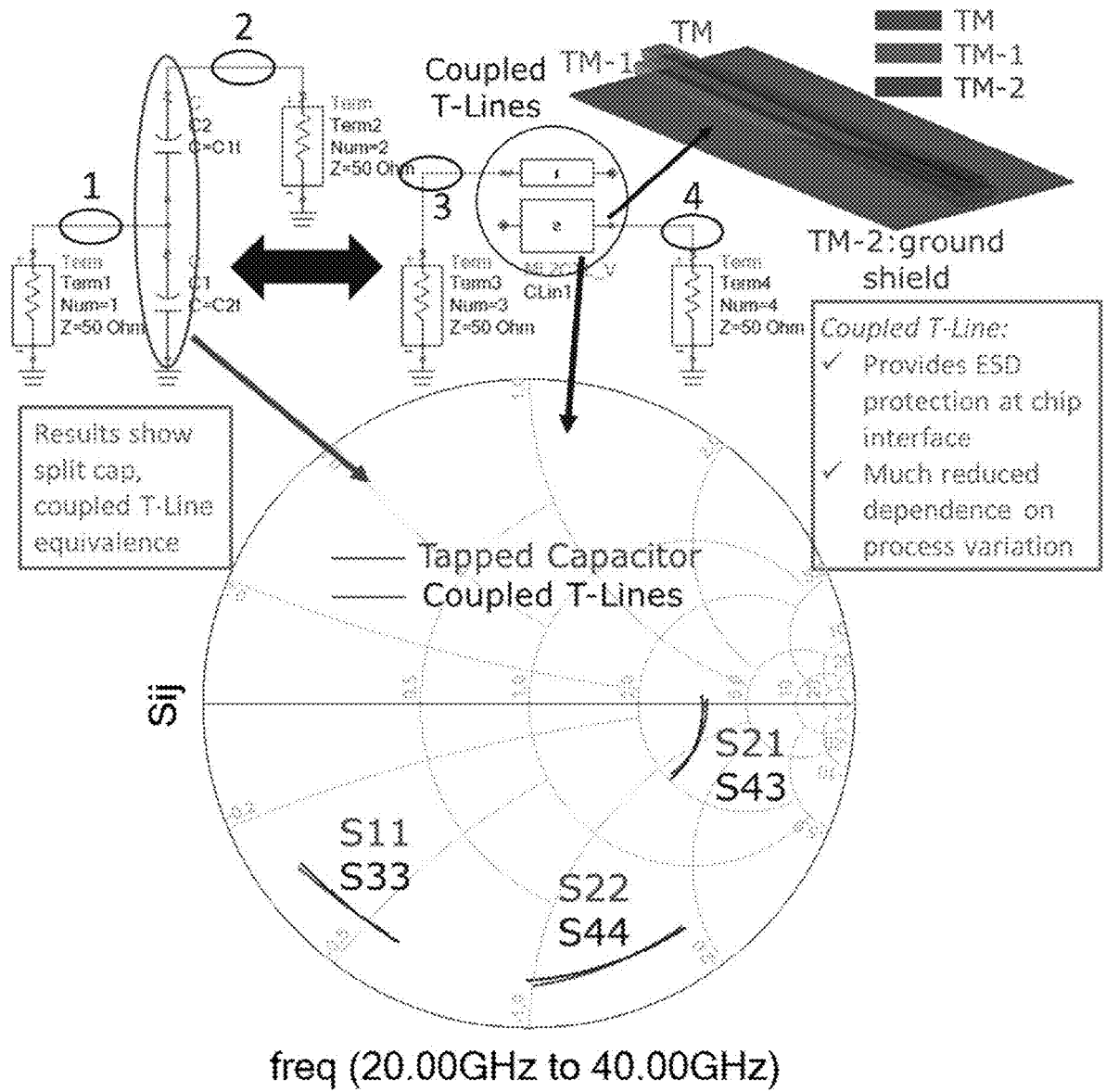

FIG. 33 illustrates a Smith chart plot of simulated test results comparing a split-capacitor circuit topology with a stacked and coupled transmission line topology, in accordance with an aspect of the disclosure.

Figure 34:
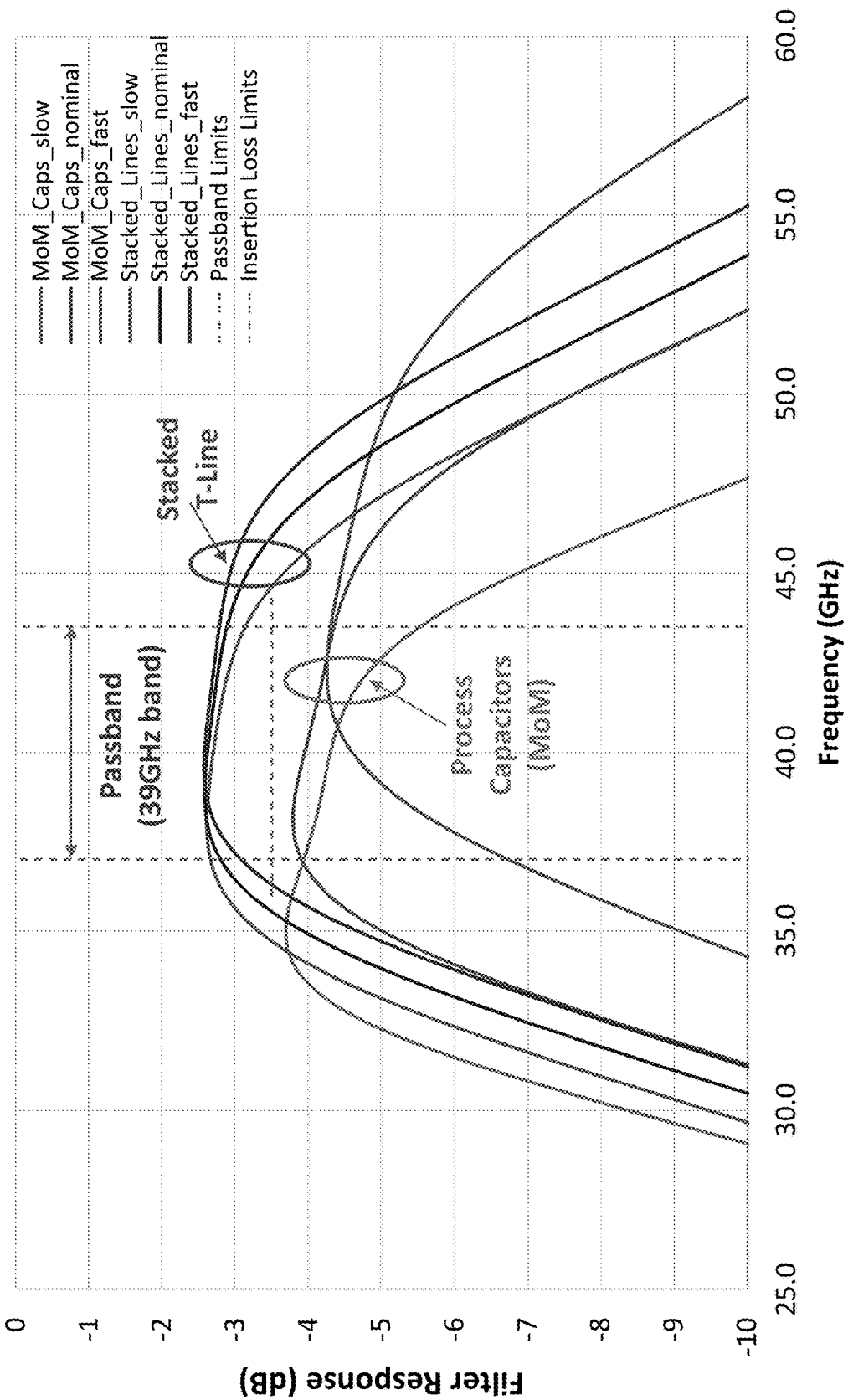

FIG. 34 illustrates a filter response plot of simulated test results comparing metal oxide metal (MoM) capacitors with the stacked and coupled transmission line topology, in accordance with an aspect of the disclosure.

Figure 35:
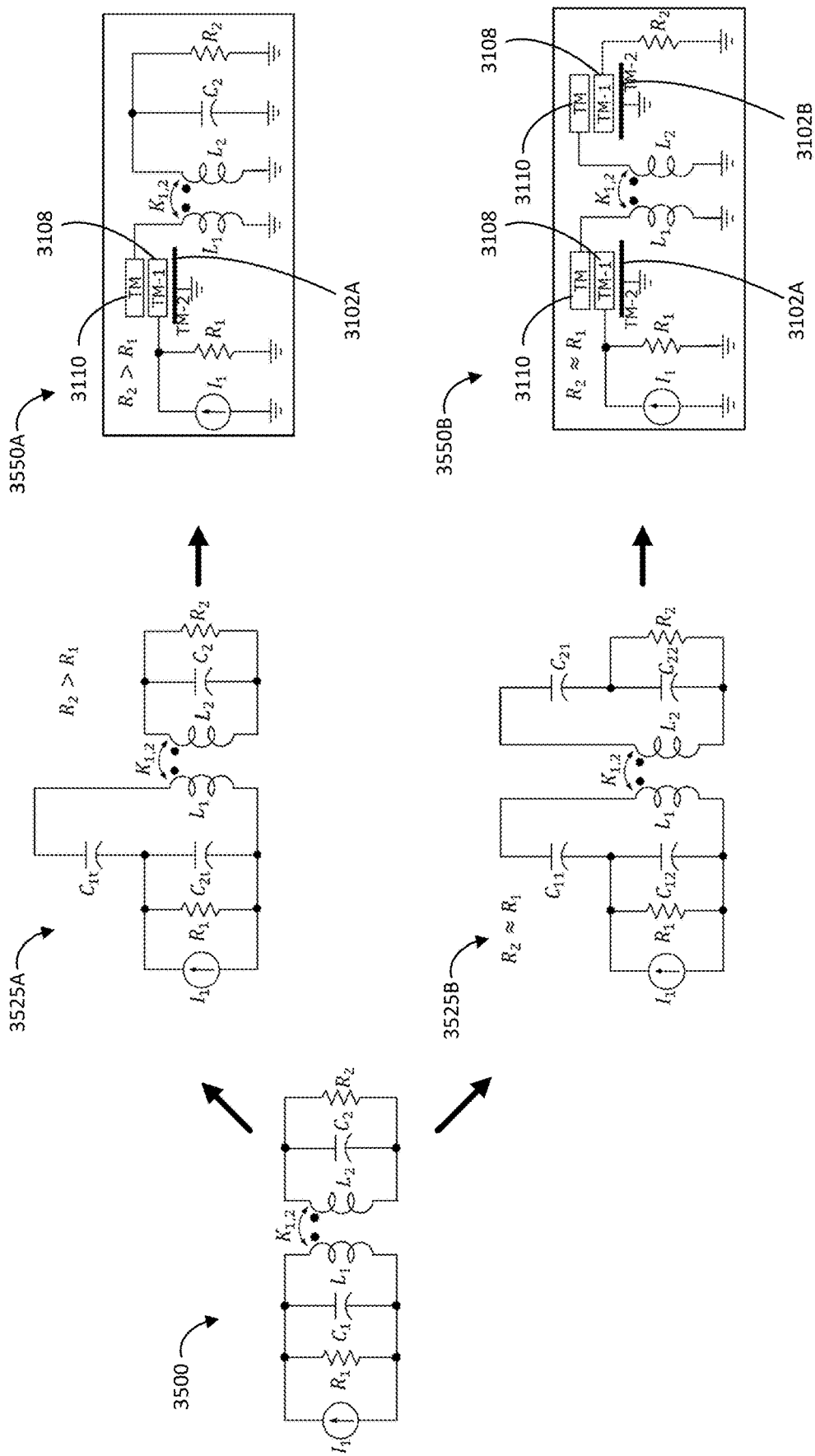

FIG. 35 illustrates different implementations of the coupled-inductor architecture and equivalent circuit representations, in accordance with an aspect of the disclosure.

Figure 36:
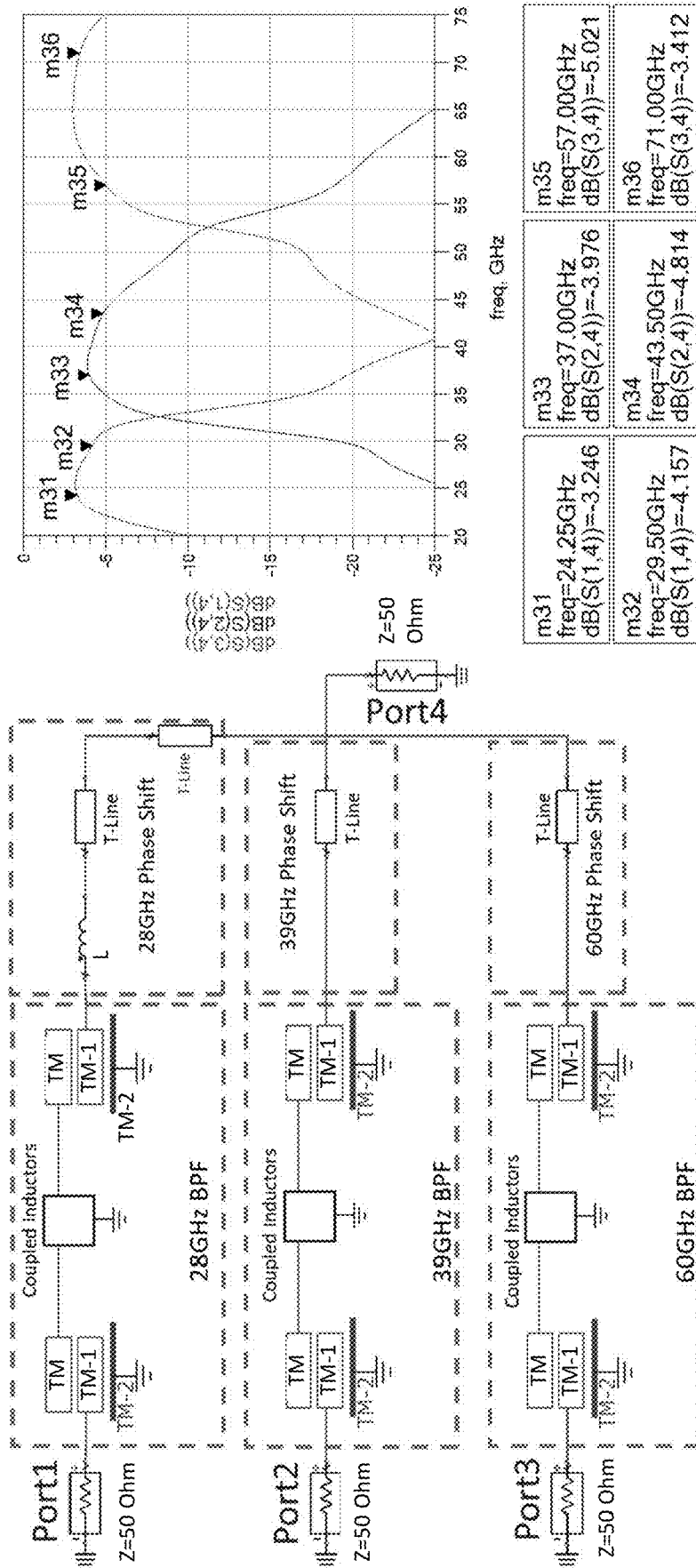

FIG. 36 illustrates an example simulated triplexer implementation and a plot of simulated test results, in accordance with an aspect of the disclosure.

Figure 37:
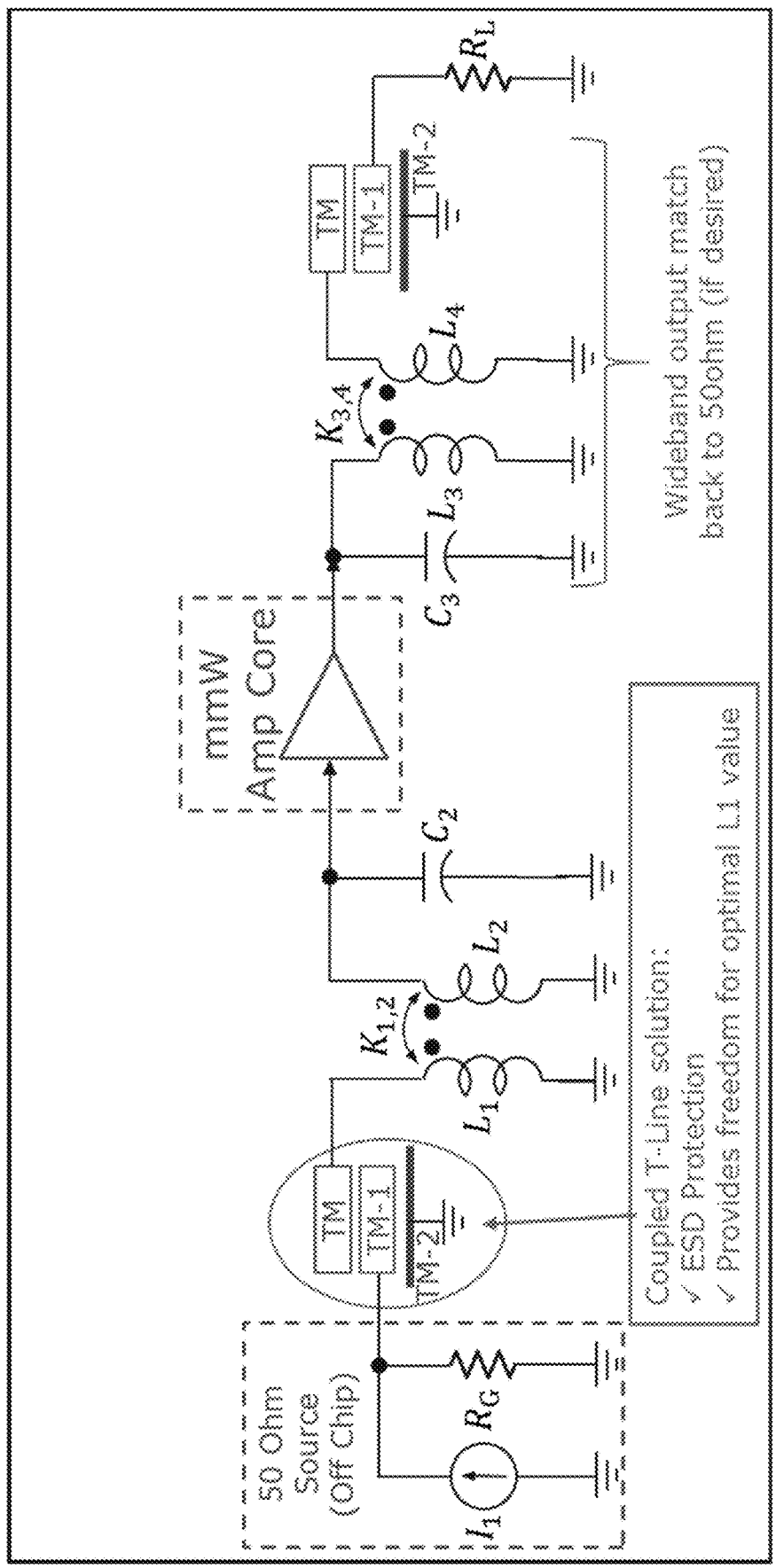

FIG. 37 illustrates an example simulated impedance matching implementation, in accordance with an aspect of the disclosure.

Figure 38:
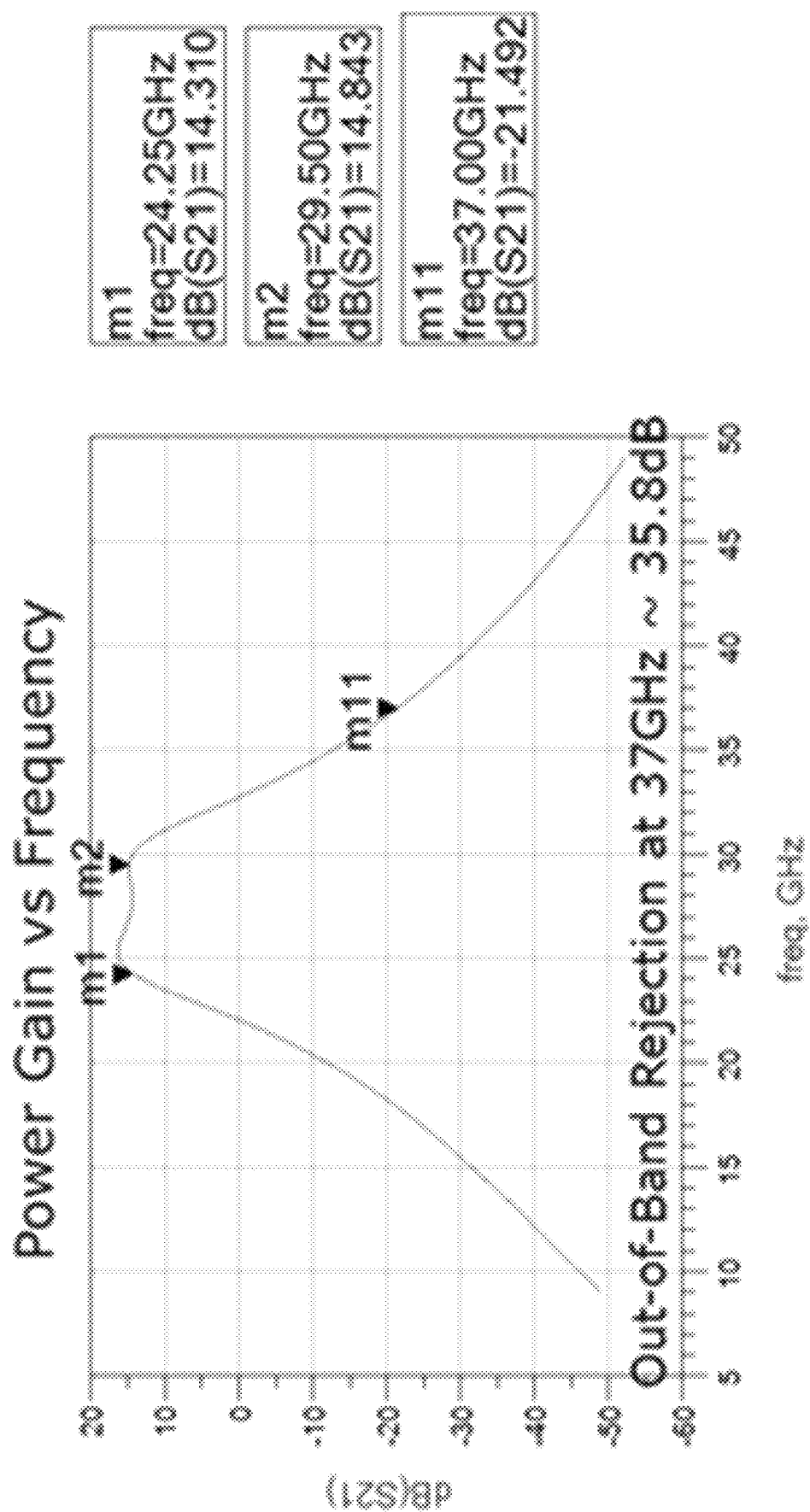

FIG. 38 illustrates a power gain versus frequency plot of the simulated impedance matching implementation shown in FIG. 37, in accordance with an aspect of the disclosure.

Figure 39:
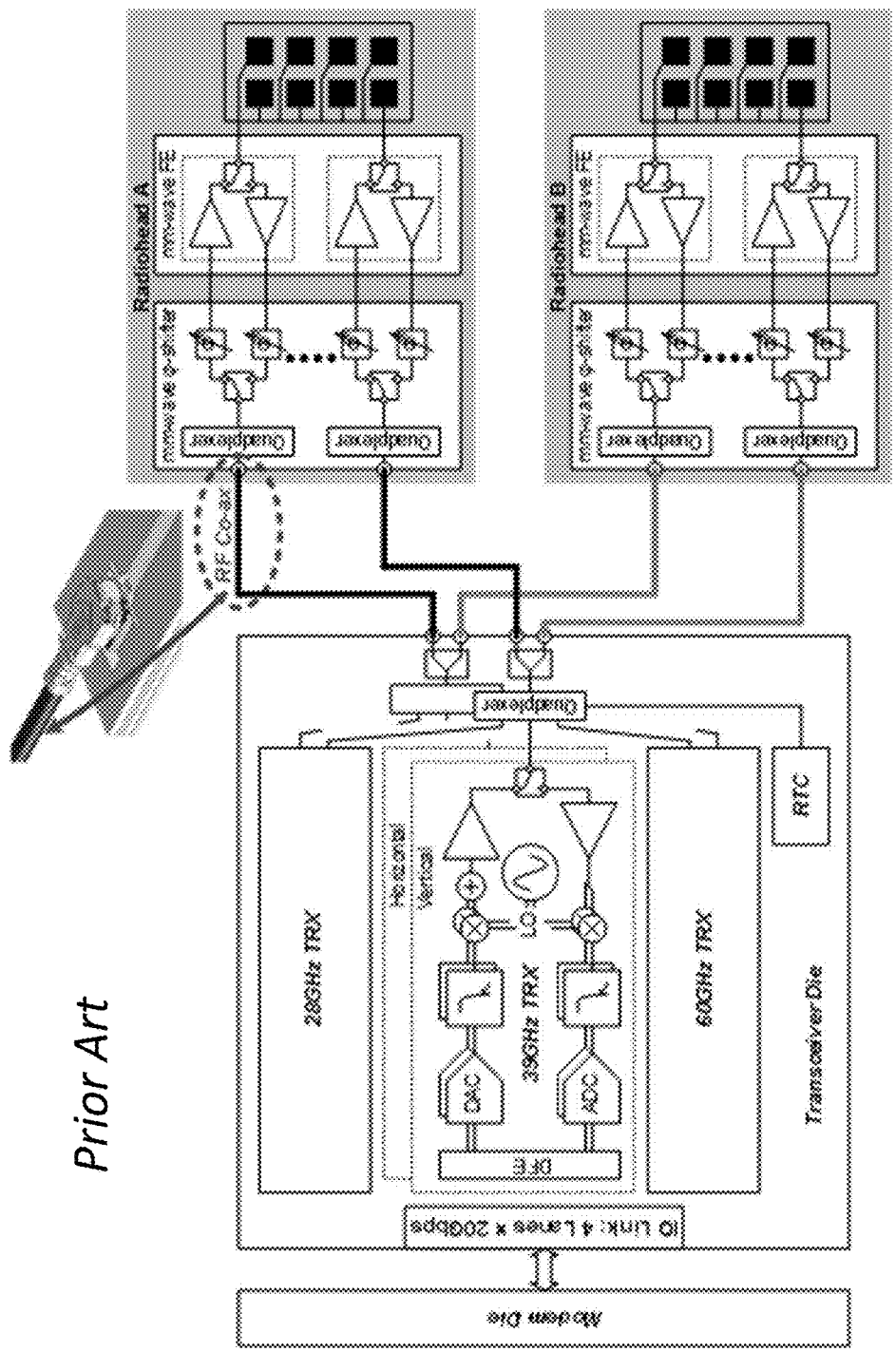

FIG. 39 illustrates a block diagram of a conventional radio partition.

Figure 40:
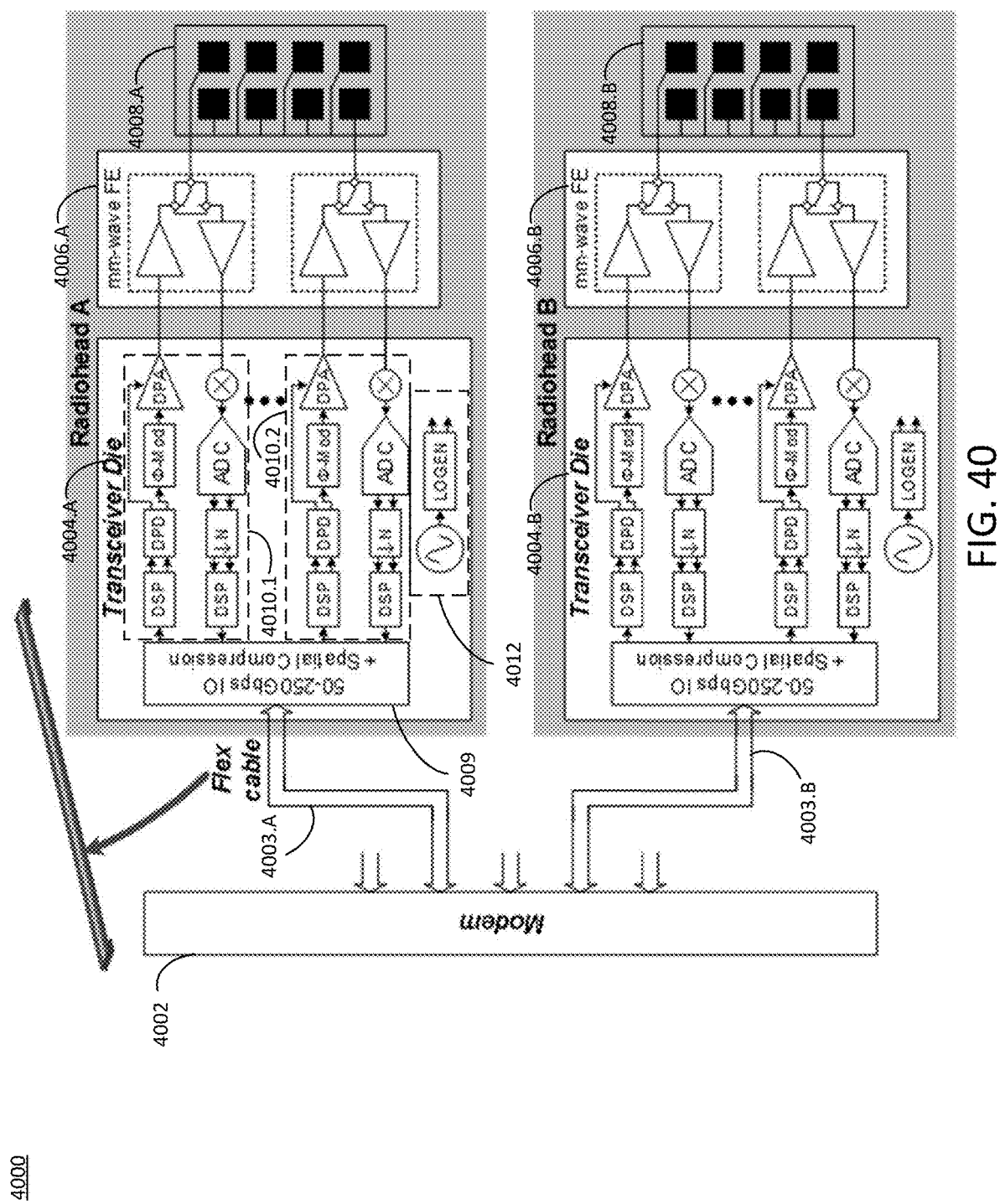

FIG. 40 illustrates a block diagram of an exemplary radio partitioning, in accordance with an aspect of the disclosure.

Figure 41:
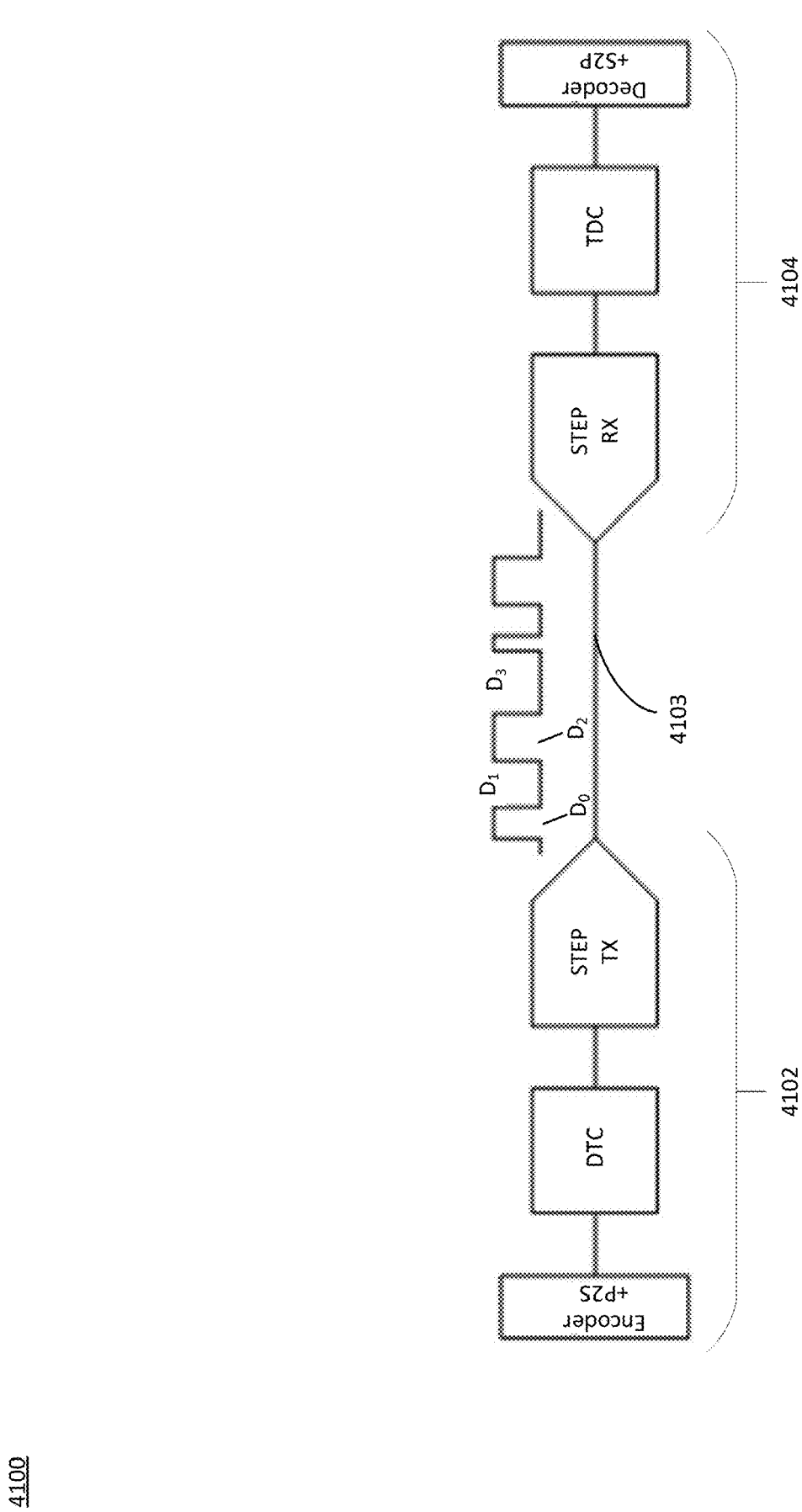

FIG. 41 illustrates a block diagram of an exemplary bi-directional digital communication chain, in accordance with an aspect of the disclosure.

Figure 42:
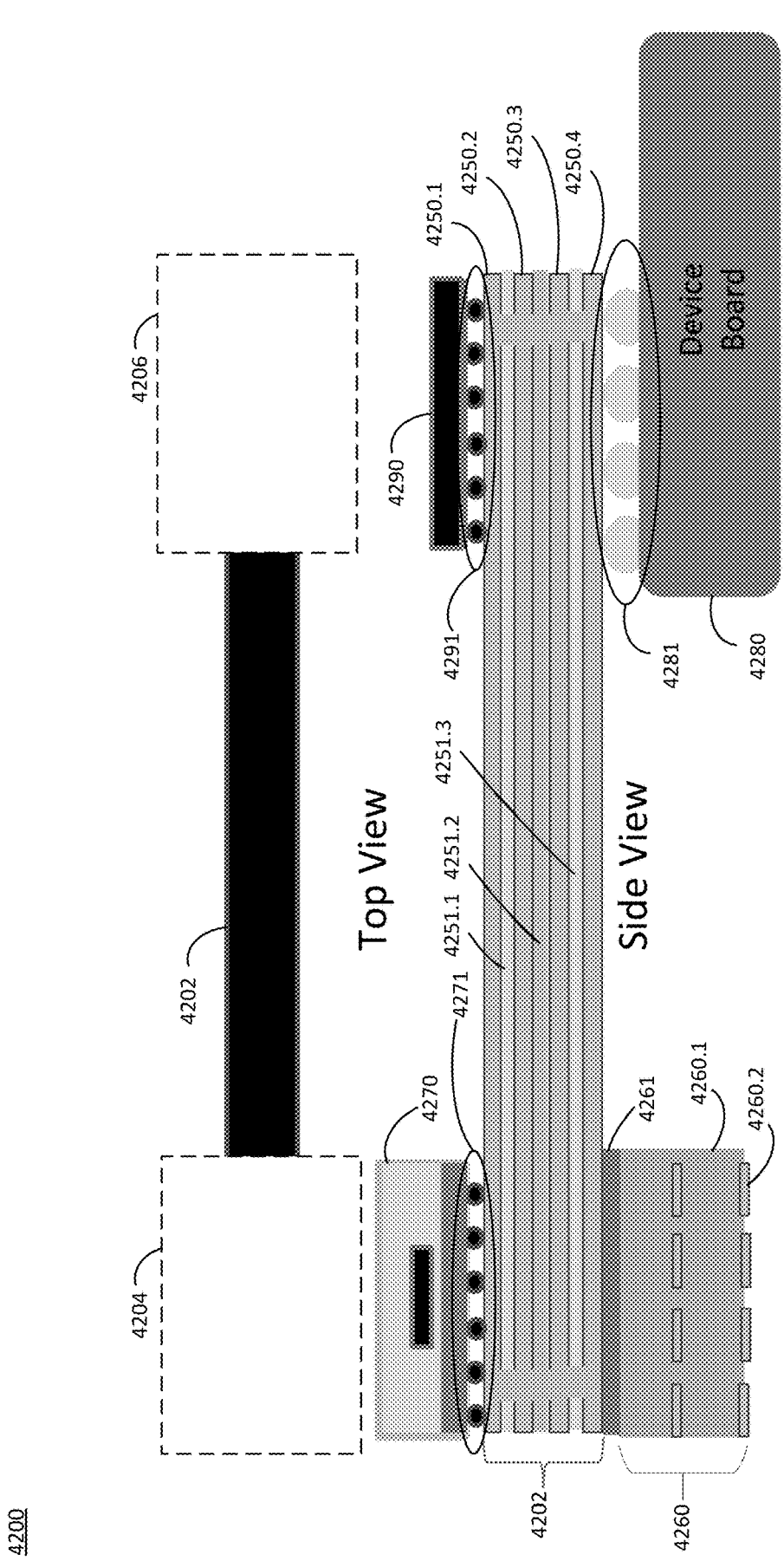

FIG. 42 illustrates an exemplary cable and component interface, in accordance with an aspect of the disclosure.

Figure 43:
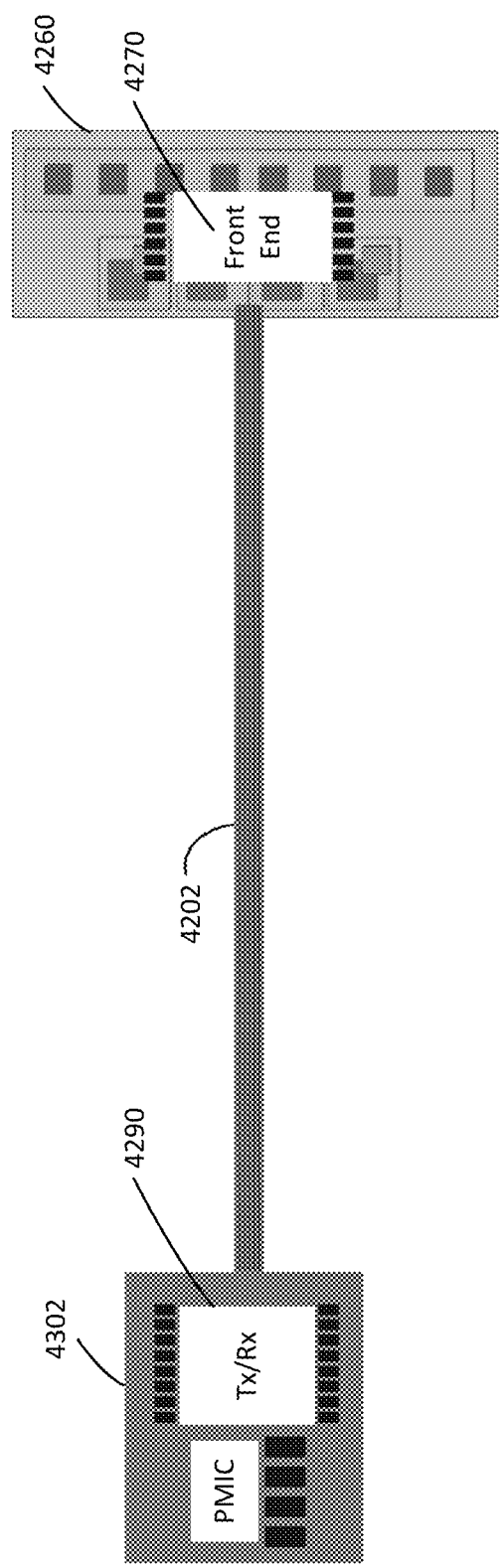

FIG. 43 illustrates a first example implementation of radio components using a cable interconnection, in accordance with an aspect of the disclosure.

Figure 44:
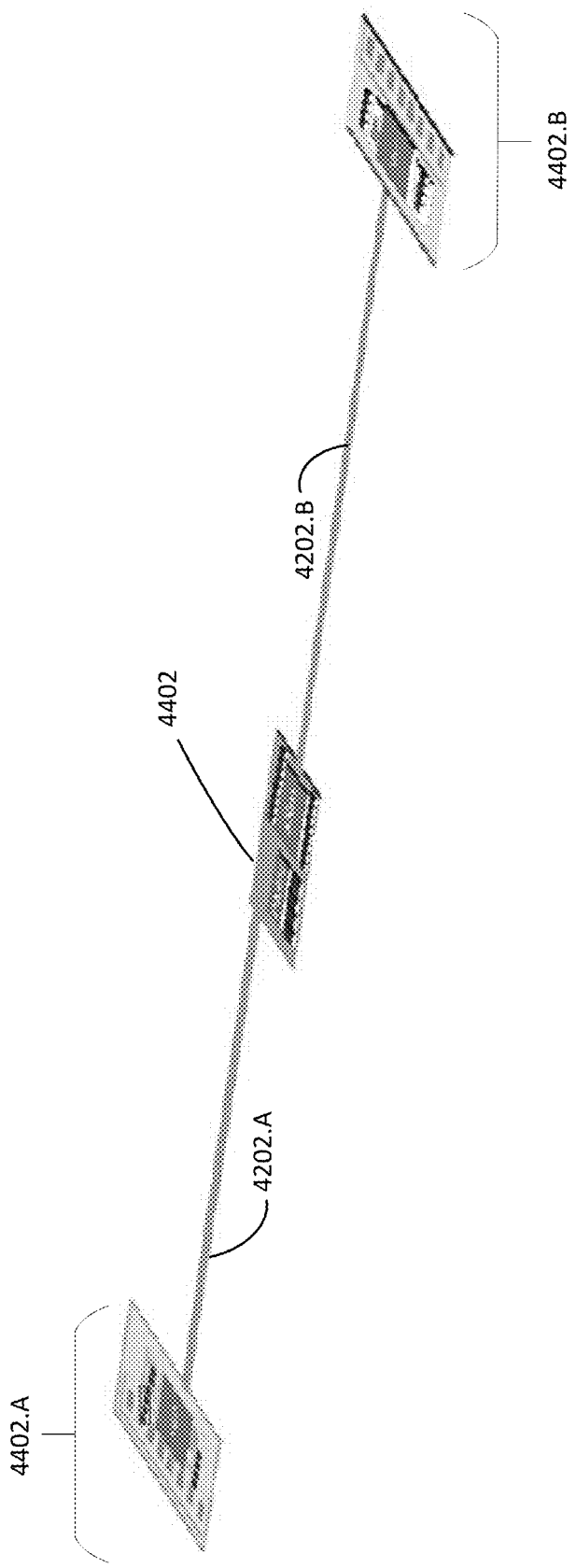

FIG. 44 illustrates a second example implementation of radio components using a cable interconnection, in accordance with an aspect of the disclosure.

The exemplary aspects of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the aspects of the present disclosure. However, it will be apparent to those skilled in the art that the aspects, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Section I—Local Oscillator Generation Using Frequency Multiplying DACs

The aspects described within this section generally relate to receivers and, more particularly, to receiver designs implementing local oscillator (LO) generation at mm-wave frequencies.

RF receivers require local oscillators (LOs) for downconversion and/or processing of received signals. For example, one or more LO signals need to be generated at each carrier frequency or channel of interest. For higher frequency receiver applications, such as 5G/mm-wave receivers, the requisite LO signal is typically a large (i.e., zero to supply) signal. Moreover, with LO beamforming, no lossy phase shifter is needed in the RF path, further saving area and power. As a result, generating and distributing such large signal mm-wave LO is advantageous but also non-trivial, and requires significant power. Moreover, such mm-wave receiver designs also require quadrature LO and, further complicating this issue, LO beamforming-based receivers also require multi-phase LOs. Therefore, generating the required LO signals for such receivers is a complex, expensive, and time-consuming task.

Again, many RF receiver designs, such as 5G/mm-wave receivers, for example, implement quadrature multi-phase LOs. Typical solutions to generate these signals include direct multi-phase quadrature LO generation techniques that aim to directly generate mm-wave LO from a phase locked loop using, for example, frequency division, 90° hybrid couplers, and poly-phase filters. Such techniques, however, result in phase noise degradation caused by capacitor quality-factor degradation at mm-wave frequencies, and utilize lossy phase shifters requiring mm-wave amplification, adding design cost, area, and power. Moreover, direct multi-phase techniques also suffer from high power dissipation at mm-wave frequencies over long distances, which is usually needed for practical applications using multi-channel beamforming receivers.

For example, frequency dividers compound the above-mentioned issues when a 2×LO clock has to be generated and distributed for local receiver frequency division, and designing frequency dividers at mm-wave frequencies is non-trivial. Furthermore, most flip-flop based divider techniques do not function at the intended frequencies due to limitations imposed on the speed of CMOS or CML logic. As a result, the only viable options have been using injection-locked frequency dividers or regenerative dividers, but each of these options suffers at mm-wave frequencies due to low quality factor of capacitors in LC-tanks, requiring high power, as noted above.

Additionally, 90° hybrid couplers are built at a specific frequency, and thus are difficult to tune for wide-band receiver use. And when used in wide-band applications, the phase and amplitude accuracy of the outputs begins to suffer as the frequency deviates from the design (i.e., tuned) frequency. Poly-phase filters also suffer from a similar problem as 90° hybrid couplers, as poly-phase filters are likewise designed to operate at a specific tuned frequency. Depending on the design topology, the phase or amplitude of the quadrature outputs thus suffers. To compensate for this, multi-stage poly-phase filters have been proposed, but these also suffer from significant power loss as each poly-phase adds a loss of 3 dB. Thus, mm-wave amplifiers may be used, which consume valuable design area and require additional power.

Other solutions to generate quadrature multi-phase LOs include the use of injection-locked-multiplication-based LO generation. Such designs use injection-locked frequency multiplication to generate mm-wave LO signals, but the fundamental input and its undesired harmonics are not fully suppressed, leading to spurs. Also, the multi-phase generation, either through interpolation or via direct phase-shifters, requires amplification post-phase-shifting at mm-wave frequencies, which also requires a power-hungry solution.

Therefore, to address the need to generate quadrature multi-phase LOs, particularly for mm-wave receivers including those implementing beamforming, the aspects herein implement a combination of frequency-multiplying digital-to-analog converters (FM-DACs) and a low-frequency delay-locked-loop (DLL). As further discussed herein, these aspects include using an RF-PLL to generate a sub-harmonic of the desired LO frequency, which is then distributed to different RF receiver chains, with each receiver chain implementing a respective FM-DAC and DLL. In other words, local to each chain, a DLL is used to generate multiple phases of the LO sub-harmonic for the FM-DAC and for beamforming. This eliminates distributing multi-phase mm-wave LO signals across a full chip. As a result, the FM-DAC, local to each chain, can generate quadrature large-swing LO signals at mm-wave frequencies using these inputs, with an appropriate LO phase per chain, while suppressing the fundamental (i.e., the LO sub-harmonic), and its undesired harmonics.

Advantages resulting from the aspects as described herein include the PLL and LO distribution being done at RF frequencies (not mm-wave frequencies), saving significant power. The FM-DAC also suppresses undesired harmonics, creating a cleaner spectrum compared to the aforementioned previous techniques. Local DLL provides a simple way to generate multiple phases (including quadrature), at LO sub-harmonic frequencies to be used in the FM-DAC.

Figure 1:
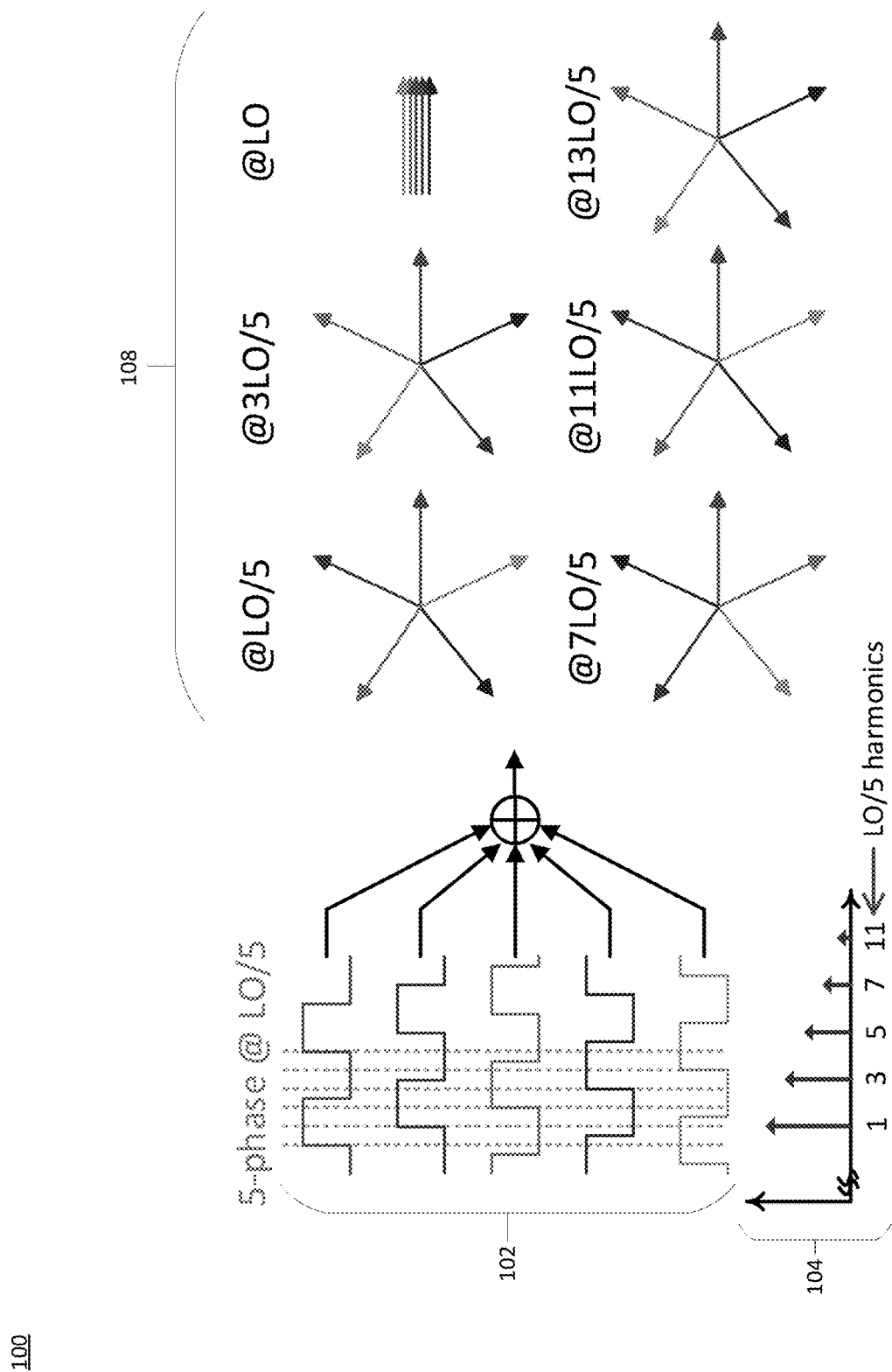
FIG. 1 illustrates an example of frequency multiplication using multiple sub-harmonic phases in accordance with an aspect of the disclosure.

FIG. 1 illustrates an exemplary of frequency multiplication using multiple sub-harmonic phases in accordance with an aspect of the disclosure. As shown in FIG. 1, frequency multiplication may be achieved using multiple sub-harmonic phases with coherent addition of desired harmonics, and the destructive combination at undesired harmonics. This technique works particularly well when the desired harmonic is odd. In the example shown in FIG. 1 and further described below, the desired harmonic is selected as the fifth harmonic, although the aspects described herein are not limited to a particular harmonic and may be implemented in accordance with any suitable sub-harmonic of the LO.

As shown in FIG. 1, 5-phase clocks 102 are illustrated at one-fifth of a desired LO frequency that is to be generated, which is represented as LO/5. The phase clocks 102 are equally spaced apart from one another in terms of their phase relationships by one-fifth of a full clock cycle, or $2\pi/5$ (i.e., 72 degrees). Combining the thus creates a cancellation at LO/5 and its odd harmonics (3LO/5, 7LO/5, etc.), except the LO harmonics (LO, 3LO, etc.), as shown in the spectral power distribution diagram 104 and the phase diagram 108. This concept can be generalized mathematically such that if a number (2N+1) of phase clocks are combined, each being equally spaced by $2\pi/(2N+1)$ at a frequency of LO/(2N+1), the LO signals will coherently add at the LO frequency (and harmonics of LO), and will cancel out at all other odd harmonics of LO/(2N+1). In this case, N represents any integer. In other frequency-multiplication techniques (e.g., injection-locking or self-mixing), the sub-harmonics are not cancelled fundamentally, creating spurs that may occur within one or more critical frequency bands of interest. The use of this phase-additive technique to generate a higher-frequency LO signal using a much lower frequency is therefore advantageous.

Figure 2:
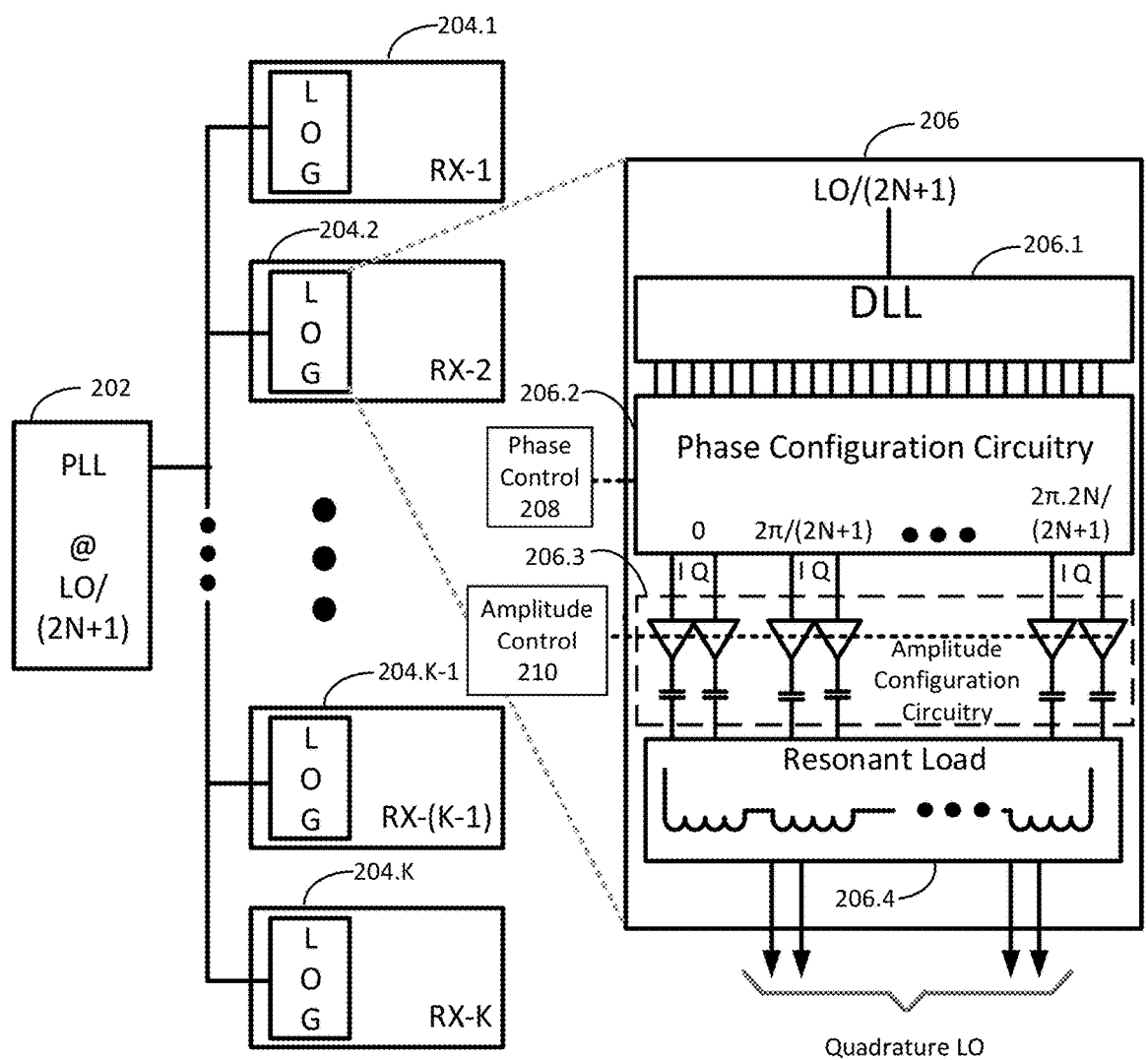
FIG. 2 illustrates a block diagram of an exemplary receiver design implementing local oscillator distribution and generation, in accordance with an aspect of the disclosure.

FIG. 2 illustrates a block diagram of an exemplary receiver design implementing local oscillator distribution and generation, in accordance with an aspect of the disclosure. As shown in FIG. 2 and further discussed herein, the receiver design 200 includes separate local oscillator generation (LOG) units 204.1-204.K including LOG circuitry, with each respective LOG unit including a frequency-multiplying digital-to-analog converter (FM-DAC) and delay-locked loop (DLL).

Figure 10:
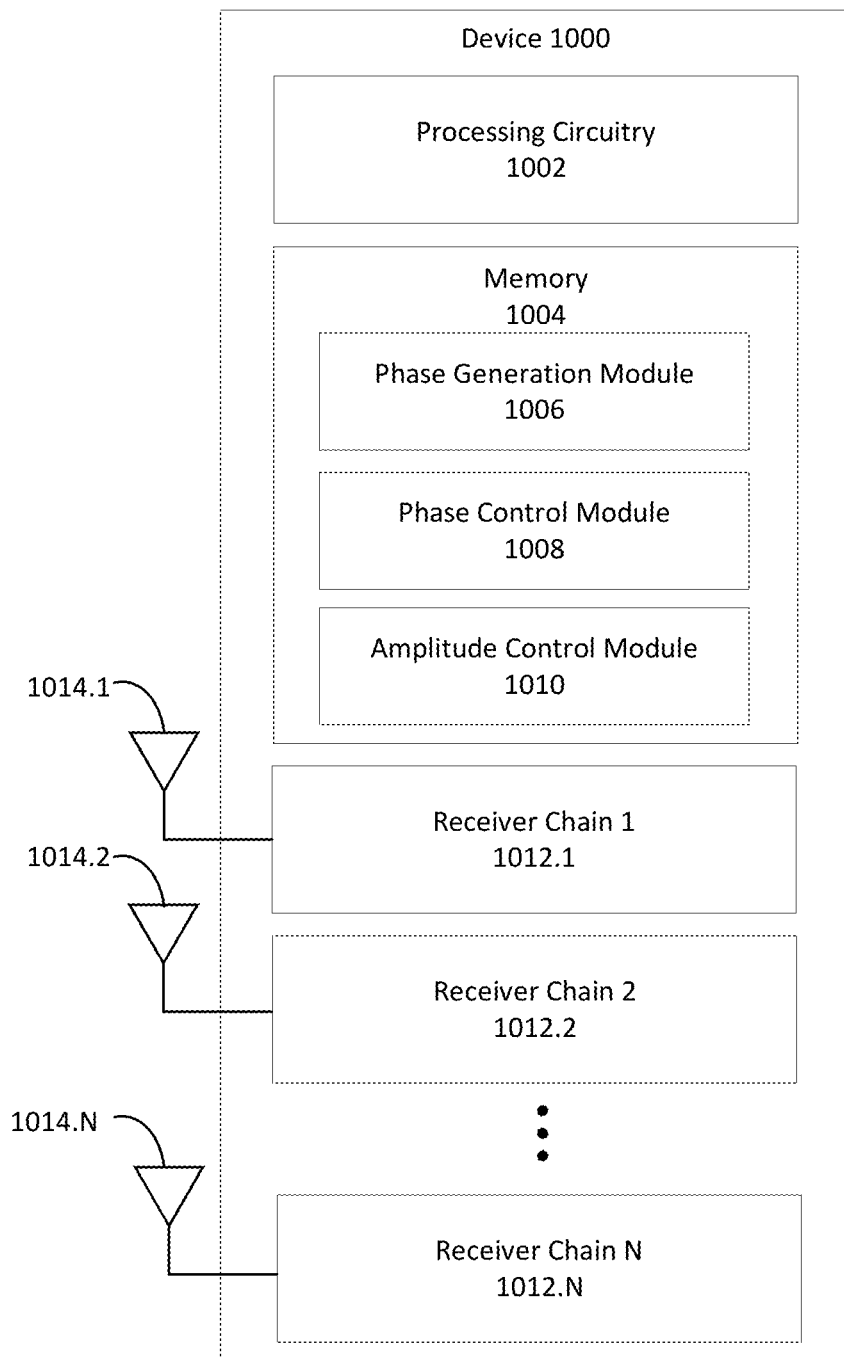
FIG. 10 illustrates a block diagram of an exemplary device, in accordance with an aspect of the disclosure.

As further discussed herein with reference to FIG. 10, aspects include the receiver design 200 being implemented as a portion of an overall receiver design that has several components omitted for brevity and ease of explanation. For example, the receiver design 200 allows a separate quadrature LO signal to be generated for each respective receiver chain RX-1-RX-K, which may then be utilized by each respective receiver chain for downconversion of received signals and subsequent signal processing. And, because each receive chain is provided with its own quadrature LO signal set, phase variations among the different receiver chains may be facilitated in this manner. Thus, the aspects described herein may be particularly useful for receivers that implement beamforming via multiple antennas, as each receiver chain may utilize its own dedicated set of quadrature LO signals with a phase tuned for that particular receiver chain and antenna.

Thus, aspects include each receiver chain using a respective set of quadrature LO signals for downconversion, demodulation, and signal processing. To do so, various aspects include each of the individual receiver chains RX-1-RX-K including additional components, circuitry, processors, antennas, etc., to ensure that received signals are received and the data contained therein processed accordingly. For example, these additional components may include mixers, demodulators, filters, amplifiers, processors, etc., with processing of received data being implemented, for example, via one or more processors (e.g., baseband processors) in combination with any other suitable components. For example, once the quadrature LO signals are generated, the quadrature LO signals may be used in accordance with any suitable techniques (e.g., known techniques) to process data contained within wirelessly received signals.

In an aspect, the receiver design 200 includes common phase-locked loop (PLL) circuitry 202 that generates a signal that is used as an input signal by each of the LOG units 204.1-204.K. This input signal may be generated at a sub-harmonic frequency of a desired, higher-frequency LO signal. In aspects, the higher-frequency LO signal may have a frequency associated with the mm-wave spectrum used for 5G wireless communications, such as the proposed 24 GHz-86 GHz spectrum, for example. However, aspects are not limited to this particular band, and the aspects described herein may be implemented in accordance with any frequency or range of frequencies suitable to a particular wireless communication application.

The common PLL circuitry 202 may be implemented using any suitable and/or known circuit components to generate the input signal. As shown in FIG. 2, the common phase-locked loop circuitry 202 generates the input signal at a sub-harmonic frequency of the higher-frequency LO signal represented by LO/(2N+1), with LO being the high-frequency target LO and N being any positive integer value based upon the desired frequency multiplication scaling used for a particular application. The input signal, which is generated at a sub-harmonic frequency of the higher-frequency LO signal, is then distributed to any suitable number K of the individual RX chains RX-1-RX-K via their respective LOG units 204.1-204.K.

Again, the input signal is generated at a lower frequency than the target LO signal by exploiting frequency multiplication (e.g., at RF frequencies versus mm-wave frequencies). As a result, the input signal may be distributed to each receiver chain RX-1-RX-K using power distribution systems that advantageously save power and require less design effort as compared to implementations used for higher frequency signals. This may be particularly advantageous, for example, when a receiver or transceiver design in which the receiver 200 is implemented uses "massively" distributed transceiver chains, with the number K being 10, 20, 100, etc. In an aspect, each receiver chain RX-1-RX-K implements respective LOG circuitry 204 to perform frequency multiplication and phase-shifting using the input signal, as shown in further detail for receiver chain 204.2 and further discussed below.

For example, a LOG unit 206 is shown in FIG. 2, which is associated with the receiver chain RX-2 and the LOG unit 204.2. Again, aspects include each of the receiver chains RX-1-RX-K implementing a separate LOG unit such as LOG unit 206, but only the details of operation of the LOG unit 206 are discussed herein for purposes of brevity. In an aspect, the LOG unit 206 includes a delay-locked loop (DLL) 206.1, optional phase configuration circuitry 206.2, optional amplitude configuration circuitry 206.3, and a resonant load 206.4. In an aspect, the LOG unit 206 may receive the input signal generated by the common PLL circuitry 202 and provide a set of quadrature LO signals as outputs. These quadrature LO clock signals may be, for example, differential LO quadrature outputs. Although the aspects are mainly described herein referencing the LO quadrature outputs as being differential in nature, the aspects are not so limited, and may include the generation of LO quadrature outputs having any relationship with respect to one another suitable for signal processing of received wireless signals.

In any event, aspects include the generated set of quadrature LO signals having a frequency at the target LO signal (e.g., a mm-wave frequency), with the quadrature LO signals being represented as an in-phase LO signal component at 0 degrees (I), an in-phase LO signal component at 180 degrees ($\bar{I}$), a quadrature LO signal component at 90 degrees (Q), and a quadrature LO signal component at 270 ($\bar{Q}$). In this way, the resonant load 206.4, in conjunction with one or more of the optional phase configuration circuitry 206.2 and the optional amplitude configuration circuitry 206.3, may form the FM-DAC.

Moreover, although the generated set of quadrature LO signals include the LO signal components with phases at 0, 90, 180, and 270 degrees with respect to one another, each of LOG units 204.1-204.K may generate its own set of quadrature LO signals that may be phase-shifted with respect to another set of quadrature LO signals. For example, LOG unit 204.1 may generate quadrature LO signals that are each 90 degrees apart from one another, but phase-shifted 5, 10, 15, degrees, etc., from the quadrature LO signals generated by the LOG unit 204.2. The details regarding how the quadrature LO signals are generated via each LOG unit 204.1-204.K are further discussed below.

Figure 3:
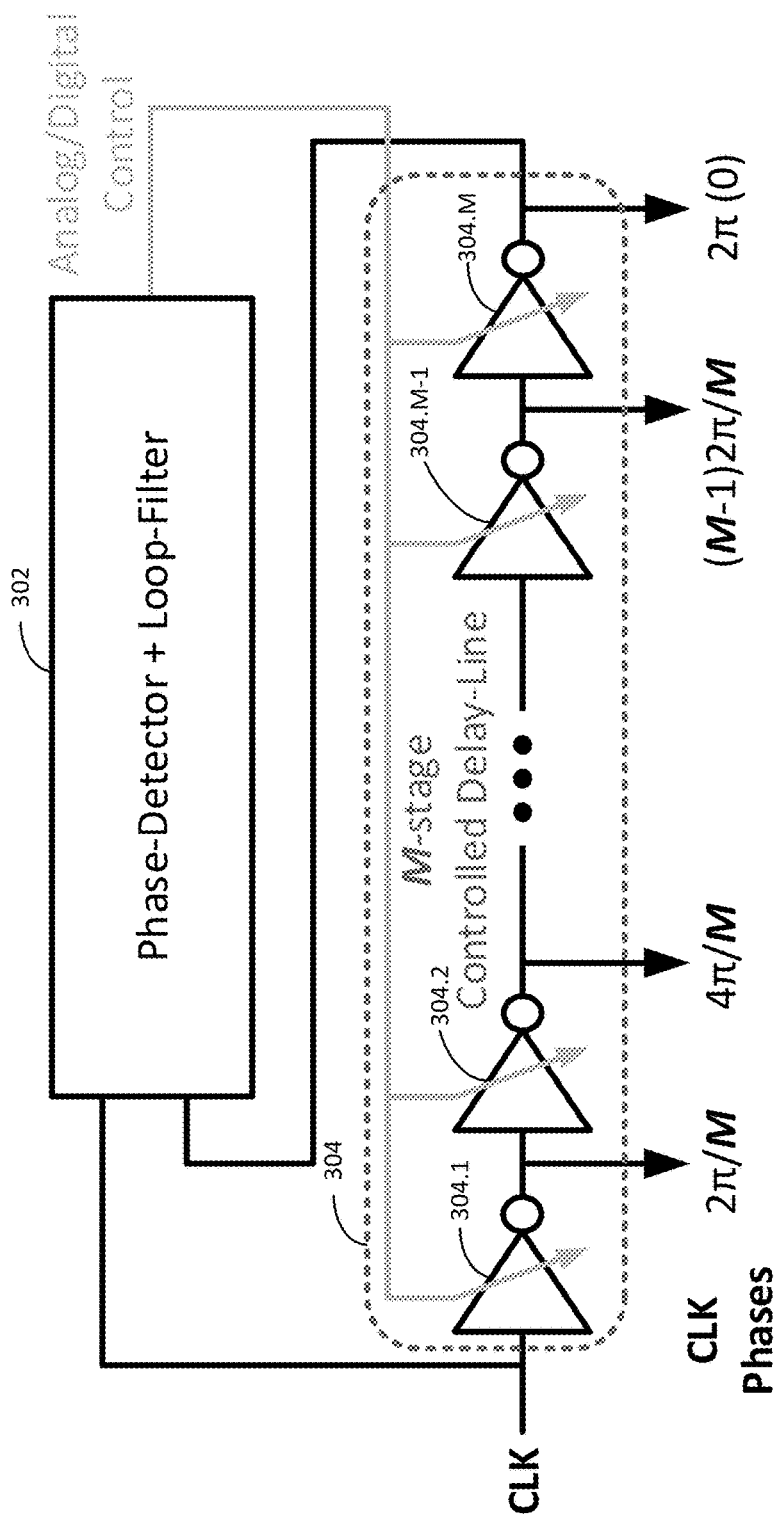
FIG. 3 illustrates a block diagram of an exemplary delay-locked loop (DLL) implementing a controlled delay-line, in accordance with an aspect of the disclosure.

In various aspects, the DLL 206.1 may be implemented using different architectures, each providing tradeoffs of increased design complexity in exchange for finer control over the phases used to generate the quadrature LO signals. In an aspect, the DLL 206.1 may be implemented as a multi-stage controlled delay-line, an example of which is illustrated in FIG. 3 as DLL 300. In an aspect, the DLL 300 may generate multi-phase input to the FM-DAC (e.g., the phase configuration circuitry 206.2, the amplitude configuration circuitry 206.3, and the resonant load 206.4). Further in accordance with such aspects, the DLL 300 may include a phase-detector and loop filter 302, which may be implemented, for example, as one or more processors configured to execute computer-readable instructions to control a state of one or more of M number of delay elements 304.1-304.M included in the M-stage controlled delay-line 304. Although the M-stage controlled delay-line 304 is illustrated in FIG. 3 as implementing inverters as delay elements 304.1-304.M, aspects include the M-stage controlled delay-line 304 being implemented with any suitable type and/or combination of delay elements 304.1-304.M, such as buffers, for example.

In an aspect, phase-detector and loop filter 302 may facilitate analog and/or digital control over the M-stage controlled delay-line 304, which may be tuned to ensure that the delay-line input and output are separated by one clock period. The clock signal may include, for instance, the distributed input signal generated by the common PLL circuitry 202, as discussed with reference to FIG. 2. Furthermore, the phase-detector and loop filter 302 may control the state of the delay elements implemented by the M-stage controlled delay-line 304 using any suitable techniques, such as via load control, current starving control, power supply control, etc.

In any event, aspects include the DLL 300 providing a set of phase-shifted signals to the phase configuration circuitry 206.2. These phase-shifted signals, as shown in FIG. 3, are separated by a phase that is a function of the number M of delay elements 304.1-304.M. Thus, the unit-phase granularity associated with an amount of phase-shift between the set of phase-shifted signals provided by the DLL 300 (i.e., the "CLK Phases") is increased with the number M of delay elements 304.1-304.M. However, the DLL 300 is limited in that the unit phase-shift ($2\pi/M$) equivalent time-delay, in some instances, may decrease beyond a unit inverter delay of an individual delay element. Therefore, to allow for a finer granularity of unit-phase shift, aspects include implementing alternate types of delay lines, as further discussed below with respect to FIGS. 4 and 5.

Figure 4:
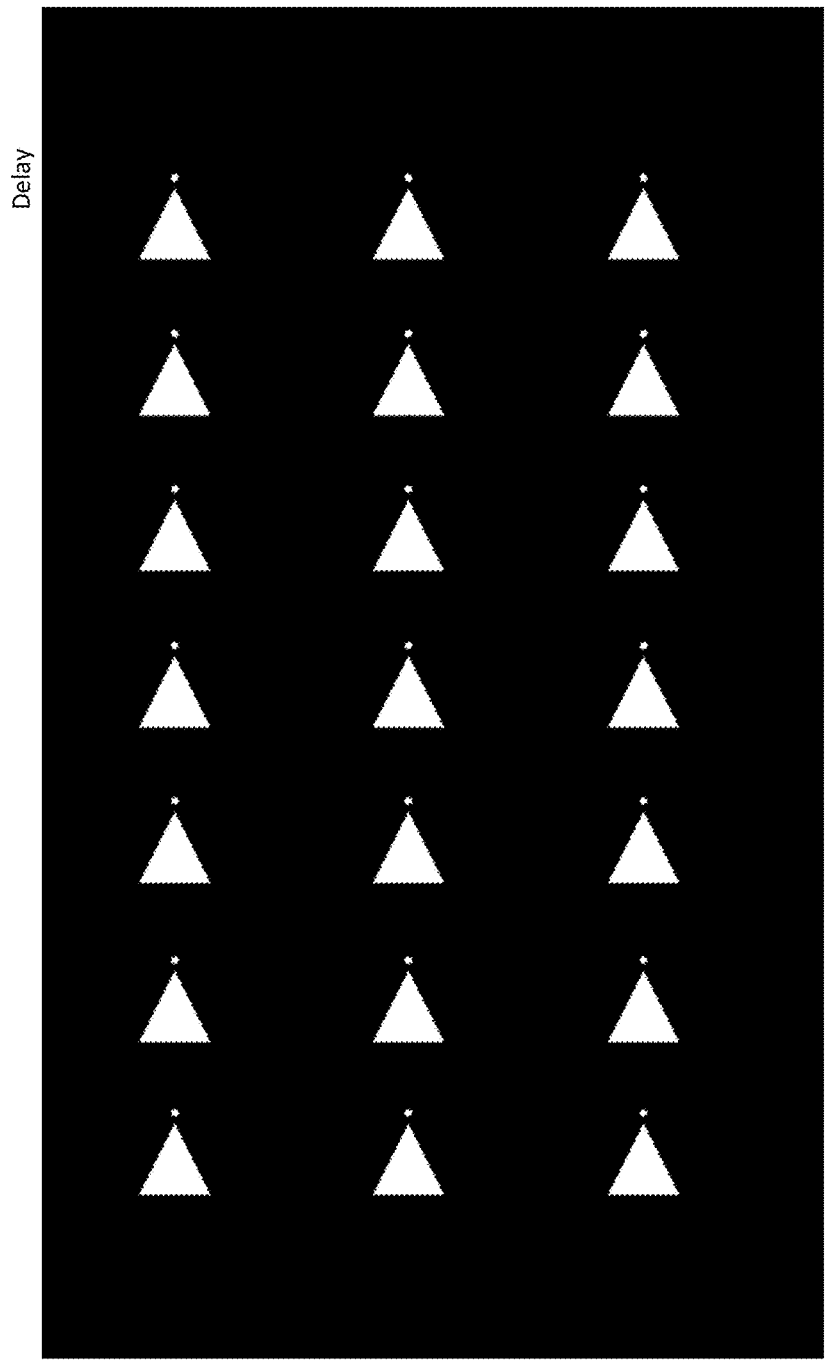
FIG. 4 illustrates a block diagram of an exemplary interpolating delay-line, in accordance with an aspect of the disclosure.

FIG. 4 illustrates a block diagram of an exemplary interpolating delay-line, in accordance with an aspect of the disclosure. In an aspect, the DLL 206.1 may be implemented utilizing the interpolating delay-line 400 as illustrated in FIG. 4. For example, the DLL 206.1 may be implemented as the DLL 300, as shown in FIG. 3 and discussed above. In other aspects, the M-stage controlled delay-line 304 may be substituted with other delay element configurations, such as the interpolating delay-line 400 as shown in FIG. 4. Thus, in accordance with such aspects, the DLL 206.1 may be implemented as a combination of the phase-detector and loop filter 302, as shown in FIG. 3, and the interpolating delay-line 400, as shown in FIG. 4.

Although the interpolating delay-line 400 includes delay elements represented as inverters in FIG. 4, aspects include the interpolating delay-line 400 implementing any suitable type of delay element. As shown in FIG. 4, a number M of delay elements may be associated with one clock cycle, with a number k representing an arbitrary element number between 1 and M. For example, the phase at the node labeled $(k+1)*(2\pi/M)$ may be associated with a delay element 404.k. By staggering the inputs between each of the rows as shown in FIG. 4, the set of phase-shifted signals provided by the DLL 400 may provide a unit phase-shift of $(k*2\pi/M)$, $(k+1)*(2\pi/M)$, $(k+2)*(2\pi/M)$, etc., which represents a greater level of phase granularity as compared to the DLL 300. In other words, the DLL 400 leverages interpolation between sets of delay elements to overcome the limitations imposed by the DLL 300, achieving a unit-phase shift that is less than that associated with the delay of an individual delay element.

For DLLs 300 and 400 as shown in FIGS. 3 and 4, respectively, each DLL represents a single DLL implemented as a specific configuration (e.g., non-interpolating DLL 300 versus interpolating DLL 400). In other aspects, as further discussed below, more than one DLL may be implemented to achieve even finer control over the unit-phase shift.

Figure 5:
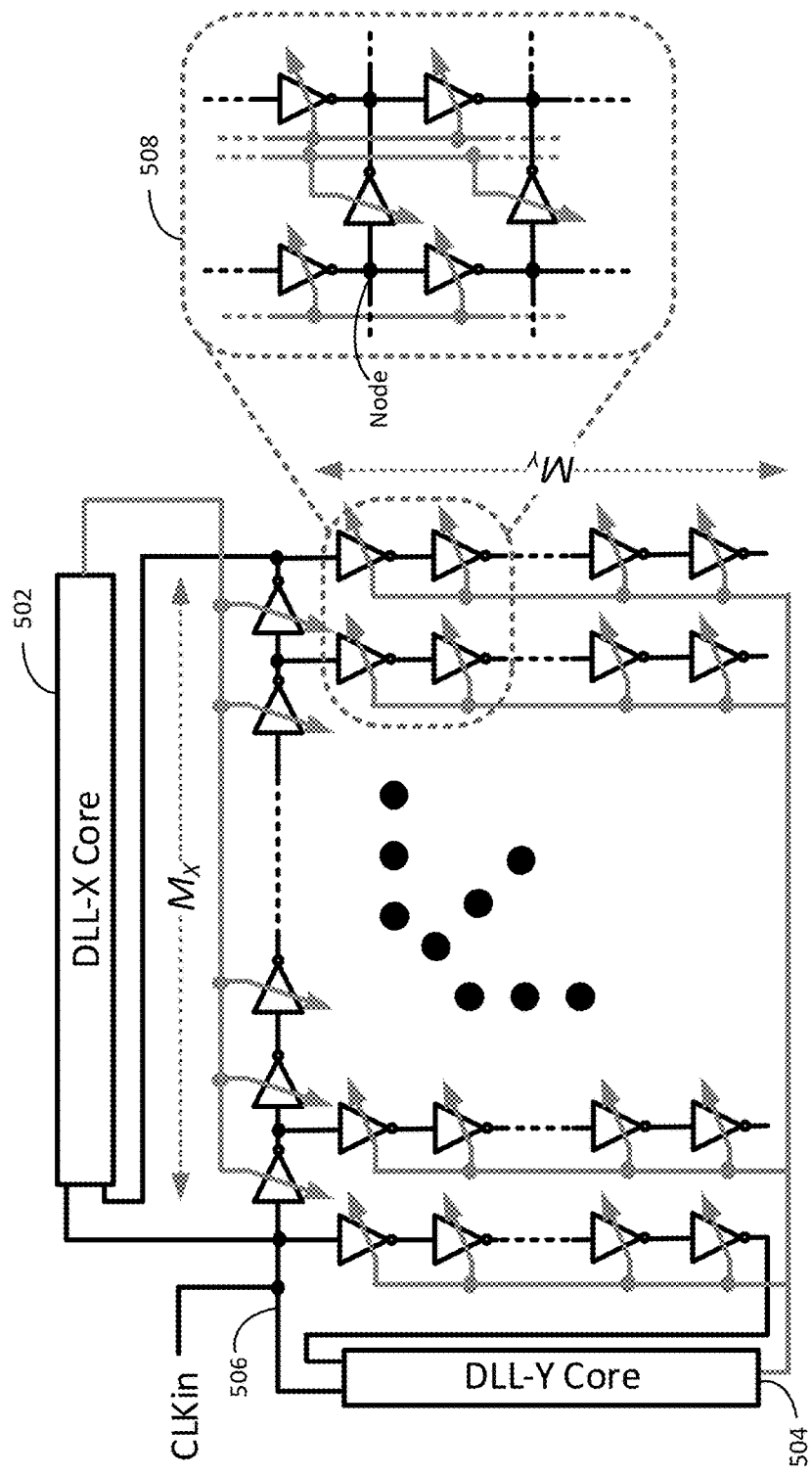
FIG. 5 illustrates a block diagram of an exemplary DLL implementing a two-dimensional delay-line, in accordance with an aspect of the disclosure.

FIG. 5 illustrates a block diagram of an exemplary DLL implementing a two-dimensional delay-line, in accordance with an aspect of the disclosure. In an aspect, the DLL 206.1 may be implemented as the two-dimensional delay-line 500 as illustrated in FIG. 5. The two-dimensional DLL 500 may implement two separate delay-line control systems DLL-X core 502 and DLL-Y core 504, each controlling a respective set of delay elements in a similar manner as DLLs 300 and 400. Also similar to the DLLs 300 and 400, the two-dimensional delay-line 500 may implement any suitable type of control over the delay elements (load control, current starving control, power supply control, etc.), which may be implemented as any suitable type of delay elements. Thus, like DLLs 300 and 400, the two-dimensional DLL 500 may receive, at input 506, the input signal generated by the common PLL circuitry 202, and output any suitable number of phase-shifted versions of the input signal. These phase-shifted input signals may then be utilized by the FM-DAC, as further discussed below, to ensure frequency multiplication of a subset of the phase-shifted input signals to generate the quadrature LO signals at a desired frequency and phase.

However, unlike DLLs 300 and 400, aspects include the two-dimensional DLL 500 including two orthogonal sets of M number of delay elements forming a two-dimensional matrix of delay elements having dimensions $M_x$-by-$M_y$. Aspects include the matrix having any suitable dimensions, and need not be symmetric. In this way, the delay element matrix may be configured, as shown in FIG. 5, with the DLL-X core 502 controlling the $M_x$ delay elements and the DLL-Y core controlling the $M_y$ delay elements. Moreover, the two-dimensional matrix of delay elements may be interleaved with one another, as illustrated in the detail portion 508, such that each node in the two-dimensional matrix is fed by two delay elements.

In an aspect, each of the delay elements are typically controlled by the DLL (−X or −Y) core output. However, the delay element chain at the "top" (i.e., the last inverter output is going back to the DLL-X core as an input), and the delay element on the "left" (i.e., the last inverter output is going back to DLL-Y core as an input) are "fully" controlled, i.e., their delay is controlled and bound by each respective DLL. Other than those chains, the other delay elements are partially controlled by the DLLs. Thus, aspects include exploiting the configuration of the two-dimensional DLL 500 to reduce delay variations in stages not fully controlled by DLLs. As an added advantage, the two-dimensional DLL 500 also allows for a more orderly "floor-planning," of the design, which may advantageously allow for an easier implementation than DLLs 300 or 400, in some aspects. An example $M_x$-by-$M_y$ matrix indicating the phases generated by the two-dimensional delay-line 500 is shown in FIG. 6 and further discussed below.

In various aspects, the appropriate phases for the FM-DAC may be generated by any suitable delay-line implementation, such as any of DLLs 300, 400, or 500, for example. In other words, a respective LOG unit 204 may output the appropriate phases via its respective DLL 206, which is utilized by the FM-DAC portion of the LOG unit 204 (e.g., the phase configuration circuitry 206.2, the amplitude configuration circuitry 206.3, and the resonant load 206.4) to provide the desired quadrature LO signals for each receiver chain.

In an aspect, and as further discussed below, two architectures may be implemented in accordance with the LOG units 204.1-204.K to generate the quadrature LO signals. For simplicity of explanation, a frequency multiplication factor of (2N+1), as well as an output phase resolution of 2π/P, is assumed for both cases. However, the aspects described herein are not limited in this regard, and may provide any suitable multiplication factor or output phase resolution depending on the particular application, the required specification, the type of DLL used, the number of delay elements, etc.

Furthermore, the phase and frequency of the LO signals may be generated in two different manners as discussed below with reference to the FM-DAC architecture in FIGS. 7 and 8, respectively. In particular, the LOG unit 700 controls the amplitude of phase signals generated by the DLL such that the combined signals yield quadrature LO signals at a desired frequency and phase. The LOG unit 800, on the other hand, controls which of the phases generated by the DLL are actually combined without having to adjust the amplitudes, the end result being the same as the LOG unit 700—providing quadrature LO signals at a desired frequency and phase.

Figure 7:
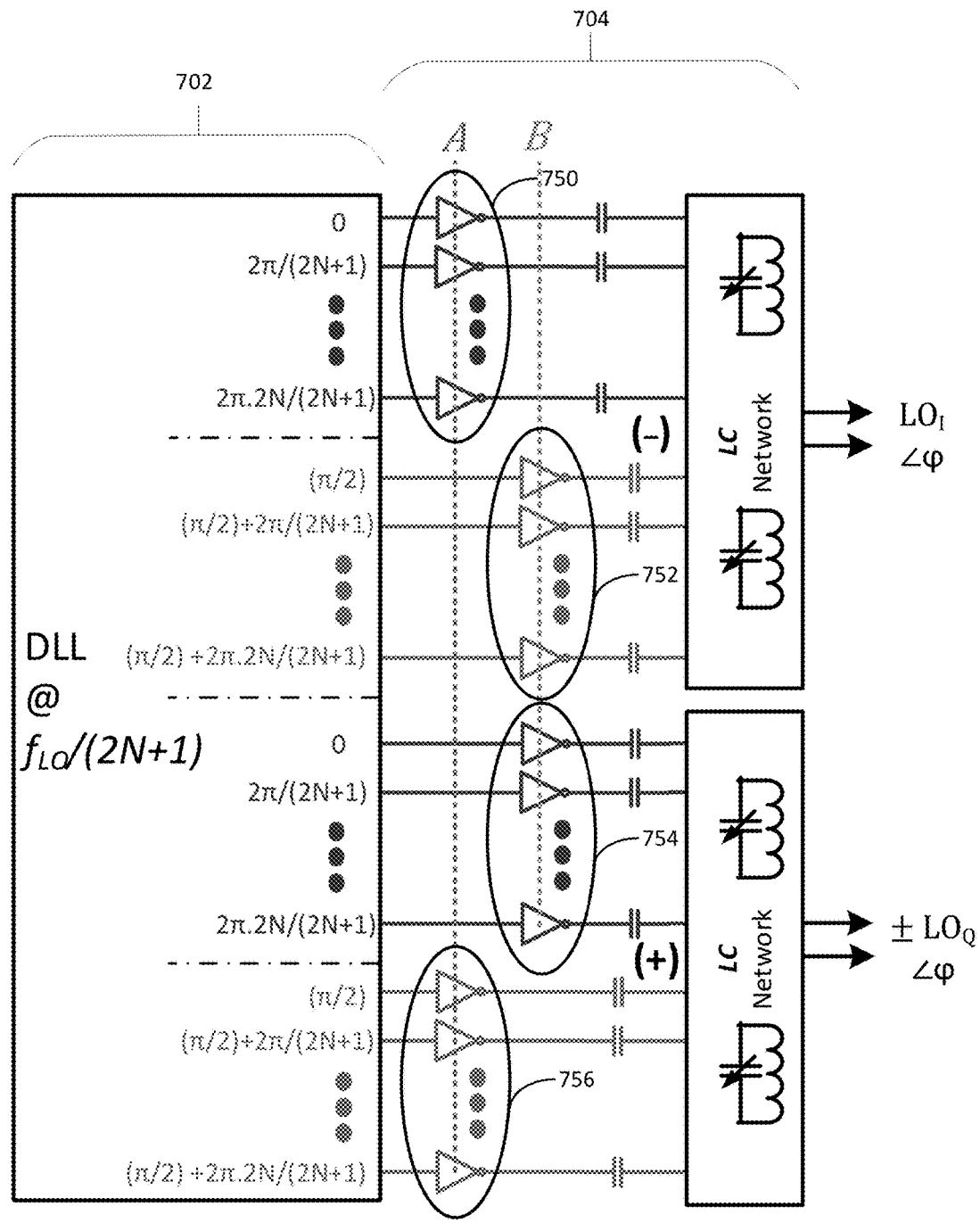
FIG. 7 illustrates a block diagram of an exemplary LOG unit architecture using quadrature phase-shifting with Cartesian combining (phase interpolation), in accordance with an aspect of the disclosure.

FIG. 7 illustrates a block diagram of an exemplary LOG unit architecture using quadrature phase-shifting with Cartesian combining (phase interpolation), in accordance with an aspect of the disclosure. As shown in FIG. 7, the LOG unit 700 generally includes two different portions—a DLL 702 and an FM-DAC 704. The DLL 702 may be identified with, for example, the DLL 206.1 as shown in FIG. 2, and thus be implemented as any suitable type of DLL (e.g., DLL 300, DLL 400, two-dimensional DLL 500), etc. Again, because the LOG unit 700 controls the phase of the generated LO signals via amplitude control block 210, which is further discussed below, such aspects do not require the use of the phase selection circuitry 206.2. Instead, the DLL 702 generates the phases needed to ensure frequency-multiplication by the FM-DAC 704. Thus, aspects include the DLL 702 generating these phase-shifted input signals having a phase difference between them in accordance with the implemented DLL architecture, which are then weighted via amplitude control block 210 such that the desired phases are obtained via interpolation in a weighted sum manner.

Therefore, the FM-DAC 704 may be identified with, for example, the amplitude configuration circuitry 206.3 and the resonant load 206.4, as shown in FIG. 2. In any event, aspects include the LOG unit 700 utilizing the appropriate phases provided by the DLL 702 to generate, for a particular input signal, a set of quadrature LO signals at a higher frequency and a desired phase by leveraging frequency-multiplication as the weighted signals are combined via the resonant load (e.g., the LC network). For instance, aspects include the DLL 702 generating a combination of phases based upon which combination of phase-shifted input signals that creates the largest spur free signal at a desired frequency. In this way, some of the phase-shifted signals phases are passed on to the FM-DAC 704 and other phase-shifted signals are not used.

In an aspect, the LOG unit 700 combines the weighted phase-shifted input signals generated by the DLL 702 in a specific manner to ensure that the signals add constructively at the desired frequency and thus provide a set of quadrature LO signals having a desired frequency and phase shift. For example, the FM-DAC 704 may generate, for the phase-shifted input signals that are weighted accordingly, a set of quadrature LO signal components, as discussed above, with an in-phase LO signal component at 0 degrees (I), an in-phase LO signal component at 180 degrees ($\bar{I}$), a quadrature LO signal component at 90 degrees (Q), and a quadrature LO signal component at 270 ($\bar{Q}$).

Although the sub-harmonic signal may be generated at various phases to ensure frequency multiplication, the overall phase shift between the in-phase LO signal component at 0 degrees (I) and the input signal $$\left(e.g., \frac{f_{LO}}{(2N+1)}\right)$$

are not impacted by the frequency multiplication alone. In other words, the input signal and the in-phase LO signal component at 0 degrees (I) output by the LOG unit 700 may, without further phase adjustments, track one another. However, it is desirable to obtain an additional phase shift that may be adjusted among each receiver chain (e.g., to time-align the LO-signal with the received signal for each antenna within a multi-antenna receiver or to facilitate beamforming).

Therefore, aspects include the LOG unit 700 implementing amplitude modulation control via the sets of phase-shifted signals output by the DLL 702. To do so, the FM-DAC 704 may implement sets of inverters, as shown in FIG. 7, for each signal phase provided by the DLL 702. Each inverter may further be coupled in series to a capacitor to couple each phase-shifted input signal to the LC network and to ensure frequency multiplication. The LC network may include any suitable number and type of reactive elements, which may be tunable and in any configuration, to ensure frequency multiplication for an appropriate frequency. Moreover, in aspects, the inverters and capacitors may be implemented using any suitable number and type of logic, and with any number of reactive elements (e.g., several capacitors in parallel with one another). Thus, each phase-shifted input signal generated by the DLL 702 may be amplitude modulated via control of the inverter-capacitor pair to which it is coupled, and the state of the inverter may be controlled to facilitate this amplitude modulation.

For example, although not shown in FIG. 7 for purpose of brevity, the 'A' and 'B' lines may represent the amplitude or weighting associated with each inverter output, which may be realized as digital code words coupled to one or more logical elements such that each inverter is separately placed into a switching mode or provides a fixed DC output. For example, each inverter shown in FIG. 7 may be replaced with an appropriate logical gate (e.g., a NAND gate), with one input being the phase-shifted signal output from the DLL 702, and the other being a digital control line driven to a desired voltage value. In any event, aspects include the amplitude of each individual inverter output, or the weighting of each phase-shifted input signal output by the DLL 702, being controlled in a digital manner (e.g., via a baseband processor or other suitable processor implemented by the receiver).

In aspects, the FM-DAC 704 provides, phase-shifted amplitude-weighted input signals 750, 752, 754, and 756, which are coupled to the LC network as shown in FIG. 7. The amplitude of the phase-shifted signals included in each of signals 750, 752, 754, and 756 allows frequency multiplication to occur via the LC network to generate a respective quadrature LO component having a particular frequency and phase. For instance, signals 750, 752, 754, and 756 may include respective sets of phase-shifted input signals weighted accordingly via amplitude control to generate, via coupling to the LC network, the in-phase LO signal component I, the in-phase LO signal component $\bar{I}$, the quadrature LO signal component Q, and the quadrature LO signal component $\bar{Q}$, respectively.

Aspects include the frequency multiplication factor for the LOG unit 700 being an odd number. This advantageously allows the quadrature relationship between clocks to be maintained when the multiplication factor is of type (4L+1), and is just reversed in case of a multiplication factor of (4L+3), with L being any integer. For the latter case, this does not present an issue as LO clocks are typically differential, and a simple swap of differential clocks fixes the reversal. By interpolating between the quadrature phases using the amplitude control path, i.e., Cartesian combining at the output via the LC network, any arbitrary phase can be generated.

Again, for the example shown in FIG. 7, the DLL 702 is configured to operate at (2N+1)th subharmonic of the LO. To provide an illustrative example, if the DLL 702 is implemented as a single DLL bank (e.g., DLL 300 or DLL 400), then the number of delay elements needed will be M=4*(2N+1). On the other hand, if the DLL 702 is implemented as a two-dimensional DLL (e.g., DLL 500), then $(M_x, M_y)=(4, (2N+1))$ or $((2N+1), 4)$.

Once the phase-shifted signals are combined to yield frequency multiplication, the Cartesian combining math can thus be expressed by the following Equations, which indicate the relationship between the designed LO signal phase shift φ and the amplitude weightings A and B as follows:

$$LO_I = A \cdot \cos(\omega_{LO}t) - B \cdot \sin(\omega_{LO}t) = \sqrt{A^2+B^2} \cdot \cos(\omega_{LO}t+\varphi) \quad \text{Eqn. 1:}$$

$$LO_Q = B \cdot \cos(\omega_{LO}t) - A \cdot \sin(\omega_{LO}t) = \sqrt{A^2+B^2} \cdot \sin(\omega_{LO}t+\varphi) \quad \text{Eqn. 2:}$$

Because of the nature of the equations, the output amplitudes of $LO_I$ and $LO_Q$ are the same, but depending on the odd multiplication factor type, there may or may not be a need to swap the $LO_Q$ outputs. Since the multiplication factor is decided during system design, this is a trivial task. The accuracy of phase generation thus depends on the digital amplitude input resolution to control the amplitudes A and B. Although the phase to amplitude control relationship is non-linear $$\left(\angle\varphi = \tan^{-1}\left(\frac{B}{A}\right)\right)$$

increasing the DAC resolution allows for arbitrarily small phase resolution to be achieved.

Figure 8:
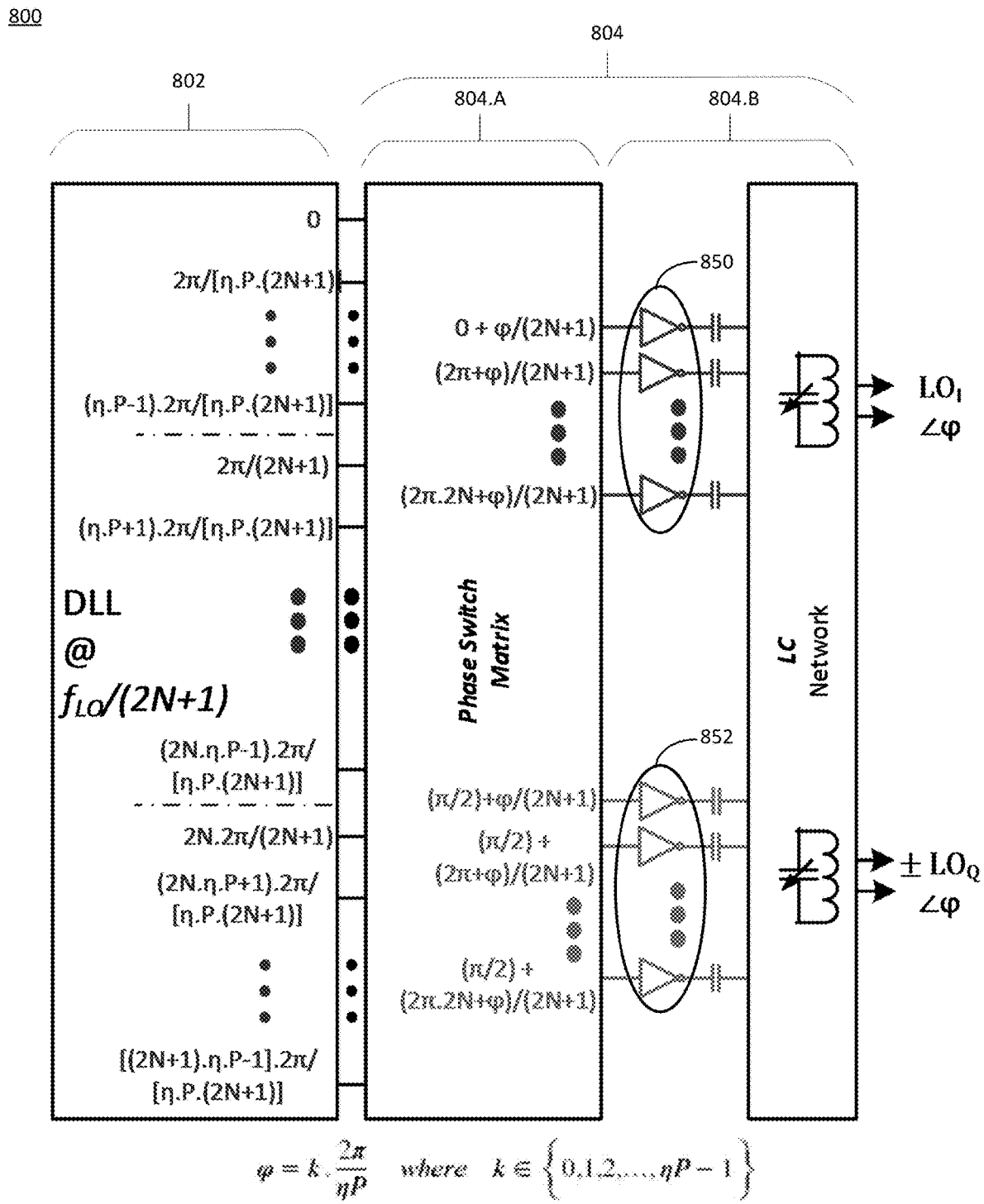
FIG. 8 illustrates a block diagram of an exemplary LOG unit architecture using direct quadrature generation and phase-shifting, in accordance with an aspect of the disclosure.

FIG. 8 illustrates a block diagram of an exemplary LOG unit architecture using direct quadrature generation and phase-shifting, in accordance with an aspect of the disclosure. As shown in FIG. 8, the LOG unit 800 generally includes two different portions—a DLL 802 and an FM-DAC 804, which includes FM-DAC portions 804.A and 804.B. The DLL 802 may be identified with, for example, the DLL 206.1 as shown in FIG. 2, and thus be implemented as any suitable type of DLL (e.g., DLL 300, DLL 400, two-dimensional DLL 500), etc. However, because the LOG unit 800 controls the phase of the generated LO signals via a selective combination of phase signals generated by the DLL, amplitude control is not needed. Instead, the FM-DAC 804 selects specific phase-shifted input signals from those generated by the DLL 802 and selectively switches and/or couples the specific phase-shifted input signals onto the resonant load (i.e., the LC network) to produce a set of quadrature LO signals at a desired frequency and phase.

Therefore, the FM-DAC 804 may be identified with, for example, the phase configuration circuitry 206.2 (phase switch matrix 804.A) and the resonant load 206.4 (portion 804.B), as shown in FIG. 2. In any event, aspects include the LOG unit 800 utilizing appropriate sets of phase-shifted input signals provided by the DLL 802 (via phase switch matrix 804.A) to generate, for a particular sub-harmonic LO signal, a set of quadrature LO signals at a higher frequency and a desired phase.

To do so, like the FM-DAC 704 associated with the LOG unit 700, the FM-DAC 804 may also implement sets of inverters and one or more reactive components (e.g., one or more capacitors), as shown in FIG. 8, to couple selected phase-shifted input signals between the DLL 802 and the LC network via the phase switch matrix 804.A. In other words, the DLL 802 generates a "superset" of phases needed to ensure frequency-multiplication by the FM-DAC 804. Thus, aspects include the DLL 802 generating phase-shifted input signals having a phase difference between them in accordance with the implemented DLL architecture for all desired beam angle scenarios. Then, by selectively coupling specific combinations of phase-shifted input signals from among the superset of phase-shifted input signals generated by the DLL 802 (i.e., a subset of the superset), the phase switch matrix 804.A selects the appropriate phase-shifted input signals 850 and 852 for frequency multiplication and beam steering, and couples these signals to the resonant load (portion 804.B). Thus, by discriminately selecting certain generated phase-shifted input signals 850 and 852, variations in the phases of the output quadrature LO signals may be realized.

In other words, the FM-DAC 804 selectively couples subset of phase-shifted input signals 850 and 852 of the superset of phase-shifted signals output by the DLL 802 to the LC network (portion 804.B), which may include any suitable number and type of reactive elements, and be tunable and in any configuration, to ensure frequency multiplication for an appropriate frequency. The specific combination of the subset of phase-shifted input signals 850 and 852 allows frequency multiplication to occur via the LC network to generate the in-phase LO signal component at 0 degrees (I), the in-phase LO signal component at 180 degrees ($\bar{I}$), the quadrature LO signal component at 90 degrees (Q), and the quadrature LO signal component at 270 ($\bar{Q}$).

In other words, the LOG unit 800 advantageously utilizes direct quadrature and phase generation in the DLL 802 to facilitate accurate phase control due to the inherent design. However, doing so causes the number of delay elements needed in the DLL 802 to increase proportionally with the phase resolution. Thus, to generate high frequency (e.g., mm-wave frequency) LO phases with a resolution of $2\pi/P$, aspects include generating phases having a resolution of $2\pi/P(2N+1)$ at the $(2N+1)$th-subharmonic (in this example).

Moreover, aspects include the LOG unit 800 generating quadrature differential phase clocks. Therefore, it is preferable that P is a factor of 4. In such a case, the quadrature differential clocks at the sub-harmonic frequency are automatically generated. A more general expression for the number of delay elements required for this implementation, which works for all integer values of P, is:

$$M = P \cdot (2N+1) \cdot \eta; \text{ where:} \qquad \text{Eqn. 3:}$$

$$\eta = 1 + 3 \cdot \text{mod}(P, 2) + (1 - \text{mod}(P, 2)) \cdot \text{mod}\frac{(P, 4)}{2}$$

The detailed phase generation mechanism is illustrated in FIG. 8 for a generic case of P, i.e., $$\varphi = k \cdot \frac{2\pi}{\eta P},$$

where $k \in \{0, 1, 2, \ldots \eta P-1\}$. In aspects, the DLL 802 generates the phases in steps of $2\pi/[\eta \cdot P \cdot (2N+1)]$. For DLL implementations using a single DLL (e.g., DLLs 300 and 400), the number of delay elements may be established as $M=\eta \cdot P \cdot (2N+1)$. However, in aspects in which a two-dimensional DLL is utilized (e.g., DLL 500), additional calculations are provided below for additional clarity.

In particular, for a two-dimensional DLL having a size of delay elements defined as $(M_x, M_y)$, it is assumed that the delay elements are defined as:

$$M_x \cdot M_y = M = \eta \cdot P \cdot (2N+1) \qquad \text{Eqn. 4:}$$

From Eqn. 4, all the unique M-phases are generated, if and only if $M_x$ and $M_y$ are co-prime. If this condition is not satisfied, then the two-dimensional matrix 600, as shown in FIG. 6, will have duplicate entries, meaning that some required phases will not be generated. FIGS. 9A-9C, which illustrate three different cases for the phase matrix.

The case shown in FIG. 9A is for a first case of $(2N+1)=5$ and $\eta \cdot P = 12$, so $M_x$ and $M_y$ are chosen as 12 and 5, respectively; $M_x$ and $M_y$ are co-prime.

The case shown in FIG. 9B is for a second case of $(2N+1)=3$ and $\eta \cdot P = 12$; $M_x$ and $M_y$ are chosen as 12 and 3, respectively; $M_x$ and $M_y$ are not co-prime.

The case shown in FIG. 9C is for a third case of $(2N+1)=3$ and $\eta \cdot P = 12$ (same as case (b)); $M_x$ and $M_y$ are chosen as 9 and 4, respectively; $M_x$ and $M_y$ are co-prime.

For cases represented by FIGS. 9A and 9C, it is shown that all the respective 60 and 36 unique phases are generated in the matrix. However, for case represented in FIG. 9B, there are many duplicated phases and, consequently, many other missing phases as compared to the case in FIG. 9C for example. This demonstrates that aspects include the DLL 802, if implemented as a two-dimensional DLL, generating the requisite phases when $M_x$ and $M_y$ are co-prime.

FIG. 10 illustrates a block diagram of an exemplary device in accordance with an aspect of the disclosure. In various aspects, device 1000 may be implemented as any suitable type of device configured to transmit and/or receive wireless signals in accordance with any suitable number and/or type of communication protocols. For instance, the device 1000 may be implemented as a user equipment (UE) such as a mobile phone, tablet, laptop computer, etc. To provide additional examples, the device 1000 may be implemented as an access point or base station. The device 1000 may implement one or more aspects as described herein to facilitate receiving wireless signals in accordance with frequency or band of frequencies, such as mm-wave frequencies, for example, as further described below.

In an aspect, the device 1000 may include processor circuitry 1002, a memory 1004, and any suitable number N of receiver chains 1012.1-1012.N, each being coupled to one or more respective antennas 1014-1-1014.N. The components shown in FIG. 10 are provided for ease of explanation, and aspects include device 1000 including additional, less, or alternative components as those shown in FIG. 10. For example, device 1000 may include one or more power sources, display interfaces, peripheral devices, ports, etc. To provide additional examples, the device 1000 may further include one or more transmitters, or the receiver chains 1012.1-1012.N may alternatively be implemented as transceivers capable of receiving and transmitting wireless signals via antennas 1014.1-1014.N.

In an aspect, the various components of device 1000 may be identified with functionality further described herein with reference to the generation of quadrature LO signals using a common input signal at a sub-harmonic of the LO frequency. For example, the wireless device 1000 may be configured to receive wireless signals via one or more of the antennas 1014.1-1014.N at mm-wave or other suitable frequencies, and to demodulate and process data contained in the wirelessly received signals via receiver chains 1012.1-1012.N. The receiver chains 1012.1-1012.N may be identified with a respective one of the receiver chains as shown, for example, in FIG. 2 (RX-1-RX-K), and each include a respective LOG unit as shown in FIG. 2 (204.1-204.K). Thus, the receiver chains 1012.1-1012.N may include additional components (mixers, demodulators, filters, amplifiers, etc.) to generate quadrature LO signals from a common PLL operating at a sub-harmonic LO frequency, as discussed herein.

To do so, processor circuitry 1002 may be configured as any suitable number and/or type of computer processors, which may facilitate control of the device 1000 as discussed herein. In some aspects, processor circuitry 1002 may be identified with a baseband processor (or suitable portions thereof) implemented by the device 1000. In other aspects, the processor circuitry 1002 may be identified with one or more processors implemented by the device 1000 that are separate from the baseband processor. In any event, aspects include the processor circuitry 1002 being configured to carry out instructions to perform arithmetical, logical, and/or input/output (I/O) operations, and/or to control the operation of one or more components of the device 1000. For example, the processor circuitry 1002 can include one or more microprocessors, memory registers, buffers, clocks, etc. Moreover, aspects include processor circuitry 1002 communicating with and/or controlling functions associated with the memory 1004 and/or the receiver chains 1012.1-1012.N. This may include, for example, controlling and/or arbitrating transmit and/or receive functions of the device 1000, performing one or more baseband processing functions (e.g., media access control (MAC), encoding/decoding, modulation/demodulation, data symbol mapping, error correction, etc.).

In an aspect, the memory 1004 stores data and/or instructions such that, when the instructions are executed by the processor circuitry 1002, the processor circuitry 1002 performs the various functions described herein. The memory 1004 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1004 can be non-removable, removable, or a combination of both.

For example, the memory 1004 may be implemented as a non-transitory computer readable medium storing one or more executable instructions such as, for example, logic, algorithms, code, etc. As further discussed below, the instructions, logic, code, etc., stored in the memory 1004 are represented by the various modules as shown in FIG. 10, which may enable the aspects disclosed herein to be functionally realized. The modules shown in FIG. 10 are provided for ease of explanation regarding the functional association between hardware and software components. Thus, aspects include the processor circuitry 1002 executing the instructions stored in these respective modules in conjunction with one or more hardware components to perform the various functions associated with the aspects as further discussed herein.

In an aspect, the executable instructions stored in phase generation module 1006 may facilitate, in conjunction with the processor circuitry 1002, the generation of phases via any suitable type of DLL (e.g., DLLs 300, 400, 500, etc.). For example, the executable instructions stored in phase generation module 1006 may provide the functionality associated with the phase-detector and loop filter 302, as shown in FIG. 3, to manage control of the M-stage controlled delay line 304 for the DLL 300 or DLL 400, depending upon the particular implementation used by the device 1000. To provide another example, the executable instructions stored in phase generation module 1006 may provide the functionality associated with each of the DLL-X core 502 and the DLL Y-core 504, as shown in FIG. 5, to control the phases generated by the two-dimensional DLL 500.

In an aspect, the executable instructions stored in phase control module 1008 may facilitate, in conjunction with the processor circuitry 1002, the selection of phases generated by the DLL implemented by the device 1000. For example, the executable instructions stored in phase control module 1008 may provide the functionality associated with the phase control block 208, as shown in FIG. 2. Thus, phase control module 1008 enables the selection of a subset of phase-shifted input signals generated by the implemented DLL to ensure that frequency multiplication occurs and that the quadrature LO signals are generated at the appropriate phases for each of receiver chains 1012.1-1012.N. For example, the phase control module 1008 may be utilized for an FM-DAC architecture using direct quadrature generation and phase-shifting, as shown in FIG. 8 and discussed with respect to LOG unit 800. Thus, the phase control module 1008 may not be required for quadrature phase-shifting with Cartesian combining, as shown in FIG. 7 and discussed with respect to LOG unit 700.

When implemented, phase control module 1008 may include instructions regarding how certain frequencies and phases are generated from sub-harmonic frequency phase combinations. For example, executable instructions stored in phase control module 1008 may include a lookup table and/or instructions regarding calculations to be performed to determine a specific set of phases that will produce a desired set of quadrature LO signals at a target frequency and optional phase shift (e.g., as discussed with regards to the LOG unit 800 and the use of Eqns. 3 and 4). These instructions, therefore, allow each respective receiver chain 1012.1-1012.N to select subsets of DLL-generated phases to produce the desired LO signal components I, $\bar{I}$, Q, and $\bar{Q}$ for FM-DAC architectures using direct quadrature generation and phase-shifting.

In an aspect, the executable instructions stored in amplitude control module 1010 may likewise facilitate, in conjunction with the processor circuitry 1002, the selection of phases generated by the DLL implemented by the device 1000. For example, the executable instructions stored in amplitude control module 1010 may provide the functionality associated with the amplitude control block 210, as shown in FIG. 2. Thus, amplitude control module 1010 enables the selection of a subset of phases generated by the implemented DLL by controlling the amplitude of each phase-shifted input signal, as discussed with respect to the LOG unit 700 as shown in FIG. 7. For example, the amplitude control module 1010 may be utilized for an FM-DAC architecture using quadrature phase-shifting with Cartesian combining, as shown in FIG. 7 and discussed with respect to LOG unit 700. Thus, the amplitude control module 1010 may not be required for an FM-DAC architecture using direct quadrature generation and phase-shifting, as shown in FIG. 8 and discussed with respect to LOG unit 800.

When implemented, amplitude control module 1010 may include instructions regarding how certain frequencies and phases are generated from sub-harmonic frequency phase combinations. For example, executable instructions stored in amplitude control module 1010 may include a lookup table and/or instructions regarding calculations to be performed to determine a specific set of amplitude and phase combinations that will produce a desired set of quadrature LO signals at a target frequency and optional phase shift (e.g., as discussed with regards to the LOG unit 700 and the use of Eqns. 1 and 2). These instructions, therefore, allow each respective receiver chain 1012.1-1012.N to select subsets of DLL-generated phase-shifted input signals to produce the desired LO signal components I, $\bar{I}$, Q, and $\bar{Q}$ for FM-DAC architectures using quadrature phase-shifting with Cartesian combining.

Section II—Polar Transmitter Frequency Multiplying RFDAC for Phased Arrays

Aspects described within this section generally relate to transmitters and, more particularly, to transmitter designs implementing phased arrays at mm-wave frequencies.

Developments in 5G wireless technology have driven transceiver designs using mm-wave frequencies, which may correspond to frequencies in the proposed 24 GHz-86 GHz spectrum, for example. Such designs typically implement multiple antennas to achieve phased arrays and beamforming patterns to adapt to channel conditions. Currently, implementing mm-wave signals in phased array designs requires a large die area and power consumption associated with up-conversion mixers, mm-wave local oscillator (LO) generation and distribution, splitters, passive phase shifters, mm-wave transmission over cable, and the amplifiers required to compensate for the loss of all these components.

Moreover, in current solutions, digital pre-distortion, which is typically introduced into the baseband signal to compensate for non-idealities and/or imbalances, needs to be applied uniformly to all transmit chains in the phased array, as the mm-wave signal originates from one source. Thus, any mismatch in transmit chains implemented in the phased array will adversely impact pre-distortion performance, resulting in lower error vector magnitude (EVM) or efficiency. As a result, current designs to generate and distribute mm-wave signals for transmitters implementing phased arrays and/or multiple transmitter chains are complex, require large amounts of power to operate, and are expensive and inefficient.

Again, mm-wave transceiver designs may implement phased arrays to facilitate beamforming to adapt to channel conditions. Current designs have been directed to either digital or analog beamforming in accordance with such systems. Analog beamforming solutions typically include a high bandwidth digital-to-analog converter (DAC) driving an image suppression baseband filter, which is followed by mixing with a mm-wave frequency LO. The output of the mixer is then amplified and coupled to a front end via a cable, where additional amplification is needed to compensate for cable losses. In some of such typical beamforming solutions, the amplified output may also be distributed to a diplexer to accommodate multiple streams. Splitters may then create multiple versions of the signal to be distributed via parallel RF chains in the phased array. Each of these RF chains, however, uses an independent phase shifter, requiring additional amplification in each RF chain to overcome the loss of the splitters and phase shifter.

Thus, conventional analog beamforming techniques require a large number of components, and RF distribution components such as cabling, splitters, diplexers, etc., require the use of additional amplifiers to compensate for their losses. The use of these amplifiers, in turn, consumes additional power and takes up significant die area. Additionally, conventional analog beamforming solutions require an extra transceiver chip, and pre-distortion cannot be applied independently per RF chain, leading to lower transmitter power efficiency. The passive phase shifters also exhibit amplitude variations with phase shift, necessitating gain compensation with additional components to avoid performance degradation.

Digital beamforming solutions avoid the need to distribute mm-wave frequency signals over cable, and instead utilize high bandwidth digital signals. Digital beamforming designs also avoid the use of splitters. However, such designs still requires a DAC, filter, mixer, and mm-wave LO for each RF chain, which incurs an area and power penalty. Thus, digital beamforming solutions require additional DACs, consume more power in the LO distribution stages, and use digital links requiring a relatively high data rate (~50-1100 Gbps).

Therefore, to address the issues present in current analog and digital beamforming solutions for mm-wave designs, the aspects herein include the use of an entire mm-wave phased array transmitter within a single "block," which is referred to herein as a frequency multiplying radio-frequency digital-to-analog converter (FM-RFDAC). As further discussed below, the FM-RFDAC implements capacitor ratios to set an amplitude or weight of a signal, but the signals distributed to each FM-RFDAC are a sub-multiple (e.g., sub-harmonic, one-quarter, one-eighth, etc.) of the mm-wave output due to the frequency multiplication. As further discussed below, low-frequency phase-shifted signals are combined, which add constructively to generate a higher-frequency signal (e.g., a mm-wave frequency signal) while preserving the signal modulation that was added to the signal at a lower-frequency.

Compared to existing solutions, the aspects described herein require less die area and consume less power, as mm-wave signal generation is done in a single block or stage, and the LO generation and distribution is performed at a lower, sub-multiple frequency of the output mm-wave frequency. Moreover, the aspects allow realization of pre-distortion on an individual transmit chain basis, providing improved power amplifier (PA) linearization. This, in turn, allows for lower power consumption or, alternatively, higher transmitted output power. Moreover, as each transmit chain may be pre-distorted independently, aspects enable the PA to operate deeper in compression, and therefore at a higher efficiency, than existing designs. Furthermore, because the aspects described herein allow for amplitude and phase adjustments to be made with high granularity at mm-wave frequencies, fine control over beams generated via a coupled phased antenna array may be achieved.

Figure 11:
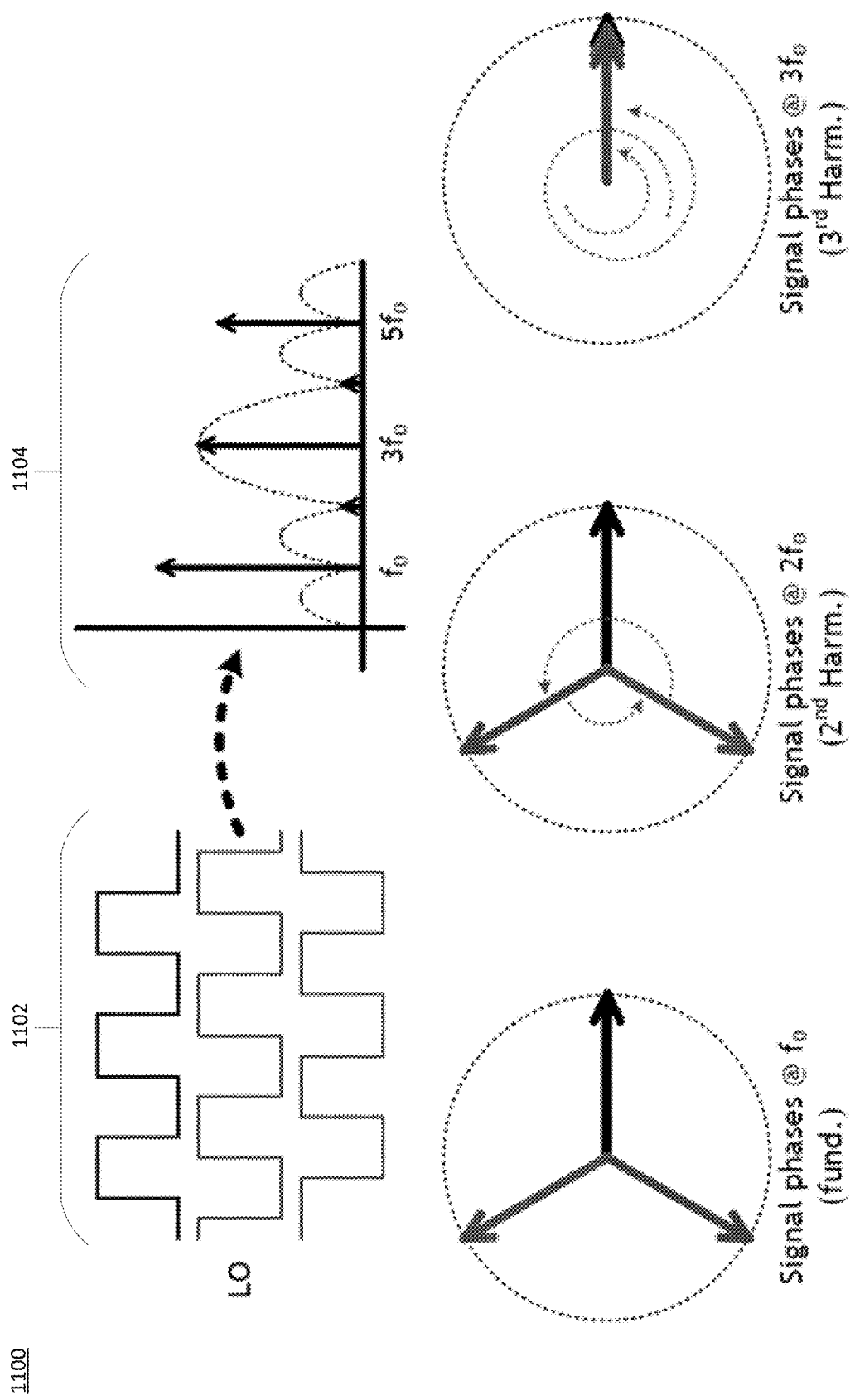
FIG. 11 illustrates an example of signal phase combinations at a fundamental frequency, a second harmonic, and a third harmonic, in accordance with an aspect of the disclosure.

FIG. 11 illustrates an example of signal phase combinations at a fundamental frequency, a second harmonic, and a third harmonic, in accordance with an aspect of the disclosure. The output of a non-linear block, such as a digital inverter, for example, generates odd harmonics of the fundamental frequency of the input signal. Therefore, if the signal is then phase shifted and summed, it is possible for the phase-shifted signals to constructively add at some frequencies and destructively interfere at others. The example in FIG. 1 shows 3 clock signals 1102 phase-shifted in an equal phase distribution (120 degrees apart). The clock signals 1102 are associated with a fundamental frequency $f_0$, with harmonics as shown in the spectral diagram 1104. The phase-shifted clock signals 1102 sum to nothing at the fundamental frequency and the second harmonic frequency. However, at the 3rd harmonic frequency, the phase is "wrapped" around 3 times, causing the phase-shifted signals 1102 to sum constructively to generate an output signal that is 3 times the magnitude of one of the input signals 1102 at the fundamental frequency. This concept allows for frequency multiplication of an input signal, as further discussed below.

As further discussed herein, aspects exploit the aforementioned frequency-multiplication concept by leveraging inverter-based frequency multipliers in conjunction with amplitude modulation using capacitive voltage division to enabling some inverters in a switching mode and others at a fixed DC per each input phase. A matching network (e.g., a resonant LC load) resonates with the capacitors to enhance the multiplied frequency while attenuating other harmonics, including the input fundamental. Because the strength of each input phase may be digitally controlled, a wide range of different frequency multiplication ratios may be programmed.

Figure 12:
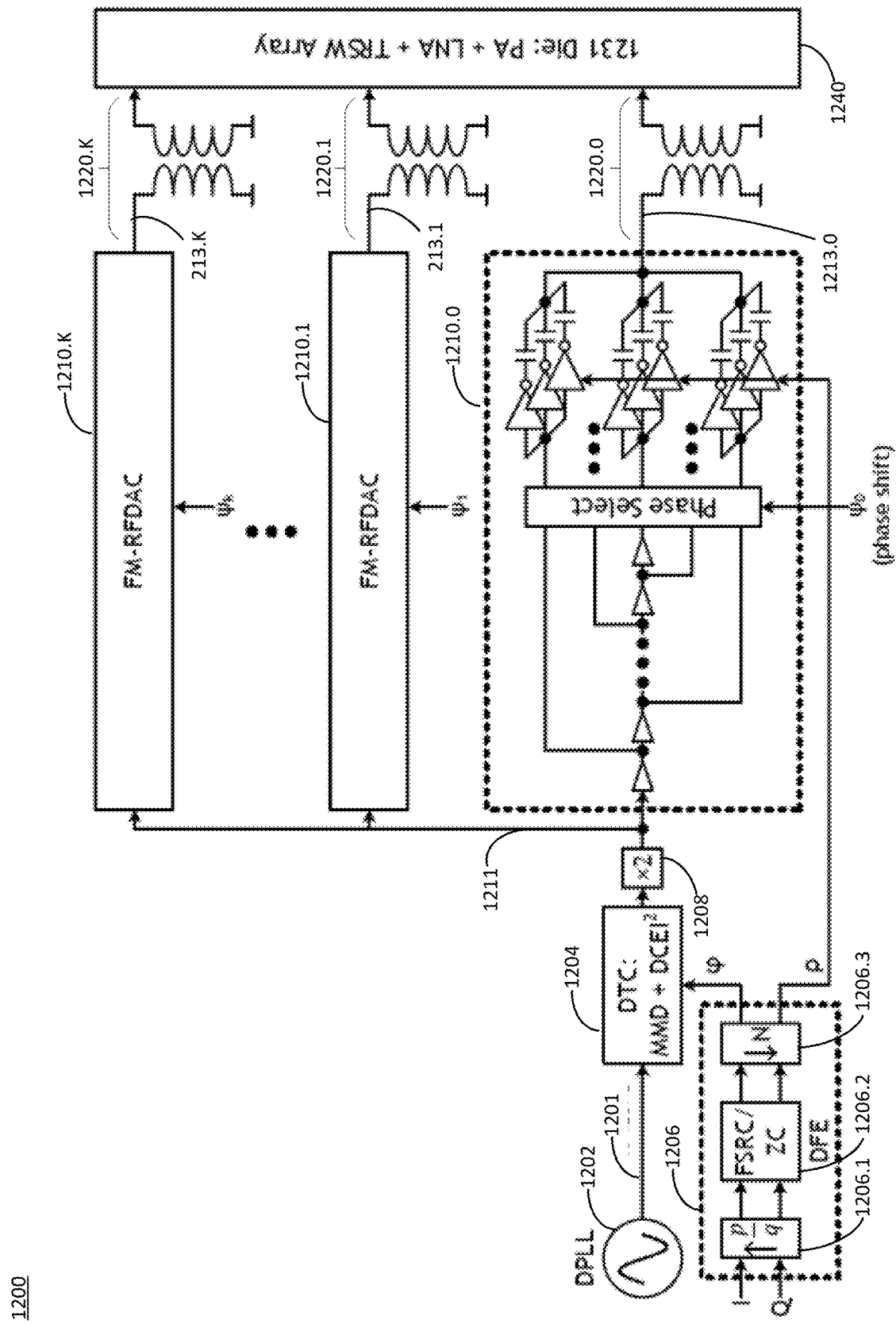
FIG. 12 illustrates a block diagram of an exemplary polar transmitter design implementing FM-RFDACs, in accordance with an aspect of the disclosure.

FIG. 12 illustrates a block diagram of an exemplary polar transmitter design implementing FM-RFDACs, in accordance with an aspect of the disclosure. As further discussed herein with reference to FIG. 15, aspects include the transmitter design 1200 being implemented as a portion of an overall transmitter design that has several components omitted for brevity and ease of explanation. For example, the transmitter design 1200 allows a separate phase and amplitude modulated signal to be generated for each respective transmitter chain via the FM-RFDACs 1210.0-1210.K. Thus, the aspects described herein may be particularly useful for receivers that implement beamforming via multiple antennas, as each transmit chain may couple its own signal that is amplitude-weighted and phase-tuned for a particular antenna element (or group of antenna elements) within a phased array.

As shown in FIG. 12 and further discussed herein, the transmitter design 1200 includes any suitable number K of FM-RFDACs 1210.1-1210.K, each being associated with a respective transmit chain. As further discussed below, aspects include each FM-RFDAC 1210.0-1210.K forming part of an individual transmit chain that receives amplitude-modulated and phase-modulated data, and in turn provides, at each respective FM-RFDAC output, a frequency-multiplied output signal. Each transmit chain, which includes an FM-RFDAC 1210.0-1210.K, thus forms the individual signal paths for each antenna(s) in the phased array. The signal output by each FM-RFDAC 1210.0-1210.K may have a specific frequency, amplitude, and phase shift with respect other FM-RFDACs 1210.0-1210.K. As a result, when the signals generated by each individual FM-RFDAC 1210.0-1210.K are coupled to antenna(s) via a respective resonant matching network 1220.0-1220.K, the signals have independently-weighted amplitude and phase-shifted values with respect to one another. This independent control of each transmit chain may therefore be utilized to generate desired beamforming patterns when applied to individual antenna elements within a phased antenna array.

In an aspect, each FM-RFDACs 1210.0-1210.K may replace other components traditionally implemented in beamforming transmitter designs having multiple transmit chains to work in conjunction with phased array antenna elements. Specifically, aspects include each of the RFDACs 1210.0-1210.K being used in place of DACs, filters, mixers, RF splitters, and phase shifters that are typically implemented in traditional transmitter architectures. As noted above, to compensate for losses from the splitters, phase shifters, and RF signaling over cables, multiple amplification stages are also used in traditional architectures, which are advantageously no longer needed in the present aspects.

Moreover, in contrast to typical mm-wave transmitter architectures that distribute a common high frequency mm-wave signal to multiple transmit chains, the present aspects instead distribute a lower-frequency input signal 1211 that is a sub-multiple of a desired higher-frequency (e.g., mm-wave) signal. This addresses many of the aforementioned issues regarding cable loss and other complexities introduced when distributing mm-wave signals, as distributing lower frequency signals in this manner does not necessarily require cabling solutions, and on-board signal routing may instead be implemented at these lower frequencies. Each of the FM-RFDACs 1210.0-1210.K may then output combined and weighted output signals that, when coupled to each respective resonant matching network 1220.0-1220.K, frequency multiply the distributed lower-frequency input signal 1211 to a higher-frequency output signal. Again, this higher-frequency output signal may be amplitude and phase modulated, and fed to individual phased array antenna elements (or groups of antenna elements) to achieve a desired antenna beam pattern.

To do so, the transmitter design 1200 may implement a digital front end (DFE) 1206 that functions to extract phase ($\varphi$) and amplitude ($\rho$) data from digital baseband signals representing in-phase (I) and quadrature-phase (Q) data streams. In other words, the DFE 1206 acts as an I/Q-to-polar converter, receiving the in-phase and quadrature-phase signals in the digital baseband as a data stream, and providing an appropriate representative amplitude and phase as outputs. As further discussed below, the amplitude and phase data extracted from the I/Q digital baseband signals may then be used to phase modulate and amplitude modulate the output signals of the FM-RFDACs 1210.0-1210.K.

In various aspects, the DFE 1206 may include any suitable number, type, and combination of components to extract the amplitude and phase data from the I/Q digital baseband signals. For example, as shown in FIG. 12, the DFE 1206 may include an upsampling block 1206.1, which up-samples the digital in-phase signal and the digital quadrature-phase signal and provides the up-sampled data to a fractional sample rate converter and zero crossing calculation block (FRSC/ZC) 1206.2. The output of the FRSC/ZC 1206.2 is in turn coupled to a downsampling block 1206.3, providing the phase and amplitude data. The DFE 1206 shown in FIG. 12 is but one example of the type of digital front end that may be implemented to extract phase and amplitude data. Aspects are not limited to this one particular example, and any suitable type of digital front end may be implemented as part of transmitter design 1200 to extract polar data.

Moreover, because the I/Q-to-polar conversion of the digital baseband signal does not need to be performed at mm-wave frequencies, but at a lower sub-multiple frequency, the speed of the digital links used for the conversion may be much less than what is generally required for traditional digital beamforming solutions. For instance, aspects include the speed at which the I/Q data samples are received and the phase and amplitude data extracted can be at a sub-sampled rate relative to the mm-wave carrier frequency. And, for traditional polar transmitter architectures, digital pre-distortion may also be applied at the digital front end 1206 stage, which would ordinarily force each transmit chain to utilize the same pre-distorted signal distributed to each one. The configuration shown in FIG. 12, however, advantageously allows pre-distortion to be applied at each transmitter chain by way of the amplitude and phase modulation facilitated by each FM-RFDAC 1210.0-1210.K.

In an aspect, the transmitter design 1200 includes a common digital phase-locked loop (DPLL) 1202 configured to generate a synthesized frequency signal 1201, which may also be referred to herein as a "clock signal." Aspects include transmitter design 1200 using the phase data extracted from the DFE 1206 to phase modulate the clock signal 1201 to thereby generate the lower-frequency input signal 1211, which may be a digital waveform that is then distributed to the FM-RFDACs 1210.0-1210.K. In an aspect, the phase-modulation of the clock signal 1201 is performed via a digital-to-time converter (DTC) 1204, which includes a multi-modulus divider (MMD) coupled to a digitally-controlled two-point edge interpolator (DCEI$^2$). The DTC 1204 thus ensures that the phase and amplitude signals are extracted at the correct time instants (i.e., time-aligned with phase modulated output) from the fixed-rate baseband in-phase and quadrature-phase signals fed into the DFE 1206. Although DTC 1206 is shown in FIG. 12 as performing phase-modulation of the clock signal 1201, the aspects are not limited to this one particular example, and any suitable number, type, and combination of components may be implemented as part of transmitter design 1200 to phase-modulate the clock signal 1201.

In aspects, the lower-frequency input signal 1211 can be generated at a fraction of the LO signal rate (e.g., a fraction of a mm-wave LO signal frequency). For instance, the lower-frequency input signal 1211 may be generated at an input clock rate of each FM-RFDAC 1210.0-1210.K or, in some aspects, at an even further sub-multiple. As shown in FIG. 12, aspects optionally include the output of the DTC 1204 being coupled to a block 1208, which may allow for 90-degree phases to be generated more easily via a frequency divider. In various aspects, the frequency division may additionally or alternatively be performed within each FM-RFDAC 1210.0-1210.K.

In various aspects, any suitable number or type of techniques may be implemented to sub-sample the phase modulation data (e.g., via one or more algorithms executable via the baseband processor or separate processor circuitry) to minimize the EVM and spectral emissions. Again, one advantage of the aspects as described herein is that the lower-frequency input signal 1211 is easier to distribute to each transmit chain. Additionally, because the lower-frequency input signal 1211 is generated by phase-modulating the lower-frequency clock signal 1201, the lower-frequency input signal 1211 may be generated and modulated in a manner that utilizes a less complex design and implementation.

An additional benefit of this scheme is that the phase modulation may only need to cover a range of $2\pi/N$ for a multiplication factor of N, simplifying the design and implementation of the DTC 1204 and further saving power. And, because the aspects described herein also utilize amplitude modulation controls that operate at a lower frequency than the higher-frequency signals output from the resonant matching networks 1220.0-1220.K, the design considerations of the aspects described herein may be significantly relaxed and less complex as compared to higher frequency designs, such as those traditionally implemented in mm-wave systems.

Again, the phase-modulated lower-frequency input signal 1211 is distributed to each individual transmit chain via respective FM-RFDACs 1210.0-1210.K. Each of the FM-RFDACs 1210.0-1210.K generates, from a specific set of phase-shifted versions of the received input signal 1211, weighted and combined phase-shifted output signals 11213.0-1213.K. As a result of the resonant load coupling, each resonant matching network 1220.0-1220.K causes each respective weighted and combined phase-shifted output signal 11213.0-1213.K to frequency multiply and to have a phase and amplitude that is independent of the other FM-RFDACs 1210.0-1210.K. The details of this process are further described below with reference to FIG. 13, which illustrates an example of a detailed block diagram associated with one of the FM-RFDACs 1210.0-1210-K.

Figure 13:
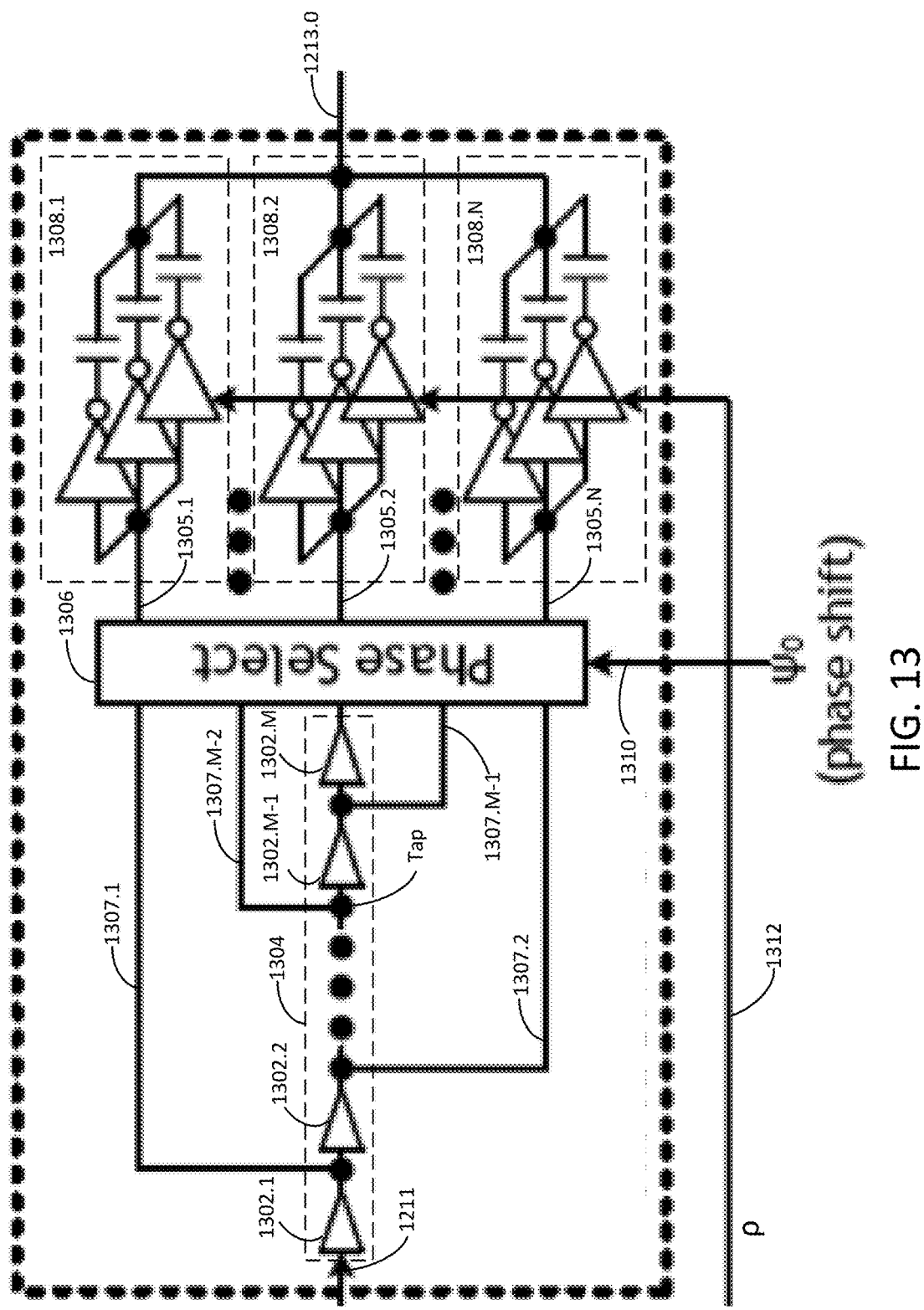
FIG. 13 illustrates a block diagram of an exemplary FM-RFDAC in accordance with an aspect of the disclosure.

Specifically, the FM-DAC 1300 as shown in FIG. 13 illustrates an example block diagram of FM-RFDAC 1210.0 in accordance with an aspect of the disclosure. As shown in FIG. 13, the FM-RFDAC 1300 receives the input signal 1211, which is coupled to a phase generation block 1304. In various aspects, the phase generation block 1304 may be implemented as any suitable number and/or type of circuit components configured to provide any suitable number of phase-shifted versions of the input signal 1211. The phase generation block 1304 is illustrated in FIG. 13 as including M number of delay elements 1302.1-1302.M, which are coupled in series with one another. The delay elements 1302.1-1302.M are shown in FIG. 13 as being implemented as digital buffers, although aspects include the delay elements 1302.1-1302.M being implemented as any suitable number and type of delay elements. For example, the delay elements 1302.1-1302.M may alternatively be implemented as digital inverters. In various aspects, the phase generation block 1304 may be implemented using the M-stage controlled delay-lines discussed herein with reference to the generation of quadrature LO signals. For example, the phase generation block 1304 may be implemented with the M-stage controlled delay-line 304, the interpolating delay-line 400, and two-dimensional delay-line 500, as shown in FIGS. 3, 4, and 5, respectively, in accordance with each delay-line's respective delay-locked loop (DLL).

In an aspect, the nodes between each of the coupled delay elements are referred to herein as "taps," each phase-shifting the input signal 1211 by an amount that is proportional to the delay time introduced by each respective delay element 1302.1-1302.M as the input signal 1211 propagates through the phase generation block 1304. As a result, the phase generation block 1304 provides a number M−1 (i.e., equal to one less than the number of delay elements 1302.1-1302.M in the configuration as shown in FIG. 12) of phase-shifted input signals 1307.1-11307.M−1 to the phase selection block 1306. Thus, the granularity of the phase shift between each of the phase-shifted input signals 1307.1-11307.M−1 may be controlled by increasing or decreasing the number M of delay elements 1302.1-1302.M, such that an appropriate number of delay elements 1302.1-1302.M may be chosen for a particular application.

In an aspect, the phase selection block 1306 may be implemented as any suitable number and/or type of hardware components that are controlled via a phase shift control line 1310. For example, the phase selection block may be implemented using switching circuitry and/or multiplexer circuitry configured to selectively couple a subset of the phase-shifted input signals 1307.1-11307.M−1 to each of the amplitude configuration blocks 1308.1-1308.M as phase-shifted input signals 1305.1-1305.N. As further discussed with reference to FIG. 15, the phase shift control line 1310 may represent one or more signal lines that carry data signals instructing the phase selection block 1306 to select a subset of the phase-shifted input signals 1307.1-11307.M−1 (e.g., a number N of the phase-shifted input signals 1307.1- 11307.M−1). Based upon this selection, the phase selection block 1306 may provide phase-shifted output signals 1305.1-1305.N. The selection of a specific subset of the phase-shifted input signals 1307.1-11307.M−1 used to produce the phase-shifted output signals 1305.1-1305.N may be calculated to ensure that a proper phase relationship exists between them to provide frequency multiplication at a desired harmonic frequency.

It should be noted that frequency multiplication occurs, however, upon the phase-shifted output signals 1305.1- 1305.N being combined and weighted via a respective amplitude configuration block 1308.1-1308.M in conjunction with the resonant load coupling, as further discussed below. Thus, the phase-shifted output signals 1305.1-1305.N share the same (lower) frequency as the input signal 1211 at this stage within the FM-RFDAC 1210.0. Moreover, aspects include the phase selection block 1306 selecting the appropriate phase-shifted input signals 1307.1-11307.M−1 to provide each of the phase-shifted output signals 1305.1-1305.N with the appropriate phase shift relative to one another. This ensures frequency multiplication at the appropriate harmonic frequency of the input signal 1211. To provide an illustrative example with reference to FIG. 1, the phase selection block 1306 may select phase-shifted input signals 1307.1-11307.M−1 such that the phase-shifted signals 1305.1, 1305.2, and 305.3 (from among the phase-shifted signals 1305.1-1305.N) are 120 degrees apart from one another, thus constructively adding at a third harmonic of the frequency of the input signal 1211 upon resonant load coupling.

Various additional techniques may be implemented, however, to provide an additional phase shift $\Psi_0, \Psi_1, \ldots \Psi_k$, to the frequency-multiplied signal that is generated via combining the phase-shifted signals 1305.1-1305.N. In other words, the phase shift $\Psi$ as shown in FIG. 12 constitutes an additional phase shift between the higher-frequency signal output by each transmit chain via coupling with each respective resonant matching network 1220.0-1220.K. It is this additional phase shift that facilitates the phased array antenna beamforming techniques in conjunction with amplitude weighting, as further discussed below. In various aspects, the phase shift between transmit chains can be implemented using various techniques.

For example, referring to FIG. 12, each of FM-RFDACs 1210.0-1210.K may include a phase selection block similar or identical to the phase selection block 1306, each being controlled via an independent phase shift control line such as phase shift control line 1310, for example, as shown in FIG. 13. Each respective phase shift control line may carry data signals instructing each independent phase selection block associated with each respective FM-RFDAC 1210.0-1210.K to select a different subset of the phase-shifted input signals 1307.1-11307.M−1. For instance, each phase selection block associated with each respective FM-RFDAC 1210.0-1210.K may "rotate" the selection of taps with respect to the phase generation block associated with other FM-RFDACs 1210.1-1210.K.

To provide an illustrative example, FM-RFDAC 1210.0 may select the phase-shifted input signal 1307.1 associated with the first tap from among the taps shown in FIG. 13 as the lowest phase signal, and select other phase-shifted input signals 1307.1-11307.M−1 from other taps such that the selected phase-shifted input signals 1305.1-305.3 are 120 degrees apart from one another. The FM-RFDAC 1210.1, however, may select (as the lowest phase signal) the second tap from among the taps shown in FIG. 13 that is associated with the phase-shifted input signal 1307.2, and select other taps such that the remaining phase-shifted input signals are also 120 degrees apart from one another. This process may thus be repeated such that, for each respective FM-RFDAC 1210.1-1210.K, the phase-shifted output signals 1305.1- 1305.N locally have the same phase-shift relative to each other (i.e., 120 degrees in this example) and frequency multiply, but will be phase-shifted (by $\Psi$) with respect to other FM-RFDACs 1210.0-1210.K.

In other aspects, each of FM-RFDACs 1210.0-1210.K may include a phase selection block similar to the phase selection block 1306, and the phase shift between FM-RFDACs 1210.0-1210.K may be realized by digitally choosing tap weightings for a desired phase shift. For example, the phase shift control line (e.g., phase shift control line 1310) may instruct each FM-RFDACs respective phase selection block to apply an appropriate weight to each selected phase-shifted input signals 1307.1-1307.M. By modifying the tap weightings among the FM-RFDACs 1210.0-1210.K, the phase-shifted output signals have a phase ($\Psi$) that is shifted among FM-RFDACs. For instance, tap weightings may be implemented using a mux or RF switch to select which tap is used and then connected to the respective FM-RFDAC 1210.0-1210.K. Each tap may also be coupled to an appropriate control switch, for example, such that any unused taps may be switched into the off state. These additional details are not shown in FIG. 13 for purposes of brevity.

In an additional aspect, the polar transmitter design 1200 may realize a phase-shift $\Psi$ between FM-RFDACs 1210.0- 1210.K by shifting the input clock at low frequencies. In yet an additional aspect, the polar transmitter design 1200 may shift the phase of the digital baseband signal provided to the DFE.

As a result of these various ways in which the phase shift between the FM-RFDACs 1210.0-1210.K can be performed, the aspects described herein provide flexibility for implementation. And, regardless of the technique used, because the phase is digitally controlled in a high resolution manner, the phase shift can be well controlled over process, voltage and temperature variations.

In any event, once the phase-shifted output signals 1305.1-1305.N are selected via the phase selection block 1306 to ensure frequency multiplication, the amplitude of the phase-shifted output signals 1305.1-1305.N may be further controlled to provide an appropriate signal amplitude weighting, which is further discussed below with reference to FIG. 14.

Figure 14:
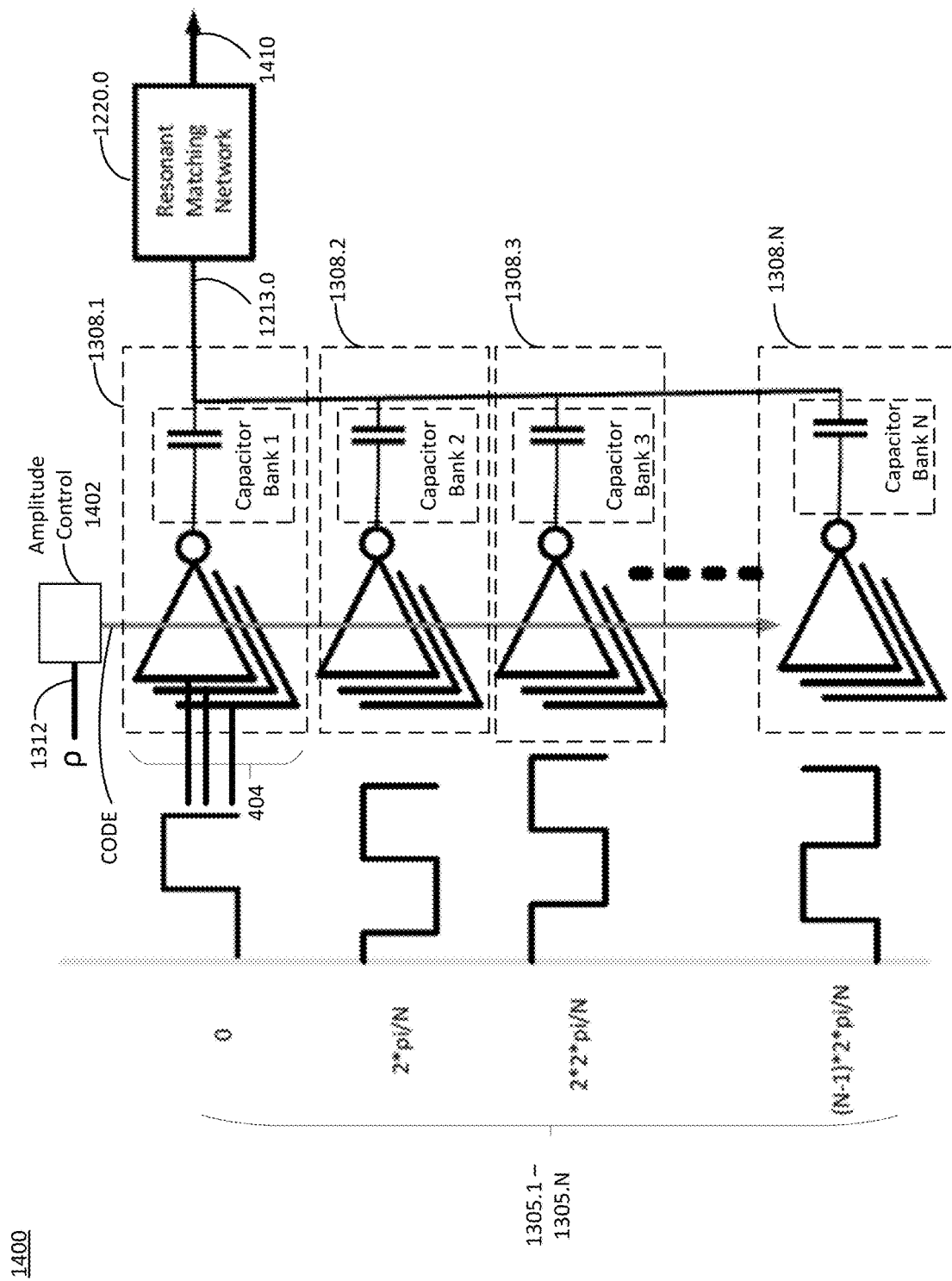
FIG. 14 illustrates a block diagram of exemplary amplitude configuration components, in accordance with an aspect of the disclosure.

FIG. 14 illustrates a block diagram of exemplary amplitude configuration components, in accordance with an aspect of the disclosure. The amplitude configuration components 1400 as shown in FIG. 14 also include the amplitude configuration components 1308.1-1308.M, as shown in FIG. 13. The amplitude configuration components 1400 as shown in FIG. 14, however, further illustrate additional details regarding how the amplitude control of the phase-shifted output signals 1305.1-1305.N is implemented. As shown in FIG. 14, the amplitude configuration components 1400 may include an amplitude control block 1402. Aspects include each FM-RFDACs 1210.0-1210.K similarly implementing an amplitude control block 1402 as shown in FIG. 14. In various aspects, the amplitude control block 1402 may be implemented as any suitable number and/or type of hardware components to facilitate controlling an operating state of each amplitude control element 1404, as further discussed below. For example, the amplitude control block 1402 may be implemented with demultiplexer and/or decoder circuitry that is controlled via an amplitude control line 1312, as shown in FIG. 13.

As further discussed with reference to FIG. 15, the amplitude control line 1312 may represent one or more signal lines that carry data signals instructing the amplitude control block 1402 to apply a specific amplitude weighting to the phase-shifted output signals 1305.1-1305.N. This amplitude weighting may be performed, for example, in accordance with the amplitude data p that was extracted from the digital baseband signals, as shown in FIG. 12. For example, the amplitude control block 1402 may receive the amplitude data p and generate a code word that is used to place some amplitude control elements 1404 included in each respective amplitude configuration block 1308.1-1308.M into a switching mode and to place others at a fixed DC per each input.

To do so, the code word line shown in FIG. 14 may be implemented as a bus or collection of digital and/or analog signal control lines, each being coupled to an amplitude control element 1404 within each of amplitude configuration blocks 1308.1-1308.M. Aspects include each of the amplitude configuration blocks 1308.1-1308.M including any suitable number of amplitude control elements 1404 coupled in series to one or more capacitors in each respective capacitor bank 1-N. Each amplitude control element 1404 and capacitor(s) series combination may be configured in parallel with any suitable number of other amplitude elements and capacitors, which is also illustrated in FIG. 13. Any suitable number of amplitude control elements 1404 and capacitors may be implemented, in various aspects, to ensure the appropriate amount of amplitude control granularity for a particular application.

Furthermore, although depicted in FIG. 14 as digital inverters, the individual amplitude control elements 1404 may be implemented as any suitable number and/or type of amplitude control elements, such as buffers, for instance. Additionally, each of the amplitude configuration blocks 1308.1-1308.M may include additional components not shown in FIG. 14 for purposes of brevity, which may allow each of the individual amplitude control elements 1404 to be controlled via signals carried by the code word line. For example, each individual amplitude control element 1404 as shown in FIG. 14 may be replaced with an appropriate logical gate (e.g., a NAND gate), with one input of the logical gate being coupled to one of the phase-shifted output signals 1305.1-1305.N, and the other input of the logical gate being coupled to the code word line driven to a desired voltage value. In any event, aspects include each individual amplitude control element 1404 being placed into a switching mode or operating at a fixed DC value based upon the control signals carried by the code word line.

Aspects include each individual amplitude control element 1404 and coupled capacitor, when placed into a switching mode, adding with the signals provided from other amplitude control elements 1404 and coupled capacitors that are also operating in a switched mode. The summed voltage from each of these signals may be calculated based upon the ratio of capacitor values within each respective capacitor bank 1-N that are coupled to amplitude control elements operating in a switched mode versus those operating in a fixed DC mode. Moreover, aspects include the resonant matching network 1220.0 (e.g., a tunable LC network) resonating with the capacitors associated with the amplitude control elements 1404 operating in a switched mode.

As a result, the phase-shifted output signals 1305.1-1305.N are combined to generate weighted and combined phase-shifted output signal 11213.0. Aspects include the weighted and combined phase-shifted output signals 11213.0 that, when coupled to the resonant matching network 1220.0, create frequency multiplication as a constructive additional of each of the weighted and combined phase-shifted output signals 11213.0. In this way, a higher-frequency output signal 1410 is generated (e.g., at mm-wave frequencies), that is coupled to a phased array antenna element, while other harmonics (including the input fundamental) are attenuated. Therefore, aspects include the amplitude modulating components 1308.1-1308.M, in conjunction with the coupled resonant matching network 1220.0, providing phase-modulated and amplitude-modulated frequency-multiplied signals from the lower-frequency phase-shifted output signals 1305.1-1305.N.

And, because digital inverter power is proportional to frequency, aspects advantageously save significant power over traditional beamforming solutions, as the phase-shifted output signals 1305.1-1305.N pass through the amplitude configuration blocks 1308.1-1308.M at a sub-multiple frequency instead of the higher mm-wave frequency. Moreover, because the only high frequency signal is at the output of each of the resonant matching networks 1220.0-1220.K, only one resonant node is required, saving significant die area. Special high-frequency signal handling (e.g., mm-wave signal handling) is thus only required from the output of each of the FM-RFDACs 1210.0-1210.K to the chip output. As yet another advantage of this architecture, a semi-digital FIR filter may, in some aspects, be additionally absorbed into one or more of the FM-RFDACs 1210.0-1210.K to suppress any undesired residual harmonics or images.

As a result of each transmit chain in the aspects described herein having its own digital stream (e.g., represented by the data included in the signals output by each FM-RFDAC 1210.0-1210.K that are combined via each respective resonant matching network 1220.0-1220.K), aspects include advantageously applying digital pre-distortion to each chain independently of the others. In an aspect, this may include using optimized coefficients for each respective FM-RFDAC 1210.0-1210.K. Traditional analog beamformers, in contrast, only have one stream common to all transmit chains. Thus, the aspects described herein provide a further advantage versus traditional analog systems, in which any variations in amplitude, phase, and RF matching used for beamforming greatly reduces the effectiveness of any applied digital pre-distortion. For example, each respective FM-RFDAC 1210.0-1210.K may apply independent phase and amplitude coefficients. In doing so, aspects include the (e.g., DFE 1206 modifying the digital code associated with the baseband signal for each of FM-RFDAC 1210.0-1210.K to effectuate amplitude and phase coefficients in this manner.

Figure 15:
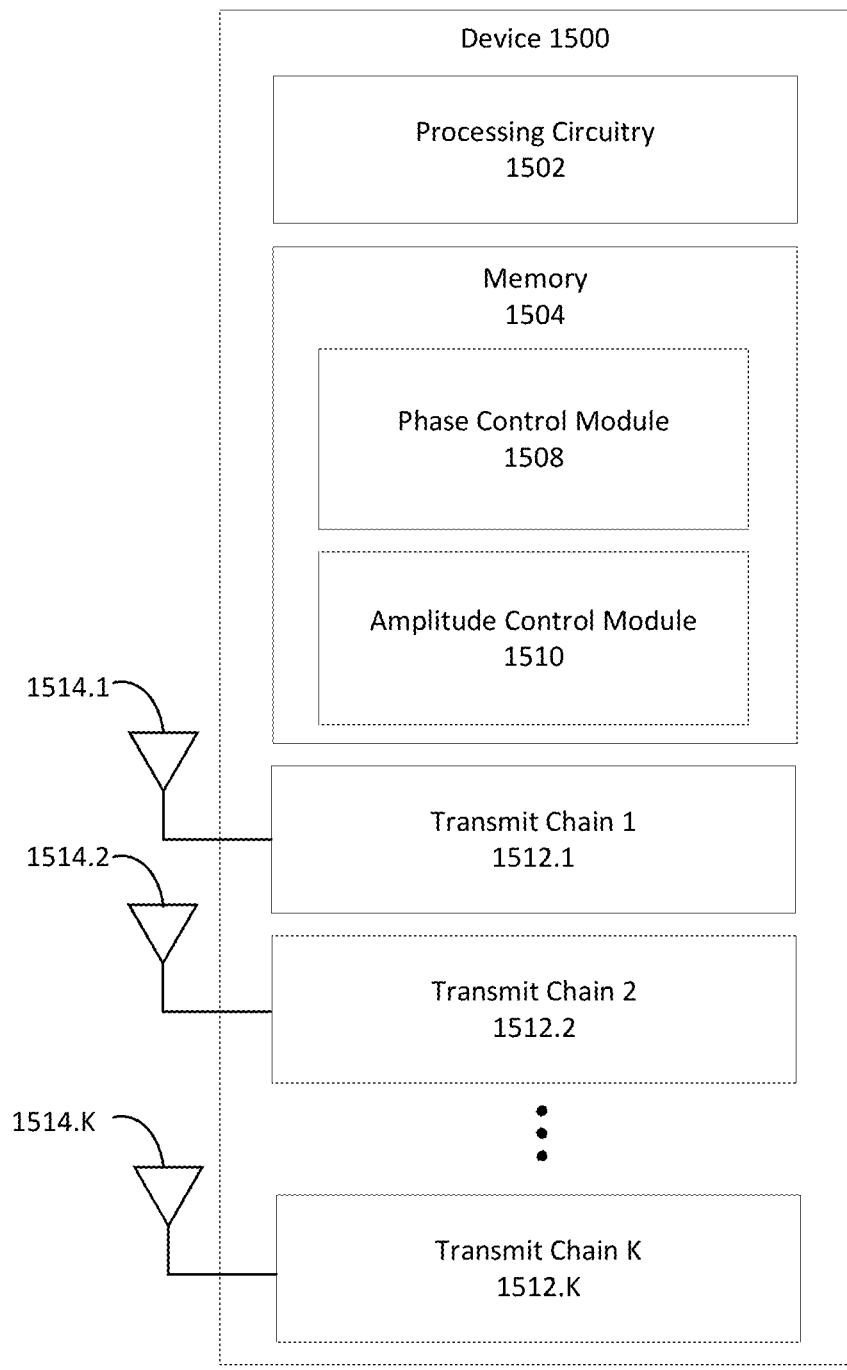
FIG. 15 illustrates a block diagram of an exemplary device, in accordance with an aspect of the disclosure.

FIG. 15 illustrates a block diagram of an exemplary device in accordance with an aspect of the disclosure. In various aspects, device 1500 may be implemented as any suitable type of device configured to transmit and/or receive wireless signals in accordance with any suitable number and/or type of communication protocols. For instance, the device 1500 may be implemented as a user equipment (UE) such as a mobile phone, tablet, laptop computer, etc. To provide additional examples, the device 1500 may be implemented as an access point or base station. The device 1500 may implement one or more aspects as described herein to facilitate transmitting wireless signals in accordance with frequency or band of frequencies, such as mm-wave frequencies, for example, as further described below.

In an aspect, the device 1500 may include processor circuitry 1502, a memory 1504, and any suitable number K of transmit chains 1512.1-512.K, each being coupled to one or more respective antennas 1514.1-514.N. The components shown in FIG. 15 are provided for ease of explanation, and aspects include device 1500 including additional, less, or alternative components as those shown in FIG. 15. For example, device 1500 may include one or more power sources, display interfaces, peripheral devices, ports, etc. To provide additional examples, the device 1500 may further include one or more receivers, or the transmit chains 1512.1-512.K may alternatively be implemented as transceivers capable of receiving and transmitting wireless signals via antennas 1514.1-1514.K.

In an aspect, the various components of device 1500 may be identified with functionality further described herein with reference to the generation of frequency-multiplied signals for use in a phased antenna array system to facilitate beamforming. For example, the wireless device 1500 may be configured to generate frequency-multiplied signals including modulated data via transmit chains 1512.1-512.K, which are wirelessly transmitted via coupled antennas 1514.1-1514.K at mm-wave or other suitable frequencies. The transmit chains 1512.1-512.K may be identified with a respective one of the transmit chains discussed, for example, with reference to each one of FM-RFDACs 1210.0-1210.K, as shown in FIG. 12. Thus, the transmit chains 1512.1-512.K may include any suitable number and type of components (e.g., those identified with the FM-RFDACs 1210.0-1210.K as well as additional or alternate components) to generate modulated frequency-multiplied signals from an input signal that is a sub-multiple or sub-harmonic frequency of the frequency-multiplied signal, as discussed herein.

To do so, processor circuitry 1502 may be configured as any suitable number and/or type of computer processors, which may facilitate control of the device 1500 as discussed herein. In some aspects, processor circuitry 1502 may be identified with a baseband processor (or suitable portions thereof) implemented by the device 1500. In other aspects, the processor circuitry 1502 may be identified with one or more processors implemented by the device 1500 that are separate from the baseband processor. In any event, aspects include the processor circuitry 1502 being configured to carry out instructions to perform arithmetical, logical, and/or input/output (I/O) operations, and/or to control the operation of one or more components of the device 1500. For example, the processor circuitry 1502 can include one or more microprocessors, memory registers, buffers, clocks, etc. Moreover, aspects include processor circuitry 1502 communicating with and/or controlling functions associated with the memory 1504 and/or the transmit chains 1512.1-512.K. This may include, for example, controlling and/or arbitrating transmit and/or receive functions of the device 1500, performing one or more baseband processing functions (e.g., media access control (MAC), encoding/decoding, modulation/demodulation, data symbol mapping, error correction, etc.).

In an aspect, the memory 1504 stores data and/or instructions such that, when the instructions are executed by the processor circuitry 1502, the processor circuitry 1502 performs the various functions described herein. The memory 1504 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 1504 can be non-removable, removable, or a combination of both.

For example, the memory 1504 may be implemented as a non-transitory computer readable medium storing one or more executable instructions such as, for example, logic, algorithms, code, etc. As further discussed below, the instructions, logic, code, etc., stored in the memory 1504 are represented by the various modules as shown in FIG. 15, which may enable the aspects disclosed herein to be functionally realized. The modules shown in FIG. 15 are provided for ease of explanation regarding the functional association between hardware and software components. Thus, aspects include the processor circuitry 1502 executing the instructions stored in these respective modules in conjunction with one or more hardware components to perform the various functions associated with the aspects as further discussed herein.

In an aspect, the executable instructions stored in phase control module 1508 may facilitate, in conjunction with the processor circuitry 1502, the selection of phases generated by the phase generation block 1304, as shown in FIG. 13, or another suitable phase generation system implemented by the device 1500. For example, the executable instructions stored in phase control module 1508 may provide the functionality associated with the phase selection block 1306, as shown in FIG. 13. Thus, phase control module 1508 enables the selection of a subset of the phase-shifted input signals 1307.1-11307.M−1 generated by the phase generation block 1304 (or another suitable phase generation system), via the phase selection block 1306.

In doing so, the phase control module 1508 ensures that phase selection block 1306 selects the appropriate phase-shifted output signals 1305.1-1305.N to provide frequency multiplication at the desired phases relative to each other for each of transmit chains 1512.1-512.K. The phase control module 1508 may also facilitate the phase selection block 1306 selecting the appropriate phase-shifted output signals 1305.1-1305.N to ensure that the proper phase shift exists for the phase-shifted output signals 1305.1-1305.N at each of transmit chains 1512.1-512.K relative to one another (i.e., the phase shift $\Psi$).

In an aspect, the phase control module 1508 may include instructions regarding how certain frequencies and phases are generated from sub-multiple (e.g., sub-harmonic) frequency phase combinations. For example, executable instructions stored in phase control module 1508 may include a lookup table and/or instructions regarding calculations to be performed to determine a specific set of phases that will produce, when combined and multiplied via each FM-RFDACs 1210.0-1210.K respective resonant matching network 1220.0-1220.K.

In an aspect, the executable instructions stored in amplitude control module 1510 may facilitate, in conjunction with the processor circuitry 1502, providing an amplitude weighting onto each of the phase-shifted output signals 1305.1-1305.N, as discussed in further detail in FIGS. 3 and 4. For example, the executable instructions stored in amplitude control module 1510 may provide the functionality associated with the amplitude control block 1402, as shown in FIG. 14. Thus, amplitude control module 1510 enables which of the individual amplitude control elements 1404, for a particular set of phase-shifted output signals 1305.1-1305.N, are placed into a switching mode and which are placed into a fixed DC mode of operation. Again, by doing so, the ratio of capacitor values coupled to switching-operated inverters versus fixed DC-operating inverters allows for the control of the level of voltage addition within each parallel set of inverters and capacitor(s), resulting in the desired level of amplitude weighting for each of the phase-shifted output signals 1305.1-1305.N. In this way, aspects include the use of amplitude control to compensate for losses on the output of the RF transmit chains and/or to provide an amplitude taper to lower beam side-lobes.

When implemented, amplitude control module 1510 may include instructions regarding which specific sets of inverters should be placed either into a switching mode or a fixed DC mode of operation based upon a desired end result, i.e., the desired amplitude weighting for the combined phase-shifted output signals 11213.0-1213.K. For example, executable instructions stored in amplitude control module 1510 may include a lookup table and/or instructions regarding calculations to be performed to determine a specific set of inverter on/off phase combinations that will produce a desired set of weighted frequency-multiplied signals from each of the FM-RFDACs 1210.0-210K. These instructions, therefore, allow each respective transmit chains 1512.1-512.K to amplitude-modulate the frequency-multiplied signals as needed which, in accordance with the phase shift provided by the phase control module 1508, provides a high-frequency beamforming control.

Section III—Quadrature Transmitter Frequency Multiplying RFDAC for Phased Arrays The aspects described in this section generally relate to transmitters and, more particularly, to transmitter designs implementing phased arrays at mm-wave frequencies.

Developments in 5G wireless technology have driven transceiver designs using mm-wave frequencies, which may correspond to frequencies in the proposed 24 GHz-86 GHz spectrum, for example. Such designs typically implement multiple antennas to achieve phased arrays and beamforming patterns to adapt to channel conditions. Currently, implementing mm-wave signals in phased array designs requires a large die area and power consumption associated with up-conversion mixers, mm-wave local oscillator (LO) generation and distribution, splitters, passive phase shifters, mm-wave transmission over cable, and the amplifiers required to compensate for the loss of all these components.

Moreover, in current solutions, digital pre-distortion, which is typically introduced into the baseband signal to compensate for non-idealities and/or imbalances, needs to be applied uniformly to all transmit chains in the phased array, as the mm-wave signal originates from one source. Thus, any mismatch in transmit chains implemented in the phased array will adversely impact pre-distortion performance, resulting in lower error vector magnitude (EVM) or efficiency. As a result, current designs to generate and distribute mm-wave signals for transmitters implementing phased arrays and/or multiple transmitter chains are complex, require large amounts of power to operate, and are expensive and inefficient.

As discussed above and with reference to the polar transmitter design aspects, mm-wave transceiver designs may implement phased arrays to facilitate beamforming to adapt to channel conditions. Again, current designs have been directed to either digital or analog beamforming in accordance with such systems, and have several drawbacks related to special high-frequency signal handling (e.g., cabling) and gain compensation for additional components to avoid performance degradation. These issues likewise plague quadrature-type transmitters operating in high frequency ranges such as mm-wave frequencies, for example, which likewise suffer from limitations imposed on applying pre-distortion independently per RF chain, the need for high data rate digital links, large die area usage, and high power usage. Furthermore, the use of high gain to overcome large losses in traditional mm-wave systems results in instability.

Moreover, high efficiency conventional polar transmitter design have been proposed, but pose difficulties with bandwidth expansion and synchronization. And high computational complexity requires large digital content and power consumption, especially for wide-band modulation. The polar transmitter aspects described herein address these aforementioned issues. However, compared to the polar transmitter implementations, a quadrature frequency multiplying radio-frequency digital-to-analog converter (FM-RF-DAC) uses less complex digital signal processing, albeit at the expense of a loss of 3 dB output power.

Therefore, to address the issues present in current analog and digital beamforming solutions for mm-wave designs, and to provide a less complex digital signal processing scheme than those used in polar FM-RFDAC transmitter architectures, the quadrature transmitter aspects herein likewise include the use of an entire mm-wave phased array transmitter within a single FM-RFDAC "block." Like the polar transmitter designs discussed herein, the quadrature transmitter FM-RFDAC also implements capacitor ratios to set an amplitude or weight of a signal, and the signals distributed to each FM-RFDAC are a sub-multiple of the mm-wave output due to frequency multiplication. As further discussed below, the quadrature transmitter aspects also combine low-frequency phase-shifted signals that add constructively to generate a higher-frequency signal (e.g., a mm-wave frequency signal) while preserving the signal modulation that was added to the signal at a lower-frequency. However, the quadrature transmitter aspects, as further discussed below, utilize a re-mapping of in-phase and quadrature-phase data values (obtained from sampled data) to a new 45-degree axis. These phases are readily available from the phases of the sub-multiple (low) frequency clock, and the phase relationships are maintained via multiplication.

Like the polar transmitter architectures discussed herein, the quadrature transmitter aspects also consume less power and utilize less die area compared to existing solutions, as the high-frequency signal generation is done in a single block or stage, and the LO generation and distribution is performed at a lower, sub-multiple frequency of the output mm-wave frequency. Moreover, the quadrature transmitter aspects also allow realization of pre-distortion on an individual transmit chain basis, providing improved power amplifier (PA) linearization allowing for lower power consumption or, alternatively, higher transmitted output power. The quadrature transmitter aspects likewise allow for amplitude and phase adjustments to be made with high granularity at mm-wave frequencies, and thus fine control over beams generated via a coupled phased antenna array may be achieved. Additionally, the quadrature transmitter aspects consume less digital signal processor power compared to the polar transmitter aspects, which may be of particular importance when transmitting at a lower power from the FM-RFDACs.

Referring back to FIGS. 1 and 11, the quadrature transmitter aspects described herein also exploit the use of constructive interference to add phase combinations of lower-frequency signal harmonics to realize frequency multiplication. In particular, like the polar transmitter aspects described herein, the quadrature aspects discussed herein also implement inverter-based frequency multipliers in conjunction with amplitude modulation using capacitive voltage division and a matching network (e.g., a resonant LC load) to enhance the multiplied frequency while attenuating other harmonics, including the input fundamental. Thus, the quadrature transmitter aspects also use digital control to modulate the strength of each input phase to utilize a wide range of different frequency multiplication ratios.

Figure 16:
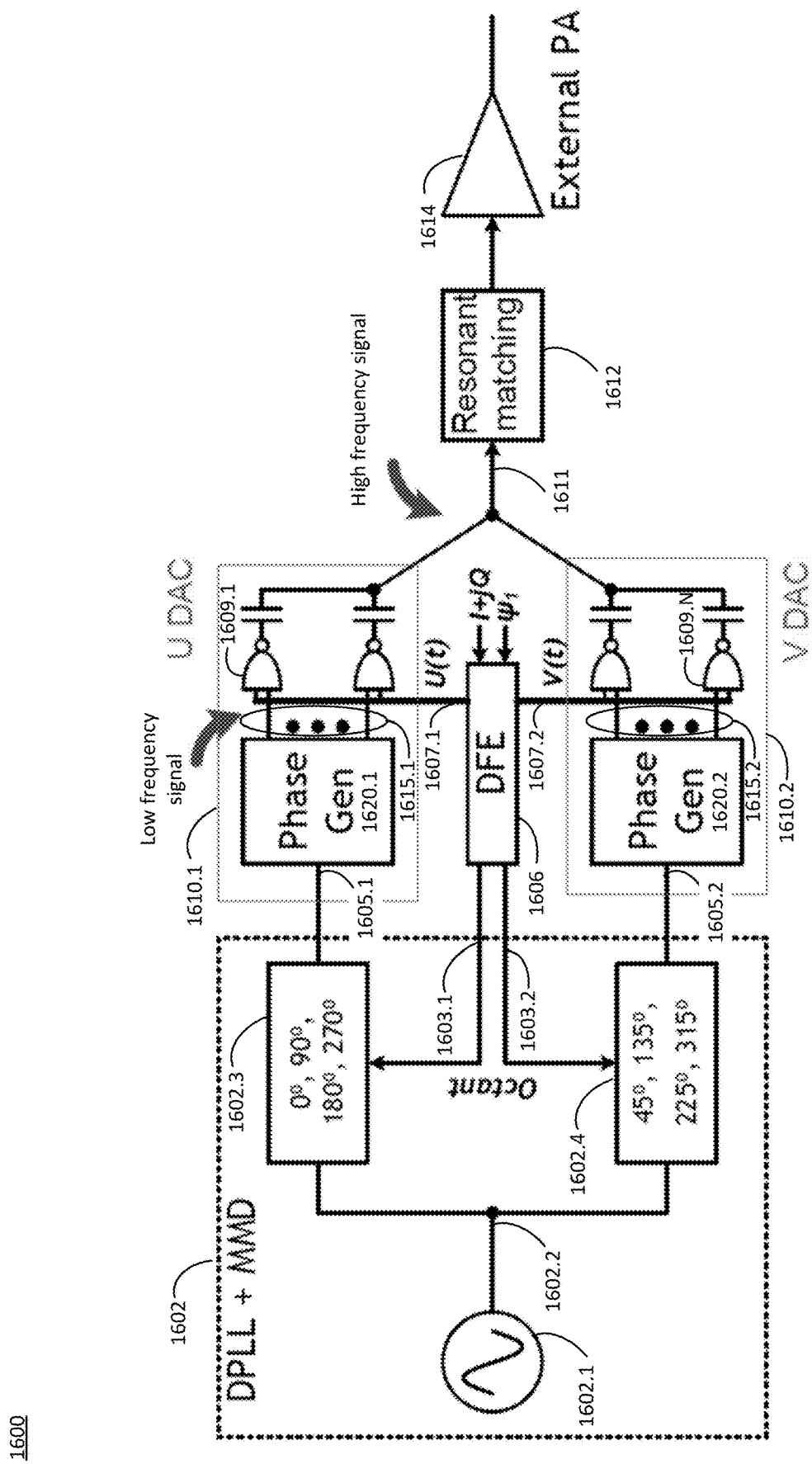
FIG. 16 illustrates a block diagram of an exemplary quadrature transmitter design implementing FM-RFDACs, in accordance with an aspect of the disclosure.

FIG. 16 illustrates a block diagram of an exemplary quadrature transmitter design implementing FM-RFDACs, in accordance with an aspect of the disclosure. As further discussed herein, aspects include the transmitter design 1600 being implemented as a portion of an overall transmitter design that has several components omitted for brevity and ease of explanation. For example, although the transmitter design 1600 is shown in FIG. 16 as including a single U FM-RFDAC 1610.1 and V FM-RFDAC 1610.2, transmitter design 1600 may include any suitable number and type of FM-RFDACs, each generating a separate signal to be generated for a respective transmitter chain. Thus, the aspects described herein may be particularly useful for transmitters that implement beamforming via multiple antennas, as each transmit chain may couple its own signal that is amplitude-weighted and phase-tuned for a particular antenna element (or group of antenna elements) within a phased array.

As shown in FIG. 16 and further discussed herein, the transmitter design 1600 includes any suitable number of multi-phase FM-RFDACs, with each receiving a phase-shifted version of the clock signal 1602.2 based upon the re-mapped in-phase and quadrature-phase complex data values associated with a signal waveform provided by the digital front end 1606. Therefore, as further discussed below, aspects include the U FM-RFDAC 1610.1 and the V FM-RFDAC 1610.2 forming part of an individual transmit chain that receives complex data that is re-mapped to a new axis, such that the complex in-phase data (I) and the quadrature-phase data (Q) are 45-degrees apart versus their original quadrature (i.e., 90 degree) phase relationship. To do so, aspects include each of the U FM-RFDAC 1610.1 and the V FM-RFDAC 1610.2 being separately clocked by a signal having a phase that is determined from the octant of the re-mapped complex signal, as further discussed below.

In an aspect, the U FM-RFDAC 1610.1 and the V FM-RFDAC 1610.2 combine their respective 45-degree re-mapped U and V data to generate a frequency-multiplied combined output signal at output node 1611 via coupling with the resonant matching component 1612. Each transmit chain, which includes both a U FM-RFDAC 1610.1 and a V FM-RFDAC 1610.2, thus forms the individual signal paths for each antenna(s) in the phased array. The frequency-multiplied combined output signal may thus have a specific frequency, amplitude, and phase shift with respect other transmit chains. As a result, when the signals generated by each individual U and V FM-RFDAC (which are associated with each respective transmit chain) are coupled to antenna(s) via their respective resonant matching networks, the signals have independently-weighted amplitude and phase-shifted values with respect to one another. This independent control of each transmit chain may therefore be utilized to generate desired beamforming patterns when applied to individual antenna elements within a phased antenna array.

In an aspect, each FM-RFDAC block associated with each transmit chain, which includes a U FM-RFDAC and a V FM-RFDAC (e.g., the U FM-RFDAC 1610.1 and the V FM-RFDAC 1610.2 shown in FIG. 16), may replace other components traditionally implemented in beamforming transmitter designs having multiple transmit chains to work in conjunction with phased array antenna elements. Specifically, like the polar transmitter design aspects discussed herein, aspects of the quadrature transmitter design 1600 include each FM-RFDAC block associated with each transmit chain being used in place of DACs, filters, mixers, RF splitters, and phase shifters that are typically implemented in traditional transmitter architectures. As noted above, to compensate for losses from the splitters, phase shifters, and RF signaling over cables, multiple amplification stages are also used in traditional architectures, which are advantageously no longer needed in the present aspects. Instead, a single external power amplifier (e.g., external PA 1614) may be implemented at each transmit chain to facilitate the output of high power transmissions, which are typically challenging for scaled digital processes.

Moreover, in contrast to typical mm-wave transmitter architectures that distribute a common high frequency mm-wave signal to multiple transmit chains, the present aspects instead distribute a lower-frequency input signal 1602.2, which is phase-shifted as needed. In aspects, the input signal 1602.2 is a sub-multiple of a desired higher-frequency (e.g., mm-wave) signal. This addresses many of the aforementioned issues regarding cable loss and other complexities introduced when distributing mm-wave signals, as distributing lower frequency signals in this manner does not necessarily require cabling solutions. Moreover, on-board signal routing may be advantageously implemented at these lower frequencies.

In an aspect, the quadrature transmitter design 1600 may implement a digital front end (DFE) 1606 that functions to extract phase data ($\phi$) and complex data (in-phase (I) and quadrature-phase (Q) data) from digital baseband signals. In various aspects, the DFE 1606 may include any suitable number, type, and combination of components to extract the phase data and complex data from the digital baseband signals. For example, the DFE 1606 may be implemented as one or more processors and/or circuit components, such as those associated with a baseband processor or digital signal processor.

Figure 17:
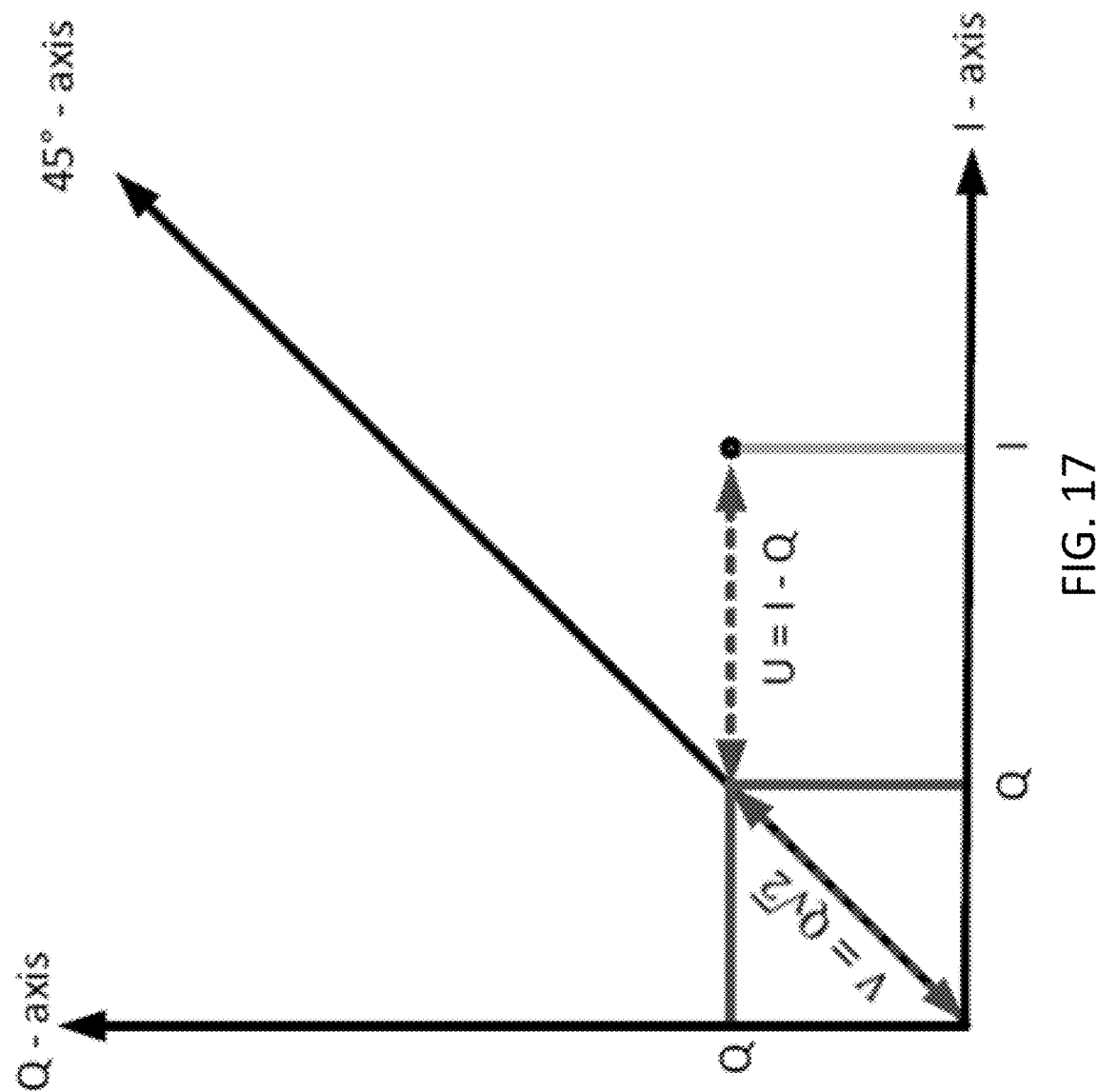
FIG. 17 illustrates I/Q data values re-mapped to a new 45-degree axis in accordance with an aspect of the disclosure.

Aspects include the DFE 1606 utilizing the extracted phase data and complex data to calculate re-mapped U and V data values, which are then used to calculate a phase shift for the clock signal 1602.2 that is fed to each of the U FM-RFDAC 1610.1 and the V FM-RFDAC 1610.2. In an aspect, the DFE 1606 may calculate the re-mapped data values by scaling and subtraction of the complex data values. For example, as shown in diagram 1700 of FIG. 17, the I/Q data values are mapped to a new 45-degree axis, with one axis being assigned the value U=(I−Q), and the other axis being assigned the value V=Q√2. In this way, the DFE 1606 re-maps I/Q data values extracted from the baseband signal that are originally 90 degrees apart from one another (i.e., in accordance with typical quadrature data sets) to U/V data values that are 45-degrees apart from one another. The use of these remapped U/V data values by each of the U FM-RFDAC 1610.1 and the V FM-RFDAC 1610.2 are further discussed below.

In an aspect, the clock generation block 1602 (i.e., clock generation circuitry) includes a common digital phase-locked loop (DPLL) 1602.1 configured to generate a synthesized frequency signal 1602.2, which may also be referred to herein as a "clock signal." The DPLL 1602.1 may be further coupled to phase-shifting blocks 1602.3 and 1602.4 (i.e., phase-shifting circuitry), which function to phase-shift the clock signal 1602.2. Aspects include phase-shifting blocks 1602.3 and 1602.4 selecting a phase-shift to utilize for the clock signal 1602.2, with the phase-shifted clock signal output by each respective phase-shifting block 1602.3 and 1602.4 (i.e., phase-shifted input signals 1605.1, 1605.2) being input to each of the U FM-RFDAC 1610.1 and the V FM-RFDAC 1610.2.

In an aspect, the phase-shift selected by the phase-shifting blocks 1602.3 and 1602.4 is based upon the octant mapping of the U/V data values provided by the DFE 1606. In particular, the re-mapped U/V data values are each, respectively, associated with one of four different phase axes and mapped 45 degrees apart from one another. Two examples of a time-varying U value and V value, which have been re-mapped to a new 45-degree axis, are represented in the phase diagrams 1800 as shown in FIGS. 18A-B as vectors U(t) and V(t).

Figure 18B:
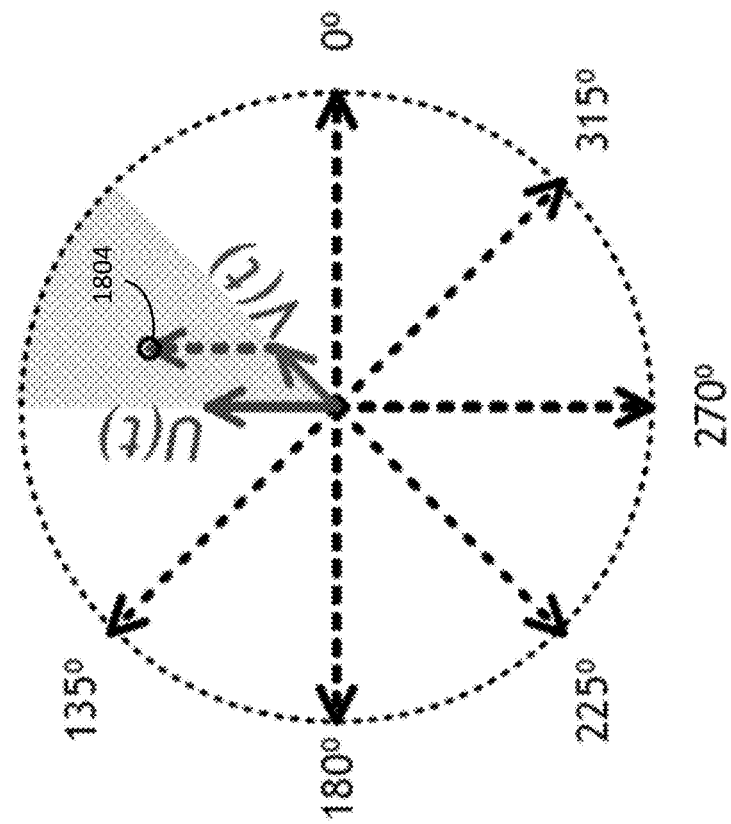
FIG. 18B illustrates a data point 1804 within a phase octant associated with the phase of the U(t) and V(t) vectors, in accordance with an aspect of the disclosure.
Figure 18A:
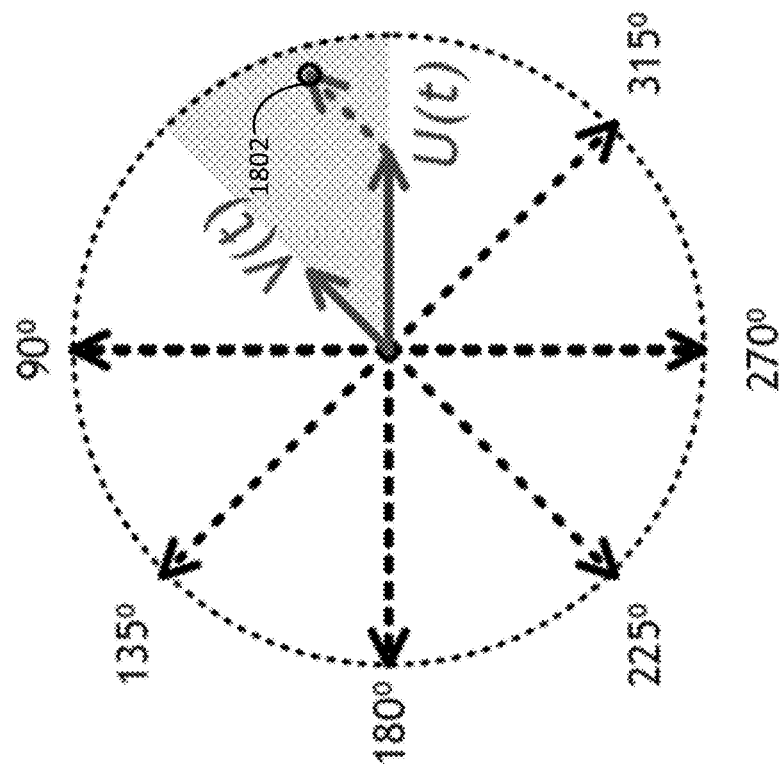
FIG. 18A illustrates a data point 1802 within a phase octant associated with the phase of the U(t) and V(t) vectors, in accordance with an aspect of the disclosure.

The vectors U(t) and V(t) as shown in FIGS. 18A-B represent re-mapped I/Q values having a particular magnitude and phase at specific instants in time. By re-mapping the I/Q data values to a new 45-degree axis, the vectors U(t) and V(t) are mapped to specific phase axes such that their vector sum U(t)+V(t) yields the data points 1802 and 1804, which are equivalent to the re-mapped I/Q data values. In doing so, the re-mapped data points 1802 and 1804 each fall within a specific phase octant, as shown in FIGS. 18A-B, with the phase of the U(t) vector being mapped onto one of a 0°, 90°, 180°, or 2700 axis, and the phase of the V(t) vector being mapped onto one of a 45°, 135°, 225°, or 315° axis.

In aspects, the U FM-RFDAC 1610.1 and the V FM-RFDAC 1610.2 sum the re-mapped signals U(t) and V(t) to provide a high-frequency combined signal, as further discussed below, thus realizing the re-mapped data points 1802 and 1804, for example, as shown in FIGS. 18A-B. It should be further noted that the diagrams shown in FIGS. 18A-18B describe the baseband envelope and thus represents the combined signal at both the digital baseband and the combined, high frequency signal. Therefore, aspects include the specific phase-shift selected by the phase-shifting blocks 1602.3 and 1602.4 corresponding to the particular octant mapping of the re-mapped I/Q data signals that result in the data point represented by U(t)+V(t). For example, the data point 1802 as shown in FIG. 18A falls within a phase octant associated with the phase of the U(t) vector mapped to the 0° axis and the phase of the V(t) vector mapped to the 45° axis. Thus, for I/Q data values that are re-mapped to a new 45-degree axis as shown in FIG. 18A, the phase-shifting block 1602.3 would phase-shift the clock signal 1602.2 by 0°, and the phase-shifting block 1602.4 would phase-shift the clock signal 1602.2 by 45°. To provide another example, the data point 1804 as shown in FIG. 18B falls within a phase octant associated with the phase of the U(t) vector mapped to the 90° axis and the phase of the V(t) vector mapped to the 45° axis. Thus, for I/Q data values that are re-mapped to a new 45-degree axis as shown in FIG. 18B, the phase-shifting block 1602.3 would phase-shift the clock signal 1602.2 by 90°, and the phase-shifting block 1602.4 would phase-shift the clock signal 1602.2 by 45°.

To do so, aspects include the DFE 1606 being coupled to each of the phase-shifting blocks 1602.3 and 1602.4 via data lines 1603.1 and 1603.2. In various aspects, the data lines 1603.1 and 1603.2 may represent any suitable number and/or type of wires, buses, digital links, etc., configured to carry data signals to each of the phase-shifting blocks 1602.3 and 1603.4. For example, the data lines 1603.1 and 1603.2 may represent a collection of signal lines configured to carry digital data signals in a serial or parallel manner, which are indicative of a particular phase octant associated with an I/Q data value remapped to a new 45-degree axis (e.g., an octant associated with data points 1802 and 1804, as shown in FIGS. 18A-B). Aspects include each of the phase-shifting blocks 1602.3 and 1602.4 receiving the octant information via the data lines 1603.1 and 1603.2, and selecting the appropriate phase shift based upon the octant information.

To facilitate the phase-shifting of the clock signal 1602.2, the phase-shifting blocks 1602.3-1602.4 may include any suitable number and/or type of delay elements, which are not shown in FIG. 16 for purpose of brevity. For example, the phase-shifting blocks 1602.3-1602.4 may include adjustable or configurable delay-line components to ensure that each of the 8 phase shifts may be generated for a clock signal 1602.2 having a particular frequency. These delay-line components may be implemented, for example, in accordance with any suitable number and/or type of delay elements to provide the desired amount of time delay, and thus phase shift. For instance, the phase-shifting blocks 1602.3-1602.4 may be implemented as a delay-locked loop (DLL) implementing a controlled delay-line, an interpolating delay-line, or a two-dimensional delay-line, as discussed herein with reference to FIGS. 4-6 and the quadrature LO receiver aspects.

Figure 19:
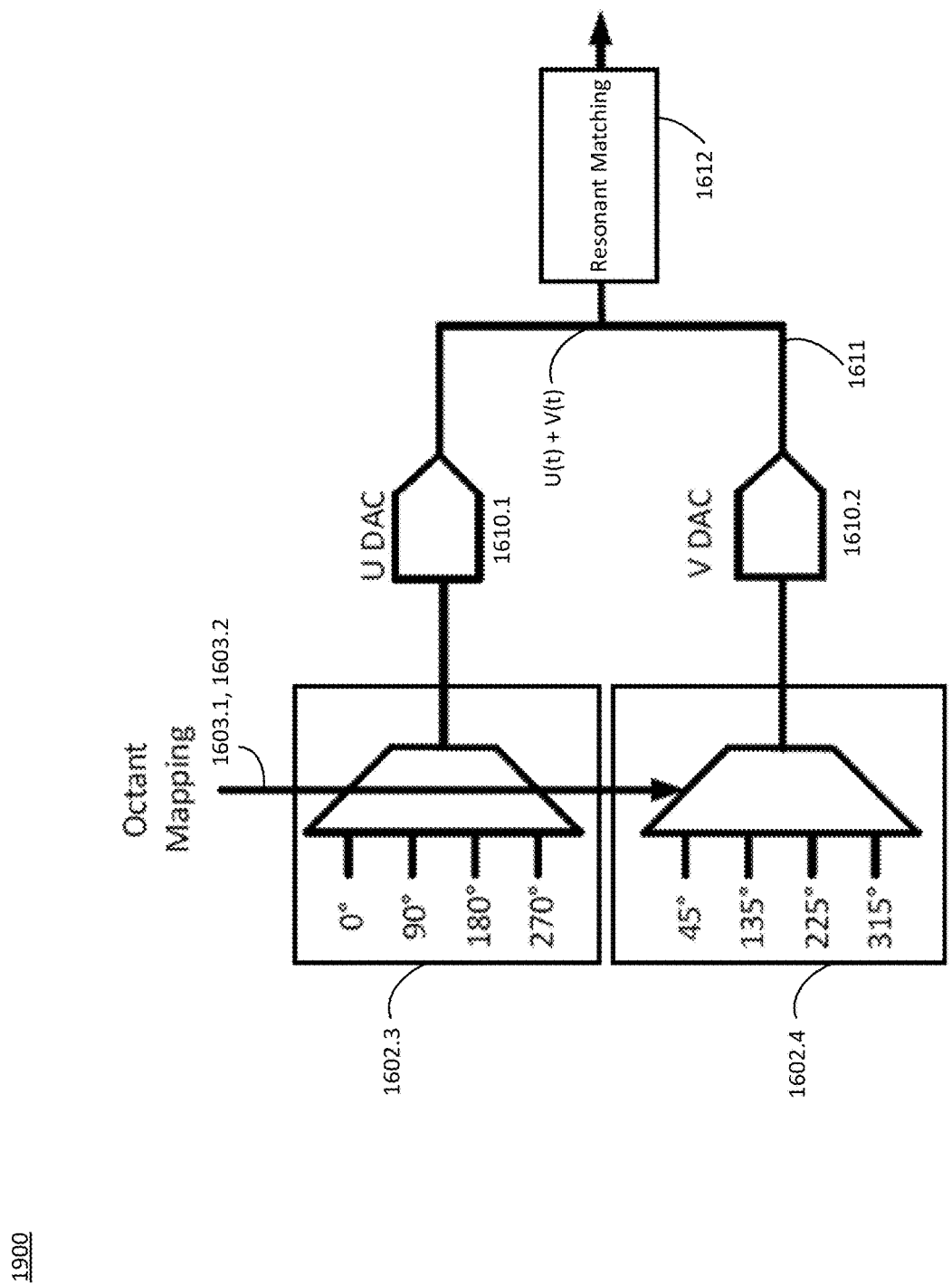
FIG. 19 illustrates a block diagram of an example implementation to select from among phase-shifted versions of a clock signal based upon the octant mapping information, in accordance with an aspect of the disclosure.

In any event, aspects include the phase-shifting blocks 1602.3, 1602.4 selecting an appropriate phase-shift value for the input clock signal 1602.2. In aspects, the phase-shifting blocks 1602.3, 1602.4 may be implemented any suitable circuits, switches, and/or other hardware components to facilitate coupling the desired phase-shifted version of the clock signal 1602.2 to each of the U FM-RFDAC 1610.1 and the V FM-RFDAC 1610.2. For example, as shown in FIG. 19, the phase-shifting blocks 1602.3, 1602.4 may be identified with the separate multiplexer blocks. In various aspects, the phase-shifting blocks 1602.3, 1602.4 may generate multiple phase-shifted versions of the clock signal 1602.2, and implement multiplexer circuitry to select from among these phase-shifted versions of the clock signal 1602.2 based upon the octant mapping information. To provide an illustrative example, the data lines 1603.1 and 1603.2 may carry data indicative of digital bit values (e.g., 00, 10, 10, 11) representative of which of the phase-shifted versions of the clock signal 1602.2 to be coupled to the output by each of the phase-shifting blocks 1602.3-1602.4.

Thus, as shown in FIG. 19, the U FM-RFDAC 1610.1 and the V FM-RFDAC 1610.2 receive the appropriate octant-based phase-shifted version of the clock signal 1602.2 (phase-shifted input signals 1605.1, 1605.2) as digital data. The phase associated with these phase-shifted input signals 1605.1, 1605.2 is then used as a reference from which additional phase-shifted signals are generated and combined at the output node 1611 to form the high-frequency signal as a result of frequency multiplication and coupling to the resonant matching network 1612, as further discussed below. In other words, the "reference" signal in this context that is provided at a particular phase used by each respective phase generation block 1620.1, 1620.2, is the result of the appropriate data signals sent to the phase-shifting blocks 1602.3, 1602.4, via the data lines 1603.1, 1603.2, respectively.

In various aspects, the U FM-RFDAC 1610.1 and the V FM-RFDAC 1610.2 may be implemented in different ways to ensure frequency multiplication of the summed time-varying signal U(t)+V(t) at the output node 1611 via coupling to the resonant matching network 1612. For example, the U FM-RFDAC 1610.1 and the V FM-RFDAC 1610.2 may implement phase generation, selection, and/or control, as well as amplitude weighting or control in a manner similar or identical to other aspects described herein. In various aspects, the phase generation blocks (i.e., phase generation circuitry) shown in FIG. 16, which are associated with each of the U FM-RFDAC 1610.1 and the V FM- RFDAC 1610.2, may be implemented using the M-stage controlled delay-lines discussed herein with reference to the generation of quadrature LO signals.

For example, the phase generation blocks 1620.1, 1620.2 associated with each of the U FM-RFDAC 1610.1 and the V FM-RFDAC 1610.2, respectively, may be implemented with the M-stage controlled delay-line 304, the interpolating delay-line 400, and the two-dimensional delay-line 500, as shown in FIGS. 3, 4, and 5, respectively, in accordance with each delay-line's respective delay-locked loop (DLL). In doing so, each of the U FM-RFDAC 1610.1 and the V FM-RFDAC 1610.2 may receive a phase-shifted version of the clock signal 1602.2 from each respective phase-shifting block 1602.3, 1602.4, which is used as a reference signal from which additional phase-shifted input signals are generated.

Aspects include the phase generation blocks 1620.1, 1620.2, associated with the U FM-RFDAC 1610.1 and the V FM-RFDAC 1610.2 generating any suitable number of phase-shifted signals 1615.1, 1615.2, depending upon the desired granularity and control over the generated high-frequency output signal and, in turn, the granularity of beamforming control that is desired. Moreover, aspects include each of the U FM-RFDAC 1610.1 and the V FM-RFDAC 1610.2 implementing an amplitude control system, similar to that described herein with reference to the FM-DAC 1300 as shown in FIG. 13. In particular, each of the U FM-RFDAC 1610.1 and the V FM-RFDAC 1610.2 may be configured to control the amplitude or weighting applied to each of a set of phase-shifted signals generated by the DLL within each respective phase generation block 1620.1, 1620.2, such that the combined signal at the output node 1611 (U(t)+V(t)) is generated at a desired frequency and phase.

To do so, each of the phase generation blocks 1620.1, 1620.2 may generate sets of phase-shifted signals needed to ensure frequency-multiplication. These phase-shifted signals are then weighted via the DFE 1606 such that the desired phase-shifted signals produce a desired high-frequency signal at the output node 1611. Aspects include the DFE 1606 performing amplitude weighting of the phase-shifted signals using any suitable number and/or type of hardware components to facilitate controlling an operating state of any suitable number N of amplitude control elements 1609.1-1609.N (i.e., amplitude control circuitry), as further discussed below. For example, the DFE 1606 may include one or more processors (e.g., baseband processors, digital signal processors, etc.), digital driver circuitry, etc., coupled to buses 1607.1 and 1607.2, as shown in FIG. 16.

The buses 1607.1 and 1607.2 may carry signal data (e.g., digital data signals) in the form of a digital code word, such that the state of each control element 1609 is controlled. In particular, the operating mode of each control element 1609.1-1609.N may be changed from a switching mode or a fixed DC output mode. In the example shown in FIG. 16, the control elements 1609.1-1609.N are implemented as NAND gates, although any suitable type of logical gate or other control element may be implemented, in various aspects. In the NAND gate example shown in FIG. 16, the input of each NAND gate is coupled to a digital control line from the appropriate bus 1607.1 or 1607.2. The DFE 1606 may then drive the digital control line to a desired voltage value in accordance with a digital code word to place the control elements 1609.1-1609.N into either a switching mode or a DC fixed mode of operation. Aspects include, for each control element 1609.1-1609.N that is placed into a switching mode, the respective phase-shifted coupled signals adding via capacitive coupling. The summed voltage from each of these signals may be calculated based upon the ratio of capacitor values within the U FM-RFDAC 1610.1 and the V FM-RFDAC 1610.2 that are operating in a switched mode versus those operating in a fixed DC mode, as discussed herein with reference to the polar FM-RFDACs shown in FIGS. 12-15. For example, the quadrature architecture may be implemented having a similar capacitor bank implementation as the polar architecture discussed herein with reference to FIGS. 11-15. Moreover, similar to the operation of the polar transmitter aspects discussed herein, aspects of the quadrature transmitter described in this section include the resonant matching network 1612 (e.g., a tunable LC network) resonating with the capacitors associated with the U FM-RFDAC 1610.1 and the V FM-RFDAC 1610.2 when the control elements 1609.1-1609.N are operating in a switched mode.

As a result, the phase-shifted signals generated by each of the U FM-RFDAC 1610.1 and the V FM-RFDAC 1610.2 are weighted and combined at the output node 1611 to generate a high frequency signal (e.g., a mm-wave signal). Aspects include the phase-shifted signals, when coupled to the resonant matching network 1612, creating frequency multiplication as a result of the constructive addition of each of the weighted and combined phase-shifted signals. In this way, a higher-frequency output signal is generated (e.g., at mm-wave frequencies). This higher-frequency output signal is, in turn, coupled to a phased array antenna element via, for example, the external power amplifier 1614, as shown in FIG. 16, while other harmonics (including the input fundamental) are attenuated.

Figure 20:
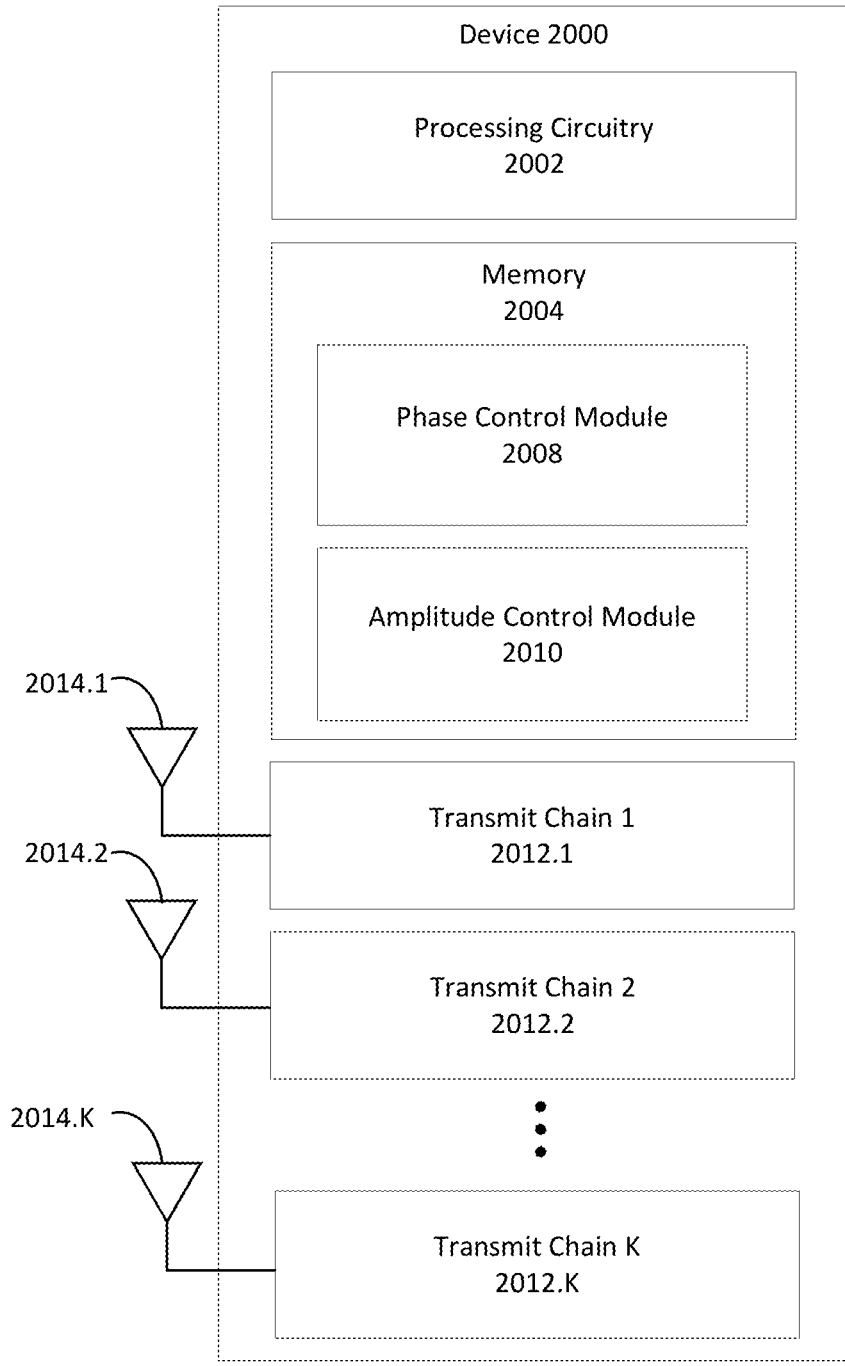
FIG. 20 illustrates a block diagram of an exemplary device, in accordance with an aspect of the disclosure.

FIG. 20 illustrates a block diagram of an exemplary device in accordance with an aspect of the disclosure. In various aspects, device 2000 may be implemented as any suitable type of device configured to transmit and/or receive wireless signals in accordance with any suitable number and/or type of communication protocols. For instance, the device 2000 may be implemented as a user equipment (UE) such as a mobile phone, tablet, laptop computer, etc. To provide additional examples, the device 2000 may be implemented as an access point or base station. The device 2000 may implement one or more aspects as described herein to facilitate transmitting wireless signals in accordance with a particular frequency or band of frequencies, such as mm-wave frequencies, for example, as further described below.

In an aspect, the device 2000 may include processing circuitry 2002, a memory 2004, and any suitable number K of transmit chains 2012.1-2012.K, each being coupled to one or more respective antennas 2014.1-2014.N. The components shown in FIG. 20 are provided for ease of explanation, and aspects include device 2000 including additional, less, or alternative components as those shown in FIG. 20. For example, device 2000 may include one or more power sources, display interfaces, peripheral devices, ports, etc. To provide additional examples, the device 2000 may further include one or more receivers, or the transmit chains 2012.1-2012.K may alternatively be implemented as transceivers capable of receiving and transmitting wireless signals via antennas 2014.1-2014.K.

In an aspect, the various components of device 2000 may be identified with functionality further described herein with reference to the generation of frequency-multiplied signals for use in a phased antenna array system to facilitate beamforming for quadrature-based transmitters. For example, the wireless device 2000 may be configured to generate frequency-multiplied signals including modulated data via transmit chains 2012.1-2012.K, which are wirelessly transmitted via coupled antennas 2014.1-2014.K at mm-wave or other suitable frequencies. Each of the transmit chains 2012.1-2012.K may be identified with a respective one of the transmit chains discussed, for example, with reference to transmitter design 1600 as shown in FIG. 16. Therefore, each respective one of the transmit chains 2012.1-2012.K may be identified with the functionality associated with the clock generation block 1602, the U FM-RFDAC 1610.1, the V FM-RFDAC 1610.2, the DFE 1606, etc., as shown in FIG. 16. In various aspects, the transmit chains 2012.1-2012.K may include any suitable number and type of components to generate modulated frequency-multiplied signals from an input signal that is a sub-multiple or sub-harmonic frequency of the frequency-multiplied signal, as discussed herein.

To do so, processing circuitry 2002 may be configured as any suitable number and/or type of computer processors, which may facilitate control of the device 2000 as discussed herein. In some aspects, processing circuitry 2002 may be identified with a baseband processor (or suitable portions thereof) implemented by the device 2000. In other aspects, the processing circuitry 2002 may be identified with one or more processors implemented by the device 2000 that are separate from the baseband processor (e.g., one or more digital signal processors). In any event, aspects include the processing circuitry 2002 being configured to carry out instructions to perform arithmetical, logical, and/or input/output (I/O) operations, and/or to control the operation of one or more components of the device 2000. For example, the processing circuitry 2002 can include one or more microprocessors, memory registers, buffers, clocks, etc. Moreover, aspects include processing circuitry 2002 communicating with and/or controlling functions associated with the memory 2004 and/or the transmit chains 2012.1-2012.K. This may include, for example, controlling and/or arbitrating transmit and/or receive functions of the device 2000, performing one or more baseband processing functions (e.g., media access control (MAC), encoding/decoding, modulation/demodulation, data symbol mapping, error correction, etc.).

In an aspect, the memory 2004 stores data and/or instructions such that, when the instructions are executed by the processing circuitry 2002, the processing circuitry 2002 performs the various functions described herein. The memory 2004 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 2004 can be non-removable, removable, or a combination of both.

For example, the memory 2004 may be implemented as a non-transitory computer readable medium storing one or more executable instructions such as, for example, logic, algorithms, code, etc. As further discussed below, the instructions, logic, code, etc., stored in the memory 2004 are represented by the various modules as shown in FIG. 20, which may enable the aspects disclosed herein to be functionally realized. The modules shown in FIG. 20 are provided for ease of explanation regarding the functional association between hardware and software components. Thus, aspects include the processing circuitry 2002 executing the instructions stored in these respective modules in conjunction with one or more hardware components to perform the various functions associated with the aspects as further discussed herein.

In an aspect, the executable instructions stored in phase control module 2008 may facilitate, in conjunction with the processing circuitry 2002, different functions. These functions may include, for example, the identification of an appropriate octant mapping for vectors U(t) and V(t) for a particular data point associated with I/Q complex data, as discussed herein with reference to FIGS. 16-19. In accordance with such aspects, the executable instructions stored in phase control module 2008 may facilitate, in conjunction with the processing circuitry 2002, the selection of an appropriate phase shift of the clock signal 1602.2 via the phase-shifting blocks 1602.3, 1602.4. This may be facilitated, for example, via the DFE 1606 sending the appropriate signals via the data lines 1603.1, 1603.2. In an aspect, the appropriate signals may be selected based upon any suitable calculation in accordance with the appropriate identified octant, such as a lookup table, for example.

To provide another example, the executable instructions stored in phase control module 2008 may facilitate the generation of phase-shifted signals by each phase generation block associated with each U and V FM-RFDAC implemented by each of the transmit chains 2012.1-2012.K. For example, instructions stored in phase control module may facilitate the generation of phases by the phase-generation blocks 1620.1, 1620.2, as shown in FIG. 16. Thus, phase control module 2008 enables the generation of a specific set of phase-shifted signals to ensure frequency multiplication, thereby producing a signal for each transmit chain 2012.1-2012.K having a desired phase and frequency.

In doing so, the phase control module 2008 ensures that phase generation block for each transmit chain 2012.1-2012.K provides the appropriate phase-shifted signals to provide frequency multiplication at the desired phases relative to each other for each of transmit chains 2012.1-2012.K. In an aspect, the phase control module 2008 may include instructions regarding how certain frequencies and phases are generated from sub-multiple (e.g., sub-harmonic) frequency phase combinations. For example, executable instructions stored in phase control module 2008 may include a lookup table and/or instructions regarding calculations to be performed to determine a specific set of phases that will produce, when combined and multiplied via the respective U and V FM-RFDACs for each transmit chain 2012.1-2012.K, a desired high-frequency signal.

In an aspect, the executable instructions stored in amplitude control module 2010 may facilitate, in conjunction with the processing circuitry 2002, providing an amplitude weighting the phase-shifted signals by the phase generation block associated with each U and V FM-RFDAC associated with each of the transmit chains 2012.1-2012.K, as discussed herein with reference to FIG. 16. For example, the executable instructions stored in amplitude control module 2010 may provide the functionality associated with the DFE 1606, as shown in FIG. 16. Thus, amplitude control module 2010 enables which of the individual control elements 1609.1-1609.N, for a particular set of phase-shifted signals, are placed into a switching mode and which are placed into a fixed DC mode of operation. Again, by doing so, the ratio of capacitor values coupled to switching-operated control elements versus fixed DC-operating control elements allows for the control of the level of voltage addition within each set of U and V FM-RFDACs, resulting in the desired level of amplitude weighting for each of the phase-shifted signals for each transmit chain 2012.1-2012.K.

In an aspect, amplitude control module 2010 may include instructions regarding which specific sets of control elements should be placed either into a switching mode or a fixed DC mode of operation based upon a desired end result, i.e., the desired weighting for the phase-shifted signals. For example, executable instructions stored in amplitude control module 2010 may include a lookup table and/or instructions regarding calculations to be performed to determine a specific set of control element state combinations that will produce a desired frequency-multiplied signal via the respective U and V FM-RFDACs for each transmit chain 2012.1-2012.K. These control element state combinations may then be realized by the digital data signals associated with, for example, the digital code words applied to the buses 1607.1, 1607.2.

These instructions, therefore, allow each of the respective transmit chains 2012.1-2012.K to amplitude-modulate the frequency-multiplied signals as needed which, in accordance with the phase shift provided by the phase control module 2008, facilitates high-frequency beamforming control. And because each transmit chain 2012.1-2012.K may produce independently-controlled high-frequency signals in this manner, each transmit chain may include an independently-controlled phase-shift and amplitude weighting relative to one another, which is suitable for beamforming applications at high frequencies (e.g., mm-wave frequencies). That is, the weighted combination of the phase-shifted signals produced and combined via the respective U and V FM-RFDACs for each transmit chain 2012.1-2012.K may facilitates the (high-frequency) output signal generated by each of the transmit chains 2012.1-2012.K to be phase-shifted with reference to one another and/or to have a different weighting, amplitude, or magnitude with respect to one another.

Section IV—Reconfigurable Hybrid Digital Radio Receiver

The aspects described within this section generally relate to transceivers and, more particularly, to receiver designs implementing dynamically reconfigurable digital hybrid beamforming.

Modern receiver designs that implement digital beamforming allow for scanning all directions simultaneously and/or concurrently, fast beam acquisition and tracking, and blocker nulling. However, such architectures typically require replication of a digital front end (DFE), analog-to-digital converters (ADCs), baseband filters, and mixer/local oscillator (LO) for each antenna in the beamforming array. As a result, the advantages realized by digital beamforming solutions are outweighed by the large power overhead associated with these aforementioned components, as well as the processing power required to facilitate digital beamforming. Additionally, for many use cases, the user equipment (UE) hardware may only require a single beam, which offsets some of the advantages of digital beamforming mentioned above.

As discussed herein, transceiver designs may implement phased arrays or antenna array circuitry arrangements to facilitate beamforming to adapt to channel conditions. Again, current designs have been directed to either digital or analog beamforming in accordance with such systems, and have several drawbacks related to special high-frequency signal handling (e.g., cabling) and gain compensation for additional components to avoid performance degradation.

As noted above, conventional digital beamforming solutions replicate the DFE, ADC, baseband filter, and mixer/LO for each antenna. In doing so, digital beamforming solutions suffer from very high power consumption. On the other hand, analog beamforming solutions have been proposed that do not have the power overhead of the extra blocks mentioned above (i.e., DFE, ADCs, baseband filter, and mixer/LO for each antenna). However, analog beamforming has drawbacks in that only one direction may be scanned at a time, incurs loss due to the phase shifter implementation, and requires a large area to accommodate a large number of passive components.

Hybrid digital beamforming solutions combine several (but not all) receive chains together for each ADC. As a result, hybrid digital beamforming loses some of the advantages of scanning in all directions. Furthermore, such solutions require phase shifters on each chain, incurring the same loss penalty as analog beamforming solutions.

Therefore, to address the issues present in conventional digital, analog, and hybrid digital beamforming solutions, the aspects disclosed in this section of the disclosure are directed to receiver implementations that utilize hybrid digital beamforming that can be dynamically reconfigured. In the aspects described throughout this section, the use of dynamic beamforming allows a receiver to switch between different types of beamforming modes or states such as full analog, full digital, or a hybrid combination of both analog and digital. In the aspects described herein, both digital and analog beamforming modes may be performed simultaneously and/or concurrently, as further discussed below. The dynamic reconfiguration aspects described herein allow a receiver to switch between any of these modes of operation on the fly in response to various channel conditions, to meet power demands, etc. As further discussed below, as part of this dynamic reconfiguration, aspects include the hybrid digital beamforming taking advantage of the features of digital beamforming while being reconfigured to operate in a lower power consumption state for other operation.

For example, in the aspects discussed herein with regards to FIGS. 1-10, techniques were disclosed to generate quadrature LO on a per-receiver chain basis. The aspects described in this section further leverage such techniques such that the LO phase shifting is implemented in a manner that does not incur additional overhead (e.g., circuit components, area, and power consumption) with respect to LO distribution. In particular, the aspects described herein exploit the use of the per-chain quadrature LO to provide a baseband switching and reconfiguration scheme that enables dynamic beamforming reconfigurations to support digital beamforming, analog beamforming, or a combination of both within a transceiver slice set at any particular time. Moreover, the use of per-chain LO quadrature generation allows for phase shifting to be enabled or disabled with no overhead. Additionally, the aspects described in this section also implement switching in the baseband to facilitate the summation of mixer outputs into a single ADC, or for each receiver chain to have an active ADC, depending on the specific system requirements at the time.

The digital hybrid aspects disclosed herein allow for fast beam acquisition and tracking, as well as nulling interferers, which may be particularly advantageous for operation in the 5G/mm-wave frequency band. Moreover, to enable 5G wireless communication in mobile devices, it is paramount to have a very low power consumption. The aspects described in this section with regards to the digital hybrid beamforming solutions advantageously allow for the simultaneous realization of both fast beam acquisition, tracking, and nulling interferers while consuming little power.

Figure 21:
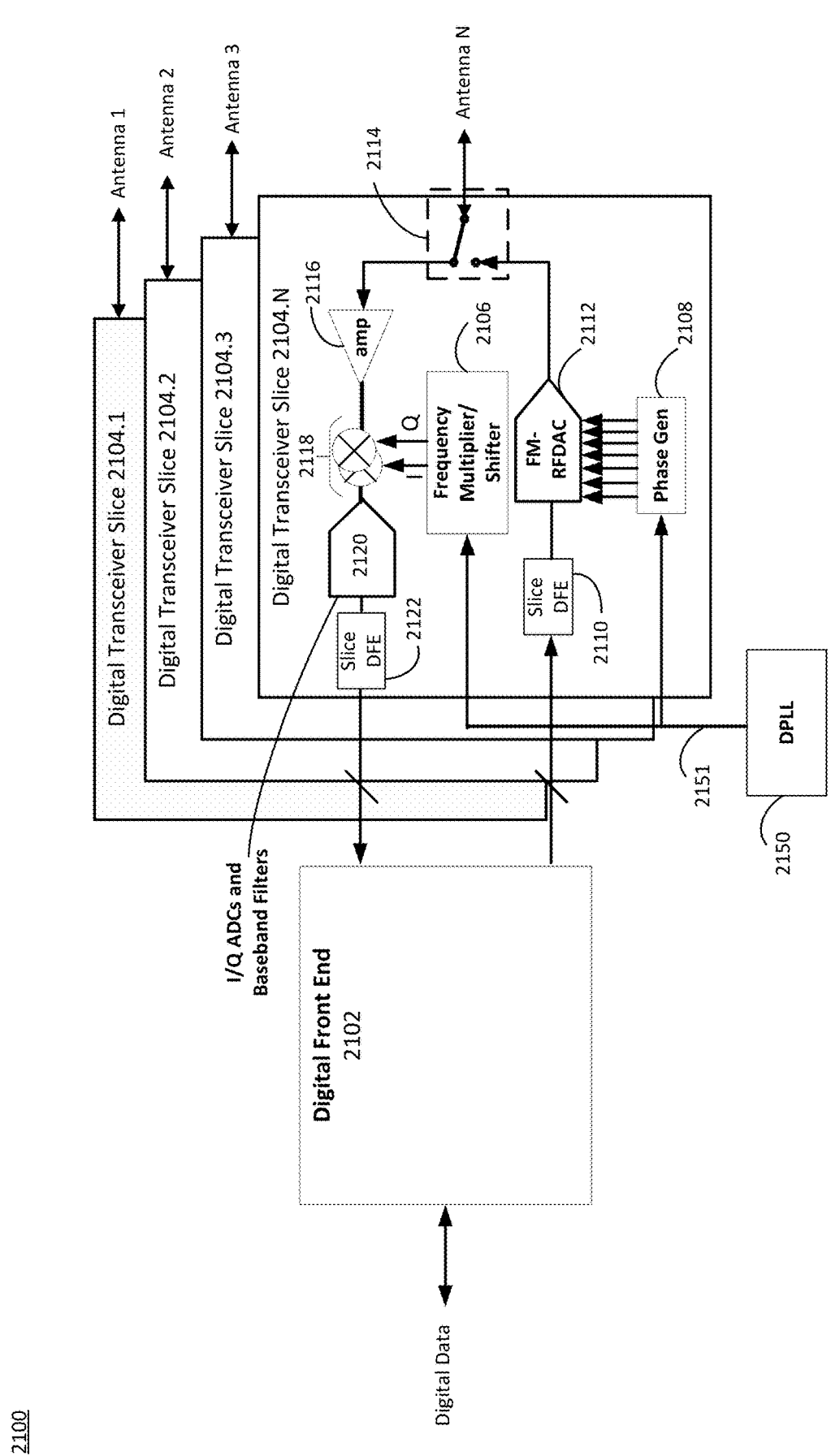
FIG. 21 illustrates a block diagram of an exemplary hybrid receiver design, in accordance with an aspect of the disclosure.

FIG. 21 illustrates a block diagram of an example hybrid receiver design, in accordance with an aspect of the disclosure. As further discussed herein, aspects include the receiver design 2100 being implemented as a portion of an overall receiver or transceiver that has several components omitted for brevity and ease of explanation. In an aspect, the receiver design 2100 includes a shared or common DFE 2102, which is coupled to any suitable number N of digital transceiver "slices," or "portions" 2104.1-2104.N. The receiver design 2100 shown in FIG. 21 illustrates the shared DFE 2102 being coupled to only one the digital transceiver slices 2104 for purposes of brevity. However, aspects include the shared DFE 2102 being coupled to each of the digital transceiver slices 2104.1-2104.N via any suitable number and/or type of wired or wireless links, which may include wired buses configured to carry digital baseband data streams to and from the digital transceiver slices 2104.1-2104.N.

In any event, the DFE 2102 may include any suitable number and/or type of components configured to perform functions known to be associated with digital front ends. For example, the DFE 2102 may be implemented as processing circuitry, portions of processing circuitry, one or more portions of an on-board chip having dedicated digital front end functionality (e.g., a digital signal processor), etc. For example, the DFE 2102 may provide digital baseband data to each of the digital transceiver slices 2104.1-2104.N for transmission via a respectively coupled antenna, as further discussed below.

To provide another example, the DFE 2102 may facilitate receiving digital baseband data from each of the digital transceiver slices 2104.1-2104.N, which may be processed to recover data included in wireless data transmissions. To do so, the DFE 2102 may be implemented with decimators and components suitable to perform reconfigurable computing (e.g., a virtual reconfigurable circuit (VRC)), as well as processing circuitry configured to perform receive impairment correction such as DC offset correction, IQ imbalance correction, and ADC skew. To provide additional examples, the DFE 2102 may further facilitate adjacent channel rejection (ACR) filtering, receiver digital gain control (DGC), down-sampling, etc.

To provide yet additional examples, the DFE 2102 may facilitate transmission of digital baseband data via each of the digital transceiver slices 2104.1-2104.N. To do so, the DFE 2102 may be implemented with interpolators and a VRC coupled to the each digital transceiver slice 2104.1-2104.N. Moreover, the DFE 2102 may include other components associated with data transmission such as, for instance, transmitter impairment correction such as LO correction, IQ imbalance, digital pre-distortion (DPD) calculation, correction factor (CF) calculation, and pre-emphasis (pre. emp.) calculation. To provide additional examples, the DFE 2102 may facilitate transmitter DGC, up-sampling, zero crossing detection algorithms, phase modulation, etc.

Additionally, aspects include the DFE 2102 being implemented with components suitable to perform beam management, digital blocker cancelation, received signal strength indicator (RSSI) measurements, DPD and calibration accelerators, test signal generation, etc.

In any event, aspects include the DFE 2102 selectively performing specific functions based upon the operating mode of the receiver design 2100. In particular, and as further discussed below, the DFE 2102 may dynamically work in conjunction with the digital transceiver slices 2104.1-2104.N to facilitate digital or analog beamforming at any particular time based upon the operating mode of the digital transceiver slices 2104.1-2104.N.

In an aspect, the receiver design 2100 may include digital phase-locked loop circuitry (DPLL) 2150, which may be functionally identical to or otherwise identified with the PLL 202, DPLL 1202, and DPLL 1602.1, as discussed herein with reference to FIGS. 2, 12, and 16, respectively. More-over, aspects include the DPLL 2150 generating a clock signal 2151, which is distributed to the frequency multiplier/shifter circuitry 2106 and phase generation circuitry 2108. Therefore, aspects include the phase generation circuitry 2108 being identified with, for instance, the phase selection block 1306 as shown in FIG. 13, or the phase generation blocks 1620.1, 1620.2, as shown in FIG. 16, depending on the particular implementation of the FM-RFDAC 2112. In other words, aspects include the FM-RFDAC 2110 being identified with, for example, the FM-RFDACs 1210, as shown in FIG. 12, or the U and V RF-RFDACs 1610, as shown in FIG. 16. In other aspects, the FM-RFDAC 2112 may be implemented as any known RFDAC design. In any event, the phase generation circuitry 2108 may include additional components not shown in FIG. 21 for purposes of brevity (e.g., DTC 1204 and block 1208, as shown in FIG. 12, phase-shifting blocks 1602.3 and 1602.4, as shown in FIG. 16, etc.).

Again, the receiver design 2100 includes any suitable number N of transceiver slices 2104. In an aspect, each of the transceiver slices 2104 has a separate transmit and receive path. For purposes of brevity and ease of explanation, each transceiver slice 2104 is shown throughout the Figures in this section as being coupled to a single respective antenna. However, In various aspects, each transceiver slice 2104 may be coupled to any suitable number of antennas, low noise amplifiers, etc., in any suitable configuration to facilitate transmitting and receiving data in accordance with a phased array antenna architecture.

With continued reference to FIG. 21, the transceiver slice 2104.N may be representative of each of the transceiver slices 2104.1-2104.N and implement a transmit path including a TX slice DFE 2110 that is coupled to the FM-RFDAC 2112. The FM-RFDAC 2112 is, in turn, coupled to an antenna N via the switching component 2114, which may represent any suitable type of component(s) to facilitate TX and RX mode switching. In an aspect, the transmit path of each transceiver slice 2104 may include a TX slice DFE 2110, which functions to provide additional DFE functionality on a per-transmit chain basis (i.e., a separate TX DFE 2110 may be implemented for each transceiver slice 2104). The additional DFE functionality includes, for example, interpolation, digital predistortion, I/Q compensation and gain control, etc.

Moreover, aspects include each transceiver slice 2104 also including a receive path coupled to the switching component 2114, which is shown in greater detail with regards to the transceiver slice 2104.N and further discussed below. For example, the receive path may include one or more amplifiers 2116, frequency multiplier/shifter circuitry 2106, one more mixers 2118, I/Q ADC and baseband filter circuitry 2120, and an RX slice DFE 2122. Again, aspects include each transceiver slice 2104 implementing a separate receive path, each having components similar to those represented by the transceiver slice 2104.N as shown in FIG. 21. Thus, aspects further include each of the components associated with the receive path being independently controlled on a per-receive chain basis (i.e., each transceiver slice 2104 may have a receive path with components that are separately controlled from one another).

To facilitate the aspects described herein, the frequency multiplier circuitry 2106 may function to provide quadrature LO signals within the receive path of each transceiver slice 2104. In an aspect, the frequency multiplier/shifter circuitry 2106 may be identified with or otherwise function substantially as the LO generation units 204, as shown in FIG. 2. For example, as shown in FIG. 2, the LOG units 204.1-204.K are associated with each respective receiver chain RX-1-RX-K. In an aspect, the frequency multiplier/shifter circuitry 2106 associated with each transceiver slice 2104.1-2104.N may be identified with each separate LOG unit 204.1-204.K.

In other words, each transceiver slice 2104 may be configured to separately generate a respective set of quadrature LO signals using the frequency multiplier/shifter circuitry 2106 by leveraging the LO clock signal 2151 generated by the DPLL 2150, which may have a frequency set to a desired sub-harmonic of the output quadrature LO signals, as discussed herein with reference to the receiver design 200. Thus, the frequency multiplier/shifter circuitry 2106 may include additional components to ensure the generation of quadrature LO signals in this manner, which are not reproduced in FIG. 21 for purpose of brevity. For instance, the frequency multiplier/shifter circuitry 2106 may include phase control circuitry (e.g., phase control block 208), amplitude control circuitry (e.g., amplitude control block 210), a delay-locked loop (e.g., DLL 206.1), phase configuration circuitry (e.g., phase configuration circuitry 206.2), amplitude configuration circuitry (e.g., amplitude configuration circuitry 206.3), one or more resonant loads (e.g., resonant load 206.4), etc.

As further discussed below, the frequency multiplier/shifter circuitry 2106 may dynamically facilitate frequency multiplication, phase-shifting, or both, regarding the quadrature LO signals provided to the mixers 2118, depending on the particular mode of beamforming (i.e., digital or analog) in which each digital transceiver slice 2104 is currently operating. In any event, aspects include the mixers 2118 utilizing the appropriate set of quadrature LO signals to downsample the received signals provided by the amplifier 2116 to provide baseband I/Q signals, and pass these baseband I/Q signals to the I/Q ADCs and baseband filter circuitry 2120. The I/Q ADCs and baseband filter circuitry 2120 may further pass the digital signals, which have been filtered in the baseband, to the RX slice DFE 2122 included in the receive path of each digital transceiver slice 2104. The RX slice DFE 2122 may function, for example, to provide DFE functionalities such as decimation filters, I/Q compensation and DC offset cancellation, etc., on a per receive chain basis.

For example, and as further discussed below with reference to digital beamforming, the I/Q ADCs and baseband filter circuitry 2120 associated with each respective transceiver slice 2104 may receive downsampled data from the output of each of the respective mixers 2118 (i.e., the mixers associated with the same transceiver slice 2104). To provide another example, and as further discussed below with reference to analog beamforming, the I/Q ADCs and baseband filter circuitry 2120 associated with one of the transceiver slices 2104.1-2104.N may receive a sum of downsampled data from each of the respective mixers 2118 (i.e., the mixers associated with the other transceiver slices 2104). In this way, by controlling the quadrature LO generation at each digital transceiver slice 2104, each digital transceiver slice 2104 may be separately and dynamically reconfigured into either a digital or analog beamforming mode, or a hybrid of both digital and analog beamforming modes (e.g., simultaneously and/or concurrently), as further discussed below.

Figure 22:
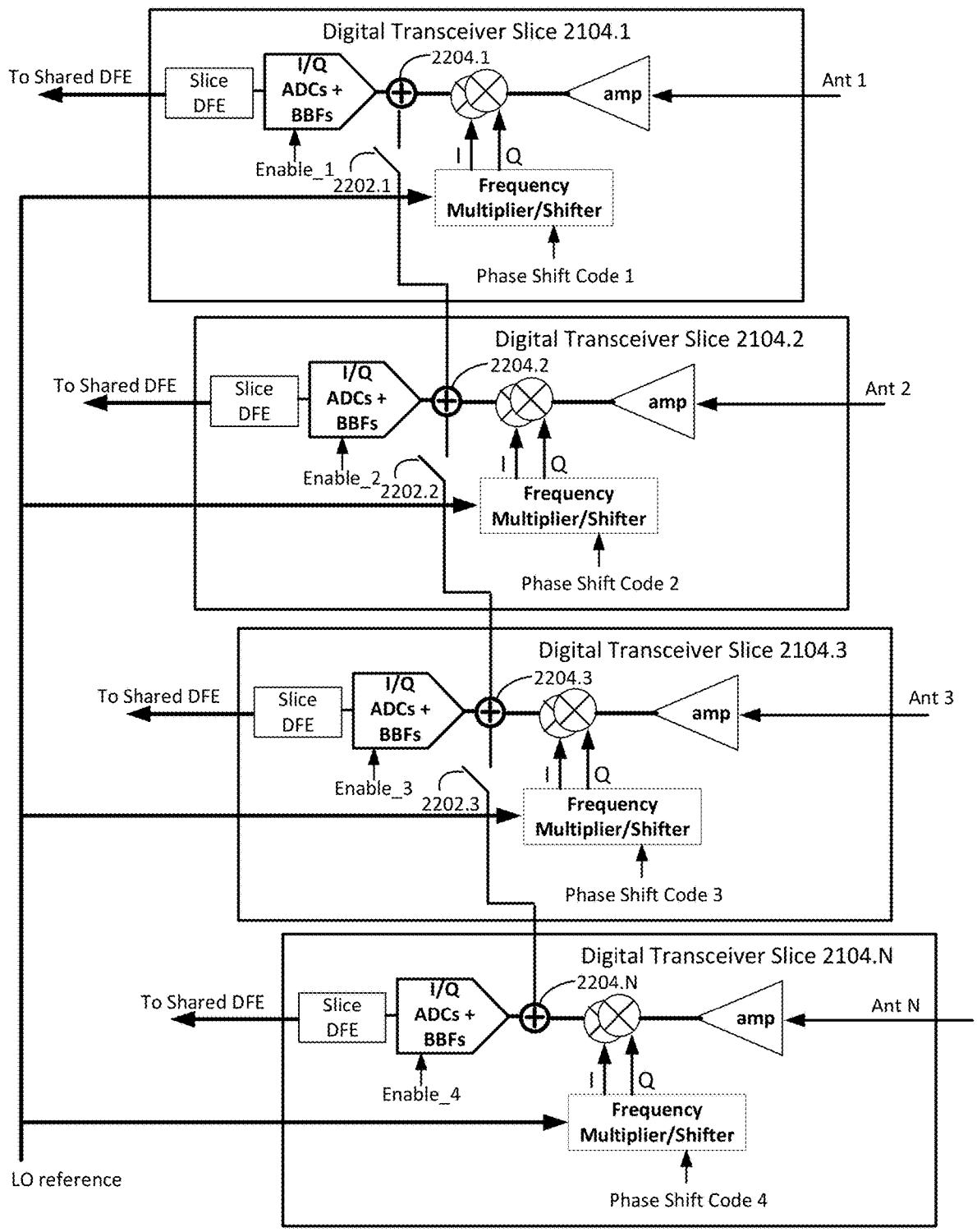
FIG. 22 illustrates a block diagram of an exemplary hybrid receive path implementation, in accordance with an aspect of the disclosure.

FIG. 22 illustrates a block diagram of an exemplary hybrid receive path implementation, in accordance with an aspect of the disclosure. The hybrid receiver design 2200 as shown in FIG. 22 provides additional detail with respect to the receiver paths for each of the digital transceiver slices 2104.1-2104.N, as shown in FIG. 21. For purposes of brevity, the components associated with the transmit path have been omitted in FIG. 22, and the switching component 2114 is assumed to be in a state associated with each of the digital transceiver slices 2104 operating in a receiving mode. Moreover, components shown in FIG. 22 that are common to those in FIG. 21 are not relabeled in FIG. 22, and the reference numbers from FIG. 21 are reused where applicable.

In an aspect, each frequency multiplier/shifter circuitry 2106 associated with each respective digital transceiver slice 2104 may receive digital data control signals, which are not shown in FIG. 21 for purposes of brevity. These digital data control signals may, for example, represent a desired phase shift to be applied by each frequency multiplier/shifter circuitry 2106 to the clock signals 2151 generated by the DPLL 2150. For example, the digital data control signals may be those as discussed herein with reference to the phase control block 208 and/or the amplitude control block 210, depending upon the particular implementation of the frequency multiplier/shifter circuitry.

Again, the frequency multiplier/shifter circuitry may be identified with the LO generation units 206 as shown in FIG. 2, and thus the digital data control signals may carry the appropriate data signals (e.g., phase control, amplitude control) so as to implement the generation of the desired LO signals as discussed in the previous section with reference to LOG units 700 or 800, for instance, as discussed herein with reference to FIGS. 7 and 8. Accordingly, the phase shift control lines may ensure, when phase shifting is utilized, that the quadrature LO signals have the proper frequency and phase associated with downconversion of the received signal via each of the digital transceiver slices 2104.1-2104.N.

As shown in FIG. 22, aspects include each of digital transceiver slices 2104.1-2104.3 implementing a respective switching component 2202.1-2202.3. In various aspects, switching components 2202.1-2202.3 may be implemented as any suitable type and/or number of components configured to control a state of coupling between each of the digital transceiver slices 2104 as shown in FIG. 22. Although not shown in FIG. 22 for purposes of brevity, each of the switching components 2202.1-2202.3 may be coupled to a control line that may be implemented as one or more wired and/or wireless links. Processing circuitry not shown in FIG. 22, which may be associated with one or more processor components of the receiver design 2200, for instance, as further discussed herein, may individually control a switching state of each of respective switching component 2202.1-2202.3.

In an aspect, each of the digital transceiver slices 2104.1-2104.N also includes a respective summation block 2204.1-2204.N, which may be implemented using any suitable type of circuitry, registers, etc., to facilitate the summation and/or combination of signals to which each summation block 2204 is coupled. Thus, when each of the switching components 2202.1-2202.3 is in the closed state, the mixer outputs from each of digital transceiver slices 2104.1-2104.3 are combined via the summation blocks 2204.1-2204.N and fed into the I/Q ADCs and baseband filter circuitry 2120 of the digital transceiver slice 2104.N, as shown and further discussed with reference to FIG. 23. However, when each of the switching components 2202.1-2202.3 is in the open state, the mixer outputs from each of digital transceiver slices 2104.1-2104.3 are separated and fed into the I/Q ADCs and baseband filter circuitry 2120 of each respective digital transceiver slice 2104.1-2104.N, as shown and further discussed with reference to FIG. 24.

In an aspect, the I/Q ADCs and baseband filter circuitry 2120 associated with each respective digital transceiver slice 2104.1-2104.N may be coupled to a separate enable control line (e.g., enable_1, enable_2, enable_3, and enable_4). These control lines may be configured to carry data signals to separately control the state of one or more components associated with the I/Q ADCs and baseband filter circuitry 2120 that is associated with each respective transceiver slice 2104. In doing so, the one or more components associated with each I/Q ADCs and baseband filter circuitry 2120 may be set as being active (i.e., enabled) or inactive (i.e., disabled). Processing circuitry not shown in FIG. 22, which may be associated with one or more processor components of the receiver design 2200, for instance, as further discussed herein, may individually control the state of each of these enable control lines. These control lines may, for instance, be asserted to different digital logic values to trigger the aforementioned enabled or disabled states. In an aspect, the state of the I/Q ADCs and baseband filter circuitry 2120 may be controlled in conjunction with the switching components 2202.1-2202.3 based upon a particular beamforming mode of operation, as further discussed below with reference to FIGS. 23 and 24.

Figure 23:
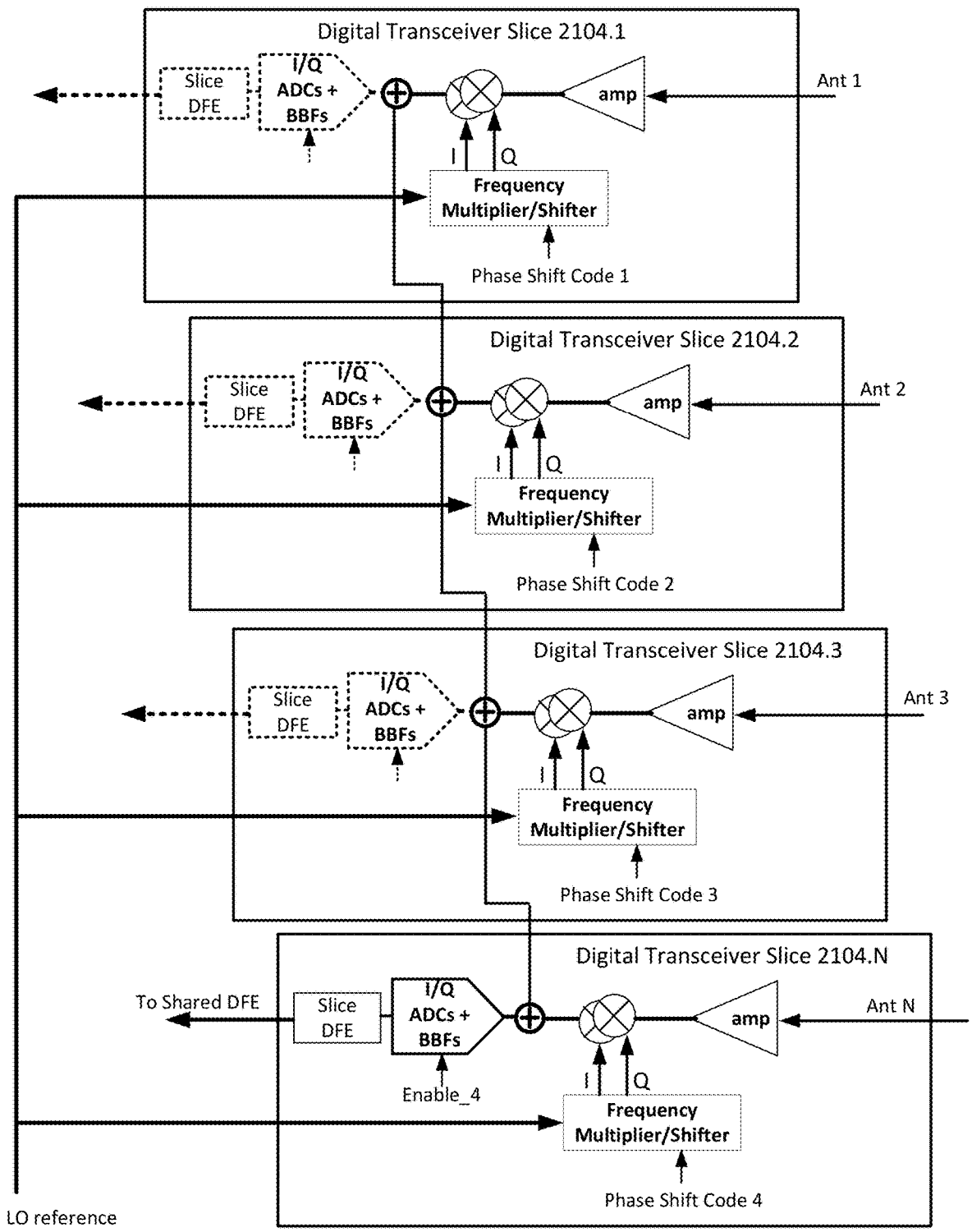
FIG. 23 illustrates a block diagram of an exemplary hybrid receiver operating in a fully analog beamforming mode, in accordance with an aspect of the disclosure.

FIG. 23 illustrates a block diagram of an exemplary hybrid receiver operating in a fully analog beamforming mode, in accordance with an aspect of the disclosure. The receiver design 2300 shown in FIG. 23 is identical to the receiver design 2200 as shown in FIG. 22, and therefore common components have not been renumbered in FIG. 23 for clarity. However, the receiver design 2300 indicates that each of the switching components 2202.1-2202.3 as shown in FIG. 22 are in the closed state, connecting the mixer output of each digital transceiver slice 2104.1-2104.N to one another via the summation blocks 2204.1-2204.N.

In other words, when each of the switching components 2202.1-2202.3 as shown in FIG. 22 is in the closed state, the mixer outputs from each of digital transceiver slices 2104.1-2104.3 are combined via the summation blocks 2204.1-2204.3 and fed into the I/Q ADCs and baseband filter circuitry 2120 of the digital transceiver slice 2104.N. Thus, the configuration shown in FIG. 23 may be identified with a "full" analog beamforming mode. In an aspect, the full analog beamforming configuration of the receiver design 2300 may facilitate quadrature LO phase shifting via the frequency multiplier/shifter circuitry 2106 associated with each digital transceiver slice 2104.1-2104.N. In this configuration, LO phase shifting is not performed within the RF path, advantageously preventing additional loss.

With continued reference to FIG. 23, when configured as a full analog beamforming mode receiver, I/Q ADCs and baseband filter circuitry 2120 associated with those digital receiver slices 2104 for which the switching component 2202 have been closed are also disabled. For example, as shown in FIG. 23, the enable control lines enable_1, enable_2, and enable_3 are switched to a logic state or otherwise instruct the respective I/Q ADCs and baseband filter circuitry 2120 for each of digital transceiver slices 2104.1-2104.3 (and their respective RF slice DFEs) to be disabled. In contrast, the enable_4 control line is switched to a logic state or otherwise instructs the I/Q ADCs and baseband filter circuitry 2120 associated with the digital transceiver slice 2104.N to be enabled. As a result, for a full analog beamforming mode, only one ADC is enabled, while the switching components 2204 are closed to connect each baseband mixer output together.

Aspects include each of the I/Q ADCs and baseband filter circuitry 2120 for each of the digital transceiver slices 2104.1-2104.N being assigned to a single beam within the beamforming pattern. In other words, although each of the digital transceiver slices 2104.1-2104.3 receives data associated with the same beam, the received data may be combined into the digital transceiver slice 2104.N when only a single beam is utilized, thus allowing the receiver to operate in an analog beamforming mode. Because one ADC is typically implemented per beam, this advantageously enables a low power mode, which may be particularly useful, for example, when one beam is needed for communications. As further discussed below with reference to FIG. 24, the switches may be controlled in conjunction with the enable control lines to dynamically reconfigure the receiver paths to provide partial or full digital beamforming.

Figure 24:
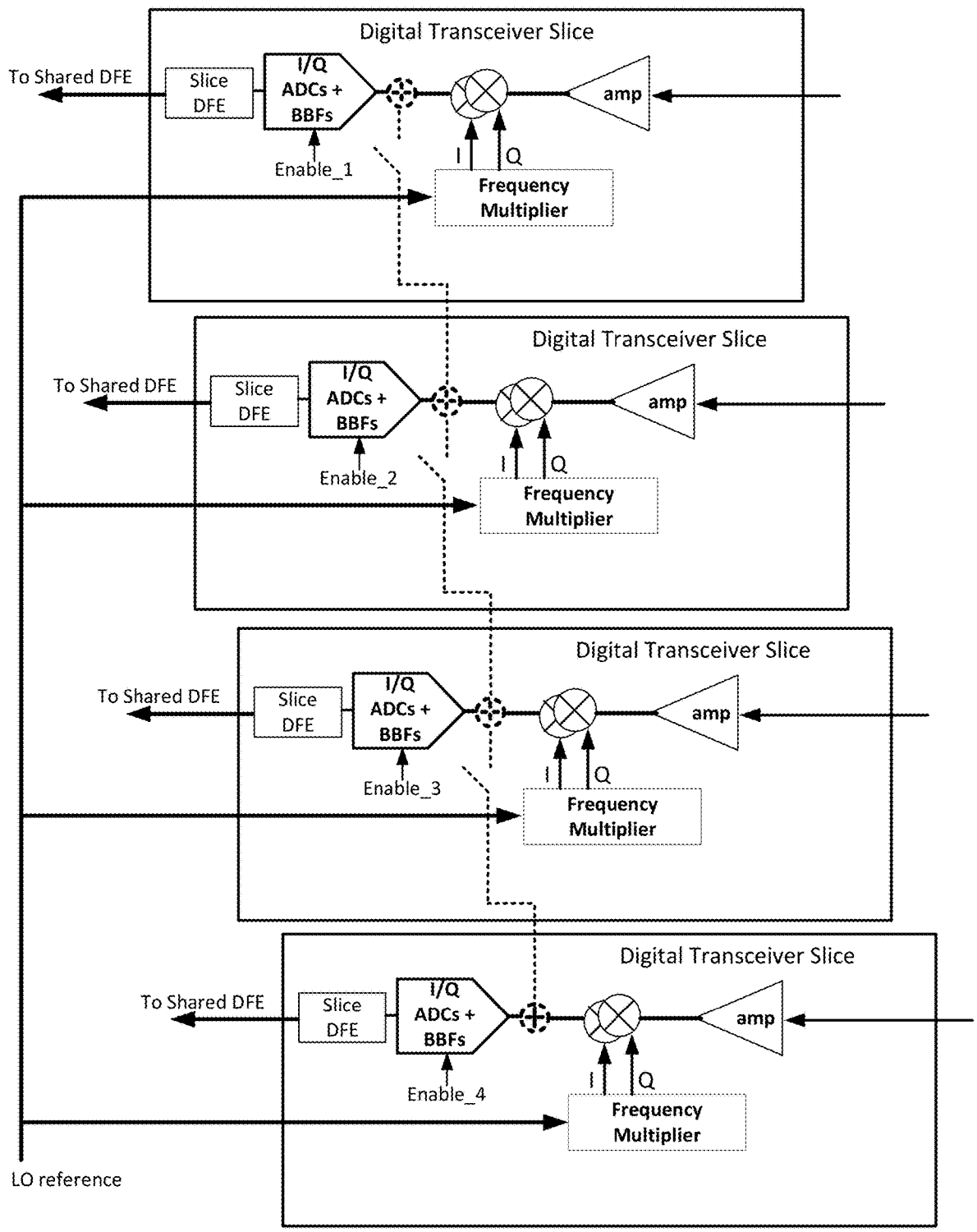
FIG. 24 illustrates a block diagram of an exemplary hybrid receiver operating in a fully digital beamforming mode, in accordance with an aspect of the disclosure.

FIG. 24 illustrates a block diagram of an exemplary hybrid receiver operating in a fully digital beamforming mode, in accordance with an aspect of the disclosure. The receiver design 2400 shown in FIG. 24 is identical to the receiver design 2200 as shown in FIG. 22, and therefore common components have not been renumbered in FIG. 24 for clarity. However, the receiver design 2400 indicates that each of the switching components 2202.1-2202.3 as shown in FIG. 22 are in the open state, thereby separating the mixer outputs of each digital transceiver slice 2104.1-2104.N from one another.

In the configuration as shown in FIG. 24, the mixer output from each respective digital transceiver slice 2104.1-2104.N is coupled to each respective I/Q ADCs and baseband filter circuitry 2120, and subsequently to each RX slice DFE 2122. Thus, the configuration shown in FIG. 24 may be identified with a "full" digital beamforming mode, which may be facilitated, in aspects, within the digital domain as a result of each receiver chain being connected to an ADC and RX DFE slice. With reference to FIG. 21, the shared DFE 2102 may receive the digital data streams subsequent to processing via each separate RX DFE 2122 associated with each respective digital transceiver slice 2104.1-2104.N. In particular, the beams may be generated using the shared DFE 2102 by adding digital phase rotations to each received digital data stream.

Therefore, aspects include the full digital beamforming configuration as shown in FIG. 24 providing quadrature LO signals (via the frequency multiplier/shifter circuitry 2106 associated with each digital transceiver slice 2104.1-2104.N) that are equal in phase. In other words, for full digital beamforming configurations, the digital beamforming is managed in the shared DFE 2102, and the digital transceiver slices 2104.1-2104.N need not provide phase shifting of the signals received via each digital transceiver slice 2104 with respect to one another. As a result of this configuration, the frequency multiplier/shifter circuitry 2106 associated with each digital transceiver slice 2104.1-2104.N may provide frequency multiplication functionality with generated quadrature LO at each digital transceiver slice 2104, but not provide phase shifting. In an aspect, the shared DFE 2102 may receive the digital data streams from each of digital transceiver slices 2104.1-2104.N and perform digital beamforming in accordance with any known techniques.

Because the I/Q ADCs and baseband filter circuitry is active for each digital transceiver slice 2104 in full digital beamforming configurations, this mode is associated with the highest power consumption mode. However, the full digital beamforming mode may facilitate advantageous features such as fast beam acquisition and tracking by scanning all directions simultaneously. Furthermore, full digital beamforming may facilitate other desirable features such as nulling, for instance. In particular, for digital transceiver slices 2104 that are configured to perform digital beamforming (even if not all digital transceiver slices 2104.1-2104.N are implemented in this manner and others are combined into an analog beamforming mode), simultaneous communications may be enabled via spatial channels, as the beams may provide simultaneous communications in several different directions and/or with different devices (e.g., different base stations). Moreover, the simultaneous use of multiple beams may advantageously allow for spatial filtering, in that directions known to be associated with blocker signals or other interference sources may be quickly identified and then actively avoided while maintaining communications using beams in other directions.

To provide an illustrative example of the advantages provided by the dynamic re-configurability of the aspects described in this section, the hybrid digital receiver design 2200 may be implemented in a UE such as a mobile device that uses a single beam for communications with a base station. On initialization (e.g., device power on, after a connection has been lost and needs to be reestablished, etc.), the hybrid digital receiver design 2200 may transition to the full digital beamforming mode as shown in FIG. 24. During the full digital beamforming mode, four spatial beams may be simultaneously acquired over a range of overall space corresponding to a sphere, for instance, or a suitable portion thereof. Upon identifying which of these four beams is preferred (e.g., the strongest RSSI, lowest signal to noise ratio, highest quality of service, etc.), and that beam's direction, the hybrid digital receiver design 2200 may then transition to the full analog beamforming mode as shown in FIG. 23. During the full analog beamforming mode, the beam direction identified in the full digital beamforming mode may be reproduced using the quadrature LO phase shift provided by the frequency multiplier/shifter circuitry 2106 associated with each digital transceiver slice 2104.1-2104.N. In this way, the dynamic and reconfigurable hybrid digital receiver aspects described in this section strike a balance between power and performance at different times, allowing for each to be optimized when it is most desirable to do so based upon current operating conditions.

Although the hybrid digital receiver may dynamically switch between the full analog and full digital aspects as described herein, the aspects are not limited to just these full digital and full analog aspects. In other aspects, the hybrid digital receiver may enable other modes in-between. For example, digital transceiver slices 2104.1, 2104.2 may operate in a digital beamforming mode, whereas digital transceiver slices 2104.3, 2104.N may operate in an analog beamforming mode. In other words, if some of the digital beamforming features are desired but not worth the full power penalty, aspects include enabling half (or other suitable portion thereof) of the ADCs (i.e., for each receiver chain) and using LO phase shifting on the other half (or other portion). Such configurations may be particularly useful, for instance, if more than one beam is needed (e.g., two in the above example), with each beam utilizing a separate set of phase paths.

Moreover, aspects include the number of ADCs, and the receive chains connected to them, being dynamically allocated via control of the switching components 2201. To provide another illustrative example, a scenario may include the use of two separate beams, with one beam being strong (e.g., a high RSSI value), and the other being much weaker (e.g., a lower RSSI value). In this case, a higher number of digital transceiver slices 2104.1-2104.N may be allocated to the beam having the weaker signal by closing the switching components 2201.1-2202.3, allowing the signals from a greater number of antenna elements to be summed together to compensate for the lower signal strength.

The architecture of the hybrid digital receiver as shown and described throughout this section is not limited to the examples shown in the Figures. For instance, aspects include utilizing any suitable number of digital transceiver slices 2104 in a configuration that allows for dynamic reconfiguration between analog and digital beamforming modes. For example, the hybrid digital receiver design 2200 may be modified to include less or additional digital transceiver slices 2104 (e.g., 2, 4, 8, 16, 32, 64, 128, etc.). To provide another example, any suitable number of different sets of digital transceiver slices 2104 may be implemented within a single receiver design. To provide an illustrative example, the hybrid digital receiver design 2200 may include one set of digital transceiver slices 2104.1-2104.N as shown in FIGS. 22-24, and a separate set of digital transceiver slices 2104.1-2104.M (not shown) that are separately controlled, and which may interface with the shared DFE 2102 or a separate DFE. In such a case, the numbers N and M of digital transceiver slice sets may be the same or different than one another.

In yet additional aspects, each of the digital transceiver slices 2104.1-2104.N may include more than one ADC within the I/Q ADCs and baseband filter circuitry 2120. In accordance with such aspects, these additional ADCs may be configured, for example, in a lower resolution mode such as via the implementation of successive approximation (SCR) ADCs, for example. Such implementations may be particularly advantageous, for instance, to allow for fewer interleaved ADC's to be enabled among the digital transceiver slices 2104.1-2104.N, further reducing power requirements.

Figure 25:
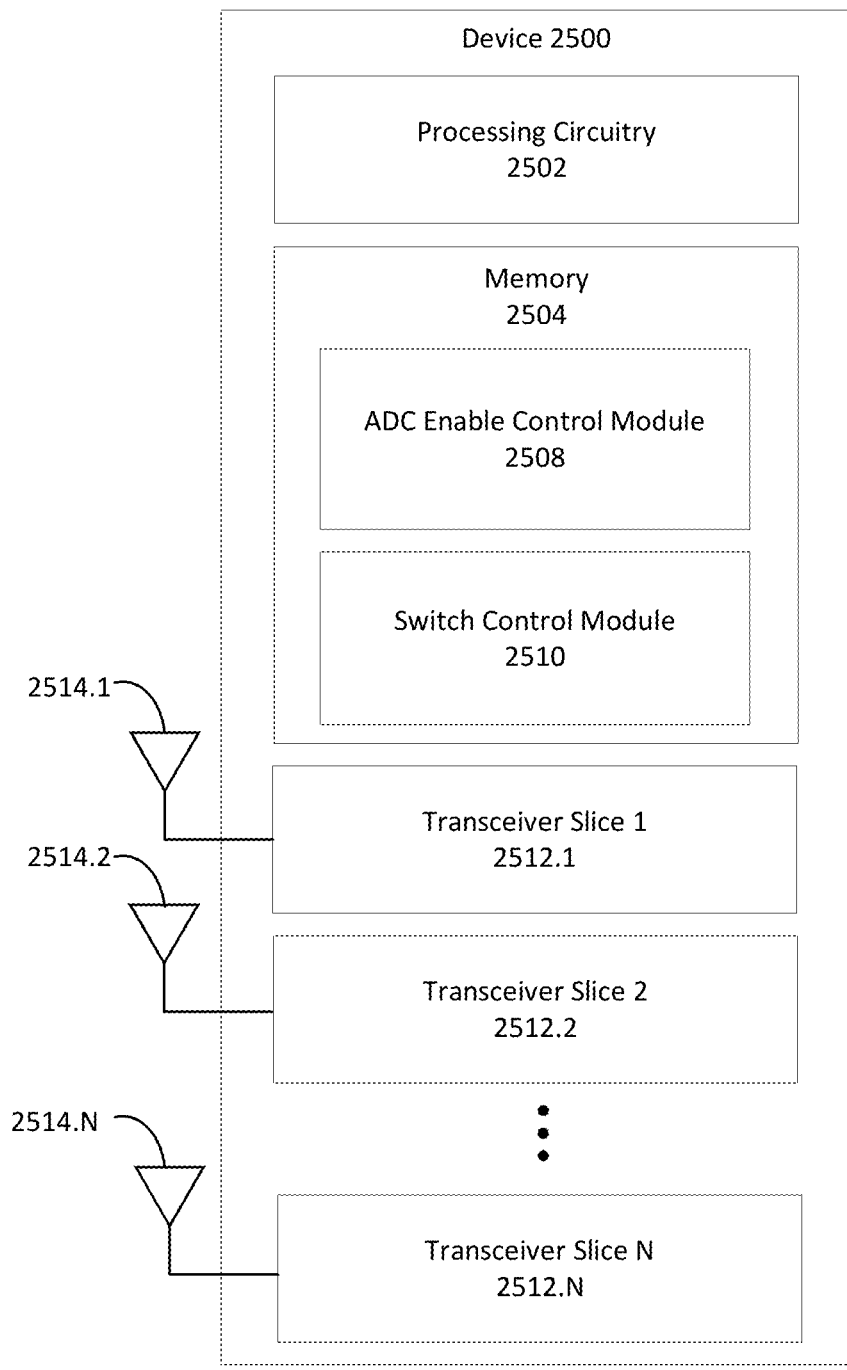
FIG. 25 illustrates a block diagram of an exemplary device, in accordance with an aspect of the disclosure.

FIG. 25 illustrates a block diagram of an exemplary device in accordance with an aspect of the disclosure. In various aspects, device 2500 may be implemented as any suitable type of device configured to transmit and/or receive wireless signals in accordance with any suitable number and/or type of communication protocols. For instance, the device 2500 may be implemented as a user equipment (UE) such as a mobile phone, tablet, laptop computer, etc. To provide additional examples, the device 2500 may be implemented as an access point or base station. The device 2500 may implement one or more aspects as described herein to facilitate transmitting wireless signals in accordance with a particular frequency or band of frequencies, such as mm-wave frequencies, for example, as further described herein.

In an aspect, the device 2500 may include processing circuitry 2502, a memory 2504, and any suitable number N of transceiver slices or chains 2512.1-2512.N, each being coupled to one or more respective antennas 2514.1-2514.N. The components shown in FIG. 25 are provided for ease of explanation, and aspects include device 2500 including additional, less, or alternative components as those shown in FIG. 25. For example, device 2500 may include one or more power sources, display interfaces, peripheral devices, ports, etc.

In an aspect, the various components of device 2500 may be identified with functionality further described herein with reference to the dynamic reconfiguration of digital and analog beamforming systems. Each of the transceiver slices 2512.1-2512.N may be identified with a respective one of the transceiver slices 2104.1-2104.N discussed, for example, with reference to receiver design 2200 as shown in FIG. 22.

Aspects include the processing circuitry 2502 being configured as any suitable number and/or type of computer processors, which may facilitate control of the device 2500 as discussed herein. In some aspects, processing circuitry 2502 may be identified with a baseband processor (or suitable portions thereof) implemented by the device 2500. In other aspects, the processing circuitry 2502 may be identified with one or more processors implemented by the device 2500 that are separate from the baseband processor (e.g., one or more digital signal processors, one or more processors associated with a DFE, etc.). In still other aspects, the functionality of the device 2500 may be combined with that discussed herein with reference to device 1000. Additionally or alternatively, aspects include the various functions discussed herein with reference to device 2500 being performed by one or more components associated with device 1000.

In any event, aspects include the processing circuitry 2502 being configured to carry out instructions to perform arithmetical, logical, and/or input/output (I/O) operations, and/or to control the operation of one or more components of the device 2500. For example, the processing circuitry 2502 can include one or more microprocessors, memory registers, buffers, clocks, etc. Moreover, aspects include processing circuitry 2502 communicating with and/or controlling functions associated with the memory 2504 and/or the transceiver slices 2512.1-2512.N. This may include, for example, controlling and/or arbitrating transmit and/or receive functions of the device 2500, facilitating analog and/or digital beamforming, controlling the configuration of the device 2500 to operate in full digital beamforming mode, full analog beamforming mode, or a combination of both digital and analog beamforming modes, performing one or more baseband processing functions (e.g., media access control (MAC), encoding/decoding, modulation/demodulation, data symbol mapping, error correction, etc.).

In an aspect, the memory 2504 stores data and/or instructions such that, when the instructions are executed by the processing circuitry 2502, the processing circuitry 2502 performs the various functions described herein. The memory 2504 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 2504 can be non-removable, removable, or a combination of both.

For example, the memory 2504 may be implemented as a non-transitory computer readable medium storing one or more executable instructions such as, for example, logic, algorithms, code, etc. As further discussed below, the instructions, logic, code, etc., stored in the memory 2504 are represented by the various modules as shown in FIG. 25, which may enable the aspects disclosed herein to be functionally realized. The modules shown in FIG. 25 are provided for ease of explanation regarding the functional association between hardware and software components. Thus, aspects include the processing circuitry 2502 executing the instructions stored in these respective modules in conjunction with one or more hardware components to perform the various functions associated with the aspects as further discussed herein. Again, the modules shown in FIG. 25 are for ease of explanation with regards to the aspects described in this section of the disclosure. Of course, the functionality explained with reference to the modules shown in FIG. 25 may also be performed by the modules shown in FIG. 10, or a combination of both the modules shown in FIG. 10 and those shown in FIG. 25.

In an aspect, the executable instructions stored in ADC enable control module 2508 may facilitate, in conjunction with the processing circuitry 2502, the device 2500 enabling and disabling specific I/Q ADCs and baseband filter circuitry 2120 based upon the beamforming mode of operation of the device 2500. This may be facilitated, for example, via the processing circuitry sending the appropriate signals via the enable control lines, as shown and discussed herein with reference to FIG. 22. In an aspect, the appropriate signals and/or logic states may be selected based upon any suitable calculation in accordance with the appropriate identified beamforming mode, such as a lookup table, for example.

In an aspect, the executable instructions stored in switch control module 2510 may facilitate, in conjunction with the processing circuitry 2502, the device 2500 controlling the state of the switching components 2202 based upon the beamforming mode of operation of the device 2500. This may be facilitated, for example, via the processing circuitry sending the appropriate signals via the control lines coupled to these switching components, as shown and discussed herein with reference to FIG. 22. In an aspect, the appropriate signals and/or logic states may be selected based upon any suitable calculation in accordance with the appropriate identified beamforming mode, such as a lookup table, for example.

Section V—Flexible Digital Pre Distortion (DPD) Implementation in a Digital Transmitter The aspects described within this section generally relate to transceivers and, more particularly, to transceiver designs using flexible digital pre distortion (DPD) implementations.

Transmitter designs utilizing analog phased arrays are relatively complex, as many transmitter chains are typically implemented, with each having differing impairments that need to match if the same RF signal is to be used for all chains. Moreover, for transmitters implementing fully digital beamforming systems, the area and power associated with DPD performance is multiplied by the number of antennas in the array. As a result, conventional DPD implementation in transmitters with phased array architectures are very complex, require significant processing power, and consume a great deal of power for operation.

As discussed herein, transceiver designs may implement phased arrays to facilitate beamforming to adapt to channel conditions. Current designs have been directed to either digital or analog beamforming in accordance with such systems. But, as noted above, conventional digital beamforming solutions are power and processor intensive, and therefore analog beamforming is sometimes implemented as an alternative. Analog beamforming transmitters may represent a reduction in power and processing over digital solutions, but utilize the same RF signal for each of the transmit chains, and each chain may not be identical in terms of linearity. Thus, as discussed above, digital pre-distortion is conventionally introduced into the baseband signal to compensate for these non-idealities and/or imbalances, but needs to be applied uniformly to all transmit chains in the phased array, as the signal originates from a single source. Thus, any mismatch between the transmit chains implemented in the phased array will adversely impact pre-distortion performance, resulting in lower error vector magnitude (EVM) or efficiency.

In an attempt to match the linearity profiles among each of the transmit chains, gain trimming has been leveraged to normalize the input 1-dB compression point (IP1 dB) among transmit chains. If no trimming is done, the transmit chains will not match, and the DPD can actually harm performance. With trimming, some improvement is possible, but the output power among each transmit chain with respect to one another still may not match, creating beam skew. And even with trimming, the transmit chains will not perfectly match one another, especially when external power amplifiers (PAs) are introduced into the system, which introduce further mismatches among transmit chains that may be difficult to predict and compensate for. Therefore, conventional analog beamforming systems are plagued by performance issues regardless of whether gain trimming is implemented.

Therefore, to address the issues present in conventional beamforming solutions, the aspects disclosed in this section of the disclosure are directed to transceiver implementations that utilize a distributed and reconfigurable DPD, which saves power and provides other benefits. To do so, as further discussed in the various aspects presented within this section, digital resources are shared when possible and chain-specific hardware is enabled when poor matching among the transmit chains is identified (e.g., mismatches identified via individual transmit chain feedback is above an established threshold). Moreover, the aspects described throughout this section may disable transmit chain-specific hardware when DPD is not necessary or fully needed to meet predetermined requirements. The aspects may be realized, for instance, using a DPD that is partitioned into a shared DPD common to each of the transmit chains and a distributed DPD that is specific to each transmit chain. As further discussed in this section, because power consumption is proportional to the number of taps, aspects may include the DPD having a reconfigurable number of taps that may be dynamically adjusted as needed to optimize power and performance.

For instance, the aspects described throughout this section allow for optimal power consumption at all times, allowing high performance when needed but not paying a power penalty when performance is not needed. This facilitates, for example, supporting higher levels of transmit output power in an efficient manner while also providing high efficiency at lower transmit output powers. This may is particularly advantageous for power-constrained applications, such as transceivers implementing mm-wave frequencies, for example.

In the aspects discussed herein with regards to the previous section and FIGS. 21-25, techniques were disclosed to utilize digital transceiver slices to enable fully digital beamforming, fully analog beamforming, or hybrid beamforming in which some transceiver slices are configured to perform each type. The aspects described in this section further leverage the use of this transceiver slice configuration, with each transmit chain and receive chain being associated with a separate antenna or group of antennas within the phased array system. In particular, the aspects described herein exploit the use of a per-chain digital front end (DFE) in conjunction with a shared DFE architecture, and further utilize each receiver chain to gather feedback regarding the performance and linearity of each respective transmit chain to which that particular receiver chain is paired. Moreover, the use of per-chain DFEs allows for DPD to be customized based upon the detected transmit chain feedback from each transceiver slice, and to perform DPD on a per-transmit chain basis such that the shared DFE and/or the slice DFEs may perform DPD functions based upon the level of mismatch between transmit chains, as well as other factors.

Thus, the aspects described in this section may utilize the same digital transceiver architecture discussed in the previous section with regards to FIGS. 21-25, with additional modifications as further noted below with reference to FIGS. 26-29. Furthermore, any of the aspects described herein with reference to the receive chains discussed in the previous section with respect to FIGS. 21-25 (as well as any other suitable aspects described herein) may also be implemented in combination with the aspects shown and described with reference to FIGS. 26-29. However, the aspects described below focus in further detail on the transmit paths to implement DPD on a per-transceiver slice basis as opposed to the aspects described with respect FIGS. 21-25, which are directed to the receive paths.

Figure 26:
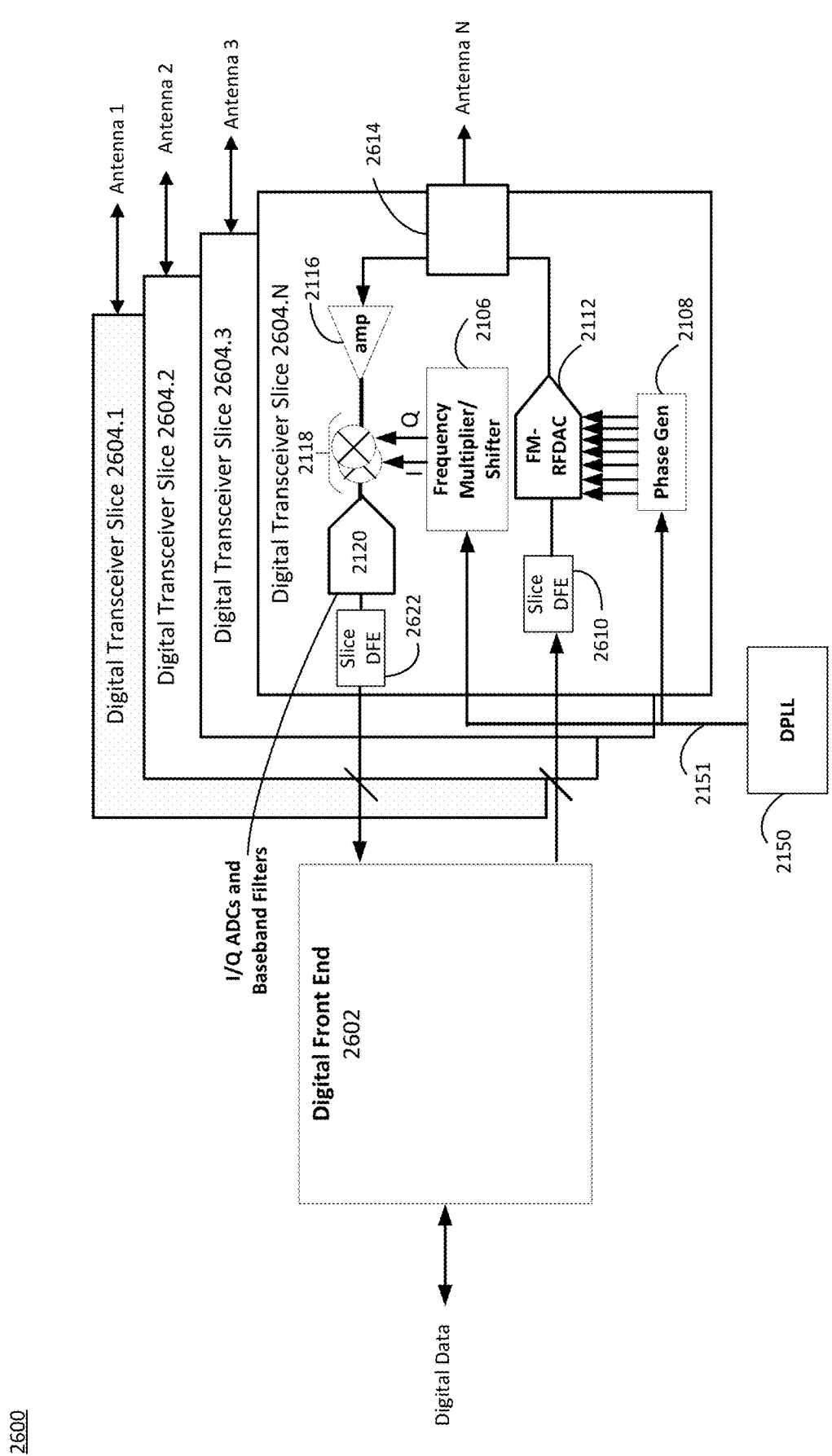
FIG. 26 illustrates a block diagram of an exemplary transceiver design, in accordance with an aspect of the disclosure.

FIG. 26 illustrates a block diagram of an exemplary transceiver design, in accordance with an aspect of the disclosure. The transceiver design 2600 as shown in FIG. 26 operates in a similar manner and shares several components with the transceiver design 2100, as shown in FIG. 21. Therefore, only differences between these aspects are shown and further described herein, which represent additional modifications from the architecture (e.g., hardware, circuitry, firmware, software, etc.) previously discussed above with reference to FIGS. 21-25. Moreover, for purposes of brevity, the same reference numerals used with regards to FIGS. 21-25 are repeated in FIGS. 26-29 where applicable, which indicates that the components function and are otherwise substantially similar or identical to the previously-described components with reference to FIGS. 21-25.

For instance, as shown in FIG. 26, aspects include the transceiver design 2600 implementing a shared DFE 2602, which operates in a similar manner as the shared DFE 2102 as described and shown, for example, in FIG. 21. As further discussed herein, the shared DFE 2602, however, may provide additional or alternate functionality with regards to processing and executing DPD. To do so, the shared DFE 2602 is coupled to any suitable number N of digital transceiver slices 2604.1-2604.N. These digital transceiver slices 2604.1-2604.N may likewise operate in a similar manner as the digital transceiver slices 2104.1-2104.N as described and shown, for example, in FIG. 21. Moreover, and as further discussed herein, the digital transceiver slices 2604.1-2604.N may provide additional or alternate functionality with regards to processing and executing DPD. In various aspects, this additional functionality may be facilitated via the DFEs 2610, 2622 associated with a respective digital transceiver slice 2604, as discussed in further detail below.

In an aspect, the switching component 2614 may be implemented with any suitable number and/or type of switches to facilitate TX and RX mode switching for each respective digital transceiver slice 2604.1-2604.N, as discussed herein with reference to the switching component 2114 shown in FIG. 21. However, aspects further include the switching component 2614 facilitating a "sampling mode." As further discussed directly below with reference to FIG. 27, during this sampling mode a digital transceiver slice 2604 may monitor or sample the transmitter output to obtain transmitter output feedback via the input to the antenna associated with that particular digital transceiver slice. In doing so, aspects allow for the receive path to be utilized at certain time periods as a feedback path so that DPD may be calibrated and calculated on a per-transmit path basis for each antenna (or group of antennas, as the case may be).

Figure 27:
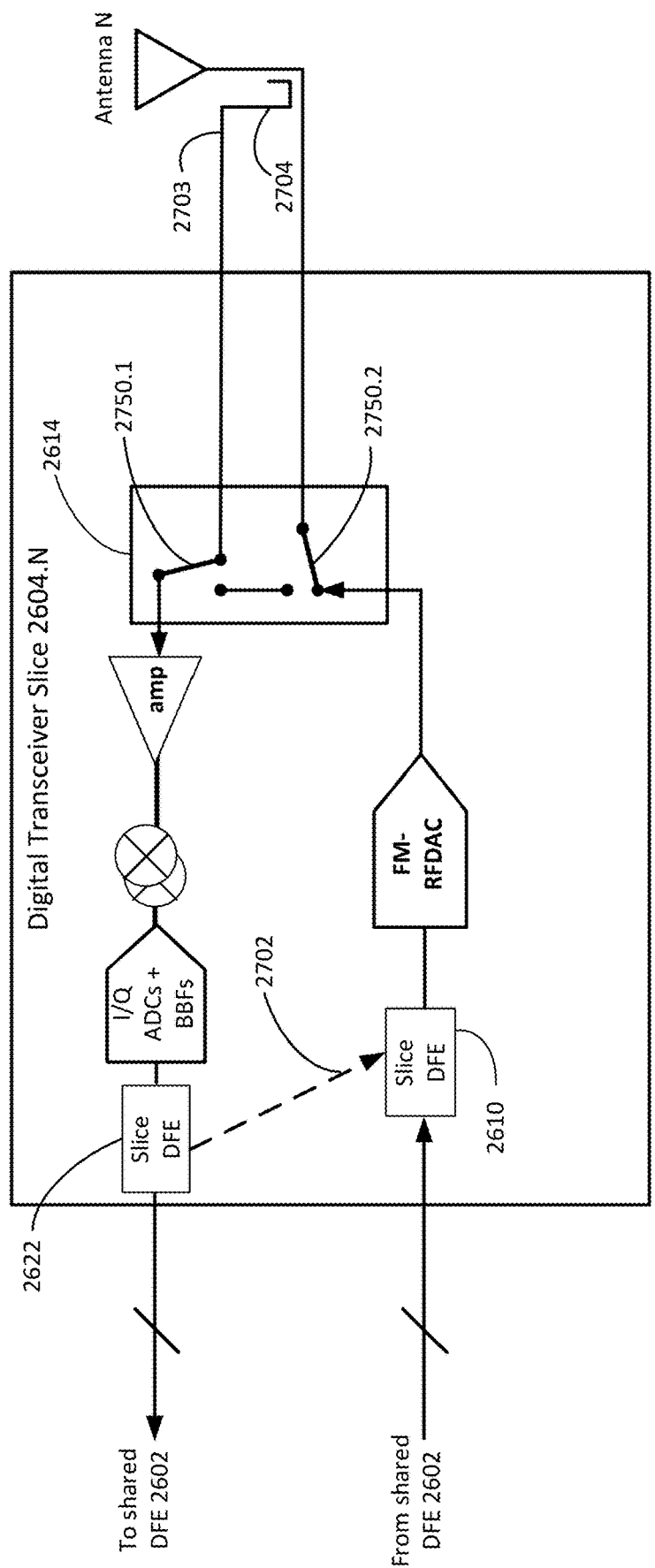
FIG. 27 illustrates a block diagram showing additional details of an exemplary transceiver slice implementation, in accordance with an aspect of the disclosure.

FIG. 27 illustrates a block diagram showing additional details of an exemplary transceiver slice implementation, in accordance with an aspect of the disclosure. The example transceiver slice 2604.N may be representative of each of the transceiver slices 2604.1-2604.N, as shown in FIG. 26, with each implementing a transmit path including a TX slice DFE 2610 that is coupled to the FM-RFDAC 2112. The FM-RFDAC 2112 is, in turn, coupled to an antenna N via the switching component 2614, which is positioned as shown in FIG. 27 to facilitate a transmit mode of operation. In an aspect, the TX slice DFE 2610 may include substantially similar or identical components, and function in a substantially similar or identical manner as, for example, the TX slice DFE 2110 as shown and described herein with reference to FIG. 21. However, aspects further include the TX slice DFE 2610 providing DPD on a per-transmit chain basis (i.e., a separate TX DFE 2610 may be implemented for each transceiver slice 2604.1-2604.N).

Moreover, aspects include each transceiver slice 2604 also implementing a receive path coupled to the switching component 2614, which is further discussed below. As shown in FIG. 27, the receive path may include an RX slice DFE 2622. In an aspect, the RX slice DFE 2622 may include substantially similar or identical components, and function in a substantially similar or identical manner as, for example, the RX slice DFE 2122 as shown and described herein with reference to FIG. 21. However, aspects further include the RX slice DFE 2622 calculating DPD on a per-receive chain basis (i.e., a separate RX DFE 2622 may be implemented for each transceiver slice 2604.1-2604.N).

To do so, the switching component 2614 may function to selectively couple the receive path to one of the antenna N or a sampling path 2703 associated with the antenna N. Of course, the digital transceiver slice 2604.N may include additional components that have been omitted for brevity and ease of explanation. For instance, the digital transceiver slice 2604.N may include additional internal or external power amplifiers (PAs) coupled in line with the antenna and the transmit and/or receive path, one or more PAs coupled in line with the sampling path 2703, additional switching blocks, etc., to ensure that transmit and receive signals are properly coupled between the transmit path, the receive path, the sampling path 2703, and the antenna N, and that these signals are appropriately conditioned for transmission or reception.

With continued reference to FIG. 27, aspects include the switching component 2614 including any suitable number of switches to couple signals between the receive path, the transmit path, the sampling path 2703, and the antenna N. For instance, as shown in FIG. 27, the switching component 2614 includes two switches 2750.1, 2750.2. Although the switches 2750.1, 2750.2 are depicted in FIG. 27 as single-pole, single-throw switches, various aspects includes the switches 2750.1, 2750.2 being implemented as any suitable type of switching component, such as electrical switches (e.g., transistor elements), mechanical switches, etc., to ensure the proper coupling between the receive path, the transmit path, the sampling path 2703, and the antenna N as needed.

To provide an illustrative example, in a transmit mode, the switch 2750.1 may be in either position, whereas the switch 2750.2 may be in a position as shown in FIG. 27. Continuing this example, both switches 2750.1, 2750.2 may change their positions from those shown in FIG. 27 to facilitate receiving mode, thus coupling the receive path (e.g., via the amplifier 2116) to the antenna N. To provide yet another example, in a sampling mode, the switches 2750.1, 2750.2 may each be in the positions shown in FIG. 27, thereby coupling the transmit path to the antenna N and the receive path to the sampling path 2703. The sampling path 2703 is shown in FIG. 27 as terminating in a coupler 2704 that is configured to sample an input power provided to the antenna N, which may include the output signal generated via the transmit path that is coupled to the antenna N for signal transmission, for example. Although depicted in FIG. 27 as a coupler, the coupler 2704 may be implemented in accordance with any suitable type and number of components to facilitate sampling of the transmitted output signal. For example, the coupler 2704 may be implemented as a directional coupler.

As discussed with regards to the polar transmitter design aspects described with reference to FIGS. 11-15, as well as the quadrature transmitter design aspects described with reference to FIGS. 16-20, the aspects described herein advantageously leverage per-transmit chain DPD solutions. Aspects may also include the application of pre-distortion on per-chain basis using a conventional transmit chain with a digital-to-analog converter (DAC) and mixer. Again, to accomplish per-transceiver chain DPD solutions, the aspects described herein include each digital transceiver slice 2604 utilizing a separate FM-RFDAC 2112. In other words, the aspects described herein utilize an architecture implementing per-transceiver slice FM-RFDACs 2112, which facilitate per-transmit chain DPD via the amplitude and phase modulation applied by each FM-RFDAC 2112, as discussed herein. For example, DPD may be implemented for a particular transmitter architecture (e.g., polar or quadrature) as the inverse of the non-linearity of the transceiver chain (e.g., a transmit and receive chain associated with a single digital transceiver slice 2604) to which the DPD is applied. The application of DPD may include, for instance, the use of digital signal processing (DSP) of the digital samples utilized by each respective transceiver chain (e.g., amplitude and phase or I/Q). To do so, the aspects described herein implement the DPD for a phased array by partitioning DPD functionality into the shared DFE 2602 and the individual TX and RX slice DFEs 2611, 2622. Again, in an aspect, the shared DFE 2602 is common to each of the transmit and receive chains (i.e., common to each digital transceiver slice 2604), whereas the individual TX and RX slice DFEs 2611, 2622 are associated with each respective digital transceiver slice 2604. As a result of this DFE-partitioned architecture, aspects include advantageously applying digital correction to each transmit chain by leveraging the digital beamforming architecture utilizing the FM-RFDAC 2112 on each transmit chain.

For example, aspects include each digital transceiver slice 2604 switching into the sampling mode in accordance with any suitable period and/or schedule to obtain feedback data 2702 with regards to the transmitter output at each antenna. In various aspects, the feedback data 2702 may be utilized for power management and/or to determine the non-linearity for a particular transceiver slice so that the inverse can be applied to the incoming samples, as discussed above. With reference to the digital transceiver slice 2604.N as shown in FIG. 27, this feedback data 2702 may be received and processed via the RX slice DFE 2622, and then utilized by the TX slice DFE 2610 to perform DPD calibration via the calculation of DPD coefficients. This may include, for instance, transmitting the data from the RX slice DFE 2622 to the TX slice DFE 2610 via any suitable number of wired and/or wireless links, which are not shown in FIG. 27 for purposes of brevity. Additionally or alternatively, aspects include the feedback data 2702 being transmitted to the shared DFE 2602, which may process the feedback data 2702 and/or transmit the feedback data 2702 to the TX slice DFE 2610. In any event, this process may be performed via each of the digital transceiver slices 2604.1-2604.N. In an aspect, the feedback data 2702 may thus be utilized (e.g., via the shared DFE 2602, the RX slice DFE 2622, and/or the TX slice DFE 2610) to dynamically update the coefficients (e.g., amplitude and phase weights) applied by the FM-RFDAC 2112 for each digital transceiver slice 2604.

The use of the shared DFE 2602 in conjunction with the RX and TX slice DFEs 2610, 2622 may be particularly advantageous, for example, to reduce power consumption compared to traditional transceiver designs. To provide an illustrative example, the bulk of power consumption of the transceiver design 2600 may be associated with the shared DFE 2602 under many conditions, as the non-linearity of the transmit chains within each of the digital transceiver slices 2604.1-2604.N will generally match one another. As a result, under such conditions, the majority of DPD correction can be performed in the shared DFE 2602 (i.e., the DPD correction to be applied equally to each of the digital transceiver slices 2604.1-2604.N).

In accordance with known DPD techniques, DPD may be calculated via any suitable number of memory and/or filter taps, each of which may be implemented via the shared DFE 2602, the RX slice DFE 2622, and/or the TX slice DFE 2610, which are not shown in FIG. 27 for purposes of brevity. Aspects include any suitable portion of these memory and/or filter taps being implemented in either the shared DFE 2602, the RX slice DFE 2622, and/or the TX slice DFE 2610.

However, because these taps and their associated DPD calculations require a high level of processing power, which in turn incurs increased power consumption, aspects include advantageously allocating a greater number of the memory and/or filter taps to the shared DFE 2602 compared to those implemented via the RX slice DFE 2622 and/or the TX slice DFE 2610. Moreover, to facilitate DPD calculations, the number of the memory and/or filter taps may be dynamically allocated (e.g., between the shared DFE 2602, each of the RX slice DFEs 2622, and/or each of the TX slice DFEs 2610) depending on the amount of non-linearity and/or mismatch among the transceiver slices 2604.1-2604.N. Moreover, aspects include this dynamic tap allocation being performed based upon the amount of power amplifier "memory effect" being cancelled.

Although the aspects described herein are mainly described with reference to utilizing per-transceiver chain DPD to correct for mismatches in the non-linearity among the each of the digital transceiver slices 2604.1-2604.N, the aspects are not limited to only this particular example. In various aspects, the per-transceiver chain DPD implemented herein may be utilized to correct for any differences between transmit chains by using the feedback data 2702 to calibrate each transmit path, and repeating this process by recalculating DPD coefficients until a desired performance is achieved (e.g., when a suitable metric is within a predefined range, above and/or below an established threshold value, etc.). For instance, the differences that may be corrected on a per-transmit chain basis may arise from process mismatch, differences in supply and ground potential, non-identical antenna routing, antenna placement within the array, temperature gradients, VSWR differences on antennas, etc.

Because the differences in non-linearity between transmit paths should be smaller than the absolute non-linearity, the correction in the distributed DPD (i.e., the DPD calculations calculated via the RX slice DFE 2622 and/or the TX slice DFE 2610 and applied via the FM-RFDAC 2112) should typically be much less as compared to the overall DPD correction calculated via the shared DFE 2602 (e.g., 1%, 5%, 10% thereof, etc.). However, similar to the shared DFE 2620, aspects include the amount of memory and/or taps associated with the RX slice DFE 2622 and/or the TX slice DFE 2610 being dynamically enabled and disabled depending on the amount of correction that is needed. In other words, as opposed to analog beamforming where there is only a single DAC shared by each of the transmit chains, the aspects described herein advantageously allow for an arbitrarily large mismatch between transmit chains to exist while still maintaining a high level of transceiver performance. For example, in a conventional analog beamforming case with a single DAC, power amplifier (PA) performance is limited to the average or even the lowest performing transmitter in the array.

Moreover, using the feedback data 2702 received via each of the transceiver slices 2604.1-2604.N, the differences between each of the transceiver slices 2604.1-2604.N may be identified with regards to any suitable metric, such as those described above, for example. In doing so, aspects include the transceiver design 2600 comparing the differences between each transmit chain based upon these measured metric values. Further in accordance with such aspects, if the differences between each of the transceiver slices 2604.1-2604.N are small enough (e.g., below a predefined threshold value for that particular metric), then the RX slice DFEs 2622 and/or the TX slice DFEs 2610 may be disabled (e.g., shut down or unused) to further save power, allowing the shared DFE 2602 to manage the DPD calculations. Furthermore, aspects include the RX slice DFEs 2622 and/or the TX slice DFEs 2610 associated with particular transceiver slices 2604.1-2604.N being disabled when respectively measured metrics indicate an individual deviation (i.e., for that particular transceiver slice as opposed to a difference between transceiver slices) from a nominal or predefined value that is less than a predefined value.

To provide yet another example, aspects include the transceiver design 2600 (e.g., via one or more processors or associated circuitry, as discussed herein with reference to FIG. 29 for example) grouping the transceiver slices 2604.1-2604.N based upon the degree of deviation from a metric and/or non-linearity measurement. As a result of this grouping, any suitable number of similar transceiver slices may be grouped together to form any suitable number of groups. For instance, common transceiver slices 2604 having a measured metric and/or non-linearity within 5%, 10%, 15%, etc., of a predefined value may be identified as similar to one another with regards to their respective measured metrics, and therefore be considered part of the same group. Continuing this example, aspects include selectively powering down and/or disabling the DPD functions for RX slice DFEs 2622 and/or the TX slice DFEs 2610 associated with particular transceiver slice groups (e.g., each of those identified as being within 5% of a predefined value or one another), while maintaining and/or enabling the DPD functions for the RX slice DFEs 2622 and/or the TX slice DFEs 2610 for other transceiver slice groups (e.g., those identified as matching in excess of 5% of the predefined value or one another).

The phased array system used in accordance with the aspects described herein utilize amplitude tapering of the signal on the outer elements of the array to improve antenna pattern characteristics, such as reducing side-lobes, for example. Using digital beamforming, a digital phased array may be implemented to apply fine resolution amplitude and phase differences to each of the antenna elements, as discussed herein with regards to the various implementations of the FM-RFDAC 2112, for example.

With the aspects described throughout this section, the distributed, per-transmit chain DPD may advantageously function to maintain the correction on non-linearities over each of the N antenna elements. Again, the aspects describe in this section allow the transmit power at each antenna element to be measured as feedback. Because a larger (amplitude) signal is typically utilized in the center antenna elements of the array as noted above, aspects include utilizing this feedback to apply additional DPD correction to the inner antenna elements (via respectively coupled transceiver slices 2604), while disabling DPD correction associated with the outer antenna elements. In this way, using the feedback to control the DPD correction to individual transmit chains and their respectively coupled antenna elements may be leveraged to save power, as it may be unnecessary in light of the additional power back-off associated with the outer antenna elements as noted above.

Another advantage realized by the per-transceiver chain DPD correction described in this section is that the characteristic of one or more transmit chains may be used to cancel non-linearities of others. For example, each of FIGS. 28A-C illustrates a grouping of four antenna elements 2802.1-2802.4. In an aspect, each of these antenna elements 2802.1-2802.4 may be coupled to or otherwise associated with each of the transceiver slices 2604.1-2604.N, respectively, as shown in FIG. 27. As shown in FIG. 28A, each of the antenna elements 2802.1-2802.4 is associated with an amplitude weighting for each antenna's respectively transmitted signal. As an example, the transmit chain associated with each of the transceiver slices 2604.1-2604.N may attempt to amplitude-weight each antenna element by an equal amount, although differences among transmit chains caused by non-linearity and/or other mismatches among the transceiver slices 2604.1-2604.N and/or the antenna elements themselves may skew the intended beam pattern, producing the beam pattern 2810.

Thus, aspects include DPD correction being applied by each of the transceiver slices 2604.1-2604.N to compensate for these differences, as shown in FIG. 28B. As a result, the resulting amplitude weighting for each antenna element is equal, thus correcting the beam skew as shown in the beam pattern 2810 of FIG. 28A to produce the beam pattern 2820 as shown in FIG. 28B. However, as long as the aggregate beam pattern is pointing in the correct direction (i.e., is not skewed), some or all of the individual transmit chains used to generate the resulting beam pattern may be non-linear. That is, because feedback data 2702 may be collected at each receive chain and used for DPD correction on a transmit chain basis, non-linearities and/or other mismatches among the transceiver slices 2604.1-2604.N may be exploited such that, for certain transceiver slice arrangements it may be more economic in terms of processing and power consumption to reduce the applied DPD correction as long as the entire antenna array is pointing in the correct direction.

In other words, DPD correction may be reduced, or not performed, for transceiver slices 2604 that have opposing characteristics, thus leaving such transmit chains largely uncorrected, allowing them to cancel out one another with regards to the aggregate beam pattern that is formed. For example, the beam pattern 2830 shown in FIG. 28C is substantially equivalent to the beam pattern 2820 as shown in FIG. 28B. However, beam patterns 2820 and 2830 may be identified with different "solutions" with regards to the amplitude weighted taper associated with the antenna elements 2802.1-2802.4. Although the amplitude taper in FIG. 28B is uniform, the amplitude taper shown in FIG. 28C is less so, while the same beam pattern is achieved in either case. Thus, by "accepting" some of the mismatches between transceiver slices 2604.1-2604.N, the beam pattern 2830 may be generated in a manner that requires less DPD correction be applied to the transceiver slices 2604.1-2604.N associated with the beam pattern 2810 than the DPD correction required to generate the beam pattern 2820. Furthermore, such aspects may provide advantages in that additional linear transmit chains are allowed to transmit additional power, whereas non-linear transmit chains may utilize additional back-off as long as the beam power can be directed correctly (e.g., by adding correction along lines of symmetry in the array to balance the higher power transmitters).

To provide yet an additional example of the benefits realized by per-transceiver chain aspects DPD described in this section, aspects include PAs for some antenna elements being powered using different supply voltages than others. To provide an illustrative example, lower power PAs may be implemented for antenna elements along the outer part of the antenna array, as these elements typically transmit at a lower power than the central antenna elements as discussed above. The use of a lower supply voltage may also be advantageous in that it provides increased efficiency. Accordingly, aspects include PAs with a lower saturation point P_SAT having a boosted supply to increase the P_SAT. Without DPD correction being applied on a per-transmit chain basis as discussed herein, the distortion created via the use of differing power supplies would be too extreme to effectively manage via a common DFE.

FIG. 29 illustrates a block diagram of an exemplary device in accordance with an aspect of the disclosure. In various aspects, device 2900 may be implemented as any suitable type of device configured to transmit and/or receive wireless signals in accordance with any suitable number and/or type of communication protocols. For instance, the device 2900 may be implemented as a user equipment (UE) such as a mobile phone, tablet, laptop computer, etc. To provide additional examples, the device 2900 may be implemented as an access point or base station. The device 2900 may implement one or more aspects as described herein to facilitate transmitting wireless signals in accordance with a particular frequency or band of frequencies, such as mm-wave frequencies, for example, as further described herein.

In an aspect, the device 2900 may include processing circuitry 2902, a memory 2904, and any suitable number N of transceiver slices or chains 2912.1-2912.N, each being coupled to one or more respective antennas 2914.1-2914.N. The components shown in FIG. 29 are provided for ease of explanation, and aspects include device 2900 including additional, less, or alternative components as those shown in FIG. 29. For example, device 2900 may include one or more power sources, display interfaces, peripheral devices, ports, etc.

In an aspect, the various components of device 2900 may be identified with functionality further described herein with reference to the dynamic application of DPD. Each of the transceiver slices 2912.1-2912.N may be identified with a respective one of the transceiver slices 2604.1-2604.N discussed, for example, with reference to the transceiver design 2600 as shown in FIG. 26.

Aspects include the processing circuitry 2902 being configured as any suitable number and/or type of computer processors, which may facilitate control of the device 2900 as discussed herein. In some aspects, processing circuitry 2902 may be identified with a baseband processor (or suitable portions thereof) implemented by the device 2900. In other aspects, the processing circuitry 2902 may be identified with one or more processors implemented by the device 2900 that are separate from the baseband processor (e.g., one or more digital signal processors, one or more processors associated with a shared or transceiver slice DFE, etc.). In still other aspects, the functionality of the device 2900 may be combined with that discussed herein with reference to device 2100, which in turn may have functionality combined with that discussed herein with reference to device 1000, as discussed above. Additionally or alternatively, aspects include the various functions discussed herein with reference to device 2900 being performed by one or more components associated with device 1000 and/or the device 2500.

In any event, aspects include the processing circuitry 2902 being configured to carry out instructions to perform arithmetical, logical, and/or input/output (I/O) operations, and/or to control the operation of one or more components of the device 2900. For example, the processing circuitry 2902 can include one or more microprocessors, memory registers, buffers, clocks, etc. Moreover, aspects include processing circuitry 2902 communicating with and/or controlling functions associated with the memory 2904 and/or the transceiver slices 2912.1-2912.N. This may include, for example, controlling and/or arbitrating transmit and/or receive functions of the device 2900, facilitating the measurement of feedback data from one or more transceiver slice receive paths, using the feedback data to calibrate the transmit path associated with one or more transceiver slice receive paths, determining a desired beam shape and/or direction, calculating the DPD coefficients for one or more of the one or more transceiver slice paths, controlling the state of the device 2500 to operate in a receiving mode, transmit mode, or sampling mode at various times, performing one or more baseband processing functions (e.g., media access control (MAC), encoding/decoding, modulation/demodulation, data symbol mapping, error correction, etc.), identifying groupings of transceiver slices for DPD management, as well as any other suitable functions to carry out the functionality associated with the aspects as described herein.

In an aspect, the memory 2904 stores data and/or instructions such that, when the instructions are executed by the processing circuitry 2902, the processing circuitry 2502 performs the various functions described herein. The memory 2904 can be implemented as any well-known volatile and/or non-volatile memory, including, for example, read-only memory (ROM), random access memory (RAM), flash memory, a magnetic storage media, an optical disc, erasable programmable read only memory (EPROM), programmable read only memory (PROM), etc. The memory 2904 can be non-removable, removable, or a combination of both.

For example, the memory 2904 may be implemented as a non-transitory computer readable medium storing one or more executable instructions such as, for example, logic, algorithms, code, etc. As further discussed below, the instructions, logic, code, etc., stored in the memory 2904 are represented by the various modules as shown in FIG. 29, which may enable the aspects disclosed herein to be functionally realized. The modules shown in FIG. 29 are provided for ease of explanation regarding the functional association between hardware and software components. Thus, aspects include the processing circuitry 2902 executing the instructions stored in these respective modules in conjunction with one or more hardware components to perform the various functions associated with the aspects as further discussed herein. Again, the modules shown in FIG. 29 are for ease of explanation with regards to the aspects described in this section of the disclosure. Of course, the functionality explained with reference to the modules shown in FIG. 29 may also be performed by the modules shown in FIG. 10 or 25 with respect to devices 1000, 2500, respectively, or a combination of any of the modules associated with devices 1000, 2500.

In an aspect, the executable instructions stored in calibration control module 2908 may facilitate, in conjunction with the processing circuitry 2902, the device 2900 periodically placing one or more of the transceiver slices 2912.1-2912.N into a sampling mode to measure the feedback data 2702 regarding the transmitted output power of a respectively coupled antenna 2914.1-2914.N. This may be facilitated, for example, via the processing circuitry 2902 sending appropriate signals via one or more control lines (not shown) to control the state of a switching component, as discussed herein with reference to the switching component 2604 as shown in FIG. 27. In an aspect, the switching mode may be utilized in accordance in with any suitable schedule to periodically update the DPD calibration for one of more of the one or more of the transceiver slices 2912.1-2912.N. For example, aspects include this period coinciding with each data transmission, or the sampling mode being triggered during a portion of each data transmission, after a certain period of time has elapsed since a predetermined number of previous transmissions, etc.

In an aspect, the executable instructions stored in the DPD control module 2910 may facilitate, in conjunction with the processing circuitry 2902, the device 2900 performing various functions related to DPD. For example, aspects include the executable instructions stored in the DPD control module 2910 determining mismatches due to non-linearities or other characteristics among the transceiver slices 2912.1-2912.N using the feedback data acquired via each transceiver slice receive path. Moreover, the executable instructions stored in the DPD control module 2910 may allow the processing circuitry 2902 to determine whether the shared DFE (e.g., shared DFE 2602) or the individual slice DFEs (e.g., RX slice DFE 2622, TX slice DFE 2610) should perform execute DPD calculations and their subsequent application via each transmit path using the feedback data. In any event, the executable instructions stored in the DPD control module 2910 may facilitate the processing circuitry 2902 calculating the DPDs that are then applied via the FM RF-DAC (e.g., FM RF-DAC 2112) to realize per-transceiver chain DPD correction, as discussed herein.

Section VI—Filter and Matching Networks for CMOS Processes

The aspects described within this section generally relate to passive radio frequency (RF) components and, more particularly, to stacked and coupled transmission-line architectures to realize passive RF components in accordance with complementary metal oxide semiconductor (CMOS) manufacturing processes.

For high-frequency transceiver applications such as communications using the 5G or millimeter-wave (mmW) bands, it is desirable to enable operation of multiple bands simultaneously. However, because of size and interface restrictions, cabling between the transceiver and RF head is very limited. Current solutions typically utilize a single coax cabling solution to carry several combined signals using a combiner and splitter architecture. These solutions also require the use of bandpass filters and matching networks, which are implemented with reactive components such as capacitors and inductors to ensure proper transceiver performance. Often these structures must be implemented external to the Radio Frequency Integrated Circuits (RFICs) within the RF head.

But current CMOS process kits typically include Metal Oxide Metal (MoM) and/or Metal Insulator Metal (MiM)

capacitors, which have a high variation with process. The high process variation associated with MoM and MiM capacitors causes undesirable traits when implemented within a transceiver design, such as causing filter response shifts that reduces out-of-band selectivity. As a result, the use of MoM and MiM capacitors in current transceiver designs is problematic, particularly with regards to higher frequency applications.

As mentioned above, wireless devices typically utilize filters and/or matching network components, which typically utilize capacitor components that are implemented with MoM and/or MiM capacitors. Again, the disadvantage of MoM and MiM capacitors is the high variation of the capacitors with process. Moreover, such solutions are not naturally robust to electrostatic discharge (ESD). Inductive or coupled inductor devices on chip are more robust to process and ESD but are costly in terms of their area on die. Furthermore, these devices are often quite lossy and degrade performance. Given the limitations of inductors and capacitors on a modern RFIC, it is often necessary to implement filter structures externally.

Moreover, other solutions include the use of non-magnetically coupled resonator filter topology in which a traditional filter solutions can be used, but no magnetic coupling between the inductors is desired. In this approach, the inductors must be sufficiently spaced so that they do not couple to each other. As a result, this solution becomes costly in area and further requires high-Q components. Furthermore, the implementation of any required capacitors within such circuits still suffers from the high variation to process as discussed above.

To overcome these issues, the aspects described throughout this section are directed to passive components implementing a stacked and coupled transmission line structure and coupled-inductor topology that bridges the gap between filter design and matching network design. This enables a novel implementation of multiplexer and matching networks with prescribed out-of-band selectivity in typical modern CMOS processes.

FIG. 30 illustrates a block diagram showing an example board-to-board interconnect, in accordance with an aspect of the disclosure. As shown in FIG. 30, the interconnection 3000 may include an RF head 3002 and a transceiver 3004 that are connected to one another via a coaxial cable 3006. Although the example shown in FIG. 30 is associated with receiving signals from the RF head and passing these signals to the transceiver 3004, the aspects described herein are not limited to only receiving or only transmitting, and may be implemented in either, or both, instances. As discussed herein, the RF head 3002 may be identified with specific portions of an overall transceiver design, such as an RF front end, for example, whereas the transceiver 3004 may likewise be identified with other, separate portions of the transceiver design configured to facilitate wireless data transmission and reception. For example, the RF head 3002 and the transceiver 3004 may be implemented as various components on separate circuit boards or other hardware separated by one or more cable couplings.

The aspects described throughout this section may be implemented with regards to the various DFE and/or transceiver implementations discussed elsewhere herein. However, the aspects are not limited to being implemented in accordance with the DFE and/or transceiver aspects provided in this disclosure, but may be implemented as part of any suitable type of system that may utilize passive RF components (e.g., splitters, combiners, filters, matching networks, etc.), using the coupled-inductor architectures as described in this section.

In any event, as discussed herein, it is desirable to enable operation of multiple bands simultaneously for millimeter-wave frequency bands of operation, such as those associated with 5G wireless applications, for example, as described herein. This is shown in FIG. 30 via the coaxial cable 3006 connecting the RF head 3002 with the transceiver 3004. In the example shown in FIG. 30, three carrier-aggregated frequencies are shown at 28 GHz, 39 GHz, and 60 GHz, although aspects described herein are not limited to this example and may incorporate any suitable number and/or type of signals having different frequencies. Moreover, the aspects described herein are not limited to only 5G implementations, nor are the aspects limited to the frequencies associated with 5G wireless frequencies allocated at the time of this writing. The aspects described herein may be implemented in accordance with any suitable wireless system implementing any suitable number and/or range of frequencies as part of its typical operation.

With continued reference to FIG. 30, the RF head 3002 implements a frequency domain multiplexer 3002.1 (i.e., a triplexer in this particular example) to combine the three supported frequency bands, which are then coupled between the RF head 3002 and the transceiver 3004 via the coaxial cable 3006. The transceiver 3004 likewise implements a frequency-domain multiplexer 3004.1 (also a triplexer in this example), which functions to separate the three different frequency signals and provide each one to a separate transceiver chain via a matching network 3004.2. The triplexers are passive components composed of a number of bandpass filters, with one for each supported frequency band of operation (i.e., three in this case). The use of the multiplexers 3002.1, 3004.1 allows for the support of inter-band carrier aggregation, while the matching networks 3004.2 provide frequency selectivity to protect the LNAs from out-of-band blockers.

The filter implemented within each of the multiplexers 3002.1, 3004.1, as well as each matching network 3004.2, may be composed of a combination of inductors and capacitors. As discussed above, these capacitor components are typically implemented as MoM and/or MiM capacitors, and thus suffer from a high degree of process variation. To overcome this issue, the aspects described in this section are directed to all-metal (or nearly all-metal) implementations of bandpass filters that utilize a novel stacked and coupled transmission line structure. In some aspects, the stacked and coupled transmission line structure may further be used in conjunction with coupled-inductors. Such architectures advantageously yield filter implementations having a very small variation with process that is also ESD robust, and this same structure may also be implemented to provide impedance matching. In other words, the aspects described herein may be utilized in one or more of the multiplexers 3002.1, 3004.1, and/or the matching networks 3004.2.

FIGS. 31A-B illustrate an example coupled-inductor architecture implementing stacked and coupled transmission lines, in accordance with an aspect of the disclosure. As shown in FIGS. 31A-B, the aspects described herein may replace typical designs implementing MoM and/or MiM capacitors, which are often arranged as part of a "tapped" configuration, with a stacked and coupled transmission-line structure. The use of tapped capacitors in this manner advantageously provides for additional degrees of freedom in the design methodology. Furthermore, the stacked and coupled transmission-line structure as discussed herein may be particularly advantageous when implemented to provide tapped capacitor network functionality at millimeter-wave frequencies. As shown and further discussed below within this section, this implementation allows for operation in a low impedance (e.g., 50Q) environment, and also allows for the use of transmission lines to implement the necessary phase-shifts required for multiplexing functionality. The aspects described herein also provide an ESD-robust implementation that does not suffer from process variations in accordance with modern RF-CMOS manufacturing processes.

To do so, aspects include the coupled-inductor architecture 3100 as shown in FIGS. 31A-B implementing a multi-layer structure. In an aspect, each layer as shown in FIGS. 31A-B corresponds to a different metal layer that is fabricated in accordance with a CMOS process. For example, the coupled-inductor architecture 3100 includes two coupled halves A and B, with each of ground shield layers 3102A, 3102B, which may function as ground planes, being separated by a first oxide layer (e.g., an $SiO_2$ dielectric layer, not shown), which is in turn coupled, at each half, to a first metal transmission line layer 3108. The first metal transmission line layer 3108 is, in turn, separated by a second oxide layer (e.g., an $SiO_2$ dielectric layer, not shown) that is stacked on top of the first metal transmission line layer 3108. A second metal transmission line layer 3110 is then stacked on top of this second oxide layer. To provide an illustrative example, the ground shield layers 3102A/B may correspond to a top metal-2 "TM-2" ground shield layer of a CMOS process, the first metal transmission line layer 3108 may correspond to another metal layer such as a top metal-1 "TM-1" layer of a CMOS process, and the second metal transmission line layer 3110 may correspond to yet another metal layer such as a top metal "TM" layer of a CMOS process. For clarity, these designations are also used throughout the Figures and description of the aspects within this section.

In any event, each half of the coupled-inductor architecture 3100 includes a dual stacked and coupled transmission line, with the transmission line formed at each end being connected to a particular RF port associated with a specific implementation of the coupled-inductor architecture 3100, as further discussed herein. Furthermore, at each half of the coupled-inductor architecture 3100, a first capacitance is realized between the ground shield 3102A/B and a respectively-coupled first metal transmission line layer 3108. A second capacitance is also realized between the first metal transmission line layer 3108 and a respectively-coupled second metal transmission line layer 3110. In this way, a "split" capacitor network may be realized exclusively from the use of the stacked and coupled transmission line structure, obviating the need for MoM and/or MiM capacitors. Moreover, the first and second capacitance realized at each half A and B of the coupled-inductor architecture 3100 is a function of the overall length of transmission line as well as other factors (e.g., the cross section and width of the first and second metal transmission line layers 3108, 3110). Therefore, aspects include advantageously adjusting the capacitances (e.g., as part of a manufacturing process) by trimming the length and/or width of the transmission lines.

With continued reference to FIG. 31A, aspects include a region 3120 in the center of the coupled-inductor architecture 3100 that is devoid of the ground shield. In other words, the ground shield halves 3102A, 3102B is each connected to and terminated at a ground ring half 3104A. Thus, the ground shield halves 3102A, 3102B do not occupy the region 3120 formed within the ground ring halves 3104A, 3104B, which is instead occupied by two spiral transformers 3106A, 3106B, which form respective inductances. The spiral transformers 3106A, 3106B are separated from one another within the region 3120 in the vertical direction (i.e., perpendicular to the ground shield halves 3102A, 3102B), and are inductively coupled to one another in accordance with a particular coupling factor K.

In an aspect, each of the spiral transformers 3106A, 3106B are formed via the same metal associated with the transmission line layers 3108, 3110, respectively. In an aspect, the spiral transformer 3106A is formed via the second metal transmission line layer 3110 (i.e., the "TM" layer in the arrangement shown in FIGS. 31A-B) extending into the region 3120 beyond the ground ring halves 3104A, 3104B, thereby forming the spiral transformer 3106A that is connected to and terminates in the ground ring half 3104A. Further in accordance with this aspect, the spiral transformer 3106B is formed via the first metal transmission line layer 3108 (i.e., the "TM-1" layer in the arrangement shown in FIGS. 31A-B), extending into the region 3120 beyond the ground ring halves 3104A, 3104B, thereby forming the spiral transformer 3106B that is also connected to and terminates in the ground ring half 3104A.

In an aspect, the arrangement of stacked and coupled transmission lines and spiral transformers as shown in FIG. 31A yields an equivalent circuit 3200 as shown in FIG. 32. The current source shown in FIG. 32 does not have an equivalent circuit component in FIG. 31A, but is shown for purposes of clarity and to provide a functionally equivalent circuit. Moreover, the resistances R1 and R2 as shown in FIG. 32 are not shown in FIG. 31A, but may be associated with the real portion of the impedance at each port associated with the coupled-inductor architecture 3100. For example, if the coupled-inductor architecture 3100 is implemented as one of the matching networks 3004.2 as shown in FIG. 30, then the resistance R1 may be identified with one of the outputs of the triplexer 3004.1, whereas the resistance R2 may be identified with a power amplifier input impedance.

With continued reference to FIG. 32, the capacitor $C_{11}$ may be associated with the coupled transmission line structure of layers 3108, 3110 at half A of the coupled-inductor architecture 3100, whereas the capacitor $C_{21}$ may be associated with the coupled transmission line structure of layers 3108, 3110 at half B of the coupled-inductor architecture 3100. Moreover, the capacitor $C_{12}$ may be associated with the transmission line structure formed by the layer 3108 and the ground shield half 3102A, whereas the capacitor $C_{22}$ may be associated with the transmission line structure formed by the layer 3108 and the ground shield half 3102B. Furthermore, the inductances L1 and L2 are associated with the spiral transformers 3106A, 3106B, respectively, thus forming a coupling factor K between them. Thus, aspects include the tapped capacitor structure being realized by stacked, coupled transmission-lines through the tuning of even/odd mode impedances.

In other words, the split capacitor topology implemented by the split capacitor circuit 3300 may be realized utilizing the coupled-inductor architecture 3100, for example, as shown in FIG. 31, in place of using MoM and/or MiM capacitors for the capacitors $C_{11}$, $C_{21}$, $C_{12}$, $C_{22}$. As a result, aspects include eliminating the need to use MoM and/or MiM capacitors. To provide additional clarity regarding this concept, FIG. 33 shows an example Smith chart comparing the plotted results of a traditional, split capacitor network that is traditionally implemented using MoM capacitors versus the stacked and coupled transmission line structure shown in FIG. 31B. The stacked and coupled transmission line structure shown in FIG. 31B is an isolated portion of the coupled-inductor architecture 3100 that may be implemented without the coupled spiral inductors 3106A, 3106B and the ground ring halves 3104A, 3104B, as further discussed herein.

As shown in FIG. 33, the Smith chart provides a comparison of S-parameters over a span of 20 GHz to 40 GHz for each design. The S-parameters $S_{11}$, $S_{21}$, $S_{22}$ are with respect to the split capacitor circuit 3300 being implemented with MoM capacitors versus the S-parameters $S_{33}$, $S_{43}$, $S_{44}$, which are associated the split capacitor circuit 3300 being implemented with the stacked and coupled transmission line structure as shown in FIG. 31B. These simulations were setup as indicated in FIG. 33, with each design being simulated with the appropriate ports and 50Ω terminations. As shown in FIG. 33, the plotted S-parameters $S_{11}$, $S_{21}$, $S_{22}$ indicate excellent correlation with the S-parameters $S_{33}$, $S_{43}$, $S_{44}$.

Because the capacitors available in current IC design kits suitable for implementing a split capacitor circuit can vary as much as 25-30%, their implementation is unacceptable for nearly all filter use cases without additional tuning. However, by using a CMOS process stacked and coupled transmission line structure as discussed herein, this variation is limited to about 5-10% at extreme corner cases. For most applications, having filter components with tolerances in this range eliminates the need to include tunability in a given design to overcome process variation. Moreover, because there are no known methodologies for incorporating filter tuning at millimeter-wave frequency ranges using CMOS processes without severely degrading performance, the aspects described in this section, which are inherently process invariant, are essential for production of high volume, high performance mmW RFIC products.

As an additional example of the advantages of the stacked and coupled transmission line structure aspects described herein over traditional MoM capacitors, FIG. 34 shows a response of a sample 39 GHz filter with process variation. From the plot, it is clear that the stacked and coupled transmission line aspects have a much smaller variation with process compared to that of the MoM capacitors. FIG. 34 also indicates that the stacked and coupled transmission line aspects have a lower insertion loss compared to MoM implementations.

The coupled-inductor architecture 3100 as shown in FIG. 31A is by way of example and for purposes of brevity. Aspects include many variations on the example shown in FIG. 31A based upon the particular application, design frequency, implementation of the coupled-inductor architecture 3100 within a particular circuit, the impedances at each port of the coupled-inductor architecture 3100, bandwidth considerations, etc. For example, aspects include several of the physical attributes of the coupled-inductor architecture 3100 being adjusted or modified based upon a particular design specification, and/or portions of the coupled-inductor architecture 3100 being omitted. For instance, the overall shape and/or size of any of the ground shield halves 3102A, 3102B, the transmission line layers 3108, 3110, the ground ring halves 3104A, 3104B, and/or the spiral transformers 3106A, 3106B may be considered design parameters and adjusted to meet design specifications for a particular application.

To provide some illustrative examples, the ground shield halves 3102A, 3102B may have portions removed outside the region 3120, portions added within the region 3120, and/or additional areas of the ground shield halves 3102A and/or 3102B removed compared to what is depicted in FIG. 31A. To provide additional illustrative examples, the ground ring halves 3104A, 3104B and/or the spiral transformers 3106A, 3106B may have other shapes such as hexagonal, circular, square, etc., and need not be the same shape as one another. To provide yet additional examples, the cross section of each of the transmission line layers 3108, 3110 may be different than one another and/or be stacked in a manner that deviates from being directly aligned with one another (e.g., one of the transmission line layers 3108, 3110 may be offset in the horizontal plane with respect to the other). To provide yet another example, one or both of the transmission line layers 3108, 3110 may deviate from the rectangular, constant cross sections as shown in FIG. 31A, and may instead have a tapered shape. This tapered shape may include, for instance, a taper in the horizontal direction (e.g., in the direction of propagation) and/or in the vertical direction (e.g., the spacing between the transmission line layers 3108, 3110 need not be uniform).

Again, the coupled-inductor architecture 3100 shown in FIG. 31A may facilitate the realization of split-capacitor network designs without the use of explicitly formed capacitors (e.g., MoM or MiM capacitors). An example of a conventional reactive circuit that may be used to achieve filtering and matching within RF circuits is shown in FIG. 35 as circuit 3500. Circuit 3500, however, has various shortcomings, particularly with regards to use in a low impedance (e.g., 50Ω) environment. For example, the inductance values L1 and L2 are not optimal when the resistance values of R1 and R2 are both equal to 50Ω. That is, to maintain the desired filter response and low impedance terminations, the values of L1 and L2 become very small, making them sub-optimal. In particular, the quality factor (Q) of the inductors becomes too small, leading to high insertion losses when implemented. Moreover, for RFIC applications at mmW frequencies, the values of R1 and R2 are typically much greater than 50Ω to achieve acceptable performance. And, as mentioned elsewhere throughout this section, the capacitors are generally implemented with MoM capacitors, which have high process variations. The overall circuit 3500 is thus generally difficult to implement on a silicon structure.

Therefore, aspects include implementing a split capacitor network circuit in accordance with a particular application of input and output resistances within the RF circuit, as illustrated in circuits 3525A, 3525B. In particular, the circuit 3525A implements a split capacitor topology on one half of the circuit associated with the resistance value R1, which is less than the resistance value R2. The circuit design 3525A therefore provides optimum L1 and L2 values for applications requiring a low-to-high impedance filter and/or matching network. The circuit 3525B, however, is the same circuit as discussed above with respect to FIG. 32, and implements a split capacitor topology on each half, which may be particularly useful, for instance, when R1 and R2 are substantially equal values (e.g., within 5 or 10% of one another). The circuit design 3525B therefore provides optimum L1 and L2 values for applications requiring a low-to-low impedance filter and/or matching network.

The aspects described herein recognize the need to implement the different circuit topologies represented by the circuits 3525A, 3525B, via the stacked and coupled transmission line structure shown in FIGS. 31A-B, for example. Thus, the equivalent circuit structures of the split capacitor circuit topology shown in the circuits 3525A, 3525B is shown in FIG. 35 as circuits 3550A, 3550B. In other words, the circuits 3550A, 3550B are equivalent circuits as circuits 3525A, 3525B, but realize the split capacitor topology utilizing the stacked and coupled transmission line structure shown in FIG. 31A, for example, versus using traditional techniques such as MoM and/or MiM capacitors. Of course, the circuits 3550A, 3550B may also realize the inductances $L_1$, $L_2$ via coupled spiral transformers (e.g., spiral transformers 3106A, 3106B).

In other words, the coupled-inductor architecture 3100 as shown in FIG. 31A may have a corresponding equivalent circuit represented by the circuits 3550A, 3550B, as indicated in FIG. 35. Portions of the coupled-inductor architecture 3100 matching the split capacitors of circuits 3525A, 3525B have been labeled for clarity, as certain portions of the coupled-inductor architecture 3100 as shown in FIG. 31 may be modified depending upon the particular application. For example, for applications in which the resistance $R_1$ is less than the resistance $R_2$, the coupled-inductor architecture 3100 may be implemented with the stacked and coupled transmission line layers 3108, 3110 in conjunction with the ground shield half 3102A. But because the stacked capacitor topology is only utilized on this half of the circuit, the coupled-inductor architecture 3100 need only implement the stacked and coupled transmission line layers 3108, 3110 on one half of the design, e.g., the half associated with the lower resistance value within the RF circuit. In this case, the other half B the coupled-inductor architecture 3100 may be implemented, for example, using only the transmission line layer 3108 as a feedline in conjunction with the ground shield half 3102B to form a single capacitance, with the stacked and coupled transmission line layer 3110 being omitted.

As another example, for applications in which the resistance $R_1$ is substantially equal to the resistance $R_2$, the coupled-inductor architecture 3100 may be implemented with the stacked and coupled transmission line layers 3108, 3110 at each of the ground shield halves A and B. In this way, a split capacitor topology is realized at each half of the circuit 3350B, similar to that shown in circuit 3525B.

The aspects described herein, therefore, exploit the use of split capacitors in a stacked and coupled transmission line configuration to allow for the sizing of spiral transformers to achieve a peak Q in the desired band of operation. Consequently, filter performance (when so implemented) is not compromised when operated between low impedance levels in an RFIC. Advantageously, the spiral transformers (and transformers in general) tend to have low process variation when manufactured in accordance with typical RFIC processes, as transformers are physically large and may be fabricated using the thicker, top metal layers. Typically, the inductance value of the spiral transformers 3106A, 3106B as shown in FIG. 31A depends on the path length of the spiral portion, which is well controlled in modern IC processes. For example, a typical variation in reactance of these structures, at the extreme "corners" of the IC process, is on the order of 5-10%.

FIG. 36 illustrates an example simulated triplexer implementation and a plot of test results, in accordance with an aspect of the disclosure. The example triplexer design shown in FIG. 36 is a simulation of a four-port device based upon non-ideal, i.e., physical models, using the coupled-inductor architecture 3100 shown in FIG. 31A. The triplexer shown in FIG. 36 implements the coupled-inductor architecture 3100 at each of ports 1-3, with the layers being labeled in accordance with a specific CMOS process. The aspects described herein are not limited to this example, which indicates that the shield layers 3102A/B correspond to the TM-2 ground shield layer, the first metal layer 3108 corresponds to the TM-1 layer, and the second metal layer 3110 corresponds to the TM layer.

As shown in FIG. 36, the triplexer is configured with three input ports 1-3, each corresponding to a specific frequency band. Each of ports 1-3 may be associated, for example, with a source or input impedance such as 50Ω. The output port 4 thus provides a combined signal comprising the 28 GHz, 39 GHz, and 60 GHz signals, each being phase shifted via a separate length of transmission line. The output port 4 may be associated with, for instance, an output impedance such as a 50Ω characteristic impedance of a coaxial cable. Thus, the triplexer shown in FIG. 36 may be identified with, for instance, the triplexer 3002.1 as shown and discussed herein with reference to FIG. 30. The example triplexer shown in FIG. 36 therefore supports 5G new radio (NR) bands at 28 GHz and 39 GHz, and enables concurrent operation with the 60 GHz band. As indicated in the graphed simulation results of S-parameters, low insertion loss and high selectivity is obtained as a result of the triplexer implementing the coupled-inductor architecture 3100. In other aspects, the stacked and coupled transmission line architecture associated with the coupled-inductor architecture 3100 may be implemented as part of the design of other RF circuit components, such as impedance matching networks, for example, as further discussed below with reference to FIG. 37.

The use of triplexers discussed throughout this section are provided by way of example and not limitation. In particular, several example aspects described herein, such as those shown in particular with reference to FIGS. 30 and 36, explain an implementation of the stacked and coupled transmission line structure using a triplexer arrangement. However, the aspects described herein are not limited to this particular implementation, and may be implemented in accordance with any suitable type of general frequency domain multiplexer (e.g., a diplexer, quadplexer, etc.).

The example impedance matching implementation shown in FIG. 37 is used in accordance with a simulated mmW amplifier application, mapping the same layers of the stacked and coupled transmission line architecture (i.e., the TM, TM-1, and TM-2 layers) discussed herein with reference to FIG. 36 by way of example and not limitation. Moreover, the simulated impedance matching implementation shown in FIG. 37 utilizes the tapped capacitor concept described herein in both the input and output matching networks, although the coupled-inductor architecture 3100 used in this example is implemented with only one half of the structure using the stacked and coupled transmission line layers 3108, 3110. For example, the impedance matching implementation shown in FIG. 37 may utilize the coupled-inductor architecture 3100 to couple the 50Ω source to the input to the mmW amplifier input. However, both of the stacked metal transmission line layers 3108, 3110 may be used only at the source side, whereas only the metal transmission line layer 3108 may be implemented at the mmW amplifier input. Furthermore, the coupled-inductor architecture 3100 may be used to couple the output of the mmW amplifier to a load (e.g., an antenna), with the stacked metal transmission line layers 3108, 3110 being implemented at the load side, but only the metal transmission line layer 3108 being used at the output of the mmW amplifier.

In other words, as discussed herein with reference to the circuit 3550B as shown in FIG. 35, the simulated impedance matching implementation shown in FIG. 37 uses a stacked and coupled transmission line at both the input (i.e., the source) and the output (i.e., the load). In this way, the simulated impedance matching implementation shown in FIG. 37 enables the amplifier to operate between a low impedance source and a low impedance load (e.g., both being 50Ω). As an added advantage of the aspects described herein, the use of the coupled-inductor architecture 3100 may provide both filter and impedance matching functionality within the same design. For instance, the input and output impedance matching networks as shown in FIG. 37 not only facilitate impedance matching between low impedance source and a low impedance load terminals, but also provide the same out-of-band selectivity as the simulated triplexer as shown and discussed with reference to FIG. 36. For instance, the impedance matching design shown in FIG. 37 may provide frequency selectivity equivalent to a 4-resonator bandpass filter.

FIG. 38 illustrates a power gain versus frequency plot of the simulated impedance matching implementation shown in FIG. 37, in accordance with an aspect of the disclosure. Again, the input matching network shown in FIG. 37 provides selectivity to out-of-band blockers, thus preventing saturation of amplifier's active stage. The simulated power gain vs frequency plot shown in FIG. 38 is provided for an operating frequency of 28 GHz. From FIG. 38 it can be observed that the amplifier has a nearly flat passband covering 5G bands n257, n258, and n261, while providing better than 35 dB of selectivity to out-of-band blockers at 37 GHz, which is the lower band edge of the 39 GHz band, n260, defined for 5G NR deployment. In this way, the stacked and coupled transmission line architecture described throughout this section effectively bridges the gap between filter design and impedance matching network design. In doing so, impedance matching networks may be designed to additionally provide a prescribed out-of-band selectivity. And because this amplifier implementation utilizes the stacked and coupled transmission line structure as discussed herein, the amplifier and matching network design also advantageously benefits from the ESD protection as discussed herein.

The coupled-inductor architecture 3100 shown in FIG. 31A, and the accompanying stacked and coupled transmission line structure shown in further detail in FIG. 31B and discussed throughout this section provide several advantages over traditional split capacitor solutions. In particular, the aspects described herein enable operation at low impedance levels (e.g., 50Ω environments) and without compromising filter performance at any given frequency. This better allows for mmW functionality and enables integration with other mmW passive networks. Moreover, because the implementation uses stacked and coupled transmissions lines and spiral transformers in an essentially all metal implementation, these components are not susceptible to process variation as compared to lumped components, such as the aforementioned MoM and MiM capacitors that are both typically utilized as part of modern CMOS processes.

Additionally, the stacked and coupled transmission line structure may be implemented as part of a CMOS process to yield the structure near chip interfaces. As a result, the stacked and coupled transmission line structure is shielded from the lossy silicon oxide layer. Moreover, aspects utilizing the stacked and coupled transmission line structure described herein are inherently ESD-robust, and thus solve the often-challenging problem of providing ESD protection at mmW interfaces, as ESD requirements generally prohibit the use of MiM or MoM capacitors directly connected to IC I/O pads.

And because the stacked and coupled transmission line structure allows for the realization of tapped capacitor designs, this facilitates freedom in sizing the coupled inductances. As a result, a lower loss structure is enabled, as a size can be chosen for peak Q in the vicinity of the passband and cut off frequencies for a given band. Still further, the multiplexing functionality that is integrated into the transceiver and ICs at the RF head saves considerable space, which may be of particular importance in handset or other consumer electronics applications. Alternative solutions to implement this functionality otherwise require additional RF components or additional cabling with large connectors.

While the circuit topologies shown and described throughout this section are designed to be used in modern CMOS processes, such designs are not so limited, and may be utilized in any design space with no known restrictions.

Section VII—Digital Radio Head Architecture and System Partitioning

The aspects described within this section generally relate to radios and, more particularly, to radio head architectures using digital data links in lieu of cabling by leveraging transceiver portions implemented within remote radio heads.

Radio designs that implement mm-wave bands often use phased arrays (typically 8-64 elements) to meet the link budget at these frequencies. Depending on the particular use case (e.g., a mobile device or other user equipment (UE), access point (e.g., customer premises equipment (CPE)), autonomous vehicle, etc., the solution may require multiple antenna arrays to be spatially separated. For instance, a UE may require multiple antenna arrays separated by several centimeters, whereas a vehicle may utilize multiple antenna arrays separated by a few meters. To support the next generation of connected devices and things, mm-wave signals from a modem and RF transceiver chip need to be distributed to these remote antenna arrays while still meeting aggressive power, cost, and form-factor requirements. Current solutions have fallen short with regards to these requirements.

As discussed herein, conventional radio designs may implement several remote radio head modules interconnected with transceivers to facilitate various types of diversity schemes (e.g., spatial). An example of a conventional radio head design is shown in FIG. 39, which illustrates two separate radio head modules 'A' and 'B.' As shown in FIG. 39, some typical high-frequency radio implementations (e.g., mm-wave) utilize a multi-chip (i.e., multi-die) partitioning solution. The conventional radio 3900 shown in FIG. 39 includes a digital modem chip (modem die) coupled to a RF transceiver chip (transceiver die), which implements data converters and mixers to generate the mm-wave signals in close proximity to the modem. Moreover, the conventional radio 3900 also includes a phased array chip (mm-wave (p-shifter)) and a front-end chip (mm-wave FE) that includes the low-noise amplifier (LNA), power amplifiers (PAs), switches, etc. As shown in FIG. 39, the conventional radio 3900, the phased array, and front-end chips are assembled with the antenna array on radio-head modules (i.e., each of the radioheads A and B). With this partitioning setup, signals are distributed between the RF transceiver and the radiohead modules via specialized RF cables (e.g., coaxial cables). Although not shown, other conventional solutions include distributing an intermediate frequency (IF) to multiple radio-heads, which is typically in the range of a few GHz and thus still requires specialized cables.

Such conventional radio head partitioning solutions have several drawbacks. For instance, the specialized RF/IF cables noted above are expensive (>$0.50/cable), and directly contribute to the bill of material (BOM) cost. Moreover, the use of specialized RF cabling introduces significant insertion loss, particularly at mm-wave frequencies. For example, for UE form-factors, the loss from these cables can be in the range of 9-25 dB, depending on the frequency band, and presents a total barrier for use in automotive applications that utilize signal distributions exceeding 5 meters and operate in a noisy environment. Furthermore, alternative IF distributions also require dual-conversion in each of the transmit and receive chains, and thus these partitioning solutions suffer from image rejection and noise aliasing limitations.

Adding to these issues, the physical volume and cost considerations typically limit mm-wave applications to 1 cable per radio-head. To overcome these issues, some solutions combine all the communication frequency bands (e.g., 28/39/60 GHz) along with the low frequency reference clocks and control data onto a single cable. However, this mandates the use of RF quadplexers, which is a large passive device, further driving up cost and introducing additions insertion loss into the system. Such losses require the RF chains to incorporate multiple tuned amplifier stages to compensate for the cabling/passive loss, which results in higher power dissipation and die area and forces noise/linearity trade-offs in the level plan. Finally, mm-wave solutions are likely to evolve towards full digital beam-forming for higher capacity and system throughput, which will require multiple RF streams—a limitation that the current RF or IF partitioning solutions described above cannot support.

Therefore, to overcome the aforementioned issues with traditional radio head distributions, the aspects described herein provide a more optimal radio partitioning and architecture in which the entire mm-wave radio chain is pushed to the remote radio-heads, as further discussed below with reference to FIG. 40, for example. As a result, the RF coax cables are replaced with a digital link interface between the modem and the radio heads.

As further discussed in this section, the radio head distribution aspects provide several advantages. For instance, the aspects lowers BOM cost by replacing an expensive RF coaxial with a low-cost digital cable (e.g., a flex cable such as those used cameras and other electronic devices). Additionally, mm-wave applications may benefit from this distribution as RF coaxial cabling otherwise incurs an accumulated insertion loss penalty on the order of 50 dB from the cables, quadplexers, splitters/combiners, and other mm-wave passive components in the signal path. Again, compensating for this loss requires adding tuned amplifier stages to the lineup, increasing power dissipation and leading to noise/linearity trade-offs.

Throughout this section, aspects are described that highlight the advantages flowing from the various aspects described in the prior sections. In other words, and as further discussed below, the previously-discussed aspects enable a radio partitioning architecture that incorporates the radio chains into the remote radio-heads. As a result of this newly-enabled partitioning scheme, the routing of RF signals between the transceivers and radioheads is eliminated, which allows for expensive and lossy RF cables (and other RF components) to be replaced by low-cost cables that need only carry digital data.

For instance, the aspects described in this section allow for the elimination of the aforementioned RF cable loss as well as the need for bulky, lossy passives like the quadplexer, resulting in lower power dissipation, better linearity, and smaller area (fewer passive components). The aspects described in this section also allow for the delivery of an end-end solution that scales from UE and CPE/AP class devices to automotive applications, where active cables with digital repeaters can support the required reach. This distribution thus supports the use of multiple independent RF streams for mm-wave applications and beyond, in contrast to current RF/IF over cable solutions.

Moreover, by eliminating the RF cabling, the radio partitioning aspects described herein further simplify the radio layout by eliminating the cable loss, thereby reducing the number of RF gain stages and the number of passives and other components (e.g., eliminating or reducing the number of large mm-wave passive components). This further results in a smaller chip or die area, as well as a lower radio power dissipation. And, as discussed herein, the radio partitioning aspects allow for per element (e.g., antenna element or group of antenna elements in conjunction with a receptive transmit chain) digital pre-distortion/correction to support higher EVM and spectral mask performance. This per element compensation may digitally correct for beam-squinting and may be particularly useful, for example, in communication applications implementing carrier aggregation and/or dual or multi-band operation.

Furthermore, the future evolution of wireless radio communications (e.g., the proposed "5G" standard and future developments such as "6G," etc.) is moving towards full digital beamforming in order to support higher capacity through multi-user MIMO. As noted above, current radio partitions do not support full digital-beamforming. In contrast, the aspects described herein facilitate scalability to full digital beam-forming, hybrid beam-forming, and combinations of spatial filtering and beam-forming. Moreover, the aspects described herein may also facilitate simultaneous multi-beam support, enabling a variety of new use cases such as soft-handoffs, device-device communication links (for autonomous vehicles and drones), etc.

FIG. 40 illustrates a block diagram of an exemplary radio partitioning, in accordance with an aspect of the disclosure. The example radio 4000 is provided for ease of explanation, and may include additional, less, or alternate components as those shown in FIG. 40. As shown in FIG. 40, the radio 4000 may include a modem 4002 and any suitable number of radio heads, with two radioheads (i.e., radioheads A and B) shown in FIG. 40 for purposes of brevity. In accordance with an aspect, the modem 4002 may be coupled to each respective radiohead via any suitable type of communication link 4003 that facilitates digital communications between these components. For example, two links 4003.A, 4003.B are shown in FIG. 40 for purposes of brevity, as two radioheads are also shown. Aspects include the links 4003.A, 4003.B being implemented as any suitable type of wired or wireless interconnection, such as cabling, for example, configured to carry digital data streams between the modem 4002 and each of radioheads A and B. As one example, the links 4003 may be implemented as flexible flat cables (FFC), flexible printed circuit (FPC) cables, etc.

The digital data exchanged between the modem 4002 and each remote radiohead implemented via the radio 4000 may represent, for example, a bidirectional communication of digital baseband data in accordance with one or more suitable communication protocols. For example, when the radio 4000 transmits data, the modem 4002 may transmit digital baseband data via the links 4003.A, 4003.B to each of the radioheads A and B, respectively. As another example, when the radio 4000 receives data, the modem 4002 may receive digital baseband data via the links 4003.A, 4003.B from each of the radioheads A and B, respectively.

To facilitate wireless data communications, each radiohead implemented via the radio 4000 may include a transceiver die or transceiver chip 4004, a front end die or chip 4006, and an antenna array die or chip 4008. In various aspects, several of the components associated with the radio 4000 may be identified with components described herein in other sections, as further discussed below. In an aspect, each radiohead may include a front end chip 4006 coupled to the antenna array chip 4008 to facilitate switching to support both transmit and receive modes. The front end chip 4006 may also facilitate the amplification of data signals received from the antenna array chip 4008, which are in turn coupled to the transceiver chip 4004. Aspects further include the front end chip 4006 amplifying signals from the transceiver chip 4004 to be transmitted via the antenna array chip 4008. Thus, aspects include the front end chip 4006 including PAs, LNA, switches, etc., with only some of these components shown in FIG. 40 for purposes of brevity, and by way of example and not limitation.

For instance, the aspects as described throughout this section are not limited to the particular radio layout as shown in FIG. 40. In other words, the radio 4000 as shown in FIG. 40 may have various configurations, with different or alternative components being coupled to or associated with individual dies or chips. To provide an illustrative example, the antenna array die 4008 may include additional components depending upon the particular mode of operation and/or design of the radio 4000.

Continuing this example, aspects include the radio 4000 being implemented in accordance with any of the other aspects described herein throughout the other sections, such as those described with regards to the reconfigurable digital, analog, and hybrid beamforming modes as discussed in the previous section with reference to FIGS. 21-25. In accordance with such aspects, the various radioheads that form part of the radio 4000 may be further modified to support one or more of these functions.

For example, one or more of the radioheads may include an antenna array die 4008 that functions as a phased array die, and thus includes one or more phase shifters incorporated as part of the silicon (not shown). In this case, each antenna array die 4008 may combine the different streams on each individual antenna array die 4008. However, other aspects include one or more of the radioheads implementing a digital beamforming die. In such an implementation, the antenna array die 4008 may still include one or more individual antenna elements as shown in FIG. 40, but may not include phase shifters on the silicon that forms that particular antenna die. Instead, a complete transceiver chain or slice (e.g., 4010.1), as well as suitable portions of the front end die 4006, may be coupled to each antenna element (or group of antenna elements). In this implementation, the signals may be combined in the digital domain in the modem 4002.

To provide yet another example, aspect include the radio 4000 implementing one or more radioheads including a hybrid die. The hybrid die may function in accordance with, for example, the hybrid beamforming solutions as described in the previous section with reference to FIGS. 21-25. In this example, the radioheads of the radio 4000 may include a combination of antenna array dies 4008 including phase shifters and/or individual transceiver slices assigned to antenna elements. In this configuration, the radio 4000 may achieve partial combining in the analog domain but perform a final combining in the modem 4002 within the digital domain.

In any event, each radio head may include one or more antenna elements within the antenna array die 4008, but the antenna array die 4008 may further include phase shifters depending upon the particular beamforming mode of operation utilized by the radio 4000. Thus aspects include the radio 4000 utilizing dynamic beamforming control that may dynamically switch between full digital, full analog, or a hybrid of both types as discussed in the previous section with reference to FIGS. 21-25, for example.

As discussed herein in the previous sections, the antenna array chip 4008, which is associated with each radiohead of the radio 4000, may include any suitable number of antenna elements configured to facilitate beamforming in accordance with a particular phase and amplitude taper (or other distribution), applied to the individual antenna elements. In an aspect, beamforming may be realized in this manner by controlling the amplitude and/or phase weighting for each antenna element (or group of antenna elements) implemented via the antenna array chip 4008. As discussed in the previous sections, aspects include achieving this per-antenna element signal granularity by coupling each antenna element (or group of antenna elements) within the antenna array chip 4008 to each respective individual transceiver "slice" or portion. Thus, aspects include each transceiver chip 4004 implemented by each remote radiohead including any suitable number of transceiver portions, with each transceiver slice utilizing any of the techniques described in the previous sections to provide various advantages on a per-chain and per-antenna element basis.

In various aspects, one or more portions of the transceiver chips 4004 may be identified with components described in the previous sections discussed herein. These components are labeled and explained with reference to one of the transceiver chips (4004.A) for purposes of brevity, although aspects include any number (or all) of the transceiver chips 4004 implemented via the radio 4000 including components being similarly identified.

For example, as shown in FIG. 40, each transceiver chip 4004 may include a common digital front end (DFE) 4009 that is shared among any suitable number of digital transceiver slices implemented via each transceiver chip 4004. In an aspect, the DFE 4009 may also facilitate communications between each of the transceiver slices 4010 on each transceiver chip 4004 and the model 4002. For example, the DFE 4009 may include any suitable number and/or type of circuits and hardware components to enable bi-directional communication of digital data via the communication links 4003 in accordance with any suitable number and/or type of digital communication protocols. For instance, the communication links 4003 may support serial and/or parallel digital data communication protocols having any suitable data rate depending upon a particular application or use.

To provide an illustrative example, turning to FIG. 41, an exemplary bi-directional digital communication chain 4100 is shown having two portions 4102, 4104 that are linked by a communication link 4103. For purposes of brevity, the components shown in FIG. 41 are shown as being associated with a particular communication direction, although aspects include each component shown in FIG. 41 implementing one or more components to facilitate data communication in either direction. For instance, portion 4102 of the communication chain 4100 may be identified with the modem 4002, while portion 4104 of the communication chain 4100 may be identified with the DFE 4009 associated with each transceiver chip 4004 as shown in FIG. 40. However, both portions 4102 and 4104 may include each of the components associated with the other portion to enable bi-directional communications.

For example, the modem 4002 and/or the DFE 4009 associated with each transceiver chip 4004 may include circuitry and/or hardware components, interconnects, etc., associated with one or more encoders and parallel to serial converters (encoder +P2S), digital-to-time converters (DTC), one or more step transmitters (step TX), one or more step receivers (step RX), time-to-digital converters (TDC), one or more decoders and serial to parallel converters (decoder +S2P), etc. The communication link 4003 may, in an aspect, be identified with one or more of the links 4003 associated with each transceiver chip 4004, as shown in FIG. 40.

In an aspect, the communication link 4103 provides bi-directional digital communications in accordance with an asynchronous time-based protocol. For example, the bi-directional digital communications sent via the communication link 4103 may include a Serial Time-Encoded Protocol (STEP) as developed the Intel Corporation headquartered in Santa Clara, Calif. In accordance with such aspects, the communication link 4103 supports multiple bits per symbol and a narrower pass-band spectral occupancy than traditional digital communication protocols. As a result, higher data rates and lower energy/bit signaling may be achieved over the same physical medium than would otherwise be possible.

Moreover, in various aspects, the transceiver slices of the transceiver chip 4004 may be identified with one or more components as shown in FIG. 40, which depicts two transceiver slices 4010.1, 4010.2 by way of example and not limitation. In an aspect, the shared DFE 4009 may be identified with the shared DFE 2102 as shown and described in the previous section with respect to FIGS. 21-25. In accordance with such aspects, the respective transceiver slices implemented via each transceiver die 4004 may be identified with, for example, the digital transceiver slices 2104.1-2104.N, which are also shown and described with reference to FIGS. 21-25. In accordance with such aspects, the digital baseband data carried via the links 4003.A, 4003.B may be identified with the "digital data" as shown and described in FIG. 21 and elsewhere herein (e.g., FIG. 26), which may in turn be identified with the bi-directional digital communications sent via the communication link 4103 as discussed above.

As shown in FIG. 40, each transceiver slice 4010 may include a transmit chain or path, and a receive chain or path, each including several components that are represented as functional blocks in FIG. 40. For example, the receive chain path associated with each respective transceiver slice 4010 may include the components shown in the lower portion of each transceiver slice 4010. These components indicate, via the direction of the arrows, that a particular data stream received via an antenna element or group of elements in the antenna array chip 4008.A is coupled to the front end chip 4006.A, and in turn to the shared DFE 4009 to facilitate data processing when the radio 4000 is operating in a receive mode.

Thus, the receive chain associated with each transceiver slice 4010 may include, for example, a mixer as shown in FIG. 40, an analog-to-digital converter block (ADC), a downsampling block (J N), and a digital signal processing block (DSP). Each of these blocks within the receive chain may be implemented via one or more circuits, processors, and/or hardware components, in various aspects. For example, the DSP block and the downsampling block may be associated with the same processor or different processors, or portions thereof. In an aspect, the DSP and downsampling blocks may represent a receive DFE slice associated with one or more receive chains of each transceiver slice 4010 that is formed as part of each transceiver chip 4004, which is associated with each respective radiohead of the radio 4000. In an aspect, this receive DFE slice may be identified with, for example, the RX slice DFE 2122 as shown and described herein with reference to FIG. 21.

And, with regards to the transmit mode of operation, the transmit chain associated with each transceiver slice 4010 may include the components shown in the upper portion of each transceiver slice 4010. These components indicate, via the direction of the arrows, that data generated by the shared DFE 4009 is coupled to the front end chip 4006.A, and in turn to the antenna array chip 4008.A to facilitate data transmission of a particular data stream via an antenna element or group of elements in the antenna array chip 4008.A. Thus, the transmit chain associated with each transceiver slice 4010 may include, for example, a digital signal processing block (DSP), a digital pre-distortion block (DPD), a phase-modulation block (Φ-Mod), and a digital power amplifier block (DPA).

Each of these blocks within the transmit chain may be implemented via one or more circuits, processors, and/or hardware components. For example, the DSP block and the DPD block may be associated with the same processor or different processors, or portions thereof. In an aspect, the DSP and DPD blocks may represent a transmit DFE slice associated with the transmit chain of each transceiver slice 4010 formed as part of each transceiver chip 4004 that is associated with each respective radiohead of the radio 4000. In an aspect, this transmit DFE slice may be identified with, for example, the TX slice DFE 2110 as shown and described herein with reference to FIG. 21.

Again, each transceiver slice 4010 may include additional or alternate components not shown in FIG. 40 for purposes of brevity. As an example, the various switches and summing blocks associated with the digital transceiver slices 2104 as shown in FIGS. 22-24 are not reproduced within each transceiver slice 4010 as shown in FIG. 40. However, due to the DFE-per transceiver slice architecture provided by the aspects as described herein (e.g., the DSP block and the downsampling block functioning as an RX slice DFE, and the DSP and DPD blocks functioning as a TX slice DFE), the use of digital data links enables system flexibility as discussed with regards to the other aspects shown and described above. For instance, the partitioning and architecture of the radio 4000 may facilitate the radio 4000 dynamically switching between full digital beamforming and hybrid beamforming modes, as shown and described herein with reference to FIGS. 21-25, for example.

Moreover, although not shown in FIG. 40 for purposes of brevity, each front end chip 4006 and antenna array chip 4008 may include further modifications to monitor or sample the transmitter output to obtain transmitter output feedback via the input to the antenna associated with each particular digital transceiver slice 4010, as shown and described herein with reference to the FIGS. 26-29, for example. In accordance with such aspects, each transceiver slice 4010 may additionally or alternatively facilitate flexible digital pre-distortion (DPD) for each transmit chain.

In accordance with such aspects, the DSP and downsampling blocks may additionally or alternatively represent a receive DFE slice identified with, for example, the RX slice DFE 2622 as shown and described herein with reference to FIGS. 26-27. Moreover, the DSP and DPD blocks may additionally or alternatively represent as a transmit DFE slice identified with, for example, the TX slice DFE 2610 as shown and described herein with reference to FIGS. 26-27. Thus, aspects include the DSP and downsampling blocks within a receive chain of one or more transceiver slices 4010 providing feedback data to the DSP and DPD blocks within a transmit chain of one or more transceiver slices 4010 to facilitate the application of DPD coefficients on a per-transceiver chain basis, as shown and described with regards to FIGS. 26-29. Again, this may include the receive and transmit slice DFEs associated with each transceiver slice 4010 working in conjunction with the shared DFE 4009 to provide an appropriate level of DPD to, for example, correct for non-linearities and beam skew.

Furthermore, a transmit chain associated with one or more respective transceiver slices 4010 may be configured to provide frequency multiplication, amplitude weighting, I/Q data mapping, phase-shifting, etc., as discussed herein with regards to the various FM-RFDAC aspects, for example, as shown and described with reference to FIGS. 11-20.

For example, aspects include the phase-modulation and digital power amplifier blocks additionally or alternatively representing the various circuits, hardware components, processing functions, and/or interconnections as described herein with reference to the FM-RFDACs 1210, as shown and described herein with reference to FIGS. 12-15. In accordance with such aspects, the phase-modulation and digital power amplifier blocks may utilize a LO signal generated by the LO block 4012, as further discussed below. In doing so, aspects include the phase-modulation and digital power amplifier blocks associated with each transceiver chain 4010 formed as part of each respective transceiver chip 4004 facilitating phase shifting and frequency multiplication of a per transceiver slice basis.

To do so, aspects include the phase-modulation and digital power amplifier blocks associated with each transceiver slice 4010 implementing phase selection circuitry, capacitor banks, delay elements, resonant matching networks, etc. Aspects include the implementation of these components facilitating, for each transceiver slice 4010, the appropriate combination of lower-frequency signals to yield a higher frequency signal with a desired phase shift for each antenna element or group of elements to provide a desired beam direction and shape. In other words, aspects include each transceiver slice 4010 facilitating the same functionality as discussed herein with regards to the various FM-RFDAC aspects utilized in a polar transmitter system, for example, as shown and described with reference to FIGS. 11-15. In accordance with such aspects, the transmit slice DFE associated with each transceiver slice 4010 (e.g., the DSP and DPD blocks) and/or the shared DFE 4009 may be identified with the DFE 1206 and DTC 1204 used for the polar transmission system as shown in FIG. 12, for example.

Moreover, aspects include each transceiver slice 4010 being further modified from the configuration shown in FIG. 40 to work in accordance with a quadrature transmission system. In accordance with such aspects, the phase-modulation and digital power amplifier blocks associated with each transceiver slice 4010 may additionally or alternatively be associated with the various circuits, hardware components, processing functions, and/or interconnections with regards to the U and V FM-RFDACs 1610.1, 1610.2, as shown and described herein with reference to FIGS. 16-20. In accordance with such aspects, each transceiver slice 4010 may facilitate re-mapping of I/Q data to a new axis (e.g., a 45-degree axis) and implement phase selection circuitry, capacitor banks, delay elements, resonant matching networks, etc. As a result, each transceiver slice 4010 may appropriately combine signals to yield a higher frequency signal with a desired phase shift for each antenna element or group of elements to provide a desired beam direction and shape. In other words, aspects include each transceiver slice 4010 facilitating the same functionality as discussed herein with regards to the various U and V FM-RFDAC aspects utilized in a quadrature transmitter system, for example, as shown and described with reference to FIGS. 16-20. In accordance with such aspects, the transmit slice DFE associated with each transceiver slice 4010 (e.g., the DSP and DPD blocks) and/or the shared DFE 4009 may be identified with the DFE 1606 used for the quadrature transmission system as shown in FIG. 16, for example.

In an aspect, the LO block 4012 may include circuitry and/or hardware components to generate one or more LO signals utilized by each transceiver slice 4010. For example, the LO block 4012 may implement a synthesized frequency generator such as a digital phase locked loop, for example, coupled to a LO generation block (LOGEN). In an aspect, the LOGEN block implemented via the LO block 4012 may be identified with one or more of the LOG units 204.1-204.K, as shown and described above with reference to FIG. 2. Thus, aspects include the LOGEN block implementing circuitry, processors, interconnects, etc., to facilitate the combination of phase shifted and/or weighted signals to generate a higher frequency LO signal using an initially generated reference signal at a sub-harmonic frequency (e.g., via a DPLL), as shown and described herein with reference to FIGS. 1-10, for example. In an aspect, the LOGEN block may generate quadrature LO signals for each receive chain included in each transceiver chain 4010 associated with the transceiver chip 4004. This quadrature LO generation may include, for example, the techniques described herein with reference to FIGS. 7 and 8. In this way, each transceiver slice 4010 may be provided with its own dedicated set of quadrature LO signals with a phase tuned for that particular receive chain and antenna.

Again, the radio partitioning for radio 4000 shown by way of example in FIG. 40 provides several benefits that are a result of pushing the radio transceiver slices to the radio-heads A and B. For example, doing so enables a more optimal system partitioning compared to the conventional partitioning shown in FIG. 39. Moreover, the radio partitioning aspects described throughout this section replaces high-frequency signal distribution (e.g., mm-wave) RF cabling with a high-speed digital I/O links using a lower cost PCB trace or flexible cabling. The use of this digital I/O also offers a number of system advantages. For instance, digital I/O enables scaling to be performed in accordance with antenna array size, the number of frequency bands, and/or distance in a simpler manner than conventional systems. From a design perspective, real-time control and synchronization signals may also be incorporated into the digital I/O link interface, as further discussed in the next section. Still further, aspects include the use of repeaters (not shown), which can easily be introduced in the digital I/O to increase the distance between the modem and the remote radio heads. This may be particularly useful, for example, for automotive applications or other high-noise environments requiring longer distances, as aspects include implementing links 4003 via fiber-optic cabling.

Section VIII—Flexible Cable Implementation for Digital Radioheads

The aspects described within this section generally relate to radio interconnects and, more particularly, to radio interconnects that eliminate connectors.

To support the next generation of connected devices and things, mm-wave signals from a modem and RF transceiver chip need to be distributed to remote antenna arrays while still meeting aggressive power, cost, and form-factor requirements. Current solutions using have fallen short with regards to these requirements.

As discussed herein, conventional radio designs may implement several remote radio head modules interconnected with transceivers to facilitate various types of diversity schemes. An example of a conventional radio head design is shown in FIG. 39, which illustrates two separate radio head modules 'A' and 'B.' In the previous section, aspects were described to overcome the aforementioned issues with these traditional radio head distributions. These aspects include providing a more optimal radio partitioning and architecture in which the entire radio chain is pushed to the remote radio-heads, as discussed with reference to FIG. 40, for example. Thus, the aspects described in the previous section with reference to FIGS. 40-41 replace the RF coax cables with a digital link interface between the modem and the radio heads.

This section provides additional details with regards to these digital links described in the previous section with reference to FIGS. 40-41. However, the aspects described throughout this section are not limited to the implementations with regards to the aspects as shown and described with reference to FIGS. 40-41, or elsewhere herein. Instead, the aspects described throughout this section may be applicable to any type of radio architecture or partitioning that may benefit from the removal of connectors from one or more cables within the radio system. The physical structure of the cables used within a radio system to provide such benefits, as well as the benefits themselves, are further discussed throughout this section.

The use of digital links between the radioheads and modems (e.g., the digital links 4003 as shown in FIG. 40) may incur excessive loss in the cabling, particularly when driven at high data rates to support, for example, mm-wave frequency communications. Moreover, the connectors add cost to designs, limit their implementation, and require design considerations, particularly with regards to physical constraints in UE devices (e.g., connectors may limit the reduction in one or more dimensions, such as thickness). Connectors also add complexity to third parties adopting designs, as a third party modem needs to mate with the radio head provided by the radiohead manufacturer.

The cable design aspects discussed in this section allow for the digital data interconnections between various radiohead components (or the entire radioheads) and modems, as discussed in the previous sections, to utilize flexible cabling that reduces or completely eliminates the need for board connectors. In doing so, the cable aspects described in this section allow for the implementation of multiple digital data differential pairs, or "lanes," to facilitate high-speed data communications (e.g., serial data communications) between the modem and radiohead(s). The removal of connectors also enables additional differential pairs to be added to the cabling, as the presence of connectors incurs additional loss with added pairs. As an added benefit, the elimination of cables, which are difficult to model, simplifies the design and layout of the radio system.

The aspects described herein also enable higher frequency communications, and the multiple digital data pairs support multiple simultaneous communication channels for different communications protocols. For instance, the cabling aspects described herein may carry digital data to support communications at mm-wave frequencies, 60 GHz bands associated with Wi-Fi communication protocols (e.g., 802.11ay), Wi-Gig, Global Navigation Satellite Systems (GNSS), etc. Therefore, the aspects described herein facilitate signal multiplexing on a single cable, providing advantages by using a lesser number of cables within a radio system to yield a less complex solution.

Moreover, the cable aspects described throughout this section may implement various components integrated within the cable design. For example, some aspects include the cables having various components such as amplifier(s), transceiver(s), antennas, etc., mounted directly to the cable to provide additional flexibility regarding their placement and use within third party equipment. And, because the cable aspects described herein allow for radio components (e.g., antenna chips and RFICs) to be mounted directly to the cable, a collocation of more than one antenna array within a single design may be achieved. This may be particularly useful, for example, for applications utilizing more than one frequency band for wireless communications. For example, when a device is used for mm-wave communications, one antenna chip may be mounted to the cable that is configured to operate at a lower frequency band (e.g., less than 7 GHz), whereas a second antenna chip may be mounted to the cable that is configured to operate at a higher frequency band (e.g., greater than 24 GHz).

FIG. 42 illustrates an exemplary cable and component interface, in accordance with an aspect of the disclosure. The example cable and component interface 4200 is provided for ease of explanation, and may include additional, less, or alternate components as those shown in FIG. 42. FIG. 42 provides a top view and a side view, which shows additional details and a particular example of an implementation using the cable 4202. With reference to the top view, the cable and component interface 4200 includes a cable 4202, which provides a digital communication interface between at least two different radio component blocks 4204 and 4206. In an aspect, each of the radio component blocks 4204, 4206 may include one or more radio components. These radio components may utilize the connections provided by the cable 4202 to communicate with one another, interact with one another, and/or work in conjunction with one another based upon the type of components, the location within the radio system architecture, and/or the function associated with the individual radio components, as further discussed below. For example, radio components within the radio component block 4204 may use interconnections within the cable 4202 to provide a radio-based function. As another example, one or more radio components within the radio component block 4204 may use interconnections within the cable 4202 to communicate with one or more radio components within radio component block 4206 to provide another, different radio-based function.

To provide an illustrative example, the cable 4202 may represent one of more of the communication links 4003 as shown and described in the previous section with regards to FIGS. 40-41. Continuing this example, one of the radio component blocks 4204, 4206 may be identified with the modem 4002, whereas the other one of the radio component blocks 4204, 4206 may be identified with one of the radio-heads A or B, as shown in FIG. 40. As further discussed below, aspects include the cable 4202 having various layers, microvias, and/or interconnections to support these communications, as well as other radio-based functions, thereby eliminating connectors at one or both cable ends.

To do so, aspects include the cable 4202 being implemented as any suitable type of cable configured to support digital communications. In an aspect, the cable 4202 may be implemented as any suitable type of flexible cable having any suitable number of layers (e.g., 2-8). For instance, the cable 4202 may be implemented as a flexible flat cable (FFC), a flexible printed circuit (FPC) cable, etc. The flexible cable may also be manufactured from any suitable type of material, such as liquid crystalline polymer (LCP), for example. Moreover, aspects include the cable 4202 having any suitable number of microvias that may be stacked between layers 4250.1-4250.4 and/or staggered among the layers 4250.1-4250.4 to provide interconnections between the layers themselves and/or interconnections between the various components that are coupled to the cable 4202.

With reference to the side view of the cable 4202 as shown in FIG. 42, the cable 4202 is, in this example, implemented as a four-layer flexible cable, as indicated by each of the cable layers 4250.1-4250.4. Again, the aspects described herein are not limited to these examples, and the cable 4202 may include any suitable number of layers depending upon the particular application, the number of radio heads, the number of communication lanes desired, etc. In an aspect, each of the layers 4250.1-4250.4 designates a respective copper layer for connecting signal layers of the cable 4202.

In accordance with various aspects, the number of layers may also be increased to include one or more voltage planes (e.g., voltage supply) planes and/or to carry low frequency data rate signals (e.g., via unshielded data lines). These low frequency data rate signals may correspond to data other than the digital baseband data, which may be communicated between the external modem (e.g. the device board 4280) and the RFIC chip 4270 at lower data rate (e.g., one-tenth, one one-hundredth, etc., of the rate of the digital baseband data). An example of these low frequency data rate signals may include, for instance, control signals communicated between the RFIC 4270 and device modem with regards to radio operation, control, and/or functionality. In various aspects, the trace routing and/or communication standards utilized for the communication of digital baseband data and the lower-frequency data signals may be the same as one another or different types of traces, communication protocols, shielding configurations, etc., depending upon the particulate application, data rates, and/or signal types.

Each of the remaining layers 4250.1-4250.4 (i.e., those not dedicated to voltage planes or low frequency signal lines), may include routed signal line traces configured to carry high-speed digital data signals. In an aspect, these routed signal lines may include, for each data lane, a dual-trace configuration in accordance with digital differential data signaling. Thus, for each differential data signaling pair, two physical traces may be disposed and routed one or more of the layers 4250.1-4250.4. As these differential data pairs may carry high-speed digital data (e.g., serial data communications on the order of several tens or hundreds of Gbps), aspects further include each differential data pair being shielded with a ground trace on each side implemented in a "stripline" configuration. Thus, additional layers 4250 may be used to support additional data lanes as these are added to the radio system, particularly given the spatial limitations with regards to the number of traces that may be routed on a single layer.

The cable layers 4250.1-4250.4 are shown in FIG. 42 as single layers for purposes of brevity. However, each of the layers 4250.1-4250.4 may further include additional sub-layers to provide adequate separation and isolation between layers 4250 as needed. These sub-layers may, in some aspects, be alternatively identified with one or more of the intermediate layers 4251.1-4251.3. For instance, each of the layers 4250.1-4250.4 may constitute a copper (or other suitable metal) layer. And, as further shown by the side view of the cable 4202, each of the layers 4250.1-4250.4 may also be separated from one another by intermediate layers 4251.1-4251.3. In an aspect, these intermediate layers 4251.1-4251.3 may include a polyimide layer. Additionally or alternatively, the top and bottom layers 4250.1, 4250.4 may include a coverlayer. The intermediate layers 4251.1-4251.3 may also include one or more adhesive layers to bond each of the layers 4250, 4251 together and form a uniform and contiguous flexible cable assembly 4202.

Aspects include radio components being mounted to the cable 4202 without the use of connectors. To accomplish this, various types of couplings may be utilized depending upon the particular radio component and/or its mounted location on the cable 4202. In the example shown in FIG. 42, for instance, one of the radio components included in the radio component block 4204 may be identified with an antenna array die or chip 4260 (e.g., part of the phased array die or chip 4008 as shown in FIG. 40). The antenna chip 4260 may include one or more silicon layers 4260.1, upon which one or more antenna elements 4260.2 are disposed. The antenna elements 4260.2 may include, in various aspects, radiating elements of any suitable size and/or shape, such as patches, for example. The antenna chip 4260 may include any suitable number of antenna elements 4260.2 that are formed on multiple layers to implement, for instance, a phased array configuration. In an aspect, the antenna chip 4260 may be mounted to the cable 4202 via the bottom layer (in this example) 4250.4 via an adhesive layer 4261.

Continuing this example, the antenna array die or chip 4260 may work in conjunction with a radio frequency integrated circuit (RFIC) chip 4270, which functions as an interface between the antenna elements 4260.2 and one or more transceivers, as further discussed below. For example, the RFIC 4270 may represent an IC implementation of the various components of the radiohead that utilize communications via the cable 4202 to transmit and/or receive data via the antenna chip 4260. For example, the RFIC chip 4270 may be identified with, for example, one or more of the transceiver chip 4004 and/or the front end chip 4006, as shown and described herein with reference to FIGS. 40-41. Moreover, the RFIC chip 4270 may include one or more digital communication interfaces, drivers, etc., to enable the receipt, processing, and/or transmission of digital baseband data via the cable 4202.

In an aspect, the RFIC chip 4270 may be bonded to the cable 4202 using the appropriate traces on the cable 4202 to ensure that the appropriate voltage levels, control signals, differential data pairs, etc., are coupled to the RFIC chip 4270. This bonding may be represented as the coupling 4271, which may include, for example, one or more solder joints, electrically-conductive adhesive joints, etc. In an aspect, the adhesive layer 4261 may represent an electrically conductive or an electrically non-conductive coupling between the antenna elements 4260.1 and the RFIC 4270 via the cable 4202. For example, if the adhesive layer 4261 represents a non-electrically conductive adhesive layer, the signals from the RFIC chip 4270 may be coupled (e.g., galvanically) to the interface represented by the adhesive layer 4262 to carry signals through the interconnections and traces in the cable 4202. However, the signals may be electromagnetically coupled (e.g., non-galvanically) to the antenna elements 4260.2 without requiring physical electrical connections at the adhesive layer 4261, such as solder joints. Such aspects may be particularly useful, for instance, to avoid the need to solder components to both sides of the cable 4202, as soldering on both sides of flex cable can be an arduous task. This solution also provides a low cost and simple solution to mount the antenna chip 4260 to the cable 4202.

Again, the flexible cable aspects described herein may be implemented in accordance with the radio partitioning and architecture as discussed herein with reference to FIGS. 40-41, for example, but are not limited to these applications. For example, the RFIC chip 4270 may, in conjunction with the antenna chip 4260, represent the components and functionality associated with each of the radioheads A and B, as discussed above. In this case, the transceiver chip 4290 may be omitted, as its hardware and functionality may be incorporated into the RFIC chip 4270.

However, in aspects in which the transceiver is not incorporated into the radiohead architecture, the cable aspects described herein may still be utilized to couple various radio components to one another without the use of connectors. For example, the RFIC 4270 may represent a front end chip, whereas the transceiver chip 4290 may represent a separate transceiver chip external to the radioheads A and B as shown in FIG. 40. In this case, the transceiver chip 4290 may be bonded to the cable 4202 using the appropriate traces on the cable 4202 to ensure that the appropriate voltage levels, control signals, differential data pairs, etc., are coupled to the transceiver chip 4290. This bonding may be represented as the coupling 4291, which may include, for example, one or more solder joints, electrically-conductive adhesive joints, etc.

The cable aspects described herein also provide flexibility with respect to third party manufacturers, such as UE device manufacturers, for example. For instance, the device board 4280 may be identified with various components, such as the modem 4002, for example, as discussed in the previous sections with respect to FIGS. 40-41. Thus, the device board 4280 as shown in FIG. 42 may include a modem that interfaces with the radiohead components via the cable 4202, and is able to do so without using a connector. Instead, the device board 4280 may be coupled to the appropriate interconnections at the cable 4202 using the coupling 4281, which may include, for example, one or more solder joints, electrically-conductive adhesive joints, etc.

Thus, because the device associated with the device board 4280 is not limited to specific connector types, greater flexibility is achieved with regards to the routing, placement, and coupling of the radiohead(s) to the device board 4280. In particular, the use of the cable 4202 as described in this section overcome issues associated with connectors on either end of the cable 4202, which otherwise limits (by nature of the connector availability) the number of differential data pairs that may be coupled to remote boards, especially when considering the additional signals (e.g., controls and power pins) that are required. Furthermore, the use of the cable 4202 improves coupling at the RF radiohead (which may or may not include the transceiver as discussed with reference to FIGS. 40-41). Moreover, in doing so, the aspects described herein allow additional gain to remain at the radiohead, as connectors are often the main source of loss, antenna coupling (feedback), and instability.

And, by directly mounting components to the cable 4202 and eliminating connectors, additional flexibility is introduced into the layout and design of the radio system. For example, FIG. 43 illustrates an example implementation of radio components using a cable interconnection. As shown in FIG. 43, the cable 4202 is utilized to offload a power management IC (PMIC) and transceiver chip 4290 (Tx/Rx) to an external board 4302. This external board 4302 is coupled, via the cable 4202, to the antenna chip 4260 and the front end chip 4270, as discussed herein with reference to FIG. 42. These aspects may be particularly useful, for example, to facilitate better thermal dissipation, as the PMIC chip and the transceiver chip 4290 may be a significant source of heat generation within a device. It is also demonstrated in FIG. 43 that other signals (e.g., voltage and/or control signals associated with the PMIC) may be coupled via the cable 4202 in addition to the differential data pairs discussed herein.

To provide another example, FIG. 44 illustrates another example implementation of radio components using a cable interconnection. As shown in FIG. 44, the cable 4402 is also used to offload a PMIC and transceiver chip (Tx/Rx) to an external board 4402, which may be identified with the external board 4302 as shown in FIG. 43. However, the external board 4402 as shown in FIG. 44 is coupled to two separate radioheads. In particular, the external board 4402 is separately coupled to a radiohead 4402.A via a cable 4202.A, and to a radiohead 4402.B via a cable 4202.B. In the example shown in FIG. 44, the radioheads 4402.A, 4402.B may be identified with, for instance the radio components 4204, as shown in FIG. 42, and each of the cables 4402.A, 4402.B may be identified with the cable 4202. As another example, the radioheads 4402.A, 4402.B may be identified with the radioheads A and B as shown and discussed in the prior section with reference to FIGS. 40-41. In various aspects, the cables 4402.A, 4402.B may be different lengths and/or at different angles with respect to one another. Thus, the connectorless cable aspects described herein may also be useful to allow additional design flexibility from the standpoint of the third party device maker, who may thus elect to perform radio component placement at a later time without regard to the physical constraints that would otherwise be introduced by the presence of on-board connectors.

EXAMPLES—I

The following examples pertain to further aspects.

Example 1 is a local oscillator (LO) signals generator, comprising: a delay-locked loop (DLL) configured to generate phase-shifted signals at a sub-harmonic frequency based on a received input signal having a sub-harmonic frequency of an output signal frequency; and phase configuration circuitry operably coupled to the DLL, the phase configuration circuitry being configured to select subsets of the generated phase-shifted signals, and to provide the selected subsets of the phase-shifted signals to a resonant load, wherein the selection of the subsets of the phase-shifted signals causes each respective one of the subsets of the phase-shifted signals to frequency-multiply when combined via the resonant load to generate, for each respective one of the subsets of the phase-shifted signals, one of a set of quadrature LO signals at the output signal frequency.

In Example 2, the subject matter of Example 1, wherein the DLL comprises a controlled delay-line having a number of delay elements, and wherein a unit-phase shift associated with the generated phase-shifted signals is a function of the number of delay elements.

In Example 3, the subject matter of one or more of Examples 1-2, wherein the DLL comprises an interpolating delay line having a plurality of delay elements, and wherein a unit-phase shift associated with the generated phase-shifted signals is less than the delay associated with a single delay element from among the plurality of delay elements.

In Example 4, the subject matter of one or more of Examples 1-3, wherein the DLL comprises a two-dimensional matrix of delay elements interleaved with one another, with each node in the matrix being fed by two delay elements.

In Example 5, the subject matter of one or more of Examples 1-4, wherein the set of quadrature LO signals are quadrature differential LO signals.

In Example 6, the subject matter of one or more of Examples 1-5, wherein the output signal frequency is within a range of mm-wave frequencies.

In Example 7, the subject matter of one or more of Examples 1-6, wherein the selection of the subsets of the phase-shifted signals causes each one of the set of quadrature LO signals at the output signal frequency to be phase-shifted with reference to a phase of the received input signal.

Example 8 is a local oscillator (LO) signals generator, comprising: a delay-locked loop (DLL) configured to generate phase-shifted signals at a sub-harmonic frequency based on a received input signal having a sub-harmonic frequency of an output signal frequency; and amplitude configuration circuitry operably coupled to the DLL, the amplitude configuration circuitry being configured to control an amplitude of each of the phase-shifted signals to generate weighted phase-shifted signals, the weighted phase-shifted signals being coupled to a resonant load, wherein the amplitudes associated with the weighted phase-shifted signals causes each respective one of the weighted phase-shifted signals to frequency-multiply when combined via the resonant load to generate, for each respective one of the weighted phase-shifted signals, one of a set of quadrature LO signals at the output signal frequency.

In Example 9, the subject matter of Example 8, wherein the DLL comprises a controlled delay-line having a number of delay elements, and wherein a unit-phase shift associated with the generated phase-shifted signals is a function of the number of delay elements.

In Example 10, the subject matter of one or more of Examples 8-9, wherein the DLL comprises an interpolating delay line having a plurality of delay elements, and wherein a unit-phase shift associated with the generated phase-shifted signals is less than the delay associated with a single delay element from among the plurality of delay elements.

In Example 11, the subject matter of one or more of Examples 8-10, wherein the DLL comprises a two-dimensional matrix of delay elements interleaved with one another, with each node in the matrix being fed by two delay elements.

In Example 12, the subject matter of one or more of Examples 8-11, wherein the set of quadrature LO signals are quadrature differential LO signals.

In Example 13, the subject matter of one or more of Examples 8-12, wherein the output signal frequency is within a range of mm-wave frequencies.

In Example 14, the subject matter of one or more of Examples 8-13, wherein the selection of amplitudes associated with the weighted phase-shifted signals causes each one of the set of quadrature LO signals at the output signal frequency to be phase-shifted with reference to a phase of the received input signal.

Example 15 is a wireless device, comprising: a plurality of receiver chains; processing circuitry; and a memory configured to store executable instructions that, when executed by the processing circuitry, causes each receiver chain from the plurality or receiver chains to generate phase-shifted signals based on a received input signal having a sub-harmonic frequency of an output signal frequency, and to selectively provide a subset of the generated phase-shifted signals to a resonant load, wherein selectively providing the subset of the generated phase-shifted signals causes each respective one of the generated phase-shifted signals to frequency-multiply when combined via the resonant load to generate, for each respective one of the generated phase-shifted signals, one of a set of quadrature local oscillator (LO) signals at the output signal frequency.

In Example 16, the subject matter of Example 15, wherein each receiver chain from among the plurality of receiver chains includes a respective LO signals generation unit that is configured to generate the set of quadrature LO signals having phases that are shifted with respect to the set of quadrature LO signals generated via the other receiver chains.

In Example 17, the subject matter of one or more of Examples 15-16, wherein each receiver chain from among the plurality of receiver chains includes a respective LO signals generation unit including a delay-locked loop (DLL) configured to receive the input signal and to generate the phase-shifted signals from the received input signal at the sub-harmonic frequency.

In Example 18, the subject matter of one or more of Examples 15-17, wherein the DLL comprises a controlled delay-line having a number of delay elements, and wherein a unit-phase shift associated with the generated phase-shifted signals for each respective one of the plurality of receiver chains is a function of the number of delay elements.

In Example 19, the subject matter of one or more of Examples 15-18, wherein the DLL comprises an interpolating delay line having a plurality of delay elements, and wherein a unit-phase shift associated with the generated phase-shifted signals for each respective one of the plurality of receiver chains is less than the delay associated with a single delay element from among the plurality of delay elements.

In Example 20, the subject matter of one or more of Examples 15-19, wherein the DLL comprises a two-dimensional matrix of delay elements interleaved with one another, with each node in the matrix being fed by two delay elements.

In Example 21, the subject matter of one or more of Examples 15-20, wherein each receiver chain from among the plurality of receiver chains includes respective phase configuration circuitry coupled to a delay-locked loop (DLL), and wherein the executable instructions, when executed by the processing circuitry, causes the phase configuration circuitry to selectively provide the generated phase-shifted signals to the resonant load by selectively coupling selected ones of the phase-shifted signals generated by the DLL to the resonant load.

In Example 22, the subject matter of one or more of Examples 15-21, wherein each receiver chain from among the plurality of receiver chains includes a respective phase configuration circuitry coupled to a delay-locked loop (DLL), and wherein the executable instructions, when executed by the processing circuitry, causes the phase configuration circuitry to selectively provide the generated phase-shifted signals to the resonant load by selectively attenuating a portion of the phase-shifted signals generated by the DLL.

In Example 23, the subject matter of one or more of Examples 15-22, wherein the set of quadrature LO signals are quadrature differential LO signals.

In Example 24, the subject matter of one or more of Examples 15-23, wherein the output signal frequency is within a range of mm-wave frequencies.

Example 25 is a local oscillator (LO) signals generator means, comprising: a delay-locked loop (DLL) means for generating phase-shifted signals at a sub-harmonic frequency based on a received input signal having a subharmonic frequency of an output signal frequency; and phase configuration means operably coupled to the DLL, the phase configuration means selecting subsets of the generated phase-shifted signals, and providing the selected subsets of the phase-shifted signals to a resonant load, wherein the selection of the subsets of the phase-shifted signals causes each respective one of the subsets of the phase-shifted signals to frequency-multiply when combined via the resonant load to generate, for each respective one of the subsets of the phase-shifted signals, one of a set of quadrature LO signals at the output signal frequency.

In Example 26, the subject matter of Example 25, wherein the DLL means comprises a controlled delay-line means having a number of delay elements, and wherein a unit-phase shift associated with the generated phase-shifted signals is a function of the number of delay elements.

In Example 27, the subject matter of one or more of Examples 25-26, wherein the DLL means comprises an interpolating delay line having a plurality of delay elements, and wherein a unit-phase shift associated with the generated phase-shifted signals is less than the delay associated with a single delay element from among the plurality of delay elements.

In Example 28, the subject matter of one or more of Examples 25-27, wherein the DLL means comprises a two-dimensional matrix of delay elements interleaved with one another, with each node in the matrix being fed by two delay elements.

In Example 29, the subject matter of one or more of Examples 25-28, wherein the set of quadrature LO signals are quadrature differential LO signals.

In Example 30, the subject matter of one or more of Examples 25-29, wherein the output signal frequency is within a range of mm-wave frequencies.

In Example 31, the subject matter of one or more of Examples 25-30, wherein the selection of the subsets of the phase-shifted signals causes each one of the set of quadrature LO signals at the output signal frequency to be phase-shifted with reference to a phase of the received input signal.

Example 32 is a local oscillator (LO) signals generator means, comprising: a delay-locked loop (DLL) means for generating phase-shifted signals at a sub-harmonic frequency based on a received input signal having a sub-harmonic frequency of an output signal frequency; and amplitude configuration means operably coupled to the DLL, the amplitude configuration means controlling an amplitude of each of the phase-shifted signals to generate weighted phase-shifted signals, the weighted phase-shifted signals being coupled to a resonant load, wherein the amplitudes associated with the weighted phase-shifted signals causes each respective one of the weighted phase-shifted signals to frequency-multiply when combined via the resonant load to generate, for each respective one of the weighted phase-shifted signals, one of a set of quadrature LO signals at the output signal frequency.

In Example 33, the subject matter of Example 32, wherein the DLL means comprises a controlled delay-line having a number of delay elements, and wherein a unit-phase shift associated with the generated phase-shifted signals is a function of the number of delay elements.

In Example 34, the subject matter of one or more of Examples 31-32, wherein the DLL means comprises an interpolating delay line having a plurality of delay elements, and wherein a unit-phase shift associated with the generated phase-shifted signals is less than the delay associated with a single delay element from among the plurality of delay elements.

In Example 35, the subject matter of one or more of Examples 31-34, wherein the DLL means comprises a two-dimensional matrix of delay elements interleaved with one another, with each node in the matrix being fed by two delay elements.

In Example 36, the subject matter of one or more of Examples 31-35, wherein the set of quadrature LO signals are quadrature differential LO signals.

In Example 37, the subject matter of one or more of Examples 31-36, wherein the output signal frequency is within a range of mm-wave frequencies.

In Example 38, the subject matter of one or more of Examples 31-37, wherein the selection of amplitudes associated with the weighted phase-shifted signals causes each one of the set of quadrature LO signals at the output signal frequency to be phase-shifted with reference to a phase of the received input signal.

Example 39 is a wireless device means, comprising: a plurality of receiver chain means; processing means; and a memory means for storing executable instructions that, when executed by the processing means, causes each receiver chain means from the plurality or receiver chain means to generate phase-shifted signals based on a received input signal having a sub-harmonic frequency of an output signal frequency, and to selectively provide a subset of the generated phase-shifted signals to a resonant load, wherein selectively providing the subset of the generated phase-shifted signals causes each respective one of the generated phase-shifted signals to frequency-multiply when combined via the resonant load to generate, for each respective one of the generated phase-shifted signals, one of a set of quadrature local oscillator (LO) signals at the output signal frequency.

In Example 40, the subject matter of Example 39, wherein each receiver chain means from among the plurality of receiver chain means includes a respective LO signals generation means for generating the set of quadrature LO signals having phases that are shifted with respect to the set of quadrature LO signals generated via the other receiver chains.

In Example 41, the subject matter of one or more of Examples 39-40, wherein each receiver chain means from among the plurality of receiver chain means includes a respective LO signals generation means including a delay-locked loop (DLL) means for receiving the input signal and generating the phase-shifted signals from the received input signal at the sub-harmonic frequency.

In Example 42, the subject matter of one or more of Examples 39-41, wherein the DLL means comprises a controlled delay-line having a number of delay elements, and wherein a unit-phase shift associated with the generated phase-shifted signals for each respective one of the plurality of receiver chains is a function of the number of delay elements.

In Example 43, the subject matter of one or more of Examples 39-42, wherein the DLL means comprises an interpolating delay line having a plurality of delay elements, and wherein a unit-phase shift associated with the generated phase-shifted signals for each respective one of the plurality of receiver chains is less than the delay associated with a single delay element from among the plurality of delay elements.

In Example 44, the subject matter of one or more of Examples 39-43, wherein the DLL means comprises a two-dimensional matrix of delay elements interleaved with one another, with each node in the matrix being fed by two delay elements.

In Example 45, the subject matter of one or more of Examples 39-44, wherein each receiver chain means from among the plurality of receiver chain means includes respective phase configuration means coupled to a delay-locked loop (DLL) means, and wherein the executable instructions, when executed by the processing means, causes the phase configuration means to selectively provide the generated phase-shifted signals to the resonant load by selectively coupling selected ones of the phase-shifted signals generated by the DLL to the resonant load.

In Example 46, the subject matter of one or more of Examples 39-45, wherein each receiver chain means from among the plurality of receiver chain means includes a respective phase configuration means coupled to a delay-locked loop (DLL) means, and wherein the executable instructions, when executed by the processing means, causes the phase configuration means to selectively provide the generated phase-shifted signals to the resonant load by selectively attenuating a portion of the phase-shifted signals generated by the DLL.

In Example 47, the subject matter of one or more of Examples 39-46, wherein the set of quadrature LO signals are quadrature differential LO signals.

In Example 48, the subject matter of one or more of Examples 39-47, wherein the output signal frequency is within a range of mm-wave frequencies.

An apparatus as shown and described.

A method as shown and described.

EXAMPLES—II

The following examples pertain to further aspects.

Example 49 is a frequency-multiplying radio-frequency digital-to-analog converter (FM-RFDAC), comprising: phase generation circuitry configured to receive an input signal having a sub-multiple frequency of an output signal frequency, and to generate phase-shifted input signals from the input signal at the sub-multiple frequency; and phase selection circuitry configured to selectively couple a subset of the phase-shifted input signals to provide phase-shifted output signals to an amplitude configuration circuitry, wherein the amplitude configuration circuitry is configured to selectively weight and combine the phase-shifted output signals, and to couple the weighted and combined phase-shifted output signals at the sub-multiple frequency to a resonant matching network, and wherein the selection of the subsets of the phase-shifted input signals causes the weighted and combined phase-shifted output signals to frequency-multiply via coupling to the resonant matching network to generate an output signal at the output signal frequency.

In Example 50, the subject matter of Example 49, wherein the phase generation circuitry comprises a plurality of delay elements coupled in series with one another, with each node between adjacent couplings of delay elements being associated with a respective one of the phase-shifted input signals by an amount phase-shift that is proportional to the delay time introduced by each respective delay element.

In Example 51, the subject matter of one or more of Examples 49-50, further comprising: a digital-to-time converter (DTC) configured to generate the input signal time-aligned with phase modulated output from baseband in-phase and quadrature-phase signals fed into a digital front end.

In Example 52, the subject matter of one or more of Examples 49-51, wherein: the amplitude configuration circuitry includes a plurality of inverters coupled to respective capacitors, and the amplitude configuration circuitry is further configured to generate the weighted and combined phase-shifted output signals by controlling a mode of each one of the plurality of inverters as one of a switching mode or a fixed DC mode, and wherein the weighting provided by the amplitude configuration circuitry is based upon a ratio of capacitor values coupled to switching-operated inverters versus capacitor values coupled to fixed DC-operated inverters.

In Example 53, the subject matter of one or more of Examples 49-52, wherein the selection of the subset of the phase-shifted input signals causes the weighted and combined phase-shifted output signals to constructively add at a harmonic of the frequency of the input signal via coupling to the resonant matching network.

In Example 54, the subject matter of one or more of Examples 49-53, wherein the selection of the subset of the phase-shifted input signals causes the output signal to be phase-shifted with reference to a phase of the input signal.

In Example 55, the subject matter of one or more of Examples 49-54, wherein the output signal frequency is within a range of mm-wave frequencies.

Example 56 is a transmitter, comprising: a plurality of frequency-multiplying radio-frequency digital-to-analog converters (FM-RFDACs), each FM-RFDAC from among the plurality of FM-RFDACs being configured to: receive an input signal having a sub-multiple frequency of an output signal frequency, and to generate phase-shifted input signals from the input signal at the sub-multiple frequency; selectively couple a subset of the phase-shifted input signals to provide phase-shifted output signals to amplitude configuration circuitry, the amplitude configuration circuitry selectively weighting and combining the phase-shifted output signals to generate weighted and combined phase-shifted output signals; and a plurality of resonant matching networks, each resonant matching network from among the plurality of resonant matching networks being coupled to a respective one of the FM-RFDACs, each of the plurality of resonant matching networks being coupled to the respective one of the weighted and combined phase-shifted output signals, wherein each respective one of the plurality of resonant matching networks causes the weighted and combined phase-shifted output signals to frequency-multiply to generate a respective output signal at the output signal frequency.

In Example 57, the subject matter of claim 56, wherein each FM-RFDAC from among the plurality of FM-RFDACs includes phase generation circuitry to generate the phase-shifted input signals from the input signal, and wherein the phase generation circuitry comprises a plurality of delay elements coupled in series with one another, with each node between adjacent couplings of delay elements being associated with a respective one of the phase-shifted input signals by an amount phase-shift that is proportional to the delay time introduced by each respective delay element.

In Example 58, the subject matter of one or more of Examples 56-57, further comprising: a digital front end (DFE) front end configured to receive baseband in-phase and quadrature-phase signals; and a digital-to-time converter (DTC) configured to generate the input signal time-aligned with phase modulated output from the baseband in-phase and quadrature-phase signals.

In Example 59, the subject matter of one or more of Examples 56-58, wherein the DTC includes a multi-modulus divider (MMD) coupled to a digitally-controlled two-point edge interpolator ($DCEI^2$).

In Example 60, the subject matter of one or more of Examples 56-59, wherein: the amplitude configuration circuitry includes a plurality of inverters coupled to respective capacitors, and the amplitude configuration circuitry is further configured to generate the weighted and combined phase-shifted output signals by controlling a mode of each one of the plurality of inverters as one of a switching mode or a fixed DC mode, and the weighting of the phase-shifted output signals based upon a ratio of capacitor values coupled to switching-operated inverters versus capacitor values coupled to fixed DC-operated inverters.

In Example 61, the subject matter of one or more of Examples 56-60, wherein the selection of the subset of the phase-shifted input signals causes the weighted and combined phase-shifted output signals to constructively add at a harmonic of the frequency of the input signal via coupling to each respective one of the plurality of resonant matching networks.

In Example 62, the subject matter of one or more of Examples 56-61, wherein the selection of the subset of the phase-shifted input signals at each FM-RFDAC from among the plurality of FM-RFDACs causes each respective output signal from among the output signals generated by each FM-RFDAC to be phase-shifted with reference to a phase of the input signal.

In Example 63, the subject matter of one or more of Examples 56-62, wherein the selection of the subset of the phase-shifted input signals at each FM-RFDAC from among the plurality of FM-RFDACs causes each respective output signal from among the output signals generated by each FM-RFDAC to be phase-shifted with reference to one another.

In Example 64, the subject matter of one or more of Examples 56-63, wherein the output signal frequency is within a range of mm-wave frequencies.

Example 65 is a wireless device, comprising: a plurality of transmit chains; processing circuitry; and a memory configured to store executable instructions that, when executed by the processing circuitry, causes each transmit chain from the plurality or transmit chains to generate phase-shifted input signals at a sub-multiple frequency of an output signal frequency, and to selectively provide subsets of the generated phase-shifted input signals to a resonant matching network, wherein the selection of the subsets of the phase-shifted input signals causes the subsets of the phase-shifted signals to frequency-multiply when combined via the resonant matching network to generate, for each respective one of the plurality of transmit chains, an output signal at the output signal frequency.

In Example 66, the subject matter of Example 65, wherein each of the plurality of transmit chains includes amplitude configuration circuitry configured to selectively weight and combine the subsets of the generated phase-shifted input to generate weighted and combined phase-shifted output signals, and wherein the weighted and combined phase-shifted output signals are coupled to the resonant matching network to generate, for each respective one of the plurality of transmit chains, the output signal at the output signal frequency.

In Example 67, the subject matter of one or more of Examples 65-66, wherein: the amplitude configuration circuitry includes a plurality of inverters coupled to respective capacitors, and the amplitude configuration circuitry is further configured to generate the weighted and combined phase-shifted output signals by controlling a mode of each one of the plurality of inverters as one of a switching mode or a fixed DC mode, and the weighting of the phase-shifted output signals based upon a ratio of capacitor values coupled to switching-operated inverters versus capacitor values coupled to fixed DC-operated inverters.

In Example 68, the subject matter of one or more of Examples 65-67, wherein each of the plurality of transmit chains includes phase generation circuitry to generate the phase-shifted input signals from the input signal, and wherein the phase generation circuitry comprises a plurality of delay elements coupled in series with one another, with each node between adjacent couplings of delay elements being associated with a respective one of the phase-shifted input signals by an amount phase-shift that is proportional to the delay time introduced by each respective delay element.

In Example 69, the subject matter of one or more of Examples 65-68, wherein the selection of the subset of the phase-shifted input signals causes the weighted and combined phase-shifted output signals to constructively add at a harmonic of the frequency of the input signal via coupling to the resonant matching network.

In Example 70, the subject matter of one or more of Examples 65-69, wherein the selection of the subset of the phase-shifted input signals causes each respective one of the plurality of transmit chains to be phase-shifted with reference to a phase of the input signal.

In Example 71, the subject matter of one or more of Examples 65-70, wherein the selection of the subset of the phase-shifted input signals causes each respective one of the plurality of transmit chains to be phase-shifted with reference to one another.

In Example 72, the subject matter of one or more of Examples 65-71, wherein the output signal frequency is within a range of mm-wave frequencies.

Example 73 is a frequency-multiplying radio-frequency digital-to-analog converter (FM-RFDAC) means, comprising: phase generation means for receiving an input signal having a sub-multiple frequency of an output signal frequency, and generating phase-shifted input signals from the input signal at the sub-multiple frequency; and phase selection means for selectively coupling a subset of the phase-shifted input signals to provide phase-shifted output signals to an amplitude configuration circuitry, wherein the amplitude configuration means selectively weights and combines the phase-shifted output signals, and couples the weighted and combined phase-shifted output signals at the sub-multiple frequency to a resonant matching network, and wherein the selection of the subsets of the phase-shifted input signals causes the weighted and combined phase-shifted output signals to frequency-multiply via coupling to the resonant matching network to generate an output signal at the output signal frequency.

In Example 74, the subject matter of Example 73, wherein the phase generation means comprises a plurality of delay elements coupled in series with one another, with each node between adjacent couplings of delay elements being associated with a respective one of the phase-shifted input signals by an amount phase-shift that is proportional to the delay time introduced by each respective delay element.

In Example 75, the subject matter of one or more of Examples 73-74, further comprising: a digital-to-time converter (DTC) means for generating the input signal time-aligned with phase modulated output from baseband in-phase and quadrature-phase signals fed into a digital front end.

In Example 76, the subject matter of one or more of Examples 73-75, wherein: the amplitude configuration means includes a plurality of inverters coupled to respective capacitors, and the amplitude configuration means further generates the weighted and combined phase-shifted output signals by controlling a mode of each one of the plurality of inverters as one of a switching mode or a fixed DC mode, and wherein the weighting provided by the amplitude configuration means is based upon a ratio of capacitor values coupled to switching-operated inverters versus capacitor values coupled to fixed DC-operated inverters.

In Example 77, the subject matter of one or more of Examples 73-76, wherein the selection of the subset of the phase-shifted input signals causes the weighted and combined phase-shifted output signals to constructively add at a harmonic of the frequency of the input signal via coupling to the resonant matching network.

In Example 78, the subject matter of one or more of Examples 73-77, wherein the selection of the subset of the phase-shifted input signals causes the output signal to be phase-shifted with reference to a phase of the input signal.

In Example 79, the subject matter of one or more of Examples 73-78, wherein the output signal frequency is within a range of mm-wave frequencies.

Example 80 is a transmitter, comprising: a plurality of frequency-multiplying radio-frequency digital-to-analog converters (FM-RFDACs) means, each FM-RFDAC means from among the plurality of FM-RFDACs means: receiving an input signal having a sub-multiple frequency of an output signal frequency, and generating phase-shifted input signals from the input signal at the sub-multiple frequency; selectively coupling a subset of the phase-shifted input signals to provide phase-shifted output signals to amplitude configuration means, the amplitude configuration means selectively weighting and combining the phase-shifted output signals to generate weighted and combined phase-shifted output signals; and a plurality of resonant matching networks, each resonant matching network from among the plurality of resonant matching networks being coupled to a respective one of the FM-RFDACs means, each of the plurality of resonant matching networks being coupled to the respective one of the weighted and combined phase-shifted output signals, wherein each respective one of the plurality of resonant matching networks causes the weighted and combined phase-shifted output signals to frequency-multiply to generate a respective output signal at the output signal frequency.

In Example 81, the subject matter of claim 80, wherein each FM-RFDAC means from among the plurality of FM-RFDAC means includes phase generation means for generating the phase-shifted input signals from the input signal, and wherein the phase generation means comprises a plurality of delay elements coupled in series with one another, with each node between adjacent couplings of delay elements being associated with a respective one of the phase-shifted input signals by an amount phase-shift that is proportional to the delay time introduced by each respective delay element.

In Example 82, the subject matter of one or more of Examples 80-81, further comprising: a digital front end (DFE) front end means for receiving baseband in-phase and quadrature-phase signals; and a digital-to-time converter (DTC) means for generating the input signal time-aligned with phase modulated output from the baseband in-phase and quadrature-phase signals.

In Example 83, the subject matter of one or more of Examples 80-82, wherein the DTC means includes a multi-modulus divider (MMD) coupled to a digitally-controlled two-point edge interpolator ($DCEI^2$).

In Example 84, the subject matter of one or more of Examples 80-83, wherein: the amplitude configuration means includes a plurality of inverters coupled to respective capacitors, and the amplitude configuration means further generates the weighted and combined phase-shifted output signals by controlling a mode of each one of the plurality of inverters as one of a switching mode or a fixed DC mode, and the weighting of the phase-shifted output signals based upon a ratio of capacitor values coupled to switching-operated inverters versus capacitor values coupled to fixed DC-operated inverters.

In Example 85, the subject matter of one or more of Examples 80-84, wherein the selection of the subset of the phase-shifted input signals causes the weighted and combined phase-shifted output signals to constructively add at a harmonic of the frequency of the input signal via coupling to each respective one of the plurality of resonant matching networks.

In Example 86, the subject matter of one or more of Examples 80-85, wherein the selection of the subset of the phase-shifted input signals at each FM-RFDAC means from among the plurality of FM-RFDAC means causes each respective output signal from among the output signals generated by each FM-RFDAC means to be phase-shifted with reference to a phase of the input signal.

In Example 87, the subject matter of one or more of Examples 80-86, wherein the selection of the subset of the phase-shifted input signals at each FM-RFDAC means from among the plurality of FM-RFDAC means causes each respective output signal from among the output signals generated by each FM-RFDAC means to be phase-shifted with reference to one another.

In Example 88, the subject matter of one or more of Examples 80-87, wherein the output signal frequency is within a range of mm-wave frequencies.

Example 89 is a wireless device means, comprising: a plurality of transmit chain means; processing means; and a memory means for storing executable instructions that, when executed by the processing means, causes each transmit chain means from the plurality of transmit chain means to generate phase-shifted input signals at a sub-multiple frequency of an output signal frequency, and to selectively provide subsets of the generated phase-shifted input signals to a resonant matching network, wherein the selection of the subsets of the phase-shifted input signals causes the subsets of the phase-shifted signals to frequency-multiply when combined via the resonant matching network to generate, for each respective one of the plurality of transmit chain means, an output signal at the output signal frequency.

In Example 90, the subject matter of Example 89, wherein each of the plurality of transmit chain means includes amplitude configuration means for selectively weighting and combining the subsets of the generated phase-shifted input to generate weighted and combined phase-shifted output signals, and wherein the weighted and combined phase-shifted output signals are coupled to the resonant matching network to generate, for each respective one of the plurality of transmit chai means, the output signal at the output signal frequency.

In Example 91, the subject matter of one or more of Examples 89-90, wherein: the amplitude configuration means includes a plurality of inverters coupled to respective capacitors, and the amplitude configuration means is further configured to generate the weighted and combined phase-shifted output signals by controlling a mode of each one of the plurality of inverters as one of a switching mode or a fixed DC mode, and the weighting of the phase-shifted output signals based upon a ratio of capacitor values coupled to switching-operated inverters versus capacitor values coupled to fixed DC-operated inverters.

In Example 92, the subject matter of one or more of Examples 89-91, wherein each of the plurality of transmit chain means includes phase generation means for generating the phase-shifted input signals from the input signal, and wherein the phase generation means comprises a plurality of delay elements coupled in series with one another, with each node between adjacent couplings of delay elements being associated with a respective one of the phase-shifted input signals by an amount phase-shift that is proportional to the delay time introduced by each respective delay element.

In Example 93, the subject matter of one or more of Examples 89-92, wherein the selection of the subset of the phase-shifted input signals causes the weighted and combined phase-shifted output signals to constructively add at a harmonic of the frequency of the input signal via coupling to the resonant matching network.

In Example 94, the subject matter of one or more of Examples 89-93, wherein the selection of the subset of the phase-shifted input signals causes each respective one of the plurality of transmit chains to be phase-shifted with reference to a phase of the input signal.

In Example 95, the subject matter of one or more of Examples 89-94, wherein the selection of the subset of the phase-shifted input signals causes each respective one of the plurality of transmit chains to be phase-shifted with reference to one another.

In Example 96, the subject matter of one or more of Examples 89-95, wherein the output signal frequency is within a range of mm-wave frequencies.

An apparatus as shown and described.
A method as shown and described.

EXAMPLES—III

The following examples pertain to further aspects.

Example 97 is a transmitter, comprising: a first and a second phase-shifting circuitry, each configured to phase-shift an input signal having a frequency that is a sub-multiple frequency of an output signal frequency to provide a first and a second phase-shifted input signal, respectively; a first frequency-multiplying radio-frequency digital-to-analog converter (FM-RFDAC) configured to generate a first set of phase-shifted signals from the first phase-shifted input signal; and a second FM-RFDAC configured to generate a second set of phase-shifted signals from the second phase-shifted input signal, wherein the each of the first set of phase-shifted signals and the second set of phase-shifted signals are weighted to generate an output signal at the output signal frequency.

In Example 98, the subject matter of Example 97, wherein the phase-shift is based upon a re-mapping of in-phase (I) and quadrature-phase (Q) complex data values resulting in the I and Q complex data values being 45-degrees apart from one another, the phase-shift associated with the first phase-shifted input signal and the second phase-shifted signal being based upon a calculated octant, and further comprising: a digital front end configured to calculate the octant occupied by the in-phase (I) and quadrature-phase (Q) complex data values after being re-mapped to a 45-degree axis.

In Example 99, the subject matter of one or more of Examples 97-98, wherein the first phase-shifting circuitry is configured to generate the first phase-shifted input signal by phase-shifting the input signal by one of 0 degrees, 90 degrees, 180 degrees, or 270 degrees, and wherein the second phase-shifting circuitry is configured to generate the second phase-shifted input signal by phase-shifting the input signal by one of 45 degrees, 135 degrees, 225 degrees, or 315 degrees In Example 100, the subject matter of one or more of Examples 97-99, wherein each of the first FM-RFDAC and the second FM-RFDAC includes a plurality of amplitude control circuitry, each one of the plurality of amplitude control circuitry being coupled to a respective capacitor, and further comprising: a digital front end configured to control a mode of operation of each one of the plurality of amplitude control circuitry as one of a switching mode or a fixed DC mode, the weighting of the first set of phase-shifted signals and the second set of phase-shifted signals being based upon a ratio of capacitor values coupled to amplitude control circuitry operating in the switching mode versus amplitude control circuitry operating in the fixed DC mode.

In Example 101, the subject matter of one or more of Examples 97-100, wherein each one of the plurality of amplitude control circuitry is a logical NAND gate.

In Example 102, the subject matter of one or more of Examples 97-101, wherein each one of the logical NAND gates has one input coupled to each respective one of the first set of phase-shifted signals and the second set of phase-shifted signals, and a second input coupled to a digital control line having a logical state that is controlled by the digital front end.

In Example 103, the subject matter of one or more of Examples 97-102, further comprising: a resonant matching network coupled to each of the first FM-RFDAC and the second FM-RFDAC at a common output node, wherein the weight applied to each of the first set of phase-shifted signals and the second set of phase-shifted signals causes the first set of phase-shifted signals and the second set of phase-shifted signals to constructively add at a harmonic of the frequency of the input signal via coupling to the resonant matching network.

In Example 104, the subject matter of one or more of Examples 97-103, wherein the output signal frequency is within a range of mm-wave frequencies.

In Example 105, the subject matter of one or more of Examples 97-104, wherein the first FM-RFDAC and the second FM-RFDAC is each configured to generate the first set of phase-shifted signals and the second set of phase-shifted signals, respectively, using one of a controlled delay-line, an interpolating delay-line, or a two-dimensional delay-line.

Example 106 is a transmitter, comprising: a digital front end configured to calculate an octant occupied by digital baseband signal in-phase (I) and quadrature-phase (Q) complex data values after being re-mapped to a 45-degree axis; a first frequency-multiplying radio-frequency digital-to-analog converter (FM-RFDAC) configured to generate a first set of phase-shifted input signals from a first phase-shifted input signal, wherein the first phase-shifted input signal is generated by applying a first phase shift to an input signal based upon the calculated octant, the input signal having a sub-multiple frequency of an output signal frequency; and a second FM-RFDAC configured to generate a second set of phase-shifted input signals from a second phase-shifted input signal, the second phase-shifted input signal being generated by applying a second phase shift to the input signal based upon the calculated octant, wherein the digital front end is further configured to weight each of the first set of phase-shifted signals and the second set of phase-shifted signals to generate an output signal at the output signal frequency.

In Example 107, the subject matter of Example 106, further comprising: first and second phase-shifting circuitry, each configured to phase-shift the input signal based upon the calculated octant to provide the first and the second phase-shifted input signal, respectively.

In Example 108, the subject matter of one or more of Examples 106-107, wherein the first phase-shifting circuitry is configured apply the first phase shift to the input signal that is one of 0 degrees, 90 degrees, 180 degrees, or 270 degrees, in accordance with the calculated octant, and wherein the second phase-shifting circuitry is configured apply the second phase shift to the input signal that is one of 45 degrees, 135 degrees, 225 degrees, or 315 degrees, in accordance with the calculated octant.

In Example 109, the subject matter of one or more of Examples 106-108, wherein: each of the first FM-RFDAC and the second FM-RFDAC includes a plurality of amplitude control circuitry, each one of the plurality of amplitude control circuitry being coupled to a respective capacitor, the digital front end is further configured to control a mode of operation of each one of the plurality of amplitude control circuitry as one of a switching mode or a fixed DC mode, and the weighting of the first set of phase-shifted signals and the second set of phase-shifted signals is based upon a ratio of capacitor values coupled to amplitude control circuitry operating in the switching mode versus amplitude control circuitry operating in the fixed DC mode.

In Example 110, the subject matter of one or more of Examples 106-109, wherein each one of the plurality of amplitude control circuitry is a logical NAND gate.

In Example 111, the subject matter of one or more of Examples 106-110, wherein each one of the logical NAND gates has one input coupled to each respective one of the first set of phase-shifted signals and the second set of phase-shifted signals, and a second input coupled to a digital control line having a logical state that is controlled by the digital front end.

In Example 112, the subject matter of one or more of Examples 106-111, further comprising: a resonant matching network coupled to each of the first FM-RFDAC and the second FM-RFDAC at a common output node, wherein the weight applied to each of the first set of phase-shifted signals and the second set of phase-shifted signals causes the first set of phase-shifted signals and the second set of phase-shifted signals to constructively add at a harmonic of the frequency of the input signal via coupling to the resonant matching network.

In Example 113, the subject matter of one or more of Examples 106-112, wherein the output signal frequency is within a range of mm-wave frequencies.

In Example 114, the subject matter of one or more of Examples 106-113, wherein the first FM-RFDAC and the second FM-RFDAC is each configured to generate the first set of phase-shifted signals and the second set of phase-shifted signals, respectively, using one of a controlled delay-line, an interpolating delay-line, or a two-dimensional delay-line.

Example 115 is a wireless device, comprising: a plurality of transmit chains; processing circuitry; and a memory configured to store executable instructions that, when executed by the processing circuitry, causes each transmit chain from the plurality or transmit chains to: phase-shift an input signal having a frequency that is a sub-multiple frequency of an output signal frequency to provide a first and a second phase-shifted input signal; generate a first set of phase-shifted signals from the first phase-shifted input signal; generate a second set of phase-shifted signals from the second phase-shifted input signal; and generate an output signal at the output signal frequency based upon a weighted combination of each of the first set of phase-shifted signals and the second set of phase-shifted signals.

In Example 116, the subject matter of Example 115, wherein: the phase-shift is based upon a re-mapping of in-phase (I) and quadrature-phase (Q) complex data values resulting in the I and Q complex data values being 45-degrees apart from one another, and the executable instructions, when executed by the processing circuitry, causes each transmit chain from the plurality or transmit chains to calculate an octant occupied by the in-phase (I) and quadrature-phase (Q) complex data values after being re-mapped to a 45-degree axis, and the phase-shift associated with the first phase-shifted input signal and the second phase-shifted signal are based upon the calculated octant.

In Example 117, the subject matter of one or more of Examples 115-116, wherein each transmit chain from the plurality or transmit chains is configured to generate the first phase-shifted input signal by phase-shifting the input signal by one of 0 degrees, 90 degrees, 180 degrees, or 270 degrees, and to generate the second phase-shifted input signal by phase-shifting the input signal by one of 45 degrees, 135 degrees, 225 degrees, or 315 degrees.

In Example 118, the subject matter of one or more of Examples 115-117, wherein each transmit chain from the plurality or transmit chains includes a plurality of amplitude control circuitry, each one of the plurality of amplitude control circuitry being coupled to a respective capacitor, and wherein the executable instructions, when executed by the processing circuitry, causes each transmit chain from the plurality or transmit chains to control a mode of operation of each one of the plurality of amplitude control circuitry as one of a switching mode or a fixed DC mode, and wherein the weighting of the first set of phase-shifted signals and the second set of phase-shifted signals is based upon a ratio of capacitor values coupled to amplitude control circuitry operating in the switching mode versus amplitude control circuitry operating in the fixed DC mode.

In Example 119, the subject matter of one or more of Examples 115-118, wherein the weighted combination of each of the first set of phase-shifted signals and the second set of phase-shifted signals at each one of the plurality of transmit chains causes the output signal generated by each respective one of the plurality of transmit chains to be phase-shifted with reference to one another.

In Example 120, the subject matter of one or more of Examples 115-119, wherein the output signal frequency is within a range of mm-wave frequencies.

Example 121 is a transmitter means, comprising: a first and a second phase-shifting means for phase-shifting an input signal having a frequency that is a sub-multiple frequency of an output signal frequency to provide a first and a second phase-shifted input signal, respectively; a first frequency-multiplying radio-frequency digital-to-analog converter (FM-RFDAC) means for generating a first set of phase-shifted signals from the first phase-shifted input signal; and a second FM-RFDAC means for generating a second set of phase-shifted signals from the second phase-shifted input signal, wherein each of the first set of phase-shifted signals and the second set of phase-shifted signals are weighted to generate an output signal at the output signal frequency.

In Example 122, the subject matter of Example 121, wherein the phase-shift is based upon a re-mapping of in-phase (I) and quadrature-phase (Q) complex data values resulting in the I and Q complex data values being 45-degrees apart from one another, the phase-shift associated with the first phase-shifted input signal and the second phase-shifted signal being based upon a calculated octant, and further comprising: a digital front end means for calculating the octant occupied by the in-phase (I) and quadrature-phase (Q) complex data values after being re-mapped to a 45-degree axis.

In Example 123, the subject matter of one or more of Examples 121-122, wherein the first phase-shifting means generates the first phase-shifted input signal by phase-shifting the input signal by one of 0 degrees, 90 degrees, 180 degrees, or 270 degrees, and wherein the second phase-shifting means generates the second phase-shifted input signal by phase-shifting the input signal by one of 45 degrees, 135 degrees, 225 degrees, or 315 degrees.

In Example 124, the subject matter of one or more of Examples 121-123, wherein each of the first FM-RFDAC means and the second FM-RFDAC means includes a plurality of amplitude control means, each one of the plurality of amplitude control means being coupled to a respective capacitor, and further comprising: a digital front end means for controlling a mode of operation of each one of the plurality of amplitude control circuitry as one of a switching mode or a fixed DC mode, the weighting of the first set of phase-shifted signals and the second set of phase-shifted signals being based upon a ratio of capacitor values coupled to amplitude control means for operating in the switching mode versus amplitude control means for operating in the fixed DC mode.

In Example 125, the subject matter of one or more of Examples 121-124, wherein each one of the plurality of amplitude control means is a logical NAND gate.

In Example 126, the subject matter of one or more of Examples 121-125, wherein each one of the logical NAND gates has one input coupled to each respective one of the first set of phase-shifted signals and the second set of phase-shifted signals, and a second input coupled to a digital control line having a logical state that is controlled by the digital front end means.

In Example 127, the subject matter of one or more of Examples 121-126, further comprising: a resonant matching network coupled to each of the first FM-RFDAC means and the second FM-RFDAC means at a common output node, wherein the weight applied to each of the first set of phase-shifted signals and the second set of phase-shifted signals causes the first set of phase-shifted signals and the second set of phase-shifted signals to constructively add at a harmonic of the frequency of the input signal via coupling to the resonant matching network.

In Example 128, the subject matter of one or more of Examples 121-127, wherein the output signal frequency is within a range of mm-wave frequencies.

In Example 129, the subject matter of one or more of Examples 121-128, wherein the first FM-RFDAC means and the second FM-RFDAC means each generates the first set of phase-shifted signals and the second set of phase-shifted signals, respectively, using one of a controlled delay-line, an interpolating delay-line, or a two-dimensional delay-line.

Example 130 is a transmitter means, comprising: a digital front end means for calculating an octant occupied by digital baseband signal in-phase (I) and quadrature-phase (Q) complex data values after being re-mapped to a 45-degree axis; a first frequency-multiplying radio-frequency digital-to-analog converter (FM-RFDAC) means for generating a first set of phase-shifted input signals from a first phase-shifted input signal, wherein the first phase-shifted input signal is generated by applying a first phase shift to an input signal based upon the calculated octant, the input signal having a sub-multiple frequency of an output signal frequency; and a second FM-RFDAC means for generating a second set of phase-shifted input signals from a second phase-shifted input signal, the second phase-shifted input signal being generated by applying a second phase shift to the input signal based upon the calculated octant, wherein the digital front end means further weights each of the first set of phase-shifted signals and the second set of phase-shifted signals to generate an output signal at the output signal frequency.

In Example 131, the subject matter of Example 130, further comprising: first and second phase-shifting means, each phase-shifting the input signal based upon the calculated octant to provide the first and the second phase-shifted input signal, respectively.

In Example 132, the subject matter of one or more of Examples 130-131, wherein the first phase-shifting means for applies the first phase shift to the input signal that is one of 0 degrees, 90 degrees, 180 degrees, or 270 degrees, in accordance with the calculated octant, and wherein the second phase-shifting means applies the second phase shift to the input signal that is one of 45 degrees, 135 degrees, 225 degrees, or 315 degrees, in accordance with the calculated octant.

In Example 133, the subject matter of one or more of Examples 130-132, wherein: each of the first FM-RFDAC means and the second FM-RFDAC means includes a plurality of amplitude control means, each one of the plurality of amplitude control means being coupled to a respective capacitor, the digital front end means further controlling a mode of operation of each one of the plurality of amplitude control means as one of a switching mode or a fixed DC mode, and the weighting of the first set of phase-shifted signals and the second set of phase-shifted signals is based upon a ratio of capacitor values coupled to amplitude control means operating in the switching mode versus amplitude control means operating in the fixed DC mode.

In Example 134, the subject matter of one or more of Examples 130-133, wherein each one of the plurality of amplitude control means is a logical NAND gate.

In Example 135, the subject matter of one or more of Examples 130-134, wherein each one of the logical NAND gates has one input coupled to each respective one of the first set of phase-shifted signals and the second set of phase-shifted signals, and a second input coupled to a digital control line having a logical state that is controlled by the digital front end.

In Example 136, the subject matter of one or more of Examples 130-135, further comprising: a resonant matching network coupled to each of the first FM-RFDAC means and the second FM-RFDAC means at a common output node, wherein the weight applied to each of the first set of phase-shifted signals and the second set of phase-shifted signals causes the first set of phase-shifted signals and the second set of phase-shifted signals to constructively add at a harmonic of the frequency of the input signal via coupling to the resonant matching network.

In Example 137, the subject matter of one or more of Examples 130-136, wherein the output signal frequency is within a range of mm-wave frequencies.

In Example 138, the subject matter of one or more of Examples 130-137, wherein the first FM-RFDAC means and the second FM-RFDAC means each generates the first set of phase-shifted signals and the second set of phase-shifted signals, respectively, using one of a controlled delay-line, an interpolating delay-line, or a two-dimensional delay-line.

Example 139 is a wireless device, comprising: a plurality of transmit chain means; processing means; and a memory means for storing executable instructions that, when executed by the processing means, causes each transmit chain means from the plurality or transmit chain means to: phase-shift an input signal having a frequency that is a sub-multiple frequency of an output signal frequency to provide a first and a second phase-shifted input signal; generate a first set of phase-shifted signals from the first phase-shifted input signal; generate a second set of phase-shifted signals from the second phase-shifted input signal; and generate an output signal at the output signal frequency based upon a weighted combination of each of the first set of phase-shifted signals and the second set of phase-shifted signals.

In Example 140, the subject matter of Example 139, wherein: the phase-shift is based upon a re-mapping of in-phase (I) and quadrature-phase (Q) complex data values resulting in the I and Q complex data values being 45-degrees apart from one another, and the executable instructions, when executed by the processing means, causes each transmit chain means from the plurality or transmit chain means to calculate an octant occupied by the in-phase (I) and quadrature-phase (Q) complex data values after being re-mapped to a 45-degree axis, and the phase-shift associated with the first phase-shifted input signal and the second phase-shifted signal are based upon the calculated octant.

In Example 141, the subject matter of one or more of Examples 139-140, wherein each transmit chain means from the plurality or transmit chain means generates the first phase-shifted input signal by phase-shifting the input signal by one of 0 degrees, 90 degrees, 180 degrees, or 270 degrees, and generates the second phase-shifted input signal by phase-shifting the input signal by one of 45 degrees, 135 degrees, 225 degrees, or 315 degrees.

In Example 142, the subject matter of one or more of Examples 139-141, wherein each transmit chain from the plurality or transmit chain means includes a plurality of amplitude control means, each one of the plurality of amplitude control means being coupled to a respective capacitor, and wherein the executable instructions, when executed by the processing means, causes each transmit chain means from the plurality or transmit chain means to control a mode of operation of each one of the plurality of amplitude control means as one of a switching mode or a fixed DC mode, and wherein the weighting of the first set of phase-shifted signals and the second set of phase-shifted signals is based upon a ratio of capacitor values coupled to amplitude control means operating in the switching mode versus amplitude control means operating in the fixed DC mode.

In Example 143, the subject matter of one or more of Examples 139-142, wherein the weighted combination of each of the first set of phase-shifted signals and the second set of phase-shifted signals at each one of the plurality of transmit chain means causes the output signal generated by each respective one of the plurality of transmit chain means to be phase-shifted with reference to one another.

In Example 144, the subject matter of one or more of Examples 139-143, wherein the output signal frequency is within a range of mm-wave frequencies.

An apparatus as shown and described.

A method as shown and described.

EXAMPLES—IV

The following examples pertain to further aspects.

Example 145 is a transceiver having a set of digital transceiver portions, a first digital transceiver portion from among the set of digital transceiver portions comprising: frequency multiplier/shifter circuitry configured to receive a local oscillator (LO) clock signal and to frequency multiply the LO clock signal to generate a set of quadrature LO signals; and a set of mixers configured to downsample received data in accordance with the set of quadrature LO signals to provide baseband in-phase (I) and quadrature phase (Q) signals, wherein the frequency multiplier/shifter circuitry is further configured to selectively phase shift the set of quadrature LO signals to enable processing of the baseband I and Q signals by a digital front end (DFE) in accordance with one of an analog or a digital beamforming mode.

In Example 146, the subject matter of Example 145, wherein the frequency multiplier/shifter circuitry is further configured to phase shift the set of quadrature LO signals to enable processing of the baseband I and Q signals by the DFE in accordance with the analog beamforming mode, and not to phase shift the set of quadrature LO signals to enable processing of the baseband I and Q signals by the DFE in accordance with the digital beamforming mode.

In Example 147, the subject matter of one or more of Examples 145-146, further comprising: I/Q analog-to-digital and baseband filter circuitry configured to be selectively enabled or disabled based upon whether the baseband I and Q signals are processed by the DFE in accordance with the analog or the digital beamforming mode.

In Example 148, the subject matter of one or more of Examples 145-147, wherein the I/Q analog-to-digital and baseband filter circuitry is configured to be enabled when the baseband I and Q signals are processed by the DFE in accordance with the digital beamforming mode, and to be disabled when the baseband I and Q signals are processed by the DFE in accordance with the analog beamforming mode.

In Example 149, the subject matter of one or more of Examples 145-148, further comprising: a switching component coupled to the output of the set of mixers, the switching component being configured to selectively couple the baseband I and Q signals to (i) the I/Q analog-to-digital and baseband filter circuitry, or (ii) an output of a second set of mixers associated with a second transceiver portion from among the set of digital transceiver portions, based upon whether the baseband I and Q signals are processed by the DFE in accordance with the analog or the digital beamforming mode.

In Example 150, the subject matter of one or more of Examples 145-149, wherein signal summation circuitry is coupled to the output of the second set of mixers associated with the second transceiver portion, and wherein the switching component is closed such that a summation of the baseband I and Q signals associated with the first transceiver portion and the second transceiver portion, respectively, are processed by the DFE in accordance with the analog beamforming mode.

In Example 151, the subject matter of one or more of Examples 145-150, wherein the switching component is open such that the baseband I and Q signals associated with the first transceiver portion are coupled to the I/Q analogto-digital and baseband filter circuitry and subsequently processed by the DFE in accordance with the digital beamforming mode.

In Example 152, the subject matter of one or more of Examples 145-151, wherein the received data is received in accordance with a signal having a frequency within a range of mm-wave frequencies.

Example 153 is transceiver, comprising: a shared digital front end (DFE) configured to process baseband in-phase (I) and quadrature phase (Q) signals in accordance with analog and digital beamforming modes; and a set of digital transceiver portions, each digital transceiver portion from among the set of digital transceiver portions being coupled to the shared DFE and including: frequency multiplier/shifter circuitry configured to receive a local oscillator (LO) clock signal and to frequency multiply the LO clock signal to generate a set of quadrature LO signals; and a set of mixers configured to downsample received data in accordance with the set of quadrature LO signals to provide the baseband I and Q signals, wherein the frequency multiplier/shifter circuitry associated with each digital transceiver portion is further configured to selectively phase shift the set of quadrature LO signals based upon whether the baseband I and Q signals for a particular digital transceiver portion are processed by the shared DFE in accordance with the analog or the digital beamforming mode.

In Example 154, the subject matter of Example 153, wherein the frequency multiplier/shifter circuitry associated with each digital transceiver portion is configured to phase shift the set of quadrature LO signals when the shared DFE processes the baseband I and Q signals in accordance with the analog beamforming mode, and to not phase shift the set of quadrature LO signals when the shared DFE processes the baseband I and Q signals in accordance with the digital beamforming mode.

In Example 155, the subject matter of one or more of Examples 153-154, wherein each digital transceiver portion from among the set of digital transceiver portions further includes I/Q analog-to-digital and baseband filter circuitry configured to be selectively enabled or disabled based upon whether the baseband I and Q signals are processed by the shared DFE in accordance with the analog or the digital beamforming mode.

In Example 156, the subject matter of one or more of Examples 153-155, wherein the I/Q analog-to-digital and baseband filter circuitry associated with each of the digital transceiver portions is configured to be enabled when the shared DFE processes the baseband I and Q signals in accordance with a digital beamforming mode.

In Example 157, the subject matter of one or more of Examples 153-156, wherein the I/Q analog-to-digital and baseband filter circuitry associated with a subset of the digital transceiver portions are disabled when the shared DFE processes the baseband I and Q signals in accordance with the analog beamforming mode.

In Example 158, the subject matter of one or more of Examples 153-157, wherein each digital transceiver portion from among the subset of the digital transceiver portions that are disabled when the shared DFE processes the baseband I and Q signals in accordance with the analog beamforming mode further includes a switching component that couples an output of the set of mixers associated with each digital transceiver portion from among the subset of the digital transceiver portions to one another.

In Example 159, the subject matter of one or more of Examples 153-158, wherein each digital transceiver portion from among the set of digital transceiver portions further includes signal summation circuitry coupled to the output of the set of mixers associated with each digital transceiver portion from among the subset of the digital transceiver portions, and wherein, when the shared DFE processes the baseband I and Q signals in accordance with an analog beamforming mode, the signal summation circuitry provides a summation of the baseband I and Q signals associated with each transceiver portion from among the subset of the digital transceiver portions that are disabled to the digital transceiver portion from among the set of digital transceiver portions having an I/Q analog-to-digital and baseband filter circuitry that is enabled.

In Example 160, the subject matter of one or more of Examples 153-159, wherein the received data is received in accordance with a signal having a frequency within a range of mm-wave frequencies.

Example 161 is a wireless device, comprising: a plurality of transceiver chains; processing circuitry; and a memory configured to store executable instructions that, when executed by the processing circuitry, causes each transceiver chain from the plurality or transceiver chains to: process baseband in-phase (I) and quadrature phase (Q) signals in accordance with analog and digital beamforming modes; receive a local oscillator (LO) clock signal and frequency multiply the LO clock signal to generate a set of quadrature LO signals; downsample received data in accordance with the set of quadrature LO signals to provide the baseband I and Q signals, wherein each transceiver chain from the plurality of transceiver chains is further configured to selectively phase shift the set of quadrature LO signals based upon whether the baseband I and Q signals for a particular transceiver chain are processed in accordance with the analog or the digital beamforming mode.

In Example 162, the subject matter of Example 161, wherein each transceiver chain from the plurality of transceiver chains is further configured to phase shift the set of quadrature LO signals when the baseband I and Q signals are processed in accordance with the analog beamforming mode, and to not phase shift the set of quadrature LO signals when the baseband I and Q signals are processed in accordance with the digital beamforming mode.

In Example 163, the subject matter of one or more of Examples 161-162, wherein each transceiver chain from the plurality of transceiver chains includes I/Q analog-to-digital and baseband filter circuitry configured to be selectively enabled or disabled based upon whether the baseband I and Q signals are processed in accordance with the analog or the digital beamforming mode.

In Example 164, the subject matter of one or more of Examples 161-163, wherein the I/Q analog-to-digital and baseband filter circuitry associated with each of the digital transceiver chains is configured to be enabled when the baseband I and Q signals are processed in accordance with the digital beamforming mode.

In Example 165, the subject matter of one or more of Examples 161-164, wherein the I/Q analog-to-digital and baseband filter circuitry associated with a subset of the digital transceiver chains are disabled when the baseband I and Q signals are processed in accordance with the analog beamforming mode.

In Example 166, the subject matter of one or more of Examples 161-165, wherein the received data is received in accordance with a signal having a frequency within a range of mm-wave frequencies.

Example 167 is a transceiver means having a set of digital transceiver means, a first digital transceiver means from among the set of digital transceiver means comprising:

frequency multiplier/shifter means for receiving a local oscillator (LO) clock signal and frequency multiplying the LO clock signal to generate a set of quadrature LO signals; and a set of mixer means for downsampling received data in accordance with the set of quadrature LO signals to provide baseband in-phase (I) and quadrature phase (Q) signals, wherein the frequency multiplier/shifter means selectively phase shifts the set of quadrature LO signals to enable processing of the baseband I and Q signals by a digital front end (DFE) means in accordance with one of an analog or a digital beamforming mode.

In Example 168, the subject matter of Example 167, wherein the frequency multiplier/shifter means further phase shifts the set of quadrature LO signals to enable processing of the baseband I and Q signals by the DFE means in accordance with the analog beamforming mode, and not to phase shift the set of quadrature LO signals to enable processing of the baseband I and Q signals by the DFE means in accordance with the digital beamforming mode.

In Example 169, the subject matter of one or more of Examples 167-168, further comprising: I/Q analog-to-digital and baseband filter means for being selectively enabled or disabled based upon whether the baseband I and Q signals are processed by the DFE means in accordance with the analog or the digital beamforming mode.

In Example 170, the subject matter of one or more of Examples 167-169, wherein the I/Q analog-to-digital and baseband filter means is enabled when the baseband I and Q signals are processed by the DFE means in accordance with the digital beamforming mode, and disabled when the baseband I and Q signals are processed by the DFE means in accordance with the analog beamforming mode.

In Example 171, the subject matter of one or more of Examples 167-170, further comprising: a switching means coupled to the output of the set of mixer means, the switching means being configured to selectively couple the baseband I and Q signals to (i) the I/Q analog-to-digital and baseband filter means, or (ii) an output of a second set of mixer means associated with a second transceiver means from among the set of digital transceiver means, based upon whether the baseband I and Q signals are processed by the DFE means in accordance with the analog or the digital beamforming mode.

In Example 172, the subject matter of one or more of Examples 167-171, wherein signal summation means is coupled to the output of the second set of mixer means associated with the second transceiver means, and wherein the switching means is closed such that a summation of the baseband I and Q signals associated with the first transceiver means and the second transceiver means, respectively, are processed by the DFE means in accordance with the analog beamforming mode.

In Example 173, the subject matter of one or more of Examples 167-172, wherein the switching means is open such that the baseband I and Q signals associated with the first transceiver means are coupled to the I/Q analog-to-digital and baseband filter means and subsequently processed by the DFE means in accordance with the digital beamforming mode.

In Example 174, the subject matter of one or more of Examples 167-173, wherein the received data is received in accordance with a signal having a frequency within a range of mm-wave frequencies.

Example 175 is transceiver means, comprising: a shared digital front end (DFE) means configured to process baseband in-phase (I) and quadrature phase (Q) signals in accordance with analog and digital beamforming modes; and a set of digital transceiver means, each digital transceiver means from among the set of digital transceiver means being coupled to the shared DFE means and including: frequency multiplier/shifter means for receiving a local oscillator (LO) clock signal and frequency multiplying the LO clock signal to generate a set of quadrature LO signals; and a set of mixer means for downsampling received data in accordance with the set of quadrature LO signals to provide the baseband I and Q signals, wherein the frequency multiplier/shifter means associated with each digital transceiver means selectively phase shifts the set of quadrature LO signals based upon whether the baseband I and Q signals for a particular digital transceiver means are processed by the shared DFE means in accordance with the analog or the digital beamforming mode.

In Example 176, the subject matter of Example 175, wherein the frequency multiplier/shifter means associated with each digital transceiver means phase shifts the set of quadrature LO signals when the shared DFE means processes the baseband I and Q signals in accordance with the analog beamforming mode, and does not phase shift the set of quadrature LO signals when the shared DFE means processes the baseband I and Q signals in accordance with the digital beamforming mode.

In Example 177, the subject matter of one or more of Examples 175-176, wherein each digital transceiver means from among the set of digital transceiver means further includes I/Q analog-to-digital and baseband filter means for being selectively enabled or disabled based upon whether the baseband I and Q signals are processed by the shared DFE means in accordance with the analog or the digital beamforming mode.

In Example 178, the subject matter of one or more of Examples 175-177, wherein the I/Q analog-to-digital and baseband filter means associated with each of the digital transceiver means is enabled when the shared DFE means processes the baseband I and Q signals in accordance with a digital beamforming mode.

In Example 179, the subject matter of one or more of Examples 175-178, wherein the I/Q analog-to-digital and baseband filter means associated with a subset of the digital transceiver means are disabled when the shared DFE means processes the baseband I and Q signals in accordance with the analog beamforming mode.

In Example 180, the subject matter of one or more of Examples 175-179, wherein each digital transceiver means from among the subset of the digital transceiver means that are disabled when the shared DFE means processes the baseband I and Q signals in accordance with the analog beamforming mode further includes a switching means that couples an output of the set of mixer means associated with each digital transceiver means from among the subset of the digital transceiver means to one another.

In Example 181, the subject matter of one or more of Examples 175-180, wherein each digital transceiver means from among the set of digital transceiver means further includes signal summation means coupled to the output of the set of mixer means associated with each digital transceiver means from among the subset of the digital transceiver means, and wherein, when the shared DFE means processes the baseband I and Q signals in accordance with an analog beamforming mode, the signal summation means provides a summation of the baseband I and Q signals associated with each transceiver means from among the subset of the digital transceiver means that are disabled to the digital transceiver means from among the set of digital transceiver means having an I/Q analog-to-digital and baseband filter means that is enabled.

In Example 182, the subject matter of one or more of Examples 175-181, wherein the received data is received in accordance with a signal having a frequency within a range of mm-wave frequencies.

Example 183 is a wireless device, comprising: a plurality of transceiver means; processing means; and a memory means for storing executable instructions that, when executed by the processing means, causes each transceiver means from the plurality or transceiver means to: process baseband in-phase (I) and quadrature phase (Q) signals in accordance with analog and digital beamforming modes; receive a local oscillator (LO) clock signal and frequency multiply the LO clock signal to generate a set of quadrature LO signals; downsample received data in accordance with the set of quadrature LO signals to provide the baseband I and Q signals, wherein each transceiver means from the plurality of transceiver means is further configured to selectively phase shift the set of quadrature LO signals based upon whether the baseband I and Q signals for a particular transceiver means are processed in accordance with the analog or the digital beamforming mode.

In Example 184, the subject matter of Example 183, wherein each transceiver means from the plurality of transceiver means is further configured to phase shift the set of quadrature LO signals when the baseband I and Q signals are processed in accordance with the analog beamforming mode, and to not phase shift the set of quadrature LO signals when the baseband I and Q signals are processed in accordance with the digital beamforming mode.

In Example 185, the subject matter of one or more of Examples 183-184, wherein each transceiver means from the plurality of transceiver means includes I/Q analog-to-digital and baseband filter means for being selectively enabled or disabled based upon whether the baseband I and Q signals are processed in accordance with the analog or the digital beamforming mode.

In Example 186, the subject matter of one or more of Examples 183-185, wherein the I/Q analog-to-digital and baseband filter means associated with each of the digital transceiver means is enabled when the baseband I and Q signals are processed in accordance with the digital beamforming mode.

In Example 187, the subject matter of one or more of Examples 183-186, wherein the I/Q analog-to-digital and baseband filter means associated with a subset of the digital transceiver means are disabled when the baseband I and Q signals are processed in accordance with the analog beamforming mode.

In Example 188, the subject matter of one or more of Examples 183-187, wherein the received data is received in accordance with a signal having a frequency within a range of mm-wave frequencies.

An apparatus as shown and described.

A method as shown and described.

EXAMPLES—V

The following examples pertain to further aspects.

Example 189 is a transceiver having a set of digital transceiver portions, a first digital transceiver portion from among the set of digital transceiver portions comprising: transmit path circuitry coupled to an antenna, the transmit path circuitry configured to couple a transmit signal via the antenna in accordance with a digital pre-distortion (DPD) coefficients of the transmit signal; and receive path circuitry configured to measure feedback data indicative of an input power of the transmit signal coupled to the antenna via the transmit path circuitry, wherein the transmit path circuitry is further configured to apply the DPD coefficients to the transmit signal based upon the feedback data to correct for non-linearity present in the first digital transceiver portion.

In Example 190, the subject matter of Example 189, wherein the transmit path circuitry further includes a frequency multiplying radio frequency analog-to-digital converter (FM-RFDAC) configured to apply the DPD coefficients to the transmit signal based upon the feedback data.

In Example 191, the subject matter of one or more of Examples 189-190, wherein the set of digital transceiver portions further includes a second digital transceiver portion, and further comprising: processing circuitry configured to compare the feedback data of the first digital transceiver portion to feedback data of the second digital transceiver portion, and to calculate the DPD coefficients applied by the transmit path circuitry to correct for non-linearity mismatches between the first digital transceiver portion and the second digital transceiver portion as indicated by the feedback data of the first and the second digital transceiver portion, respectively.

In Example 192, the subject matter of one or more of Examples 189-191, further comprising: a switching component coupled to the receive path circuitry and the transmit path circuitry, the switching component being configured to selectively couple, to the receive path circuitry, one of (i) the antenna, or (ii) a sampling path indicative of the input power of the transmit signal coupled to the antenna via the transmit path circuitry.

In Example 193, the subject matter of one or more of Examples 189-192, wherein the receive path circuitry is configured to measure the input power of the transmit signal coupled to the antenna via the transmit path circuitry concurrently with transmission of the transmit signal via the transmit path circuitry.

In Example 194, the subject matter of one or more of Examples 189-193, wherein the set of digital transceiver portions includes a second digital transceiver portion, and wherein the transmit path circuitry of the first digital transceiver portion and the second digital transceiver portion each includes a first and a second transceiver portion digital front end (DFE), respectively, and further comprising: a shared DFE coupled to each of the first digital transceiver portion and the second digital transceiver portion.

In Example 195, the subject matter of one or more of Examples 189-194, further comprising: processor circuitry configured to identify an amount of non-linearity mismatch between the first digital transceiver portion and the second digital transceiver portion, and to control which of the first transceiver portion DFE, the second transceiver portion DFE, and the shared DFE calculates the DPD coefficients for transmit chains of the first digital transceiver portion and the second digital transceiver portion based upon the amount of non-linearity mismatch.

In Example 196, the subject matter of one or more of Examples 189-195, wherein the transmit path circuitry is further configured to transmit the transmit signal having a frequency within a range of mm-wave frequencies via the antenna.

Example 197 is a transceiver, comprising: a shared digital front end (DFE); a set of digital transceiver portions, each digital transceiver portion from among the set of digital transceiver portions being coupled to the shared DFE and including: transmit path circuitry coupled to an antenna, the transmit path circuitry including a transceiver portion DFE configured to couple a transmit signal via the antenna in accordance with a digital pre-distortion (DPD) coefficients of the transmit signal; and receive path circuitry configured to measure feedback data indicative of an input power of the transmit signal coupled to the antenna via the transmit path circuitry; and processor circuitry configured to control whether, for each digital transceiver portion from among the set of digital transceiver portions, (i) the shared DFE, or (ii) the transceiver portion DFE, calculates the DPD coefficients based upon the measured feedback data.

In Example 198, the subject matter of Example 197, wherein the processor circuitry is configured to identify an amount of mismatch between each digital transceiver portion from among the set of digital transceiver portions using the measured feedback data, and wherein the DPD coefficients are calculated to correct the mismatch.

In Example 199, the subject matter of one or more of Examples 197-198, wherein the mismatches between each digital transceiver portion from among the set of digital transceiver portions as indicated by the measured feedback data includes one or more of: mismatches due to non-linearity differences, process mismatch, differences in supply and ground potential, non-identical antenna routing, antenna placement, temperature gradients, and voltage standing wave ratio (VSWR) differences on antennas.

In Example 200, the subject matter of one or more of Examples 197-199, wherein the transmit path circuitry further includes a frequency multiplying radio frequency analog-to-digital converter (FM-RFDAC) configured to apply the DPD coefficients to the transmit signal based upon the feedback data.

In Example 201, the subject matter of one or more of Examples 197-200, wherein each digital transceiver portion from among the set of digital transceiver portions further includes a switching component coupled to the receive path circuitry and the transmit path circuitry, the switching component being configured to selectively couple, to the receive path circuitry, one of (i) the antenna, or (ii) a sampling path indicative of the input power of the transmit signal coupled to the antenna via the transmit path circuitry.

In Example 202, the subject matter of one or more of Examples 197-201, wherein the processing circuitry is further configured to identify a subset of digital transceiver portions from among the set of digital transceiver portions for which the feedback data indicates mismatch one another less than a predetermined value and, for the subset of digital transceiver portions, perform the DPD calculations and disable the transceiver portion DFE from performing the DPD calculations.

In Example 203, the subject matter of one or more of Examples 197-202, wherein the processing circuitry is further configured to identify, for each digital transceiver portion from among the set of digital transceiver portions, an amount of non-linearity, and to control whether the shared DFE or the transceiver portion DFE calculates the DPD coefficients based upon the amount of non-linearity.

In Example 204, the subject matter of one or more of Examples 197-203, wherein the transmit path circuitry is further configured to transmit the transmit signal having a frequency within a range of mm-wave frequencies via the antenna.

Example 205 is a wireless device, comprising: a shared digital front end (DFE); a plurality of transceiver chains, each transceiver chain from among the plurality of transceiver chains being coupled to the shared DFE; processor circuitry; and a memory configured to store executable instructions that, when executed by the processing circuitry, causes each transceiver chain from the plurality or transceiver chains to: transmit, via a transmit path, a transmit signal via an antenna in accordance with a digital pre-distortion (DPD) coefficients of the transmit signal; measure, via a receive path, feedback data indicative of an input power of the transmit signal coupled to the antenna via the transmit path circuitry; control whether, for each transceiver chain from among the plurality of transceiver chains, (i) the shared DFE, or (ii) a transceiver portion DFE of a respective one of the plurality of transceiver chains, calculates the DPD coefficients based upon the measured feedback data.

In Example 206, the subject matter of Example 205, wherein the processor circuitry is configured to identify an amount of mismatch between each transceiver chain from among the plurality of transceiver chains using the measured feedback data, and wherein the DPD coefficients are calculated to correct the mismatch.

In Example 207, the subject matter of one or more of Examples 205-206, wherein the mismatches between each transceiver chain from among the plurality of transceiver chains includes one or more of: mismatches due to non-linearity differences, process mismatch, differences in supply and ground potential, non-identical antenna routing, antenna placement, temperature gradients, and voltage standing wave ratio (VSWR) differences on antennas.

In Example 208, the subject matter of one or more of Examples 205-207, wherein each transceiver chain from among the plurality of transceiver chains further includes a frequency multiplying radio frequency analog-to-digital converter (FM-RFDAC) configured to apply the DPD coefficients to the transmit signal based upon the feedback data.

In Example 209, the subject matter of one or more of Examples 205-208, wherein each transceiver chain from among the plurality of transceiver chains further includes a switching component coupled to the receive path circuitry and the transmit path circuitry, the switching component being configured to selectively couple, to the receive path circuitry, one of (i) the antenna, or (ii) a sampling path indicative of the input power of the transmit signal coupled to the antenna via the transmit path circuitry.

In Example 210, the subject matter of one or more of Examples 205-209, wherein the processing circuitry is further configured to identify a subset of transceiver chains from among the plurality of transceiver chains for which the feedback data indicates mismatch one another less than a predetermined value and, for the subset of transceiver chains, perform the DPD calculations and disable the transceiver portion DFE from performing the DPD calculations.

In Example 211, the subject matter of one or more of Examples 205-210, wherein the processing circuitry is further configured to identify, for each transceiver chain from among the plurality of transceiver chains, an amount of non-linearity, and to control whether the shared DFE or the transceiver portion DFE calculates the DPD coefficients based upon the amount of non-linearity.

In Example 212, the subject matter of one or more of Examples 205-211, wherein the transmit path circuitry of each transceiver chain from among the plurality of transceiver chains is further configured to transmit the transmit signal having a frequency within a range of mm-wave frequencies via the antenna.

Example 213 is a transceiver having a set of digital transceiver means, a first digital transceiver means from among the set of digital transceiver means comprising: transmit path means coupled to an antenna means, the transmit path means coupling a transmit signal via the antenna means in accordance with a digital pre-distortion (DPD) coefficients of the transmit signal; and receive path means for measuring feedback data indicative of an input power of the transmit signal coupled to the antenna means via the transmit path means, wherein the transmit path means is further configured to apply the DPD coefficients to the transmit signal based upon the feedback data to correct for non-linearity present in the first digital transceiver means.

In Example 214, the subject matter of Example 213, wherein the transmit path means further includes a frequency multiplying radio frequency analog-to-digital converter (FM-RFDAC) means for applying the DPD coefficients to the transmit signal based upon the feedback data.

In Example 215, the subject matter of one or more of Examples 213-214, wherein the set of digital transceiver means further includes a second digital transceiver means, and further comprising: processing means for comparing the feedback data of the first digital transceiver means to feedback data of the second digital transceiver means, and for calculating the DPD coefficients applied by the transmit path means to correct for non-linearity mismatches between the first digital transceiver means and the second digital transceiver means as indicated by the feedback data of the first and the second digital transceiver means, respectively.

In Example 216, the subject matter of one or more of Examples 213-215, further comprising: a switching means coupled to the receive path means and the transmit path means, the switching means selectively coupling, to the receive path circuitry, one of (i) the antenna means, or (ii) a sampling path means indicative of the input power of the transmit signal coupled to the antenna means via the transmit path means.

In Example 217, the subject matter of one or more of Examples 213-216, wherein the receive path means is configured to measure the input power of the transmit signal coupled to the antenna means via the transmit path means concurrently with transmission of the transmit signal via the transmit path means.

In Example 218, the subject matter of one or more of Examples 213-217, wherein the set of digital transceiver means includes a second digital transceiver means, and wherein the transmit path means of the first digital transceiver means and the second digital transceiver means each includes a first and a second transceiver portion digital front end (DFE) means, respectively, and further comprising: a shared DFE means coupled to each of the first digital transceiver means and the second digital transceiver means.

In Example 219, the subject matter of one or more of Examples 213-218, further comprising: processor means configured to identify an amount of non-linearity mismatch between the first digital transceiver means and the second digital transceiver means, and to control which of the first transceiver portion DFE means, the second transceiver portion DFE means, and the shared DFE means calculates the DPD coefficients for transmit chains of the first digital transceiver means and the second digital transceiver means based upon the amount of non-linearity mismatch.

In Example 220, the subject matter of one or more of Examples 213-219, wherein the transmit path means is further configured to transmit the transmit signal having a frequency within a range of mm-wave frequencies via the antenna means.

Example 221 is a transceiver, comprising: a shared digital front end (DFE) means; a set of digital transceiver means, each digital transceiver means from among the set of digital transceiver means being coupled to the shared DFE means and including: transmit path means coupled to an antenna means, the transmit path means including a transceiver portion DFE means for coupling a transmit signal via the antenna means in accordance with a digital pre-distortion (DPD) coefficients of the transmit signal; and receive path means for measuring feedback data indicative of an input power of the transmit signal coupled to the antenna means via the transmit path means; and processor means for controlling whether, for each digital transceiver means from among the set of digital transceiver means, (i) the shared DFE means, or (ii) the transceiver portion DFE means, calculates the DPD coefficients based upon the measured feedback data.

In Example 222, the subject matter of Example 221, wherein the processor means identifies an amount of mismatch between each digital transceiver means from among the set of digital transceiver means using the measured feedback data, and wherein the DPD coefficients are calculated to correct the mismatch.

In Example 223, the subject matter of one or more of Examples 221-222, wherein the mismatches between each digital transceiver means from among the set of digital transceiver means as indicated by the measured feedback data includes one or more of: mismatches due to non-linearity differences, process mismatch, differences in supply and ground potential, non-identical antenna routing, antenna placement, temperature gradients, and voltage standing wave ratio (VSWR) differences on antennas.

In Example 224, the subject matter of one or more of Examples 221-223, wherein the transmit path means further includes a frequency multiplying radio frequency analog-to-digital converter (FM-RFDAC) means for applying the DPD coefficients to the transmit signal based upon the feedback data.

In Example 225, the subject matter of one or more of Examples 221-224, wherein each digital transceiver means from among the set of digital transceiver means further includes a switching means coupled to the receive path means and the transmit path means, the switching means selectively coupling, to the receive path means, one of (i) the antenna means, or (ii) a sampling path means indicative of the input power of the transmit signal coupled to the antenna means via the transmit path means.

In Example 226, the subject matter of one or more of Examples 221-225, wherein the processing means further identifies a subset of digital transceiver means from among the set of digital transceiver means for which the feedback data indicates mismatch one another less than a predetermined value and, for the subset of digital transceiver means, performs the DPD calculations and disables the transceiver portion DFE means from performing the DPD calculations.

In Example 227, the subject matter of one or more of Examples 221-226, wherein the processing means further identifies, for each digital transceiver means from among the set of digital transceiver means, an amount of non-linearity, and controls whether the shared DFE means or the transceiver portion DFE means calculates the DPD coefficients based upon the amount of non-linearity.

In Example 228, the subject matter of one or more of Examples 221-227, wherein the transmit path means further transmits the transmit signal having a frequency within a range of mm-wave frequencies via the antenna means.

Example 229 is a wireless device means, comprising: a shared digital front end (DFE) means; a plurality of transceiver means, each transceiver means from among the plurality of transceiver means being coupled to the shared DFE means; processor means; and a memory means for storing executable instructions that, when executed by the processing means, causes each transceiver means from the plurality or transceiver means to: transmit, via a transmit path means, a transmit signal via an antenna means in accordance with a digital pre-distortion (DPD) coefficients of the transmit signal; measure, via a receive path, feedback data indicative of an input power of the transmit signal coupled to the antenna means via the transmit path means; control whether, for each transceiver means from among the plurality of transceiver means, (i) the shared DFE means, or (ii) a transceiver portion DFE means of a respective one of the plurality of transceiver means, calculates the DPD coefficients based upon the measured feedback data.

In Example 230, the subject matter of Example 229, wherein the processor means identifies an amount of mismatch between each transceiver means from among the plurality of transceiver means using the measured feedback data, and wherein the DPD coefficients are calculated to correct the mismatch.

In Example 231, the subject matter of one or more of Examples 229-230, wherein the mismatches between each transceiver means from among the plurality of transceiver means includes one or more of: mismatches due to non-linearity differences, process mismatch, differences in supply and ground potential, non-identical antenna routing, antenna placement, temperature gradients, and voltage standing wave ratio (VSWR) differences on antennas.

In Example 232, the subject matter of one or more of Examples 229-231, wherein each transceiver means from among the plurality of transceiver means further includes a frequency multiplying radio frequency analog-to-digital converter (FM-RFDAC) means for applying the DPD coefficients to the transmit signal based upon the feedback data.

In Example 233, the subject matter of one or more of Examples 229-232, wherein each transceiver means from among the plurality of transceiver means further includes a switching means coupled to the receive path means and the transmit path means, the switching means being selectively coupling, to the receive path means, one of (i) the antenna means, or (ii) a sampling path means indicative of the input power of the transmit signal coupled to the antenna means via the transmit path means.

In Example 234, the subject matter of one or more of Examples 229-233, wherein the processing means further identifies a subset of transceiver means from among the plurality of transceiver means for which the feedback data indicates mismatch one another less than a predetermined value and, for the subset of transceiver chains, perform the DPD calculations and disable the transceiver portion DFE means from performing the DPD calculations.

In Example 235, the subject matter of one or more of Examples 229-234, wherein the processing means further identifies, for each transceiver means from among the plurality of transceiver means, an amount of non-linearity, and to control whether the shared DFE means or the transceiver portion DFE means calculates the DPD coefficients based upon the amount of non-linearity.

In Example 236, the subject matter of one or more of Examples 229-235, wherein the transmit path means of each transceiver means from among the plurality of transceiver means is further configured to transmit the transmit signal having a frequency within a range of mm-wave frequencies via the antenna means.

An apparatus as shown and described.

A method as shown and described.

EXAMPLES—VI

The following examples pertain to further aspects.

Example 237 is a coupled-inductor based component, comprising: a first half including a first metal layer disposed beneath a second metal layer to form a stacked and coupled transmission line, the second metal layer being connected to a first spiral transformer; and a second half including the first metal layer connected to a second spiral transformer, wherein the first spiral transformer and the second spiral transformer form a set of coupled inductors, and wherein the stacked and coupled transmission line forms an equivalent split capacitor circuit.

In Example 238, the subject matter of Example 237, wherein the first metal layer and the second metal layer are associated with layers formed via a complementary metal oxide semiconductor (CMOS) process.

In Example 239, the subject matter of one or more of Examples 237-238, wherein the first spiral transformer and the second spiral transformer each have an octagonal shape.

In Example 240, the subject matter of one or more of Examples 237-239, wherein the first metal layer included in the second half further includes the second metal layer disposed thereon to form a second stacked and coupled transmission line.

In Example 241, the subject matter of one or more of Examples 237-240, wherein the second stacked and coupled transmission line form an equivalent split capacitor circuit.

In Example 242, the subject matter of one or more of Examples 237-241, wherein the first metal layer is disposed on top of a ground shield layer, and wherein a region beneath the first spiral transformer and the second spiral transformer is devoid of the ground shield layer.

In Example 243, the subject matter of one or more of Examples 237-242, wherein the first spiral transformer and the second spiral transformer are each connected to a ground ring that is connected to a ground shield layer.

In Example 244, the subject matter of one or more of Examples 237-243, wherein the ground ring has an octagonal shape and includes a first ground ring half and a second ground ring half, the first ground ring half and the second ground ring half each being connected to the ground shield layer.

In Example 245, the subject matter of one or more of Examples 237-244, wherein the first spiral transformer and the second spiral transformer are each connected to the first ground ring half.

In Example 246, the subject matter of one or more of Examples 237-245, wherein the first spiral transformer and the second spiral transformer are each connected to a ground ring that is connected to a ground shield layer, and wherein the first spiral transformer and the second spiral transformer are disposed within a region formed inside the ground ring that is devoid of the ground shield layer.

Example 247 is a coupled-inductor based component, comprising: a first port associated with a first half of the coupled-inductor based component, the first port including a first metal layer disposed beneath a second metal layer to form a stacked and coupled transmission line, the second metal layer being connected to a first spiral transformer; and a second port associated with a second half of the coupled-inductor based component, the second port including the first metal layer connected to a second spiral transformer, wherein the first spiral transformer and the second spiral transformer form a set of coupled inductors, and wherein the stacked and coupled transmission line forms an equivalent split capacitor circuit.

In Example 248, the subject matter Example 247, wherein the first metal layer and the second metal layer are associated with layers formed via a complementary metal oxide semiconductor (CMOS) process.

In Example 249, the subject matter of one or more of Examples 247-248, wherein the first port is coupled to a 50-Ohm source, and wherein the second port is coupled to an input of a millimeter-wave (mmW) amplifier.

In Example 250, the subject matter of one or more of Examples 247-249, wherein the first port is coupled to a 50-Ohm load, and wherein the second port is coupled to an output of a millimeter-wave (mmW) amplifier.

In Example 251, the subject matter of one or more of Examples 247-250, wherein the first metal layer included in the second port further includes the second metal layer disposed thereon to form a second stacked and coupled transmission line at the second port.

In Example 252, the subject matter of one or more of Examples 247-251, wherein: the coupled-inductor based component forms part of triplexer circuitry, the first port is coupled to a signal associated with a radio frequency (RF) head, the signal being from among a plurality of signals having different frequencies that are combined by the triplexer circuitry, and the second port is coupled to an output of the triplexer circuitry.

In Example 253, the subject matter of one or more of Examples 247-252, wherein the coupled-inductor based component forms a bandpass filter between the first and the second ports having a filter response in accordance with a frequency of the signal.

In Example 254, the subject matter of one or more of Examples 247-253, wherein the first spiral transformer and the second spiral transformer each have an octagonal shape.

In Example 255, the subject matter of one or more of Examples 247-254, wherein the second stacked and coupled transmission line form an equivalent split capacitor circuit.

In Example 256, the subject matter of one or more of Examples 247-255, wherein the first metal layer is disposed on top of a ground shield layer, and wherein a region beneath the first spiral transformer and the second spiral transformer is devoid of the ground shield layer.

Example 257 is a coupled-inductor based component, comprising: a first half including a first metal layer means disposed beneath a second metal layer means to form a stacked and coupled transmission line means, the second metal layer means being connected to a first spiral transformer means; and a second half including the first metal layer means connected to a second spiral transformer means, wherein the first spiral transformer means and the second spiral transformer means form a set of coupled inductors, and wherein the stacked and coupled transmission line forms an equivalent split capacitor circuit.

In Example 258, the subject matter of Example 257, wherein the first metal layer means and the second metal layer means are associated with layers formed via a complementary metal oxide semiconductor (CMOS) process.

In Example 259, the subject matter of one or more of Examples 257-258, wherein the first spiral transformer means and the second spiral transformer means each have an octagonal shape.

In Example 260, the subject matter of one or more of Examples 257-259, wherein the first metal layer means included in the second half further includes the second metal layer means disposed thereon to form a second stacked and coupled transmission line.

In Example 261, the subject matter of one or more of Examples 257-260, wherein the second stacked and coupled transmission line form an equivalent split capacitor circuit.

In Example 262, the subject matter of one or more of Examples 257-261, wherein the first metal layer means is disposed on top of a ground shield layer, and wherein a region beneath the first spiral transformer means and the second spiral transformer means is devoid of the ground shield layer.

In Example 263, the subject matter of one or more of Examples 257-262, wherein the first spiral transformer means and the second spiral transformer means are each connected to a ground ring that is connected to a ground shield layer.

In Example 264, the subject matter of one or more of Examples 257-263, wherein the ground ring has an octagonal shape and includes a first ground ring half and a second ground ring half, the first ground ring half and the second ground ring half each being connected to the ground shield layer.

In Example 265, the subject matter of one or more of Examples 257-264, wherein the first spiral transformer means and the second spiral transformer means are each connected to the first ground ring half.

In Example 266, the subject matter of one or more of Examples 257-265, wherein the first spiral transformer means and the second spiral transformer means are each connected to a ground ring that is connected to a ground shield layer, and wherein the first spiral transformer means and the second spiral transformer means are disposed within a region formed inside the ground ring that is devoid of the ground shield layer.

Example 267 is a coupled-inductor based component, comprising: a first port means associated with a first half of the coupled-inductor based component, the first port means including a first metal layer means disposed beneath a second metal layer means to form a stacked and coupled transmission line, the second metal layer means being connected to a first spiral transformer means; and a second port means associated with a second half of the coupled-inductor based component, the second port means including the first metal layer means connected to a second spiral transformer means, wherein the first spiral transformer means and the second spiral transformer means form a set of coupled inductors, and wherein the stacked and coupled transmission line forms an equivalent split capacitor circuit.

In Example 268, the subject matter Example 267, wherein the first metal layer means and the second metal layer means are associated with layers formed via a complementary metal oxide semiconductor (CMOS) process.

In Example 269, the subject matter of one or more of Examples 267-268, wherein the first port means is coupled to a 50-Ohm source, and wherein the second port means is coupled to an input of a millimeter-wave (mmW) amplifier.

In Example 270, the subject matter of one or more of Examples 267-269, wherein the first port means is coupled to a 50-Ohm load, and wherein the second port means is coupled to an output of a millimeter-wave (mmW) amplifier.

In Example 271, the subject matter of one or more of Examples 267-270, wherein the first metal layer means included in the second port means further includes the second metal layer means disposed thereon to form a second stacked and coupled transmission line at the second port means.

In Example 272, the subject matter of one or more of Examples 267-271, wherein: the coupled-inductor based component forms part of a triplexer means, the first port means coupling a signal associated with a radio frequency (RF) head, the signal being from among a plurality of signals having different frequencies that are combined by the triplexer means, and the second port means is coupled to an output of the triplexer means.

In Example 273, the subject matter of one or more of Examples 267-272, wherein the coupled-inductor based component forms a bandpass filter between the first and the second port means having a filter response in accordance with a frequency of the signal.

In Example 274, the subject matter of one or more of Examples 267-273, wherein the first spiral transformer means and the second spiral transformer means each have an octagonal shape.

In Example 275, the subject matter of one or more of Examples 267-274, wherein the second stacked and coupled transmission line form an equivalent split capacitor circuit.

In Example 276, the subject matter of one or more of Examples 267-275, wherein the first metal layer means is disposed on top of a ground shield layer, and wherein a region beneath the first spiral transformer means and the second spiral transformer means is devoid of the ground shield layer.

An apparatus as shown and described.

A method as shown and described.

EXAMPLES—VII

The following examples pertain to further aspects

Example 277 is a radiohead, comprising: a transceiver die including at least one transceiver chain; a front end die coupled to the at least one transceiver chain; and an antenna array die coupled to the front end die, wherein the at least one transceiver chain is configured to, in conjunction with the front end die and the antenna array die, facilitate wireless data communications with a device based upon digital data communications with a modem that is external to the radiohead.

In Example 278, the subject matter of Example 277, wherein the transceiver die is coupled to the modem via a digital cable that includes one of a flexible flat cable (FFC) or a flexible printed circuit (FPC) cable.

In Example 279, the subject matter of one or more of Examples 277-278, wherein the transceiver die further includes a plurality of transceiver chains and a common digital front end, the common digital front end being configured to facilitate digital data communications with the modem and each one of the plurality of transceiver chains.

In Example 280, the subject matter of one or more of Examples 277-279, wherein the digital data communications between the at least one transceiver chain and the modem is in accordance with a serial digital interface.

In Example 281, the subject matter of one or more of Examples 277-280, wherein the antenna array die includes a plurality of antenna elements, and wherein each one of the plurality of transceiver chains is coupled to a respective one of the plurality of antenna elements.

In Example 282, the subject matter of one or more of Examples 277-281, wherein each one of the plurality of transceiver chains is configured to provide a signal to each respective one of the plurality of antenna elements having an amplitude and signal weighting based upon digital data received via the common digital front end.

In Example 283, the subject matter of one or more of Examples 277-282, wherein each one of the plurality of transceiver chains includes a receive chain and a transmit chain, with each transmit chain and receive chain including a transceiver digital front end coupled to the common digital front end.

In Example 284, the subject matter of one or more of Examples 277-283, wherein the transceiver die further includes a plurality of transceiver chains, and further comprising: a local oscillator (LO) circuitry configured to generate quadrature LO signals, and wherein each one of the plurality of transceiver chains utilizes a separate set of quadrature LO signals generated by the LO circuitry.

Example 285 is a radiohead, comprising: a transceiver die including a plurality of transceiver chains; a front end die coupled to each one of the plurality of transceiver chains; and a plurality of antenna elements, each antenna element from among the plurality of antenna elements being coupled to each respective one of the plurality of transceiver chains via the front end die, wherein each one of the plurality of transceiver chains is configured to, in conjunction with the front end die and the plurality of antenna elements, facilitate wireless data communications with a device based upon digital data communications with a modem that is external to the radiohead.

In Example 286, the subject matter of Example 285, wherein each one of the plurality of transceiver chains is coupled to the modem via a digital cable that includes one of a flexible flat cable (FFC) or a flexible printed circuit (FPC) cable.

In Example 287, the subject matter of one or more of Examples 285-286, wherein the transceiver die further includes a common digital front end, the common digital front end being configured to facilitate the digital data communications with the modem and each one of the plurality of transceiver chains.

In Example 288, the subject matter of one or more of Examples 285-287, wherein the digital data communications between each one of the plurality of transceiver chains and the modem is in accordance with a serial digital interface.

In Example 289, the subject matter of one or more of Examples 285-288, wherein each one of the plurality of transceiver chains is configured to provide a signal to each respective one of the plurality of antenna elements having an amplitude and signal weighting based upon digital data received via the common digital front end.

In Example 290, the subject matter of one or more of Examples 285-289, wherein each one of the plurality of transceiver chains includes a receive chain and a transmit chain, with each transmit chain and receive chain including a transceiver digital front end coupled to the common digital front end.

In Example 291, the subject matter of one or more of Examples 285-290, wherein the transceiver die further includes a local oscillator (LO) circuitry configured to generate quadrature LO signals, and wherein each one of the plurality of transceiver chains utilizes a separate set of quadrature LO signals generated by the LO circuitry.

In Example 292, the subject matter of one or more of Examples 285-291, wherein the wireless data communications with the device is in accordance with a frequency range including millimeter-wave (mm-wave) frequencies.

Example 293 is a radio, comprising: a radiohead including: at least one transceiver chain; a front end die coupled to the at least one transceiver chain; and an antenna array die coupled to the front end die; and a modem external to the radiohead, the modem being coupled to the radiohead via a digital communication link, wherein the at least one transceiver chain is configured to, in conjunction with the front end die and the antenna array die, wirelessly communicate with a device based upon digital data communications with the modem via the digital communication link.

In Example 294, the subject matter of Example 293, wherein digital communication link includes one of a flexible flat cable (FFC) or a flexible printed circuit (FPC) cable.

In Example 295, the subject matter of one or more of Examples 293-294, wherein the transceiver die further includes a plurality of transceiver chains and a common digital front end, the common digital front end being configured to facilitate the digital data communications with the modem and each one of the plurality of transceiver chains.

In Example 296, the subject matter of one or more of Examples 293-295, wherein the digital data communications between the at least one transceiver chain and the external modem is in accordance with a serial digital interface.

In Example 297, the subject matter of one or more of Examples 293-296, wherein the antenna array die includes a plurality of antenna elements, and wherein each one of the plurality of transceiver chains is coupled to a respective one of the plurality of antenna elements.

In Example 298, the subject matter of one or more of Examples 293-297, wherein each one of the plurality of transceiver chains is configured to provide a signal to each respective one of the plurality of antenna elements having an amplitude and signal weighting based upon digital data received via the common digital front end.

In Example 299, the subject matter of one or more of Examples 293-298, wherein each one of the plurality of transceiver chains includes a receive chain and a transmit chain, with each transmit chain and receive chain including a transceiver digital front end coupled to the common digital front end.

In Example 300, the subject matter of one or more of Examples 293-299, wherein the transceiver die further includes a plurality of transceiver chains, and further comprising: a local oscillator (LO) circuitry configured to generate quadrature LO signals, and wherein each one of the plurality of transceiver chains utilizes a separate set of quadrature LO signals generated by the LO circuitry.

Example 301 is a radiohead, comprising: a transceiver means including at least one transceiver chain means; a front end means coupled to the at least one transceiver chain means; and an antenna array means coupled to the front end means, wherein the at least one transceiver chain means is configured to, in conjunction with the front end means and the antenna array means, facilitate wireless data communications with a device based upon digital data communications with a modem that is external to the radiohead.

In Example 302, the subject matter of Example 301, wherein the transceiver means is coupled to the modem via a digital cable that includes one of a flexible flat cable (FFC) or a flexible printed circuit (FPC) cable.

In Example 303, the subject matter of one or more of Examples 301-302, wherein the transceiver means further includes a plurality of transceiver chain means and a common digital front end means, the common digital front end means facilitating digital data communications with the modem and each one of the plurality of transceiver chain means.

In Example 304, the subject matter of one or more of Examples 301-303, wherein the digital data communications between the at least one transceiver chain means and the modem is in accordance with a serial digital interface.

In Example 305, the subject matter of one or more of Examples 301-304, wherein the antenna array means includes a plurality of antenna elements, and wherein each one of the plurality of transceiver chain means is coupled to a respective one of the plurality of antenna elements.

In Example 306, the subject matter of one or more of Examples 301-305, wherein each one of the plurality of transceiver chain means provides a signal to each respective one of the plurality of antenna elements having an amplitude and signal weighting based upon digital data received via the common digital front end means.

In Example 307, the subject matter of one or more of Examples 301-306, wherein each one of the plurality of transceiver chain means includes a receive chain means and a transmit chain means, with each transmit chain means and receive chain means including a transceiver digital front end means coupled to the common digital front end means.

In Example 308, the subject matter of one or more of Examples 301-307, wherein the transceiver means further includes a plurality of transceiver chain means, and further comprising: a local oscillator (LO) means for generating quadrature LO signals, and wherein each one of the plurality of transceiver chain means utilizes a separate set of quadrature LO signals generated by the LO means.

Example 309 is a radiohead, comprising: a transceiver means including a plurality of transceiver chain means; a front end means coupled to each one of the plurality of transceiver chain means; and a plurality of antenna elements, each antenna element from among the plurality of antenna elements being coupled to each respective one of the plurality of transceiver chain means via the front end means, wherein each one of the plurality of transceiver chain means, in conjunction with the front end means and the plurality of antenna elements, facilitates wireless data communications with a device based upon digital data communications with a modem that is external to the radiohead.

In Example 310, the subject matter of Example 309, wherein each one of the plurality of transceiver chain means is coupled to the modem via a digital cable that includes one of a flexible flat cable (FFC) or a flexible printed circuit (FPC) cable.

In Example 311, the subject matter of one or more of Examples 309-310, wherein the transceiver means further includes a common digital front end means, the common digital front end means facilitating the digital data communications with the modem and each one of the plurality of transceiver chain means.

In Example 312, the subject matter of one or more of Examples 309-311, wherein the digital data communications between each one of the plurality of transceiver chain means and the modem is in accordance with a serial digital interface.

In Example 313, the subject matter of one or more of Examples 309-312, wherein each one of the plurality of transceiver chain means provides a signal to each respective one of the plurality of antenna elements having an amplitude and signal weighting based upon digital data received via the common digital front end means.

In Example 314, the subject matter of one or more of Examples 309-313, wherein each one of the plurality of transceiver chain means includes a receive chain means and a transmit chain means, with each transmit chain means and receive chain means including a transceiver digital front end means coupled to the common digital front end means.

In Example 315, the subject matter of one or more of Examples 309-314, wherein the transceiver means further includes a local oscillator (LO) means for generating quadrature LO signals, and wherein each one of the plurality of transceiver chain means utilizes a separate set of quadrature LO signals generated by the LO means.

In Example 316, the subject matter of one or more of Examples 309-315, wherein the wireless data communications with the device is in accordance with a frequency range including millimeter-wave (mm-wave) frequencies.

Example 317 is a radio, comprising: a radiohead means including: at least one transceiver chain means; a front end means coupled to the at least one transceiver chain means; and an antenna array means coupled to the front end means; and a modem external to the radiohead means, the modem being coupled to the radiohead means via a digital communication link, wherein the at least one transceiver chain means, in conjunction with the front end means and the antenna array means, wirelessly communicates with a device based upon digital data communications with the modem via the digital communication link.

In Example 318, the subject matter of Example 317, wherein digital communication link includes one of a flexible flat cable (FFC) or a flexible printed circuit (FPC) cable.

In Example 319, the subject matter of one or more of Examples 317-318, wherein the transceiver means further includes a plurality of transceiver chain means and a common digital front end means, the common digital front end means facilitating the digital data communications with the modem and each one of the plurality of transceiver chain means.

In Example 320, the subject matter of one or more of Examples 317-319, wherein the digital data communications between the at least one transceiver chain means and the external modem is in accordance with a serial digital interface.

In Example 321, the subject matter of one or more of Examples 317-320, wherein the antenna array means includes a plurality of antenna elements, and wherein each one of the plurality of transceiver chain means is coupled to a respective one of the plurality of antenna elements.

In Example 322, the subject matter of one or more of Examples 317-321, wherein each one of the plurality of transceiver chain means provides a signal to each respective one of the plurality of antenna elements having an amplitude and signal weighting based upon digital data received via the common digital front end means.

In Example 323, the subject matter of one or more of Examples 317-322, wherein each one of the plurality of transceiver chain means includes a receive chain means and a transmit chain means, with each transmit chain means and receive chain means including a transceiver digital front end means coupled to the common digital front end means.

In Example 324, the subject matter of one or more of Examples 317-323, wherein the transceiver means further includes a plurality of transceiver chain means, and further comprising: a local oscillator (LO) means for generating quadrature LO signals, and wherein each one of the plurality of transceiver chain means utilizes a separate set of quadrature LO signals generated by the LO means.

An apparatus as shown and described.

A method as shown and described.

EXAMPLES—VIII

The following examples pertain to further aspects.

Example 325 is a cable, comprising: a flexible cable; an antenna array die coupled to a first side of the flexible cable; and a radio frequency integrated circuit (RFIC) coupled to a second side of the flexible cable, the first side and the second side being on opposite sides of the flexible cable, and wherein the RFIC is coupled to the antenna array die via the flexible cable.

In Example 326, the subject matter of Example 325, wherein the RFIC includes a front end and transceiver that form part of a radiohead.

In Example 327, the subject matter of one or more of Examples 325-326, wherein the flexible cable includes one or more metallic traces configured to support digital differential data signaling.

In Example 328, the subject matter of one or more of Examples 325-327, wherein the flexible cable is configured to serially communicate digital baseband data between the RFIC and a modem using the one or more metallic traces in accordance with a digital differential data signaling protocol.

In Example 329, the subject matter of one or more of Examples 325-328, wherein the flexible cable is configured to enable the serial communication of digital baseband data between the RFIC and the modem in accordance with a first data rate, and wherein the flexible cable further includes one or more additional metallic traces configured to enable communication of one or more control signals in accordance with a second data rate that is less than the first data rate.

In Example 330, the subject matter of one or more of Examples 325-329, wherein the modem is associated with a remote device board, and wherein the RFIC, the antenna array chip, and the device board are coupled directly to one another via the flexible cable without the use of cable connectors.

In Example 331, the subject matter of one or more of Examples 325-330, wherein the antenna array die is coupled to the first side of the flexible cable via a non-conductive adhesive such that a non-galvanic electromagnetic coupling is formed between the antenna array die and the flexible cable.

In Example 332, the subject matter of one or more of Examples 325-331, wherein the RFIC is galvanically coupled, via the flexible cable, to one side of the non-galvanic electromagnetic coupling formed between the antenna array die and the flexible cable.

In Example 333, the subject matter of one or more of Examples 325-332, wherein the flexible cable includes multiple layers, with at least one the multiple layers being associated with a voltage supply plane.

In Example 334, the subject matter of one or more of Examples 325-333, wherein the flexible cable is comprised of a liquid crystalline polymer (LCP) that is multilayered and includes microvias.

Example 335 is a cable, comprising: a flexible cable; an antenna array die; and a radio frequency integrated circuit (RFIC), wherein the flexible cable includes multiple layers with portions thereof interconnected with microvias, and wherein the microvias function to couple portions of the antenna array die to portions of the RFIC across the multiple layers of the flexible cable.

In Example 336, the subject matter of Example 335, wherein the antenna array die is coupled to a first side of the flexible cable, and wherein the RFIC is coupled to a second side of the flexible cable, the first side and the second side being opposite sides of the flexible cable.

In Example 337, the subject matter of one or more of Examples 335-336, wherein the RFIC includes a front end and transceiver that form part of a radiohead.

In Example 338, the subject matter of one or more of Examples 335-337, wherein the flexible cable includes one or more metallic traces configured to support digital differential data signaling.

In Example 339, the subject matter of one or more of Examples 335-338, wherein the flexible cable is configured to serially communicate digital baseband data between the RFIC and a modem using the one or more metallic traces in accordance with a digital differential data signaling protocol.

In Example 340, the subject matter of one or more of Examples 335-339, wherein the flexible cable is configured to enable the serial communication of digital baseband data between the RFIC and the modem in accordance with a first data rate, and wherein the flexible cable further includes one or more additional metallic traces configured to enable communication of one or more control signals in accordance with a second data rate that is less than the first data rate.

In Example 341, the subject matter of one or more of Examples 335-340, wherein the modem is associated with a remote device board, and wherein the RFIC, the antenna array chip, and the device board are coupled directly to one another via the flexible cable without the use of cable connectors.

In Example 342, the subject matter of one or more of Examples 335-341, wherein the antenna array die is coupled to the first side of the flexible cable via a non-conductive adhesive such that a non-galvanic electromagnetic coupling is formed between the antenna array die and the flexible cable, and wherein the RFIC is galvanically coupled, via the flexible cable, to one side of the non-galvanic electromagnetic coupling formed between the antenna array die and the flexible cable.

In Example 343, the subject matter of one or more of Examples 335-342, wherein at least one of the multiple layers of the flexible cable is associated with a voltage supply plane.

In Example 344, the subject matter of one or more of Examples 335-343, wherein the flexible cable is comprised of a liquid crystalline polymer (LCP).

Example 345 is a cable means, comprising: a flexible cable means; an antenna array means coupled to a first side of the flexible cable means; and a radio frequency integrated circuit (RFIC) means coupled to a second side of the flexible cable means, the first side and the second side being on opposite sides of the flexible cable means, and wherein the RFIC means is coupled to the antenna array means via the flexible cable means.

In Example 346, the subject matter of Example 345, wherein the RFIC means includes a front end and transceiver means that form part of a radiohead means.

In Example 347, the subject matter of one or more of Examples 345-346, wherein the flexible cable means includes one or more metallic traces configured to support digital differential data signaling.

In Example 348, the subject matter of one or more of Examples 345-347, wherein the flexible cable means is configured to serially communicate digital baseband data between the RFIC means and a modem means using the one or more metallic traces in accordance with a digital differential data signaling protocol.

In Example 349, the subject matter of one or more of Examples 345-348, wherein the flexible cable means for enabling the serial communication of digital baseband data between the RFIC means and the modem means in accordance with a first data rate, and wherein the flexible cable means further includes one or more additional metallic traces for enabling communication of one or more control signals in accordance with a second data rate that is less than the first data rate.

In Example 350, the subject matter of one or more of Examples 345-349, wherein the modem means is associated with a remote device board, and wherein the RFIC means, the antenna array means, and the device board are coupled directly to one another via the flexible cable means without the use of cable connectors.

In Example 351, the subject matter of one or more of Examples 345-350, wherein the antenna array means is coupled to the first side of the flexible cable means via a non-conductive adhesive such that a non-galvanic electromagnetic coupling is formed between the antenna array means and the flexible cable means.

In Example 352, the subject matter of one or more of Examples 345-351, wherein the RFIC means is galvanically coupled, via the flexible cable means, to one side of the non-galvanic electromagnetic coupling formed between the antenna array means and the flexible cable means.

In Example 353, the subject matter of one or more of Examples 345-352, wherein the flexible cable means includes multiple layers, with at least one the multiple layers being associated with a voltage supply plane.

In Example 354, the subject matter of one or more of Examples 345-353, wherein the flexible cable means is comprised of a liquid crystalline polymer (LCP) that is multilayered and includes microvias.

Example 355 is a cable means, comprising: a flexible cable means; an antenna array means; and a radio frequency integrated circuit (RFIC) means, wherein the flexible cable means includes multiple layers with portions thereof interconnected with microvias, and wherein the microvias function to couple portions of the antenna array means to portions of the RFIC means across the multiple layers of the flexible cable means.

In Example 356, the subject matter of Example 355, wherein the antenna array means is coupled to a first side of the flexible cable means, and wherein the RFIC means is coupled to a second side of the flexible cable means, the first side and the second side being opposite sides of the flexible cable means.

In Example 357, the subject matter of one or more of Examples 355-356, wherein the RFIC means includes a front end means and transceiver means that form part of a radiohead means.

In Example 358, the subject matter of one or more of Examples 355-357, wherein the flexible cable means includes one or more metallic traces configured to support digital differential data signaling.

In Example 359, the subject matter of one or more of Examples 355-358, wherein the flexible cable means is configured to serially communicate digital baseband data between the RFIC means and a modem means using the one or more metallic traces in accordance with a digital differential data signaling protocol.

In Example 360, the subject matter of one or more of Examples 355-359, wherein the flexible cable means enables the serial communication of digital baseband data between the RFIC means and the modem means in accordance with a first data rate, and wherein the flexible cable means further includes one or more additional metallic traces configured to enable communication of one or more control signals in accordance with a second data rate that is less than the first data rate.

In Example 361, the subject matter of one or more of Examples 355-360, wherein the modem means is associated with a remote device board, and wherein the RFIC means, the antenna array means, and the device board are coupled directly to one another via the flexible cable means without the use of cable connectors.

In Example 362, the subject matter of one or more of Examples 355-361, wherein the antenna array means is coupled to the first side of the flexible cable means via a non-conductive adhesive such that a non-galvanic electromagnetic coupling is formed between the antenna array means and the flexible cable means, and wherein the RFIC means is galvanically coupled, via the flexible cable means, to one side of the non-galvanic electromagnetic coupling formed between the antenna array means and the flexible cable means.

In Example 363, the subject matter of one or more of Examples 355-362, wherein at least one of the multiple layers of the flexible cable means is associated with a voltage supply plane.

In Example 364, the subject matter of one or more of Examples 355-363, wherein the flexible cable means is comprised of a liquid crystalline polymer (LCP).

An apparatus as shown and described.
A method as shown and described.

CONCLUSION

Throughout the disclosure numeric variables may be provided to indicate any suitable number of certain components, such as M, N, K, etc. In some of the examples provided, the numeric variables may be repeated for ease of explanation. However, the aspects described herein are not limited to these examples, and components being referenced by the same numeric variable suffix need not be equal to each other. For example, referring to FIG. 15, although the antennas 1514.1-1514.K and the transmit chains 1512.1-512.K each share the 'K' numeric variable as a suffix, aspects include the number of these components being the same as or different than one another based upon the desired application.

The aforementioned description of the specific aspects will so fully reveal the general nature of the disclosure that others can, by applying knowledge within the skill of the art, readily modify and/or adapt for various applications such specific aspects, without undue experimentation, and without departing from the general concept of the present disclosure. Therefore, such adaptations and modifications are intended to be within the meaning and range of equivalents of the disclosed aspects, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one aspect," "an aspect," "an exemplary aspect," etc., indicate that the aspect described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is submitted that it is within the knowledge of one skilled in the art to affect such feature, structure, or characteristic in connection with other aspects whether or not explicitly described.

The exemplary aspects described herein are provided for illustrative purposes, and are not limiting. Other exemplary aspects are possible, and modifications may be made to the exemplary aspects. Therefore, the specification is not meant to limit the disclosure. Rather, the scope of the disclosure is defined only in accordance with the following claims and their equivalents.

Aspects may be implemented in hardware (e.g., circuits), firmware, software, or any combination thereof. Aspects may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to aspects described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary aspects described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:
1. A local oscillator (LO) signals generator, comprising:
a delay-locked loop (DLL) comprising a delay line having a plurality of delay elements, the DLL being configured to generate phase-shifted signals based on a received input signal having a sub-harmonic frequency of an output signal frequency; and
phase configuration circuitry operably coupled to the DLL, the phase configuration circuitry being configured to select subsets of the generated phase-shifted signals, and to provide the selected subsets of the phase-shifted signals to a resonant load,
wherein the selection of the subsets of the phase-shifted signals causes each respective one of the subsets of the phase-shifted signals to frequency-multiply when combined via the resonant load to generate, for each respective one of the subsets of the phase-shifted signals, one of a set of quadrature LO signals at the output signal frequency, and
wherein a unit-phase shift associated with the generated phase-shifted signals is less than a delay associated with a single delay element from among the plurality of delay elements of the DLL.

2. The LO signals generator of claim 1, wherein the DLL comprises a delay line having a number of delay elements, and wherein a unit-phase shift associated with the generated phase-shifted signals is a function of the number of delay elements.

3. The LO signals generator of claim 1, wherein the set of quadrature LO signals are quadrature differential LO signals.

4. The LO signals generator of claim 1, wherein the output signal frequency is within a range of mm-wave frequencies.

5. The LO signals generator of claim 1, wherein the selection of the subsets of the phase-shifted signals causes each one of the set of quadrature LO signals at the output signal frequency to be phase-shifted with reference to a phase of the received input signal.

6. A local oscillator (LO) signals generator, comprising:
a delay-locked loop (DLL) configured to generate phase-shifted signals based on a received input signal having a sub-harmonic frequency of an output signal frequency; and
amplitude configuration circuitry operably coupled to the DLL, the amplitude configuration circuitry being configured to control an amplitude of each of the phase-shifted signals to generate weighted phase-shifted signals, the weighted phase-shifted signals being coupled to a resonant load,
wherein the amplitudes associated with the weighted phase-shifted signals causes each respective one of the weighted phase-shifted signals to frequency-multiply when combined via the resonant load to generate, for each respective one of the weighted phase-shifted signals, one of a set of quadrature LO signals at the output signal frequency.

7. The LO signals generator of claim 6, wherein the DLL comprises a delay line having a number of delay elements, and wherein a unit-phase shift associated with the generated phase-shifted signals is a function of the number of delay elements.

8. The LO signals generator of claim 6, wherein the DLL comprises a delay line having a plurality of delay elements, and wherein a unit-phase shift associated with the generated phase-shifted signals is less than the delay associated with a single delay element from among the plurality of delay elements.

9. The LO signals generator of claim 6, wherein the DLL comprises a two-dimensional matrix of delay elements interleaved with one another, with each node in the matrix being fed by two delay elements.

10. The LO signals generator of claim 6, wherein the set of quadrature LO signals are quadrature differential LO signals.

11. The LO signals generator of claim 6, wherein the output signal frequency is within a range of mm-wave frequencies.

12. The LO signals generator of claim 6, wherein the selection of amplitudes associated with the weighted phase-shifted signals causes each one of the set of quadrature LO signals at the output signal frequency to be phase-shifted with reference to a phase of the received input signal.

13. A wireless device, comprising:
a plurality of receiver chains;
processing circuitry; and
a memory configured to store executable instructions that, when executed by the processing circuitry, causes each receiver chain from the plurality of receiver chains to generate phase-shifted signals based on a received input signal having a sub-harmonic frequency of an output signal frequency, and to selectively provide a subset of the generated phase-shifted signals to a resonant load,
wherein selectively providing the subset of the generated phase-shifted signals causes each respective one of the generated phase-shifted signals to frequency-multiply when combined via the resonant load to generate, for each respective one of the generated phase-shifted signals, one of a set of quadrature local oscillator (LO) signals at the output signal frequency.

14. The wireless device of claim 13, wherein each receiver chain from among the plurality of receiver chains includes a respective LO signals generation unit that is configured to generate the set of quadrature LO signals having phases that are shifted with respect to the set of quadrature LO signals generated via the other receiver chains from among the plurality of receiver chains.

15. The wireless device of claim 13, wherein each receiver chain from among the plurality of receiver chains includes a respective LO signals generation unit including a delay-locked loop (DLL) configured to receive the input signal and to generate the phase-shifted signals from the received input signal at the sub-harmonic frequency.

16. The wireless device of claim 15, wherein the DLL comprises a delay line having a number of delay elements, and wherein a unit-phase shift associated with the generated phase-shifted signals for each respective one of the plurality of receiver chains is a function of the number of delay elements.

17. The wireless device of claim 15, wherein the DLL comprises a delay line having a plurality of delay elements, and wherein a unit-phase shift associated with the generated phase-shifted signals for each respective one of the plurality of receiver chains is less than the delay associated with a single delay element from among the plurality of delay elements.

18. The wireless device of claim 15, wherein the DLL comprises a two-dimensional matrix of delay elements interleaved with one another, with each node in the matrix being fed by two delay elements.

19. The wireless device of claim 13, wherein each receiver chain from among the plurality of receiver chains includes respective phase configuration circuitry coupled to a delay-locked loop (DLL), and wherein the executable instructions, when executed by the processing circuitry, causes the phase configuration circuitry to selectively provide the generated phase-shifted signals to the resonant load by selectively coupling selected ones of the phase-shifted signals generated by the DLL to the resonant load.

20. The wireless device of claim 13, wherein each receiver chain from among the plurality of receiver chains includes a respective phase configuration circuitry coupled to a delay-locked loop (DLL), and wherein the executable instructions, when executed by the processing circuitry, causes the phase configuration circuitry to selectively provide the generated phase-shifted signals to the resonant load by selectively attenuating a portion of the phase-shifted signals generated by the DLL.

21. The wireless device of claim 13, wherein the set of quadrature LO signals are quadrature differential LO signals.

22. The wireless device of claim 13, wherein the output signal frequency is within a range of mm-wave frequencies.

23. A local oscillator (LO) signals generator, comprising:
 a delay-locked loop (DLL) comprising a two-dimensional matrix of delay elements interleaved with one another, with each node in the two-dimensional matrix of delay elements being fed by two delay elements, the DLL being configured to generate phase-shifted signals based on a received input signal having a sub-harmonic frequency of an output signal frequency; and
 phase configuration circuitry operably coupled to the DLL, the phase configuration circuitry being configured to select subsets of the generated phase-shifted signals, and to provide the selected subsets of the phase-shifted signals to a resonant load,
 wherein the selection of the subsets of the phase-shifted signals causes each respective one of the subsets of the phase-shifted signals to frequency-multiply when combined via the resonant load to generate, for each respective one of the subsets of the phase-shifted signals, one of a set of quadrature LO signals at the output signal frequency.

24. The LO signals generator of claim 23, wherein the output signal frequency is within a range of mm-wave frequencies.

* * * * *